(12) United States Patent
Hashiya et al.

(10) Patent No.: US 11,256,043 B2
(45) Date of Patent: Feb. 22, 2022

(54) OPTICAL DEVICE AND PHOTODETECTION SYSTEM

(71) Applicant: Panasonic Intellectual Property Management Co., Ltd., Osaka (JP)

(72) Inventors: Akira Hashiya, Osaka (JP); Yasuhisa Inada, Osaka (JP); Taku Hirasawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 37 days.

(21) Appl. No.: 16/984,746

(22) Filed: Aug. 4, 2020

(65) Prior Publication Data

US 2020/0363596 A1 Nov. 19, 2020

Related U.S. Application Data

(63) Continuation of application No. PCT/JP2019/002313, filed on Jan. 24, 2019.

(30) Foreign Application Priority Data

| Mar. 9, 2018 | (JP) | JP2018-043288 |
| Mar. 16, 2018 | (JP) | JP2018-049962 |
| Jan. 16, 2019 | (JP) | JP2019-005562 |

(51) Int. Cl.
*G02B 6/12* (2006.01)
*G02B 6/42* (2006.01)
(Continued)

(52) U.S. Cl.
CPC .......... *G02B 6/4214* (2013.01); *G02B 6/122* (2013.01); *G02B 6/43* (2013.01); *H01S 5/026* (2013.01); *G02B 2006/12104* (2013.01)

(58) Field of Classification Search
CPC ........ G02B 6/4214; G02B 6/122; G02B 6/43; G02B 2006/12104; G02B 6/29323;
(Continued)

(56) References Cited

U.S. PATENT DOCUMENTS 3,905,676 A 9/1975 Ulrich
8,267,583 B2 * 9/2012 Yao .................... G02B 6/12002
384/31

(Continued)

FOREIGN PATENT DOCUMENTS

JP 61-144608 7/1986
JP 5-173196 7/1993
(Continued)

OTHER PUBLICATIONS

International Search Report of PCT application No. PCT/JP2019/002313 dated Feb. 19, 2019.
(Continued)

*Primary Examiner* — Ellen E Kim
(74) *Attorney, Agent, or Firm* — McDermott Will & Emery

(57) ABSTRACT

An optical device includes a first waveguide that propagates light in a first direction; and a second waveguide including a first mirror, a second mirror, and an optical waveguide layer. The first mirror extends in the first direction and has a first reflecting surface, and the second mirror extends in the first direction and has a second reflecting surface. The optical waveguide layer is located between the first and second mirrors and propagates the light in the first direction. A forward end portion of the first waveguide is disposed inside the optical waveguide layer. In a region in which the first and second waveguides overlap each other when viewed in a direction perpendicular to the first reflecting surface, at least part of the first waveguide and/or at least
(Continued)

part of the second waveguide includes at least one grating whose refractive index varies periodically in the first direction.

30 Claims, 86 Drawing Sheets

(51) Int. Cl.
  *H01S 5/026* (2006.01)
  *G02B 6/122* (2006.01)
  *G02B 6/43* (2006.01)
(58) Field of Classification Search
  CPC ...... G02B 6/12004; G02B 6/124; G02B 6/34; G02B 6/1225; G02B 26/08; H01S 5/026; G01S 7/4817; G02F 1/1326; G02F 1/292; G02F 2201/063; G02F 2201/30; G02F 2201/302; G02F 2202/20; G02F 2202/42; G02F 2203/07; G02F 2203/62
  See application file for complete search history.

(56) References Cited

U.S. PATENT DOCUMENTS

| | | | |
|---|---|---|---|
| 10,895,686 B2* | 1/2021 | Lambert | ............ G02B 6/1228 |
| 2016/0131848 A1* | 5/2016 | Svilans | ............ G02B 6/12004 |
| | | | 385/14 |

FOREIGN PATENT DOCUMENTS

| | | |
|---|---|---|
| JP | 6-051144 | 2/1994 |
| JP | 2013-016591 | 1/2013 |
| JP | 2016-024439 | 2/2016 |
| JP | 2016-508235 | 3/2016 |
| JP | 2016-102883 | 6/2016 |
| WO | 2013/168266 | 11/2013 |
| WO | 2014/110017 | 7/2014 |

OTHER PUBLICATIONS

M. Lamponi et al., "Low-Threshold Heterogeneously Integrated InP/SOI Lasers With a Double Adiabatic Taper Coupler", IEEE Photonics Technology Letters, vol. 24, No. 1, 2012, pp. 76-78.
Aashish Singh, "Free charge carrier induced refractive index modulation of crystalline Silicon", 7th IEEE International Conference on Group IV Photonics, pp. 102-104.
Seiji Toyoda et al., "Low-Driving-Voltage Electro-Optic Modulator With Novel KTa1-xNbxO3 Crystal Waveguides", Japanese Journal of Applied Physics, vol. 43, No. 8B, 2004, pp. 5862-5866.
Bradley J. Frey et al., "Temperature-dependent refractive index of silicon and germanium", Proceedings of SPIE, vol. 6273, Optomechanical Technologies for Astronomy, 62732J-1-62732J-10.
Extended European Search Report dated Mar. 4, 2021 for the related European Patent Application No. 19763760.6.

* cited by examiner

AIR n = 1

AIR n = 1

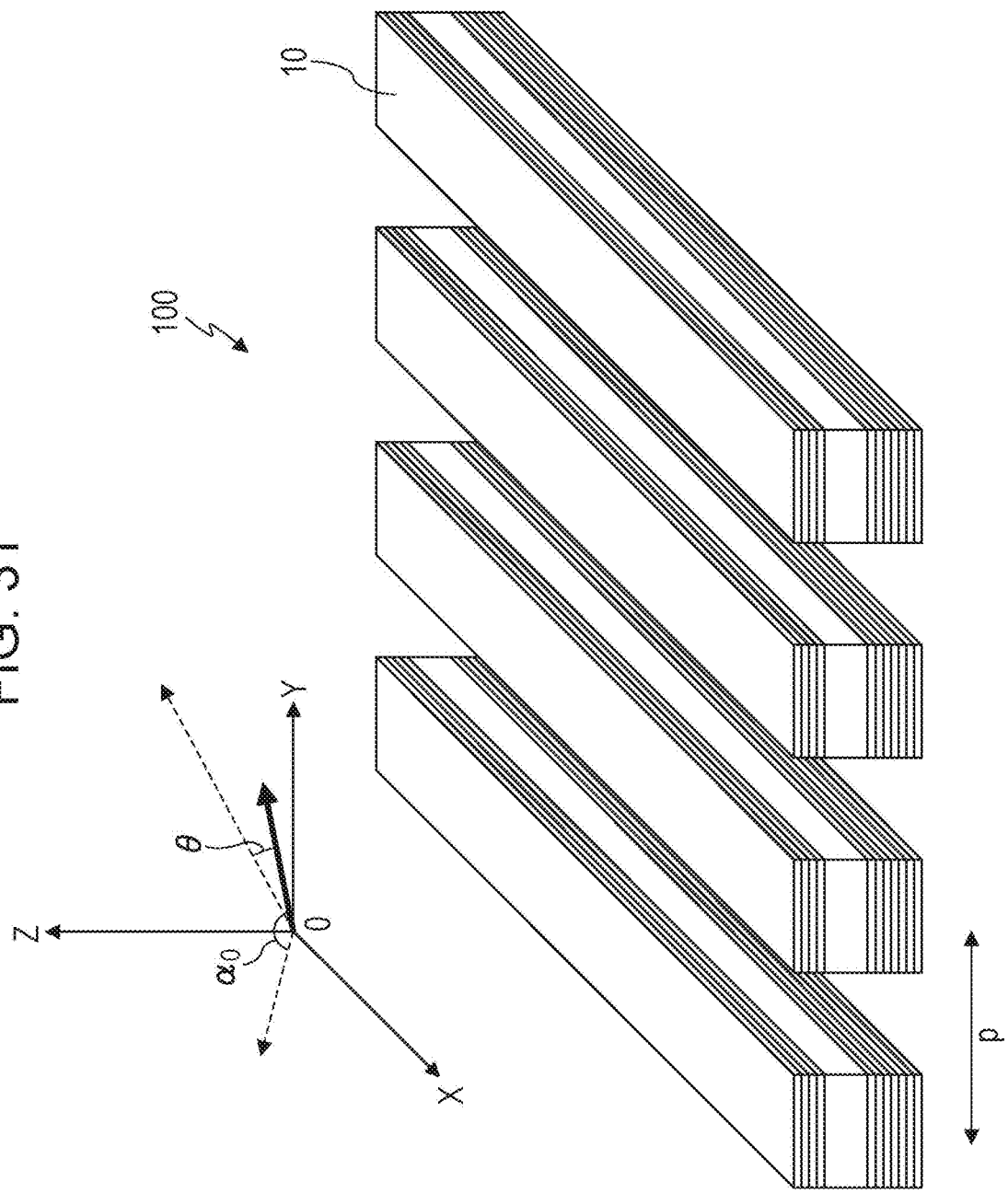

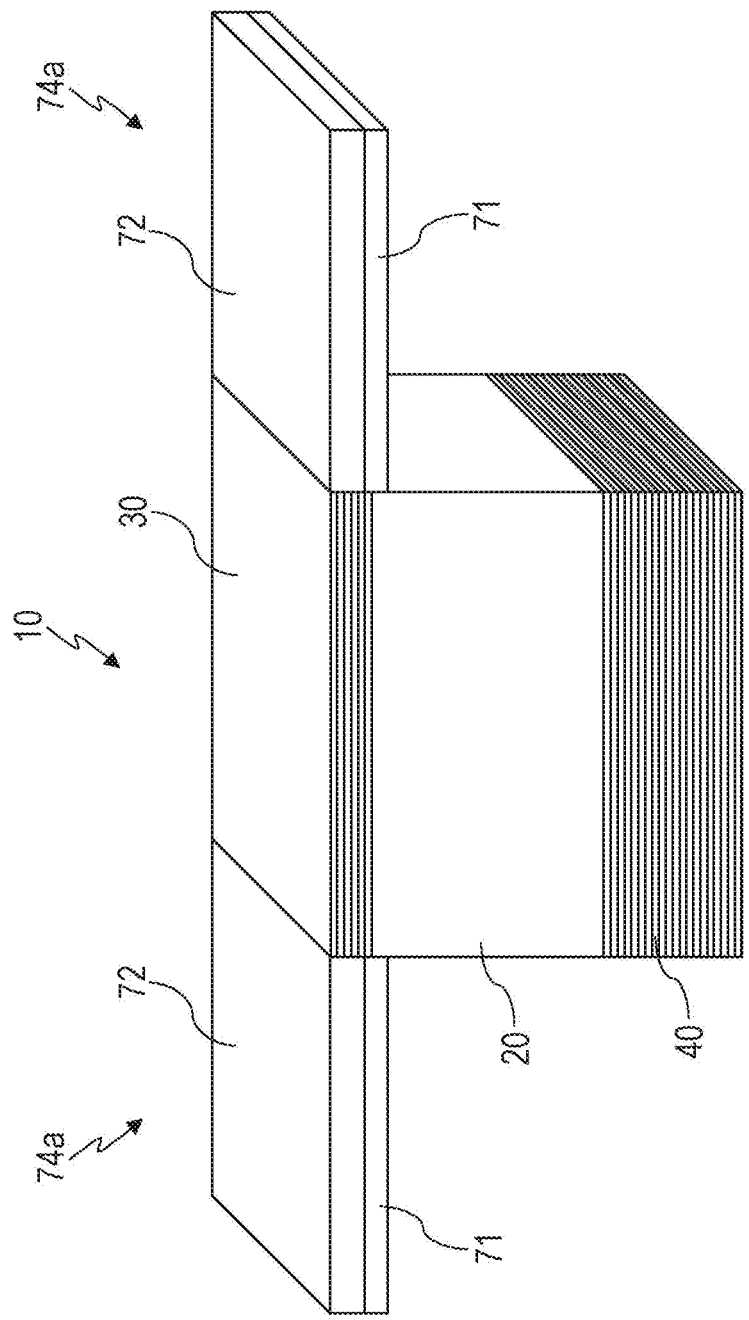

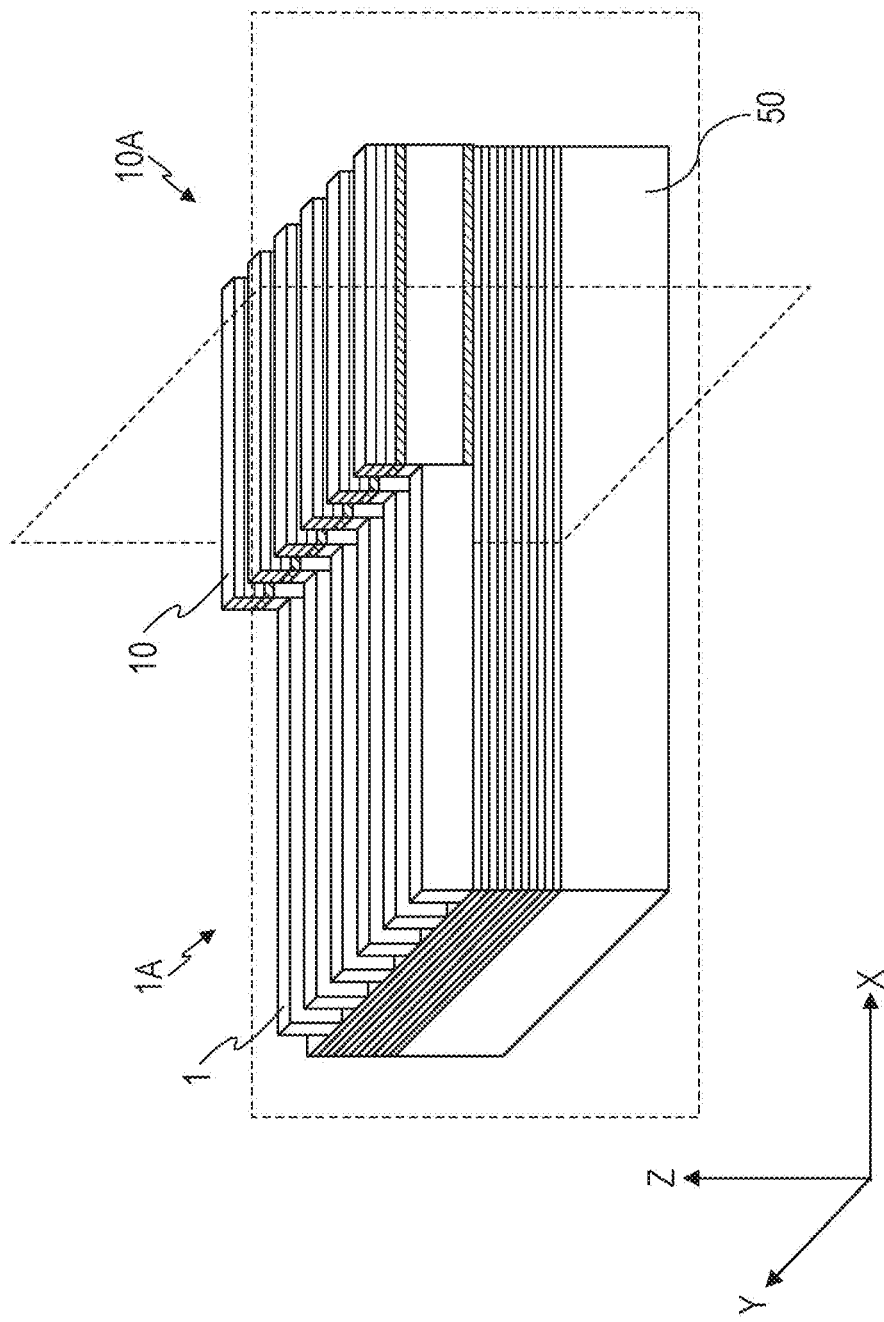

OPTICAL DEVICE AND PHOTODETECTION SYSTEM

BACKGROUND

1. Technical Field

The present disclosure relates to an optical device and to a photodetection system.

2. Description of the Related Art

Various devices capable of scanning a space with light have been proposed.

International Publication No. 2013/168266 discloses a structure that can perform optical scanning using a driving unit for rotating a mirror.

Japanese Unexamined Patent Application Publication (Translation of PCT Application) No. 2016-508235 discloses an optical phased array including a plurality of nanophotonic antenna elements arranged in two dimensions. Each antenna element is optically coupled to a corresponding variable optical delay line (i.e., a phase shifter). In this optical phased array, a coherent light beam is guided to each antenna element through a corresponding waveguide, and the phase of the light beam is shifted by a corresponding phase shifter. In this manner, an amplitude distribution of a far-field radiation pattern can be changed.

Japanese Unexamined Patent Application Publication No. 2013-16591 discloses a light deflection element including: a waveguide including an optical waveguide layer through which light is guided and first distributed Bragg reflectors formed on the upper and lower surfaces of the optical waveguide layer; a light inlet for allowing light to enter the waveguide; and a light outlet formed on a surface of the waveguide to allow the light entering from the light inlet and guided through the waveguide to be emitted.

SUMMARY

One non-limiting and exemplary embodiment provides a novel optical device having a relatively simple structure.

Solution to Problem

In one general aspect, the techniques disclosed here feature an optical device including: a first waveguide that propagates light in a first direction; and a second waveguide including a first mirror, a second mirror, and an optical waveguide layer, the first mirror extending in the first direction and having a first reflecting surface, the second mirror extending in the first direction and having a second reflecting surface facing the first reflecting surface, the optical waveguide layer being located between the first mirror and the second mirror and propagating the light in the first direction. A forward end portion of the first waveguide is disposed inside the optical waveguide layer. In a region in which the first waveguide and the second waveguide overlap each other when viewed in a direction perpendicular to the first reflecting surface, at least part of the first waveguide and/or at least part of the second waveguide includes at least one grating whose refractive index varies periodically in the first direction.

According to the above aspect of the present disclosure, a relatively simple structure can be achieved.

It should be noted that general or specific embodiments of the present disclosure may be implemented as a device, a system, a method, or any selective combination thereof.

Additional benefits and advantages of the disclosed embodiments will become apparent from the present specification and drawings. The benefits and/or advantages may be individually obtained by the various embodiments and features of the present specification and drawings, which need not all be provided in order to obtain one or more of such benefits and/or advantages.

BRIEF DESCRIPTION OF THE DRAWINGS

FIG. 31 is a perspective view schematically showing a waveguide array in a three-dimensional space;

FIG. 45 is an illustration showing an example of an actuator;

FIG. 65A is an illustration schematically showing an optical scanning device in an embodiment;

FIG. 79B is a graph showing the results of computations of an electric field intensity distribution in the structural example in FIG. 78;

FIG. 80 is a cross-sectional view of an optical scanning device, schematically showing a structural example in an embodiment in which spacers having different refractive indexes are present;

FIG. 81 is a cross-sectional view of an optical scanning device, schematically showing a structural example of a waveguide element in a modification;

FIG. 82 is a graph showing the relation between the width of an optical waveguide region and the spread of an electric field;

FIG. 83 is a cross-sectional view of an optical scanning device, schematically showing a structural example of an optical waveguide region and non-waveguide regions in an embodiment;

FIG. 84A is a graph showing the results of computations of the electric field distribution of a waveguide mode;

FIG. 84B is a graph showing the results of computations of the electric field distribution of the waveguide mode;

FIG. 85 is a graph showing the relation between the ratio of a dimension of members to the distance between mirrors and the spread of the electric field;

FIG. 86 is a graph showing the relation between the ratio of the dimension of the members to the distance between the mirrors and the extinction coefficient of each waveguide mode in the example in FIG. 85;

FIG. 87 is a graph showing the relation between the ratio of the dimension of the members to the distance between the mirrors and the spread of the electric field;

FIG. 88 is a cross-sectional view of an optical scanning device, schematically showing the structure of the optical waveguide region and the non-waveguide regions;

FIG. 89 is a graph showing the relation between the ratio of the dimension of a member to the distance between the mirrors and the spread of the electric field;

Figure 90A:
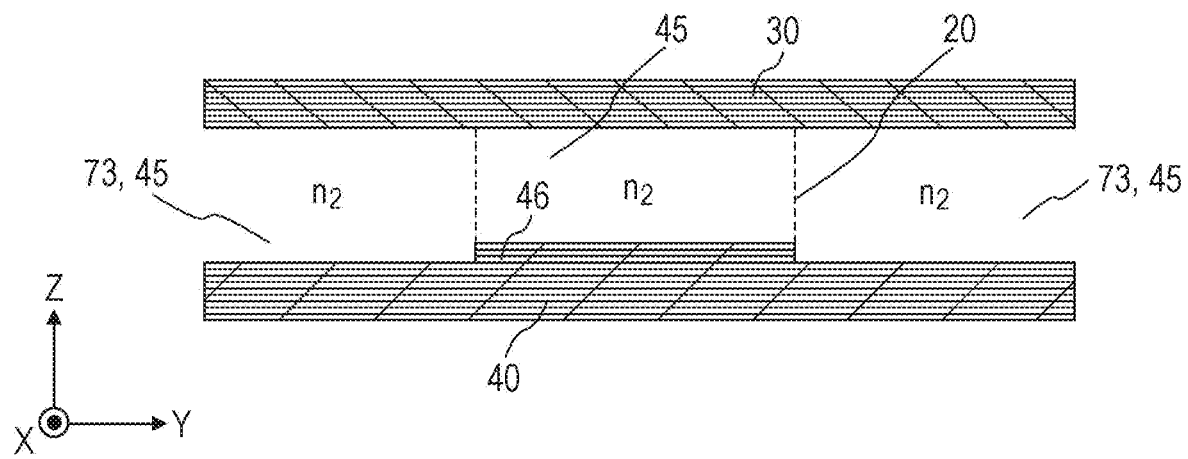
Figure 90B:
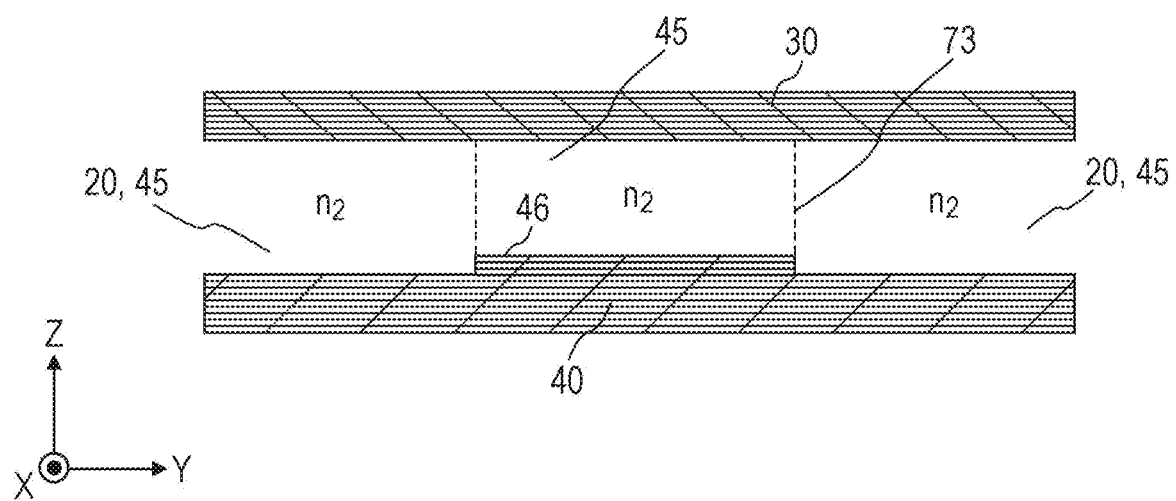
Figure 91:
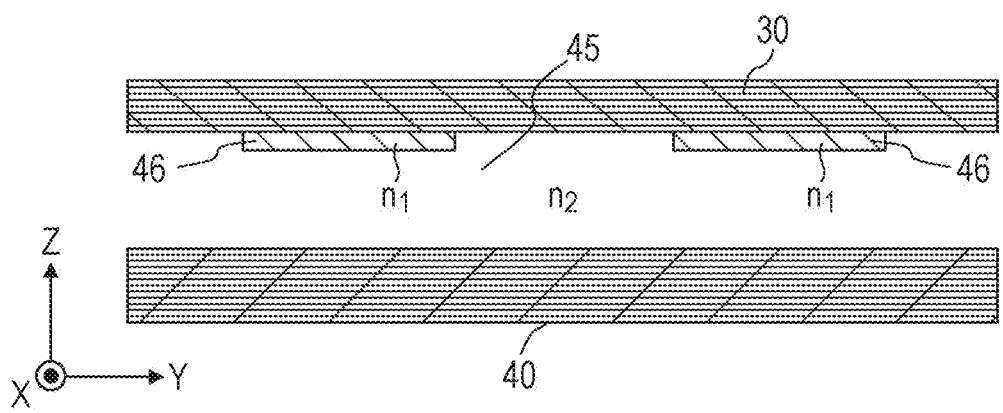
Figure 92:
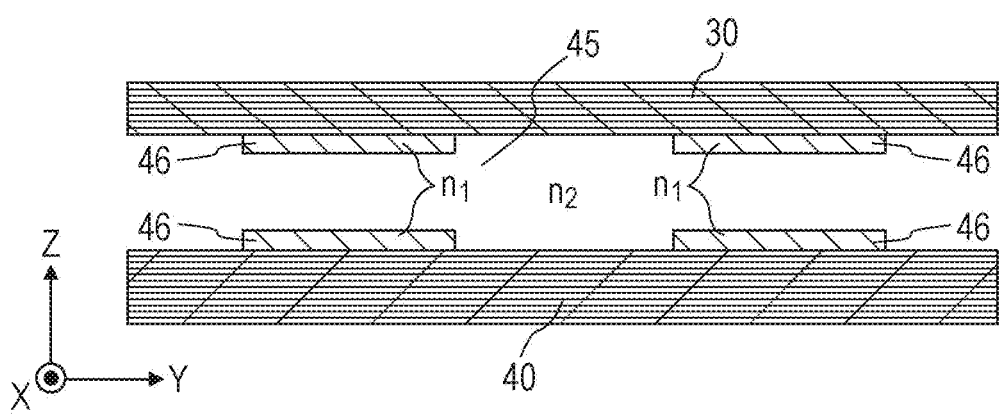
Figure 93:
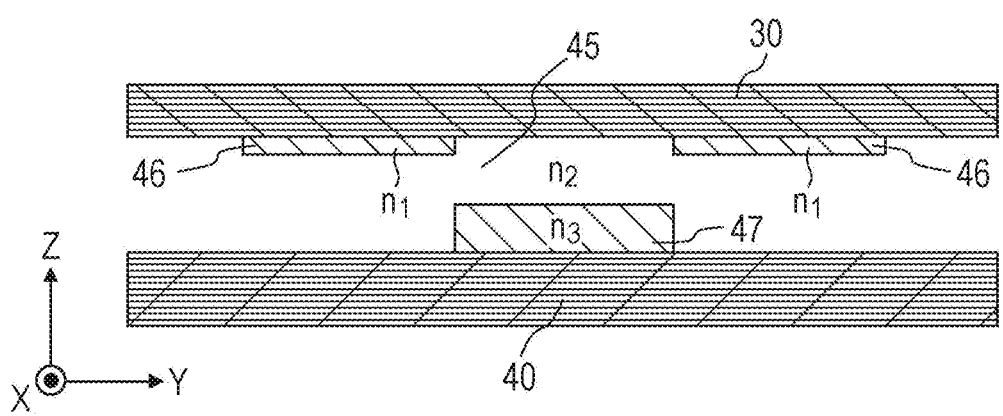
Figure 94:
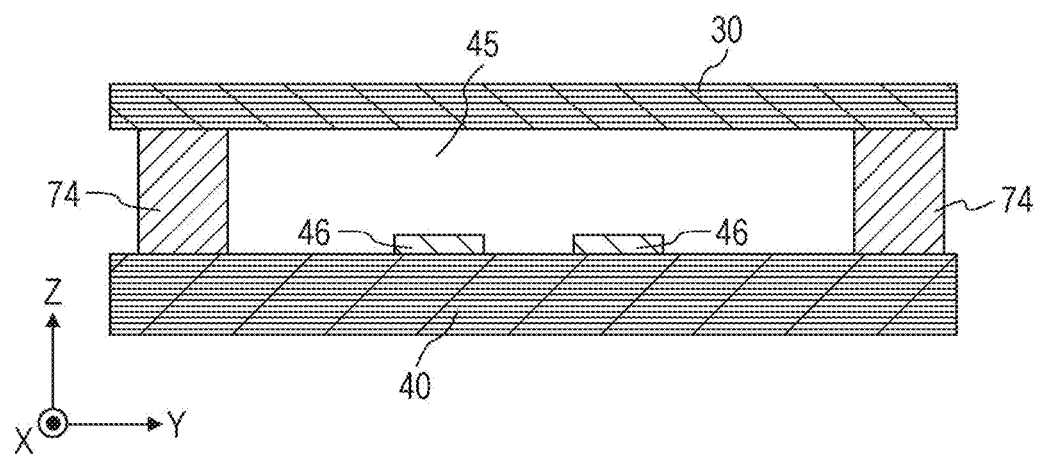
Figure 95:
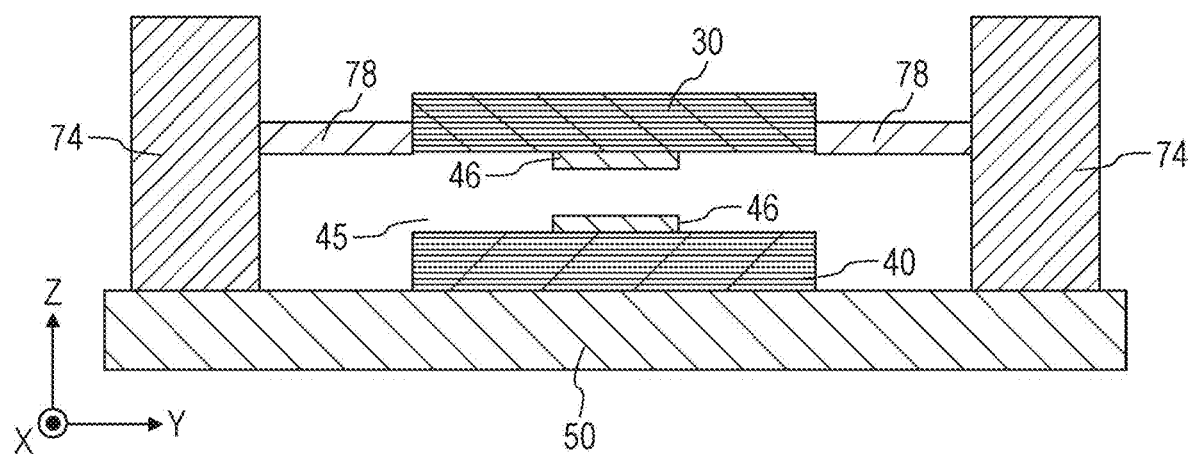
Figure 96:
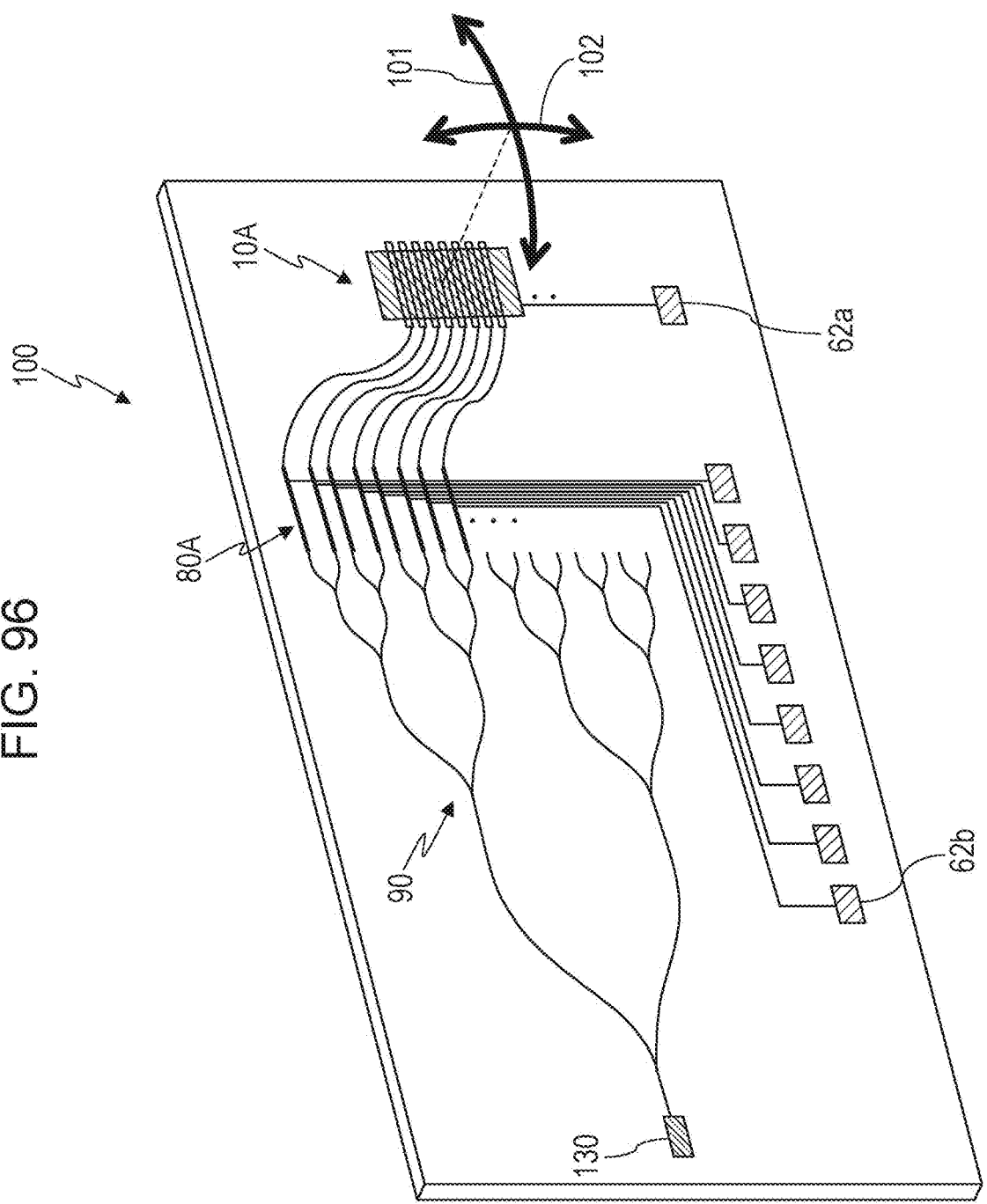
Figure 97:
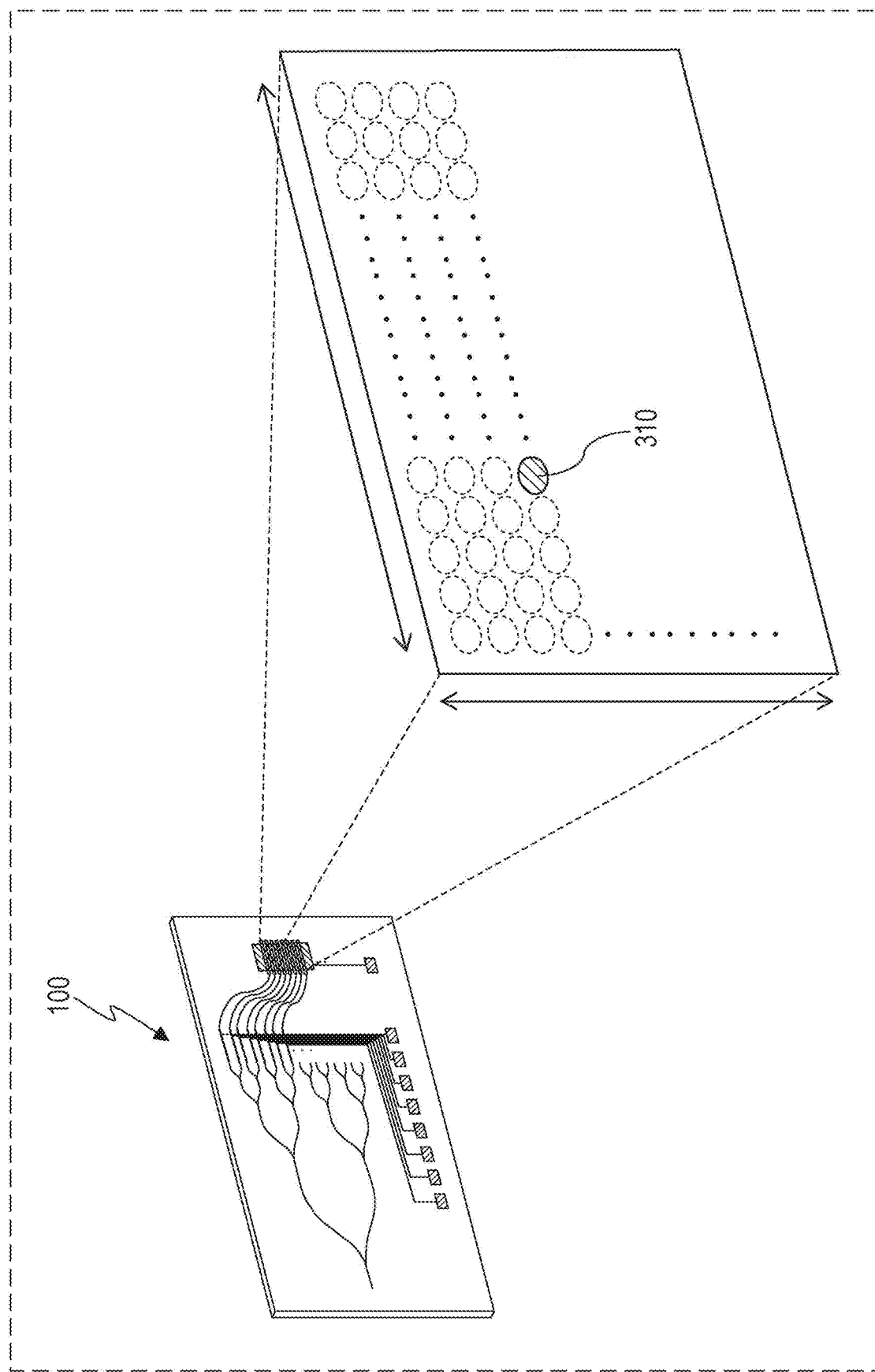
Figure 98:
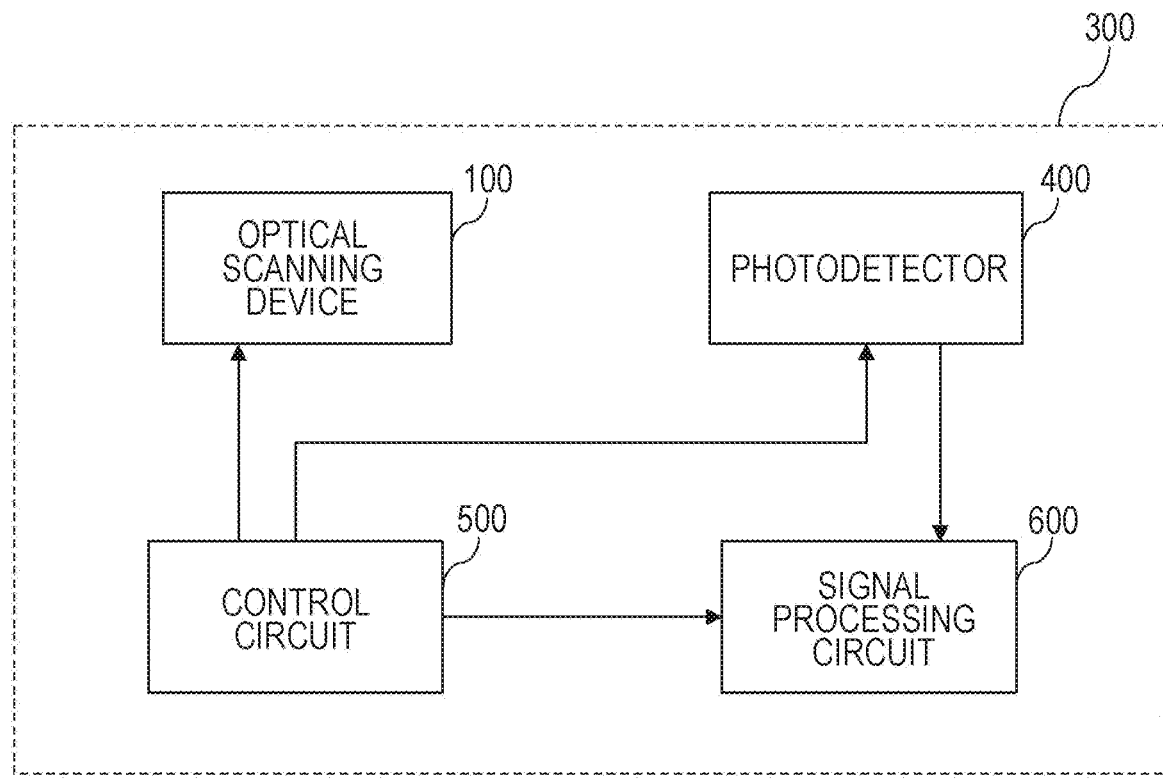

FIG. 90A is a cross-sectional view showing an example in which a protruding portion protruding from other portions is disposed in part of the reflecting surface of the second mirror;

FIG. 90B is a cross-sectional view schematically showing another example in which the protruding portion is disposed in part of the reflecting surface of the second mirror;

FIG. 91 is a cross-sectional view of an optical scanning device, schematically showing a structural example in which two members are disposed on the first mirror so as to be spaced apart from each other;

FIG. 92 is a cross-sectional view of an optical scanning device, schematically showing a structural example in which two members are disposed on each of the first and second mirrors so as to be spaced apart from each other;

FIG. 93 is a cross-sectional view of an optical scanning device, schematically showing a structural example in which two members are disposed on the first mirror so as to be spaced apart from each other and another member is disposed on the second mirror;

FIG. 94 is a cross-sectional view of an optical scanning device, schematically showing a structural example in which two members are disposed on the second mirror so as to be spaced apart from each other;

FIG. 95 is a cross-sectional view of an optical scanning device, schematically showing a structural example in which a member is disposed on each of the first and second mirrors;

FIG. 96 is an illustration showing a structural example of an optical scanning device including elements such as an optical divider, a waveguide array, a phase shifter array, and a light source integrated on a circuit substrate;

FIG. 97 is a schematic diagram showing how two-dimensional scanning is performed by irradiating a distant object with a light beam such as a laser beam from the optical scanning device; and FIG. 98 is a block diagram showing a structural example of a LiDAR system that can generate a range image.

DETAILED DESCRIPTION

Before embodiments of the present disclosure are described, findings underlying the present disclosure will be described.

The present inventors have found that a problem with conventional optical scanning devices is that it is difficult to optically scan a space without increasing the complexity of the structures of the devices.

For example, in the technique disclosed in International Publication No. 2013/168266, the driving unit for rotating the mirror is necessary. Therefore, the device structure is complicated. A problem with this device is that the device is not robust against vibration.

In the optical phased array described in Japanese Unexamined Patent Application Publication (Translation of PCT Application) No. 2016-508235, light must be split and introduced into a plurality of row waveguides and a plurality of column waveguides to guide the split light beams to the plurality of antenna elements arranged in two dimensions. Therefore, wiring lines for the waveguides for guiding the light beams are very complicated. Moreover, the range of two-dimensional scanning cannot be increased. To change the amplitude distribution of the emitted light two dimensionally in a far field, the phase shifters must be connected to the plurality of antenna elements arranged in two dimensions, and wiring lines for phase control must be attached to the phase shifters. The phases of the light beams entering the plurality of two-dimensionally arranged antenna elements can thereby be changed by different amounts. Therefore, the structure of the elements is very complicated.

The present inventors have focused attention on the problems in the conventional techniques and have conducted studies to solve these problems. The present inventors have found that the above problems can be solved by using a waveguide element including a pair of opposed mirrors and an optical waveguide layer sandwiched between these mirrors. One of the pair of mirrors of the waveguide element has a higher light transmittance than the other and allows part of light propagating through the optical waveguide layer to be emitted to the outside. The direction of the emitted light (or its emission angle) can be changed by adjusting the refractive index of the optical waveguide layer, the thickness thereof, or the wavelength of the light to be inputted to the optical waveguide layer, as described later. More specifically, by changing the refractive index, the thickness, or the wavelength, a component of the wave vector of the emitted light which component is along the longitudinal direction of the optical waveguide layer can be changed. One-dimensional scanning is thereby achieved.

When an array of a plurality of waveguide elements is used, two-dimensional scanning can be achieved. More specifically, light beams with appropriate phase differences are supplied to the plurality of waveguide elements, and the phase differences are controlled to change a direction in which light beams emitted from the plurality of waveguide elements are reinforced. By changing the phase differences, a component of the wave vector of the emitted light which component is along a direction intersecting the longitudinal direction of the optical waveguide layer is changed. Two-dimensional scanning can thereby be achieved. When two-dimensional scanning is performed, it is unnecessary to change the refractive indexes of the plurality of optical waveguide layers, the thicknesses thereof, or the wavelengths of the light beams by different amounts. Specifically, two-dimensional scanning can be performed by supplying light beams with appropriate phase differences to the plurality of optical waveguide layers and changing the refractive indexes of the plurality of optical waveguide layers and/or the thicknesses thereof and/or the wavelengths by the same amount in a synchronous manner. As described above, in the above embodiment of the present disclosure, two-dimensional optical scanning can be achieved using the relatively simple structure.

In the present specification, the phrase "the refractive indexes and/or the thicknesses and/or the wavelengths" means at least one property selected from the group consisting of the refractive indexes of the optical waveguide layers, the thicknesses of the optical waveguide layers, and the wavelengths of light beams to be inputted to the optical waveguide layers. To change the emission direction of the light, at least one property selected from the refractive indexes, the thicknesses, and the wavelengths may be controlled independently. Alternatively, any two or all of the three properties may be controlled to change the emission direction of the light. In the following description, a mode in which the refractive indexes or thicknesses of the optical waveguide layers are controlled will be mainly described. In the following embodiments, instead of or in addition to the control of the refractive indexes or the thicknesses, the wavelengths of the light beams to be inputted to the optical waveguide layers may be controlled.

The above-described basic principle is applicable not only to the application in which light is emitted but also to an application in which a light signal is received. By changing the refractive indexes and/or the thicknesses and/or the wavelengths, a light receivable direction can be changed one-dimensionally. Moreover, the light receivable direction can be changed two-dimensionally by changing phase differences between light beams using a plurality of phase shifters connected to a plurality of waveguide elements arranged in one direction.

An optical scanning device and a photoreceiver device in embodiments of the present disclosure can be used for, for example, antennas of a photodetection system such as a LiDAR (Light Detection and Ranging) system. The LiDAR system uses electromagnetic waves (visible light, infrared light, or ultraviolet light) having shorter wavelengths than radio waves such as millimeter waves used in a radar system and can therefore detect a distance distribution of an object with high resolution. Such a LiDAR system is mounted on a mobile unit such as an automobile, a UAV (Unmanned Aerial Vehicle, a so-called drone), or an AGV (Automated Guided Vehicle) and used as one of crash avoidance techniques. In the present specification, the optical scanning device and the photoreceiver device may be collectively referred to as an "optical device." A device used as the optical scanning device or the photoreceiver device may also be referred to as an "optical device."

Structural Example of Optical Scanning Device

An exemplary structure of an optical scanning device that performs two-dimensional scanning will be described. However, unnecessarily detailed description may be omitted. For example, detailed description of well-known matters and redundant description of substantially the same structures may be omitted. This is to avoid unnecessary redundancy in the following description and to facilitate understanding by those skilled in the art. The present inventors provide the accompanying drawings and the following description to allow those skilled in the art to fully understand the present disclosure. The accompanying drawings and the following description are not intended to limit the subject matter defined in the claims. In the following description, the same or similar components are denoted by the same reference numerals.

In the present disclosure, the "light" means electromagnetic waves including not only visible light (wavelength: about 400 nm to about 700 nm) but also ultraviolet rays (wavelength: about 10 nm to about 400 nm) and infrared rays (wavelength: about 700 nm to about 1 mm). In the present specification, the ultraviolet rays may be referred to as "ultraviolet light," and the infrared rays may be referred to as "infrared light."

In the present disclosure, the "scanning" with light means that the direction of the light is changed. The "one-dimensional scanning" means that the direction of the light is linearly changed in a direction intersecting the direction of the light. The "two-dimensional scanning" means that the direction of the light is changed two-dimensionally along a plane intersecting the direction of the light.

In the present specification, the phrase "two directions parallel to each other" means not only that they are strictly parallel to each other but also that the angle between them is 15 degrees or less. In the present specification, the phrase "two directions perpendicular to each other" means not only that they are strictly perpendicular to each other but also that the angle between them is from 75 degrees to 105 degrees inclusive.

Figure 1:
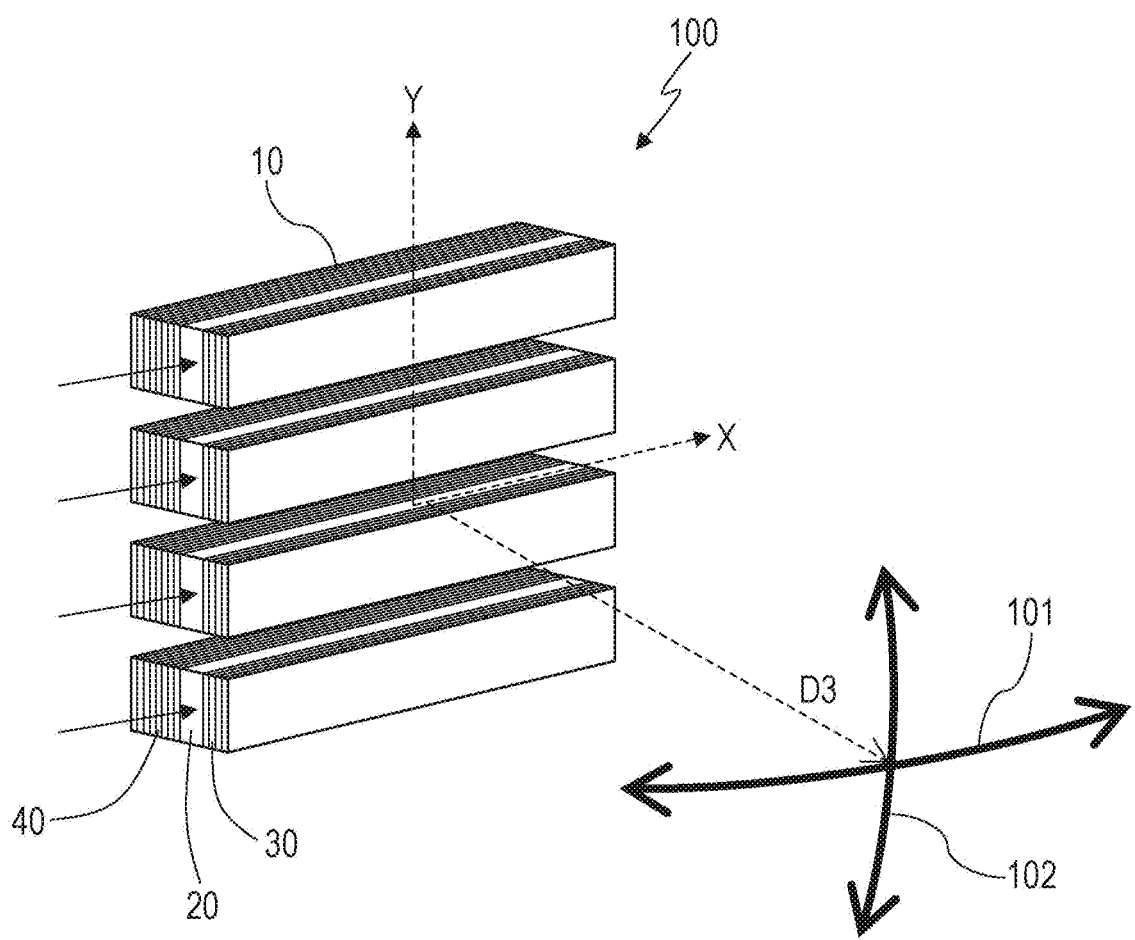
FIG. 1 is a perspective view schematically showing the structure of an optical scanning device in an exemplary embodiment of the present disclosure.

FIG. 1 is a perspective view schematically showing the structure of an optical scanning device 100 in an exemplary embodiment of the present disclosure. The optical scanning device 100 includes a waveguide array including a plurality of waveguide elements 10. Each of the plurality of waveguide elements 10 has a shape elongated in a first direction (the X direction in FIG. 1). The plurality of waveguide elements 10 are regularly arranged in a second direction (the Y direction in FIG. 1) intersecting the first direction. Each of the plurality of waveguide elements 10 propagates light in the first direction and allows the light to be emitted in a third direction D3 that intersects a virtual plane parallel to the first and second directions. In the present embodiment, the first direction (the X direction) and the second direction (the Y direction) are orthogonal to each other but may not be orthogonal to each other. In the present embodiment, the plurality of waveguide elements 10 are arranged in the Y direction at regular intervals but are not necessarily arranged at regular intervals.

The orientation of each of the structures shown in the drawings of the present disclosure is set in consideration of the ease of understanding of description, and the orientation of a structure when an embodiment of the present disclosure is actually implemented is not limited thereto. The shape and size of part or all of any of the structures shown in the drawings do not limit the actual shape and size.

Each of the plurality of waveguide elements 10 includes a first mirror 30 and a second mirror 40 (hereinafter may be referred to simply as "mirrors") that face each other and further includes an optical waveguide layer 20 located between the mirrors 30 and 40. Each of the mirrors 30 and 40 has a reflecting surface that intersects the third direction D3 and is located at an interface with the optical waveguide layer 20. Each of the mirrors 30 and 40 and the optical waveguide layer 20 has a shape elongated in the first direction (the X direction).

As described later, the first mirrors 30 of the plurality of waveguide elements 10 may be a plurality of portions of an integrally formed third mirror. The second mirrors 40 of the plurality of waveguide elements 10 may be a plurality of portions of an integrally formed fourth mirror. The optical waveguide layers 20 of the plurality of waveguide elements 10 may be a plurality of portions of an integrally formed optical waveguide layer. A plurality of waveguides can be formed when at least one of the following conditions is met: (1) Each of the first mirrors 30 is formed separately from the other first mirrors 30. (2) Each of the second mirrors 40 is formed separately from the other second mirrors 40. (3) Each of the optical waveguide layers 20 is formed separately from the other optical waveguide layers 20. The phrase "each of the first mirrors is formed separately from the other first mirrors" means not only that physical spaces are provided between the first mirrors but also that a material having a different refractive index is disposed between the first mirrors to separate them from each other.

The reflecting surface of each first mirror 30 and the reflecting surface of a corresponding second mirror 40 are approximately parallel to each other and face each other. Among the mirrors 30 and 40, at least the first mirror 30 has the capability of allowing part of light propagating in the optical waveguide layer 20 to pass through. In other words, the first mirror 30 has a higher transmittance for the above light than the second mirror 40. Therefore, part of the light propagating in the optical waveguide layer 20 is emitted to the outside through the first mirror 30. Each of the above-described mirrors 30 and 40 may be, for example, a multi-layer film mirror formed from a multilayer film (may be referred to as a "multilayer reflective film") made of a dielectric material.

By controlling the phases of light beams to be inputted to the waveguide elements 10 and changing the refractive indexes or thicknesses of the optical waveguide layers 20 of the waveguide elements 10 or the wavelengths of the light beams to be inputted to the optical waveguide layers 20 simultaneously in a synchronous manner, two-dimensional optical scanning can be achieved.

To implement the above two-dimensional scanning, the present inventors have analyzed the details of the operating principle of the waveguide elements 10. Based on the results obtained, the inventors have succeeded in implementing two-dimensional optical scanning by driving the plurality of waveguide elements 10 in a synchronous manner.

As shown in FIG. 1, when light is inputted to each waveguide element 10, the light is emitted from the emission surface of the waveguide element 10. The emission surface is located opposite to the reflecting surface of the first mirror 30. The direction D3 of the emitted light depends on the refractive index and thickness of the optical waveguide layer and the wavelength of the light. In the present embodiment, the refractive indexes of the optical waveguide layers and/or the thicknesses thereof and/or the wavelengths are controlled in a synchronous manner such that light beams are emitted from the waveguide elements 10 in approximately the same direction. In this manner, the X direction component of the wave vector of the light emitted from the plurality of waveguide elements 10 can be changed. In other words, the direction D3 of the emitted light can be changed in a direction 101 shown in FIG. 1.

Since the light beams emitted from the plurality of waveguide elements 10 are directed in the same direction, the emitted light beams interfere with each other. By controlling the phases of the light beams emitted from the waveguide elements 10, the direction in which the light beams are reinforced by interference can be changed. For example, when a plurality of waveguide elements 10 having the same size are arranged at regular intervals in the Y direction, light beams having different phases shifted by a given amount are inputted to the plurality of waveguide elements 10. By changing the phase differences, the Y direction component of the wave vector of the emitted light can be changed. In other words, by changing the phase differences between the light beams introduced into the plurality of waveguide elements 10, the direction D3 in which the emitted light beams are reinforced by interference can be changed in a direction 102 shown in FIG. 1. Two-dimensional optical scanning can thereby be achieved.

The operating principle of the optical scanning device 100 will next be described in more detail.

<Operating Principle of Waveguide Element>

Figure 2:
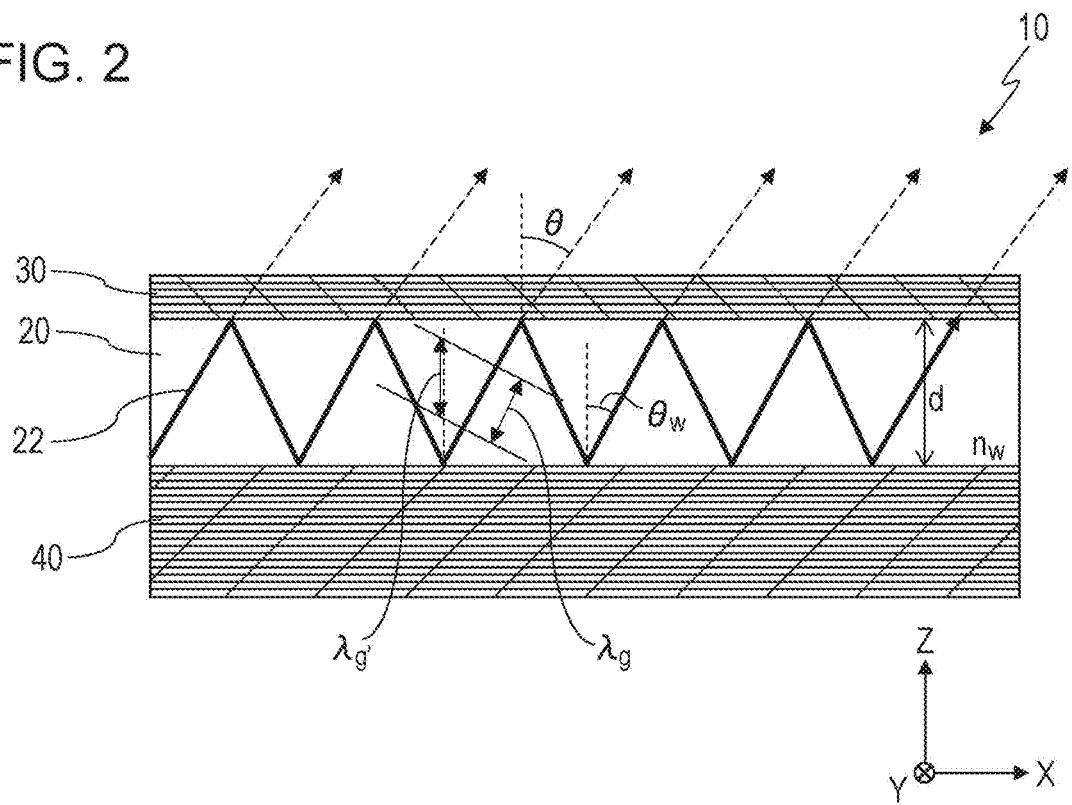
FIG. 2 is an illustration schematically showing an example of a cross-sectional structure of one waveguide element and an example of light propagating therethrough.

FIG. 2 is an illustration schematically showing an example of a cross-sectional structure of one waveguide element 10 and light propagating therethrough. In FIG. 2, a direction perpendicular to the X and Y directions shown in FIG. 1 is referred to as the Z direction, and a cross section of the waveguide element 10 parallel to the XZ plane is schematically shown. In the waveguide element 10, a pair of mirrors 30 and 40 are disposed so as to sandwich an optical waveguide layer 20 therebetween. Light 22 introduced from one X direction end of the optical waveguide layer 20 propagates through the optical waveguide layer 20 while repeatedly reflected from the first mirror 30 disposed on the upper surface of the optical waveguide layer 20 (the upper surface in FIG. 2) and the second mirror 40 disposed on the lower surface (the lower surface in FIG. 2). The light transmittance of the first mirror 30 is higher than the light transmittance of the second mirror 40. Therefore, part of the light can be outputted mainly from the first mirror 30.

In an ordinary waveguide such as an optical fiber, light propagates through the waveguide while undergoing total reflection repeatedly. However, in the waveguide element 10 in the present embodiment, light propagates while repeatedly reflected from the mirrors 30 and 40 disposed on the upper and lower surfaces, respectively, of the optical waveguide layer 20. Therefore, there is no constraint on the propagation angle of the light. The propagation angle of the light means the incident angle at the interface between the optical waveguide layer 20 and the mirror 30 or 40. Light incident on the mirror 30 or 40 at an angle closer to the vertical is also allowed to propagate. Specifically, light incident on the interface at an angle smaller than the critical angle of total reflection can be propagated. Therefore, the group velocity of light in its propagation direction is much lower than the velocity of light in free space. Thus, the waveguide element 10 has such characteristics that the propagation conditions of light are largely changed according to changes in the wavelength of the light, the thickness of the optical waveguide layer 20, and the refractive index of the optical waveguide layer 20. Such a waveguide is referred to as a "reflective waveguide" or a "slow light waveguide."

The propagation of light through the waveguide element 10 will be described in more detail. Let the refractive index of the optical waveguide layer 20 be $n_w$, and the thickness of the optical waveguide layer 20 be d. The thickness d of the optical waveguide layer 20 is the size of the optical waveguide layer 20 in the direction normal to the reflecting surface of the mirror 30 or 40. In consideration of light interference conditions, the propagation angle $\theta_w$ of light with a wavelength $\lambda$ satisfies formula (1) below.

$$2dn_w \cos \theta_w = m\lambda \quad (1)$$

Here, m is the mode number. Formula (1) corresponds to a condition for allowing the light to form a standing wave in the thickness direction within the optical waveguide layer 20. When the wavelength $\lambda_g$ in the optical waveguide layer 20 is $\lambda/n_w$, the wavelength $\lambda_g'$ in the thickness direction of the optical waveguide layer 20 is considered to be $\lambda/(n_w \cos \theta_w)$. When the thickness d of the optical waveguide layer 20 is equal to an integer multiple of one half of the wavelength $\lambda_g'$ in the thickness direction of the optical waveguide layer 20, i.e., $\lambda/(2n_w \cos \theta_w)$, a standing wave is formed. Formula (1) is obtained from this condition. m in formula (1) represents the number of loops (anti-nodes) of the standing wave.

When the mirrors 30 and 40 are multilayer film mirrors, light penetrates into the mirrors at the time of reflection. Therefore, strictly speaking, a term corresponding to the penetration path length of the light must be added to the left-hand side of formula (1). However, since the influences of the refractive index $n_w$ and thickness d of the optical waveguide layer 20 are much larger than the influence of the light penetrating into the mirrors, the fundamental behavior of the light can be explained by formula (1).

The emission angle $\theta$ when the light propagating through the optical waveguide layer 20 is emitted to the outside (typically the air) through the first mirror 30 can be denoted by formula (2) below according to the Snell's law.

$$\sin \theta = n_w \sin \theta_w \quad (2)$$

Formula (2) is obtained from the condition that, on the light emission surface, the wavelength $\lambda/\sin \theta$ of the light in a surface direction on the air side is equal to the wavelength $\lambda/(n_w \sin \theta_w)$ of the light in the propagation direction on the waveguide element 10 side.

From formulas (1) and (2), the emission angle $\theta$ can be denoted by formula (3) below.

$$\sin \theta = \sqrt{n_w^2 - \left(\frac{m\lambda}{2d}\right)^2} \quad (3)$$

As can be seen from formula (3), by changing the wavelength $\lambda$ of the light, the refractive index $n_w$ of the optical waveguide layer 20, or the thickness d of the optical waveguide layer 20, the emission direction of the light can be changed.

For example, when $n_w=2$, d=387 nm, $\lambda=1,550$ nm, and m=1, the emission angle is 0°. When the refractive index $n_w$ is changed from the above state to 2.2, the emission angle is changed to about 66°. When the thickness d is changed to 420 nm while the refractive index is unchanged, the emission angle is changed to about 51°. When the wavelength $\lambda$ is changed to 1,500 nm while the refractive index and the thickness are unchanged, the emission angle is changed to about 30°. As described above, the emission direction of the light can be largely changed by changing one of the wavelength $\lambda$ of the light, the refractive index $n_w$ of the optical waveguide layer 20, and the thickness d of the optical waveguide layer 20.

In the optical scanning device 100 in the embodiment of the present disclosure, the light emission direction is controlled by controlling at least one of the wavelength $\lambda$ of the light to be inputted to the optical waveguide layer 20, the refractive index $n_w$ of the optical waveguide layer 20, and the thickness d of the optical waveguide layer 20. The wavelength $\lambda$ of the light may be unchanged during operation and held constant. In this case, optical scanning can be achieved using a simpler structure. No particular limitation is imposed on the wavelength $\lambda$. For example, the wavelength $\lambda$ may be within the wavelength range of 400 nm to 1,100 nm (the visible to infrared range) in which high detection sensitivity can be obtained by using one of a general photo detector and a general image sensor that detect light through light absorption by silicon (Si). In another example, the wavelength $\lambda$ may be within the near-infrared range of 1,260 nm to 1,625 nm in which transmission loss in an optical fiber or a Si waveguide is relatively small. However, the above wavelength ranges are merely examples. The wavelength range of the light used is not limited to the visible or infrared wavelength range and may be, for example, an ultraviolet wavelength range.

The present inventors have examined by optical analysis whether light can be actually emitted in a specific direction as described above. The optical analysis was performed by computation using DiffractMOD available from Cybernet Systems Co., Ltd. This is a simulation based on rigorous coupled-wave analysis (RCWA), and the effects of wave optics can be correctly computed.

Figure 3:
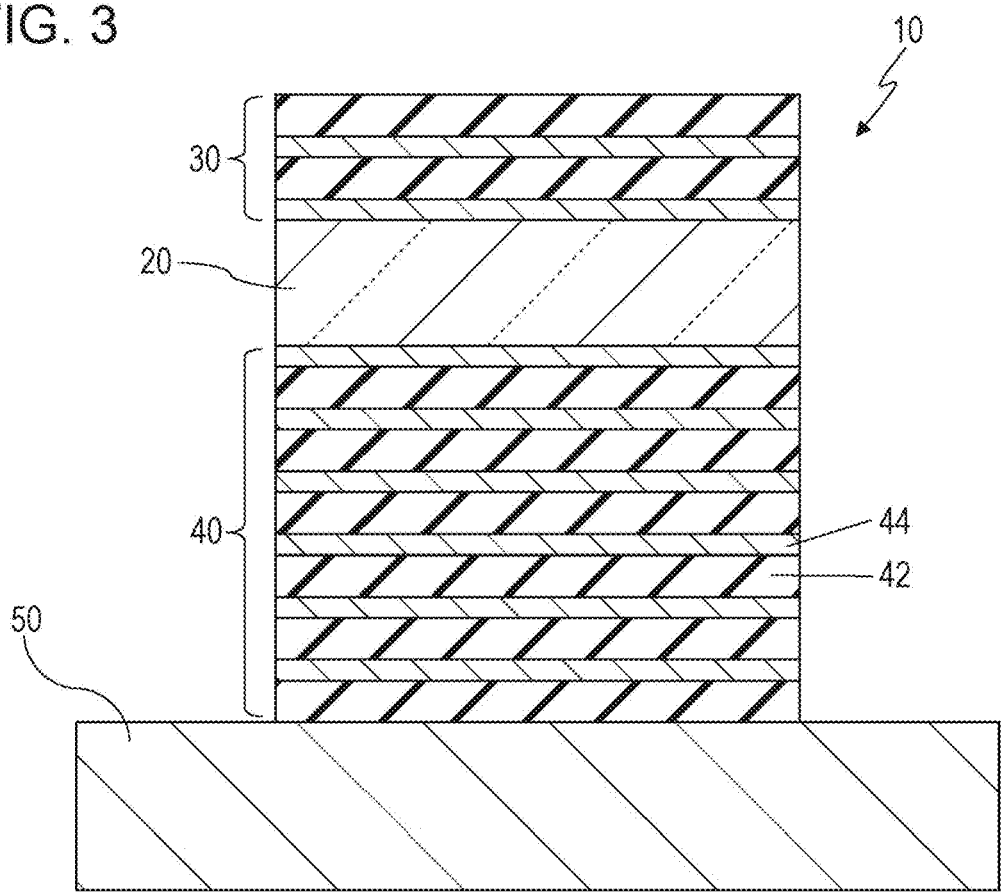
FIG. 3 is an illustration schematically showing a computational model used for a simulation.

FIG. 3 is an illustration schematically showing a computational model used for the simulation. In this computational model, a second mirror 40, an optical waveguide layer 20, and a first mirror 30 are stacked in this order on a substrate 50. Each of the first mirror 30 and the second mirror 40 is a multilayer film mirror including a dielectric multilayer film. The second mirror 40 has a structure in which six low-refractive index layers 42 having a lower refractive index and six high-refractive index layers 44 having a higher refractive index (a total of twelve layers) are alternately stacked. The first mirror 30 has a structure in which two low-refractive index layers 42 and two high-refractive index layers 44 (i.e., a total of four layers) are alternately stacked. The optical waveguide layer 20 is disposed between the mirrors 30 and 40. A medium other than the waveguide element 10 and the substrate 50 is air.

The optical response to incident light was examined using the above model while the incident angle of the light was changed. This corresponds to examination of the degree of coupling of the incident light from air into the optical waveguide layer 20. Under the condition that the incident light is coupled into the optical waveguide layer 20, the reverse process can occur in which the light propagating through the optical waveguide layer 20 is emitted to the outside. Therefore, the determination of the incident angle when the incident light is coupled into the optical waveguide layer 20 corresponds to the determination of the emission angle when the light propagating through the optical waveguide layer 20 is emitted to the outside. When the incident light is coupled into the optical waveguide layer 20, light loss occurs in the optical waveguide layer 20 due to absorption and scattering of the light. Specifically, under the condition that a large loss occurs, the incident light is strongly coupled into the optical waveguide layer 20. When there is no light loss due to absorption, etc., the sum of the light transmittance and reflectance is 1. However, when there is a loss, the sum of the transmittance and reflectance is less than 1. In this computation, to take the influence of light absorption into consideration, an imaginary part was added to the refractive index of the optical waveguide layer 20, and a value obtained by subtracting the sum of the transmittance and reflectance from 1 was used as the magnitude of the loss.

In this simulation, the substrate 50 is Si, the low-refractive index layers 42 are $SiO_2$ (thickness: 267 nm), and the high-refractive index layers 44 are Si (thickness: 108 nm). The magnitude of loss was computed while the incident angle of light with a wavelength $\lambda=1.55$ μm was changed.

Figure 4A:
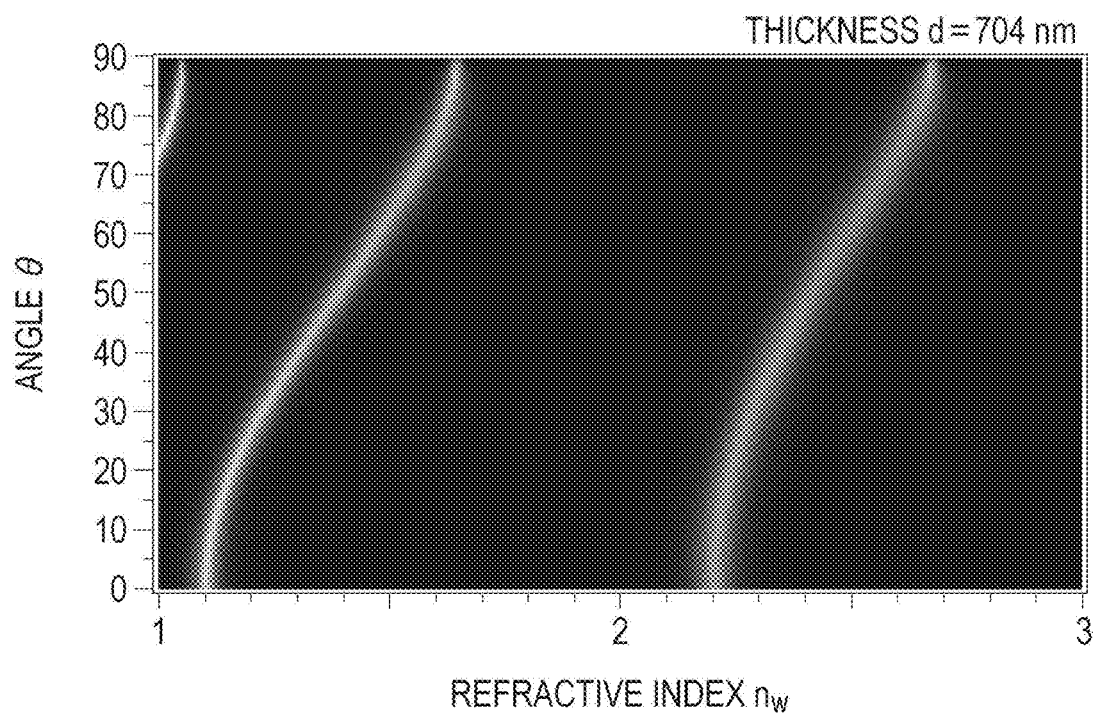
FIG. 4A shows the results of computations of the relation between the refractive index of an example of an optical waveguide layer and the emission angle of light therefrom.

FIG. 4A shows the results of the computations of the relation between the refractive index $n_w$ of the optical waveguide layer 20 and the emission angle $\theta$ of light with a mode number of m=1 when the thickness d of the optical waveguide layer 20 is 704 nm. White lines indicate that the loss is large. As shown in FIG. 4A, the emission angle $\theta$ of the light with a mode number of m=1 is 0° near $n_w=2.2$. One example of a material having a refractive index $n_w$ of around 2.2 is lithium niobate.

Figure 4B:
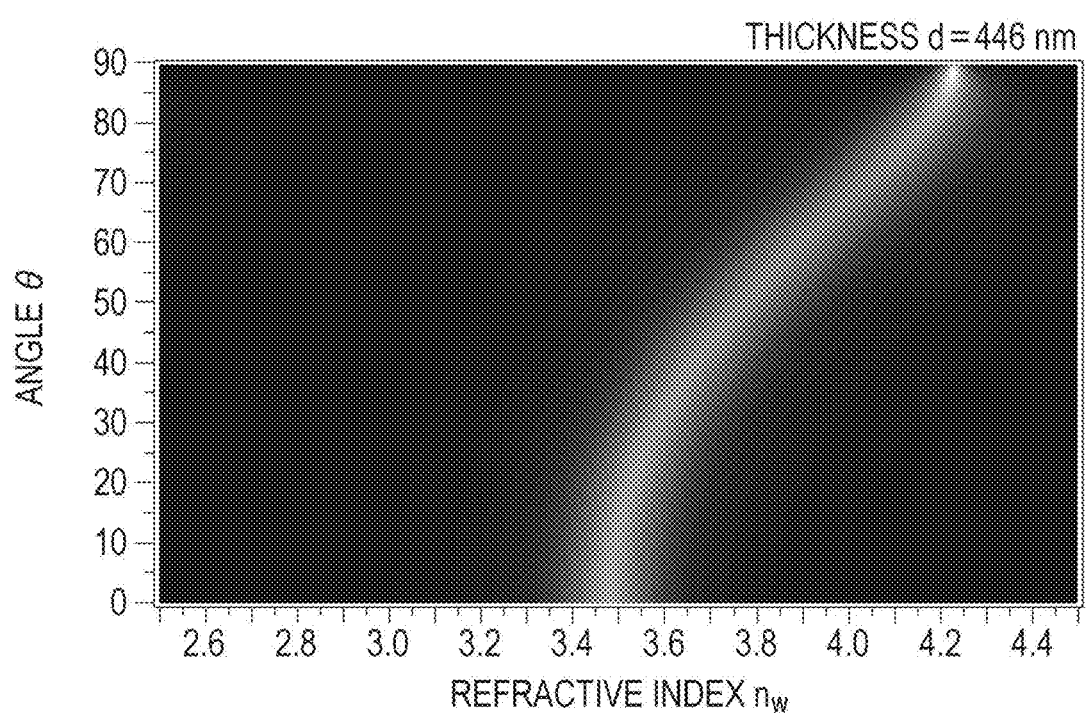
FIG. 4B shows the results of computations of the relation between the refractive index of another example of the optical waveguide layer and the emission angle of light therefrom.

FIG. 4B shows the results of the computations of the relation between the refractive index $n_w$ of the optical waveguide layer 20 and the emission angle $\theta$ of light with a mode number of m=1 when the thickness d of the optical waveguide layer 20 is 446 nm. As shown in FIG. 4B, the emission angle $\theta$ of the light with a mode number of m=1 is 0° near $n_w=3.45$. One example of a material having a refractive index $n_w$ of around 3.45 is silicon (Si).

As described above, the waveguide element 10 can be designed such that, when the optical waveguide layer 20 has a specific refractive index $n_w$, the emission angle $\theta$ of light with a specific mode number (e.g., m=1) is set to be 0° by adjusting the thickness d of the optical waveguide layer 20.

As can be seen from FIGS. 4A and 4B, the emission angle $\theta$ is largely changed according to the change in the refractive index. As described later, the refractive index can be changed by various methods such as carrier injection, an electro-optical effect, and a thermo-optical effect. However, the change in the refractive index by such a method is not so large, i.e., about 0.1. Therefore, it has been considered that such a small change in refractive index does not cause a large change in the emission angle. However, as can be seen from FIGS. 4A and 4B, near the refractive index at which the emission angle $\theta$ is 0°, when the refractive index increases by 0.1, the emission angle $\theta$ is changed from 0° to about 30°. As described above, in the waveguide element 10 in the present embodiment, even a small change in the refractive index can cause the emission angle to be changed largely.

Similarly, as can be seen from comparison between FIGS. 4A and 4B, the emission angle $\theta$ changes largely according to the change in the thickness d of the optical waveguide layer 20. As described later, the thickness d can be changed using, for example, an actuator connected to at least one of the two mirrors. Even when the change in the thickness d is small, the emission angle can be largely changed.

As described above, by changing the refractive index $n_w$ and/or the thickness d of the optical waveguide layer 20, the direction of the light emitted from the waveguide element 10 can be changed. Similarly, by changing the wavelength of the light to be inputted to the optical waveguide layer 20, the direction of the light emitted from the waveguide element 10 can be changed. To change the direction of the emission light, the optical scanning device 100 may include a first adjusting element that changes the refractive indexes of the optical waveguide layers 20 of the waveguide elements 10 and/or the thicknesses thereof and/or the wavelengths. A structural example of the first adjusting element will be described later.

As described above, the use of the waveguide element 10 allows the emission direction of light to be changed largely by changing at least one of the refractive index $n_w$ of the optical waveguide layer 20, the thickness d thereof, and the wavelength $\lambda$. In this manner, the emission angle of the light emitted from the mirror 30 can be changed in a direction along the waveguide element 10. By using at least one waveguide element 10, the above-described one-dimensional scanning can be achieved.

Figure 5:
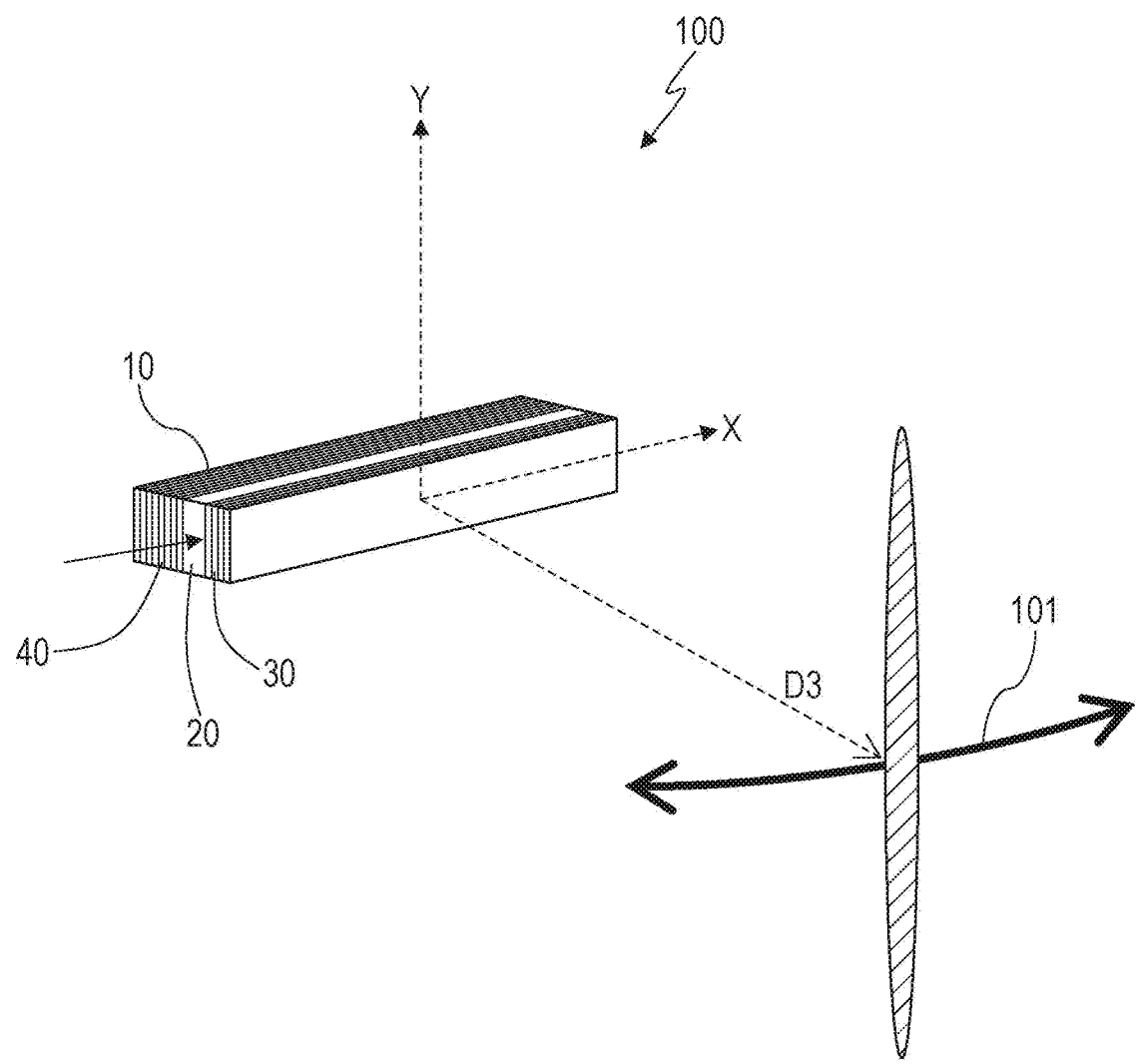
FIG. 5 is an illustration schematically showing an example of the optical scanning device.

FIG. 5 is an illustration schematically showing an example of the optical scanning device 100 that can implement one-dimensional scanning using a single waveguide element 10. In this example, a beam spot extending in the Y direction is formed. By changing at least one of the refractive index of the optical waveguide layer 20, the thickness thereof, and the wavelength, the beam spot can be moved in the X direction. One-dimensional scanning can thereby be achieved. Since the beam spot extends in the Y direction, a relatively large area extending two-dimensionally can be scanned by uniaxial scanning. The structure shown in FIG. 5 may be employed in applications in which two-dimensional scanning is unnecessary.

To implement two-dimensional scanning, the waveguide array in which the plurality of waveguide elements 10 are arranged is used, as shown in FIG. 1. When the phases of light beams propagating through the plurality of waveguide elements 10 satisfy a specific condition, the light beams are emitted in a specific direction. When the condition for the phases is changed, the emission direction of the light beams is changed also in the arrangement direction of the waveguide array. Specifically, the use of the waveguide array allows two-dimensional scanning to be implemented. An example of a specific structure for implementing the two-dimensional scanning will be described later.

As described above, when at least one waveguide element 10 is used, the emission direction of light can be changed by changing at least one of the refractive index of the optical waveguide layer 20 of the waveguide element 10, the thickness of the optical waveguide layer 20, and the wavelength. Unlike a general total reflection waveguide that uses total reflection of light, the waveguide element 10 in the present embodiment of the present disclosure has the reflective waveguide structure in which the optical waveguide layer is sandwiched between the pair of mirrors. Coupling of light into such a reflective waveguide has not been studied sufficiently. The present inventors have also examined a structure for efficiently introducing light into the optical waveguide layer 20.

Figure 6A:
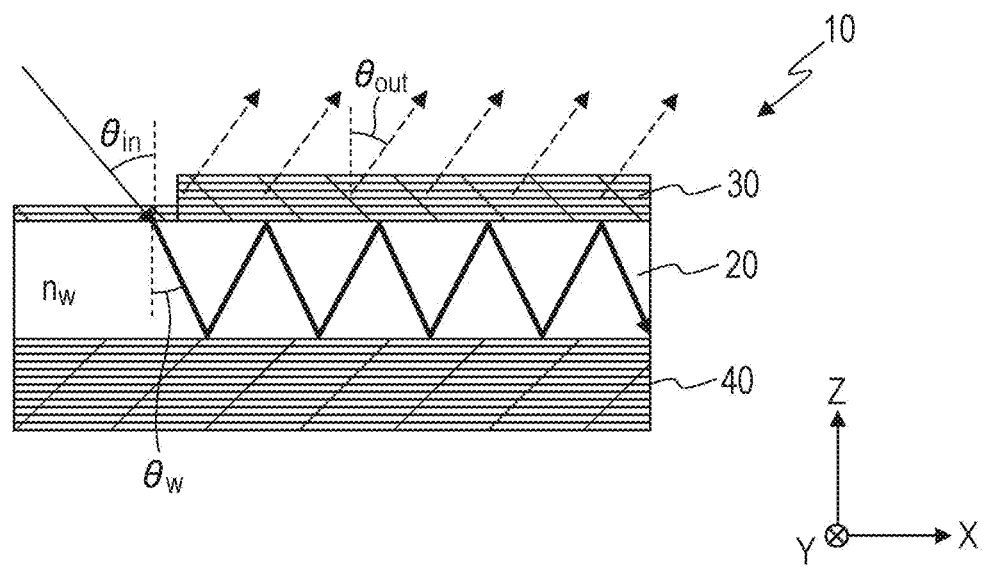
FIG. 6A is a cross-sectional view schematically showing the structure of a Comparative Example.

FIG. 6A is a cross-sectional view schematically showing an example of a structure in which light is indirectly inputted into the optical waveguide layer 20 through air and the mirror 30. In this example, the propagating light is indirectly introduced from the outside through air and the mirror 30 into the optical waveguide layer 20 of the waveguide element 10, which is a reflective waveguide. To introduce the light into the optical waveguide layer 20, the reflection angle $\theta_w$ of the guided light inside the optical waveguide layer 20 must satisfy the Snell's law ($n_{in} \sin \theta_{in} = n_w \sin \theta_w$). Here, n is the refractive index of the external medium, $\theta_{in}$ is the incident angle of the propagating light, and $n_w$ is the refractive index of the optical waveguide layer 20. By adjusting the incident angle $\theta_{in}$ in consideration of the above condition, the coupling efficiency of the light can be maximized. In this example, the number of films in the multilayer reflective film is smaller in a portion of the first mirror 30 than in the other portion. The light is inputted from this portion, and the coupling efficiency can thereby be increased. However, in the above structure, the incident angle $\theta_{in}$ of the light on the optical waveguide layer 20 must be changed according to the change in $\theta_{wav}$ caused by the change in the propagation constant of the optical waveguide layer 20.

Figure 6B:
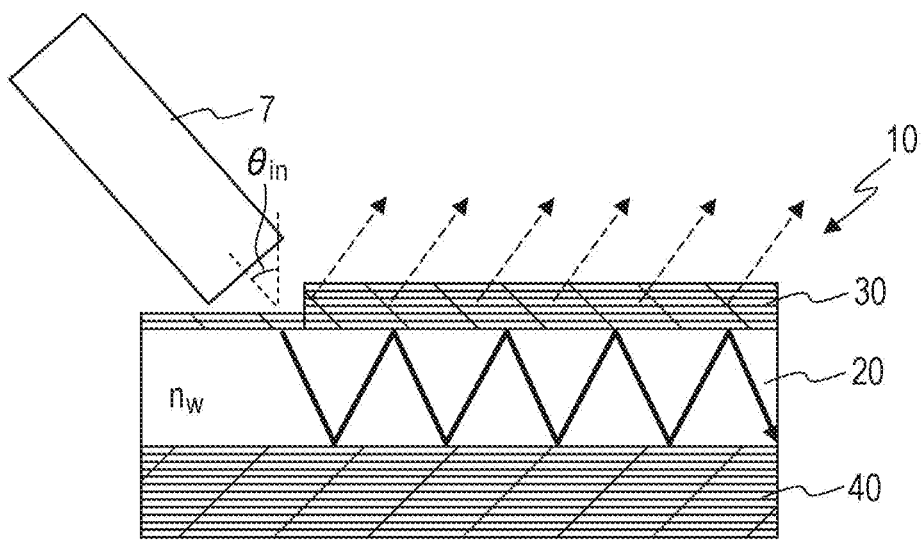
FIG. 6B is a cross-sectional view schematically showing the structure of another Comparative Example.

One method to maintain the state in which the light can be always coupled into the waveguide even when the propagation constant of the optical waveguide layer 20 is changed is to cause a diverging beam to be incident on the portion of the multilayer reflective film that includes a reduced number of films. FIG. 6B shows an example of such a method. In this example, a diverging beam is introduced into the waveguide element 10 from an optical fiber 7 inclined at an angle $\theta i$ with respect to the direction normal to the mirror 30. The coupling efficiency when light is introduced indirectly from the outside through air and the mirror 30 using the above structure will be examined.

For the sake of simplicity, the light is assumed to be a ray of light. The numerical aperture (NA) of an ordinary single mode fiber is about 0.14. This corresponds to an angle of about ±8 degrees. The range of the incident angle of the light coupled into the waveguide is comparable to the divergence angle of the light emitted from the waveguide. The divergence angle $\theta_{div}$ of the emitted light is represented by formula (4) below.

$$\theta_{div} \approx \frac{\lambda}{L \cos\theta_{out}} \quad (4)$$

Figure 7:
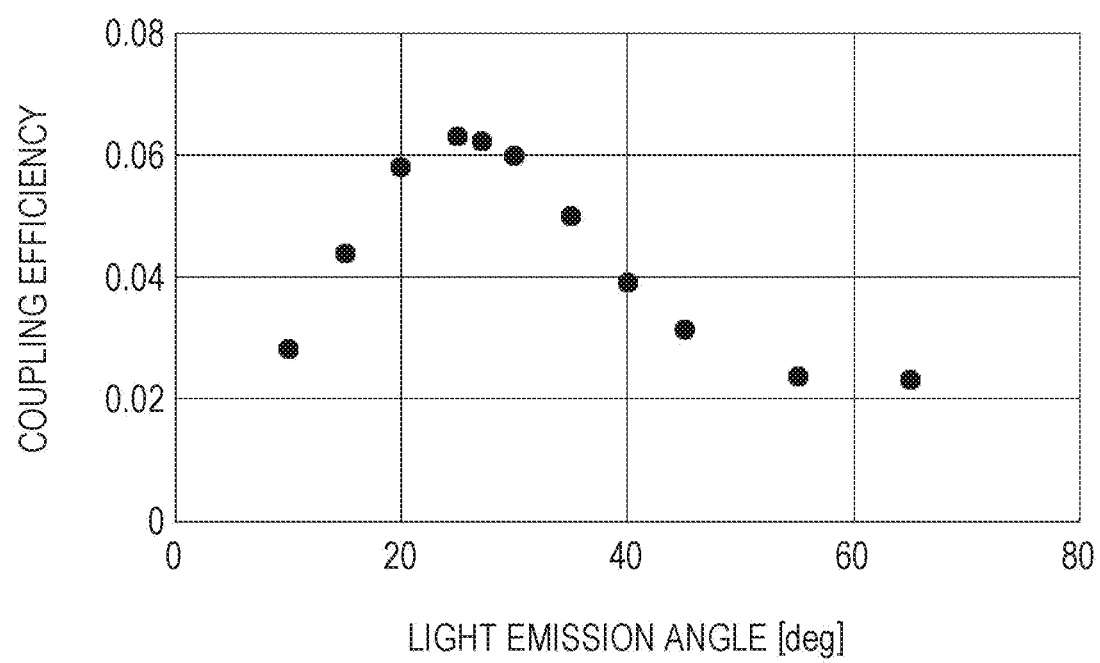
FIG. 7 is a graph showing an example of changes in coupling efficiency when the refractive index of a waveguide is changed.

Here, L is a propagation length, $\lambda$ is the wavelength of the light, and $\theta_{out}$ is the emergent angle of the light. When L is 10 μm or more, $\theta_{div}$ is at most 1 degree or less. Therefore, the coupling efficiency of the light from the optical fiber 7 is $1/16 \times 100\% \approx 6.3\%$ or less. FIG. 7 shows the results of computations of changes in the coupling efficiency when the refractive index $n_w$ of the waveguide was changed to change the emergent angle $\theta_{out}$ of the light while the incident angle $\theta_{in}$ of the light was fixed. The coupling efficiency is the ratio of the energy of the guided light to the energy of the incident light. The results shown in FIG. 7 were obtained by computing the coupling efficiency using an incident angle $\theta_{in}$ of 30°, a waveguide thickness of 1.125 μm, and a wavelength of 1.55 μm. In the above computations, the refractive index $n_w$ was changed within the range of 1.44 to 1.78 to change the emergent angle $\theta_{out}$ within the range of 10° to 65°. As show in FIG. 7, in this structure, the coupling efficiency is at most less than 7%. When the emergent angle $\theta_{out}$ is changed by 20° or more from the emergent angle that gives the maximum coupling efficiency, the coupling efficiency is reduced to one-half or less of the maximum coupling efficiency.

As described above, when the propagation constant is changed by changing, for example, the refractive index of the waveguide in order to perform optical scanning, the coupling efficiency is further reduced. To maintain the coupling efficiency, it is also necessary to change the incident angle $\theta_{in}$ of the light according to the change in the propagation constant. However, introduction of a mechanism for changing the incident angle $\theta_{in}$ of the light causes the device structure to be complicated.

The present inventors have found that the light incident angle can be fixed when a region including a waveguide whose refractive index is maintained constant is provided upstream of a region including a waveguide whose refractive index, for example, is to be changed. Moreover, the inventors have examined a method for connecting these two waveguides while high light coupling efficiency is achieved.

Figure 8A:
FIG. 8A is an illustration showing a schematic structure of a total reflection waveguide.
Figure 8B:
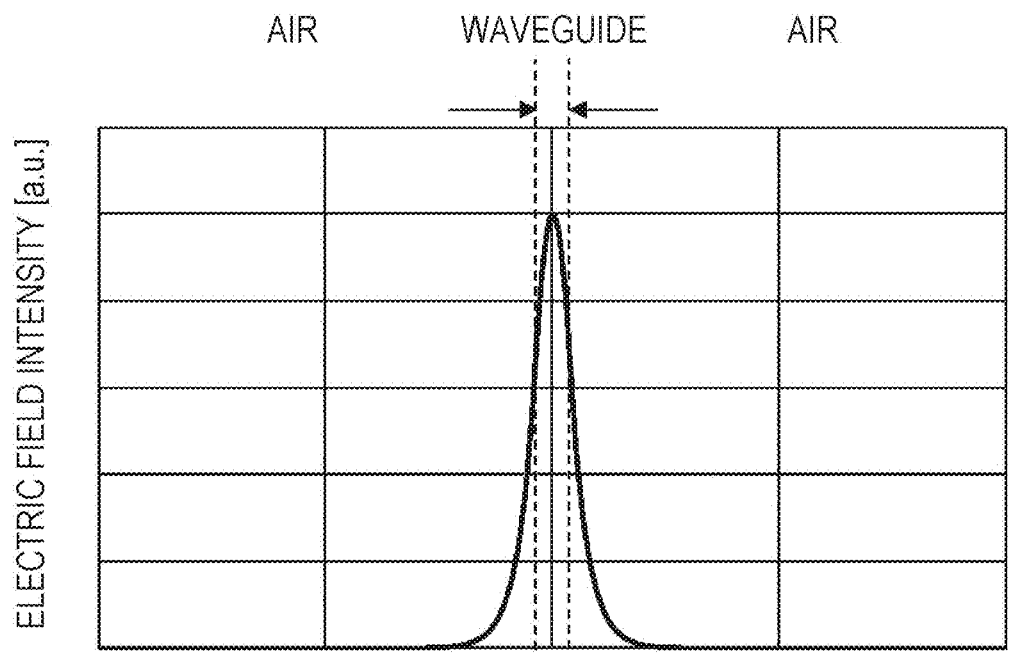
FIG. 8B is a graph showing an electric field intensity distribution in the total reflection waveguide.
Figure 8C:
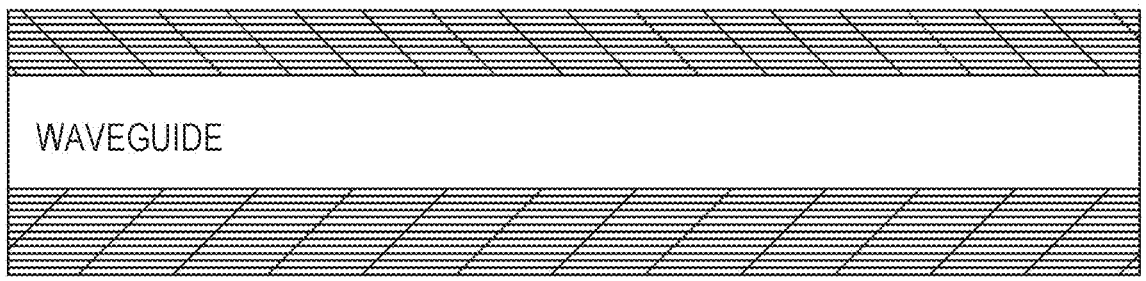
FIG. 8C is an illustration showing a schematic structure of a slow light waveguide.
Figure 8D:
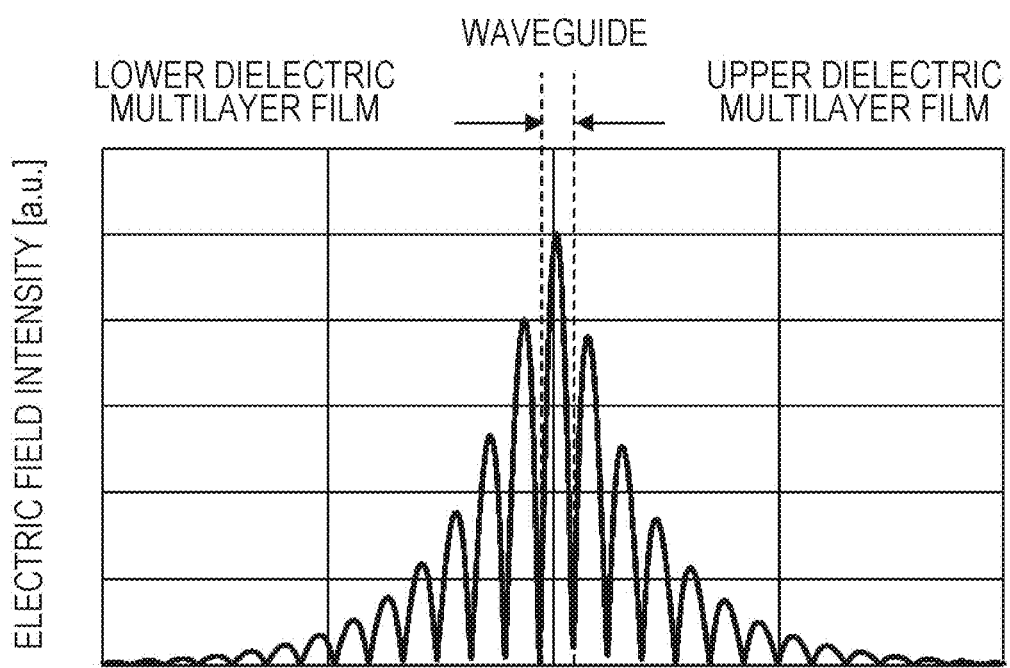
FIG. 8D is a graph showing an electric field intensity distribution in the slow light waveguide.

There are two factors for coupling of guided light between two different waveguides. One of them is the propagation constant of the propagating light, and the other one is the electric field intensity distribution of each mode. The closer the propagation constant and the electric field intensity distribution in one of the two waveguides are to those in the other, the higher the coupling efficiency. The propagation constant $\beta$ of light propagating through a waveguide is represented by $\delta = k \cdot \sin\theta_w = (2\pi n_w \sin\theta_w)/\lambda$ when the light is treated in a geometrical optics manner for simplicity. Here, k is the wave number, $\theta_w$ is the angle of the guided light, and $n_w$ is the refractive index of the optical waveguide layer. In a total reflection waveguide, the guided light is confined in the waveguide layer by utilizing total reflection, so that the total reflection condition $n_w \sin\theta_w > 1$ is satisfied. However, in a slow light waveguide, light is confined in the waveguide by using multilayer reflective films present above and below the waveguide, and part of the guided light is emitted through the multilayer reflective films, so that $n_w \sin\theta_w < 1$. The propagation constant in the total reflection waveguide cannot be the same as the propagation constant in the slow light waveguide from which part of the guided light is emitted. The electric field intensity distribution in a total reflection waveguide shown in FIG. 8A has a peak within the waveguide as shown in FIG. 8B, and the electric field intensity decreases monotonically outside the waveguide. However, a slow light waveguide shown in FIG. 8C has an electric field intensity distribution shown in FIG. 8D. The electric field intensity distribution has a peak within the waveguide, as in the above case. However, in the slow light waveguide shown in FIG. 8C, the guided light is reflected in the dielectric multilayer films due to interference. Therefore, as shown in FIG. 8D, the electric field intensity penetrates deep into the dielectric multilayer films and varies in a vibrating manner.

As described above, the propagation constant of the guided light and the electric field intensity distribution in the total reflection waveguide differ largely from those in the slow light waveguide. Therefore, it has not been contemplated to connect a total reflection waveguide directly to a slow light waveguide. The present inventors have found that a total reflection waveguide can be connected directly to an optical waveguide layer having a variable refractive index and/or a variable thickness.

The present inventors have also found that, by disposing these two types of waveguides on a common substrate, an optical scanning device can be produced easily. Specifically, the two types of waveguides may be disposed on a single integrally formed substrate. A general waveguide is produced on a substrate using a semiconductor process. For example, a production method using a combination of deposition by vacuum evaporation, sputtering, etc. and fine patterning by lithography, etching, etc. may be used. The waveguide structures can thereby be formed on the substrate using the above method. For example, Si, $SiO_2$, GaAs, or GaN can be used as the material of the substrate.

A reflective waveguide can be produced using a similar semiconductor process. In the reflective waveguide, one of a pair of mirrors sandwiching an optical waveguide layer allows light to pass through, and the light is thereby emitted.

The mirrors may be formed on, for example, a glass substrate available at low cost. For example, a substrate made of Si, $SiO_2$, GaAs, GaN, etc. may be used instead of the glass substrate.

By connecting a reflective waveguide to another waveguide, light can be introduced into the reflective waveguide. An example of such a structure will be described.

Figure 9:
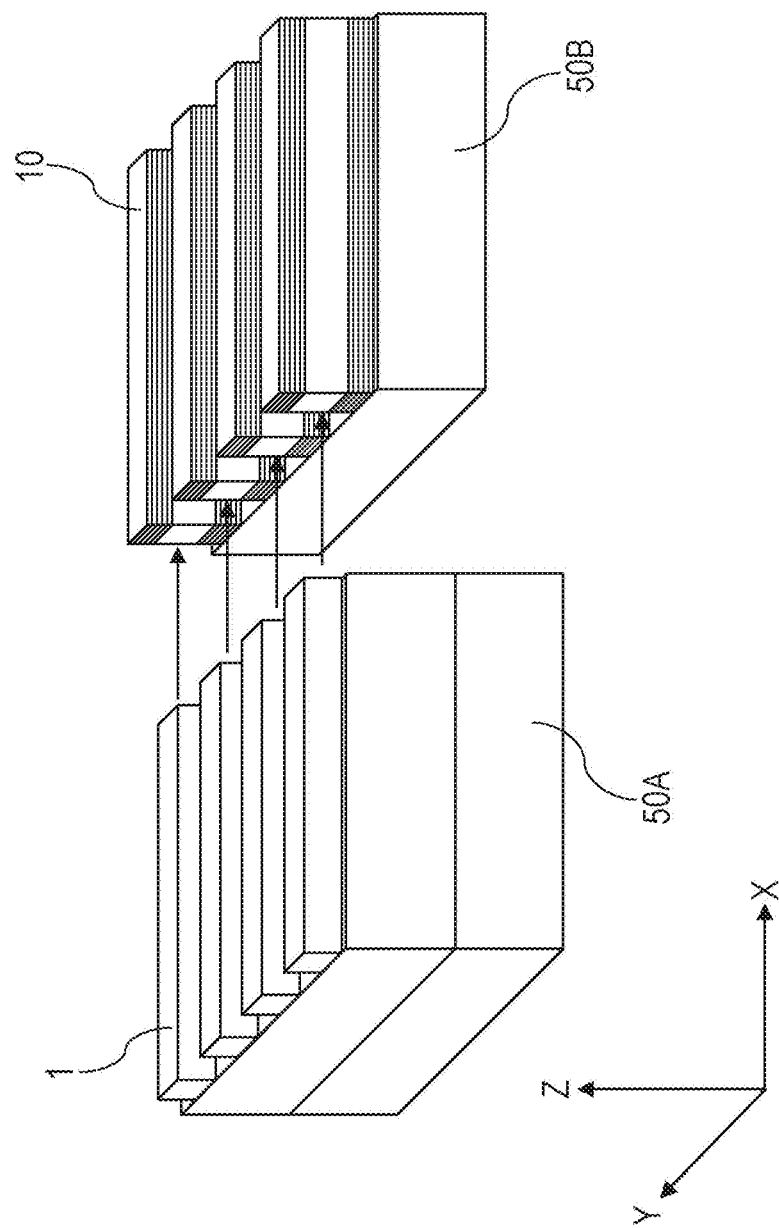
FIG. 9 is an illustration schematically showing an example of connections between a plurality of first waveguides and a plurality of second waveguides.

FIG. 9 is an illustration schematically showing connections between a plurality of first waveguides 1 produced on a substrate 50A and a plurality of second waveguides 10 produced on another substrate 50B. The substrates 50A and 50B are disposed parallel to each other in the XY plane. The plurality of first waveguides 1 and the plurality of second waveguides 10 extend in the X direction and are arranged in the Y direction. The first waveguides 1 are, for example, general waveguides that use total reflection of light. The second waveguides 10 are reflective waveguides. The first waveguides 1 and the second waveguides 10 disposed on the different substrates 50A and 50B, respectively, are aligned and connected with each other, and this allows light to be introduced from the first waveguides 1 into the second waveguides 10.

To introduce light from the first waveguides 1 into the second waveguides 10 efficiently, it is desired that the waveguides are aligned with very high precision on the order of 10 nm. Even when the waveguides are aligned with high precision, if the thermal expansion coefficients of the substrates 50A and 50B differ from each other, the alignment may be changed due to a change in temperature. For example, the thermal expansion coefficients of Si, $SiO_2$, GaAs, and GaN are about 4, 0.5, 6, and 5 ($\times 10^{-6}$/K), respectively, and the thermal expansion coefficient of BK7, which is often used for a glass substrate, is 9 ($\times 10^4$/K). Even when any two of these materials are used for the above substrates, the difference in thermal expansion coefficient is $1 \times 10^{-6}$/K or more. For example, when the size of the substrates 50A and 50B in the arrangement direction of the plurality of first waveguides 1 and the plurality of second waveguides 10 (in the Y direction in FIG. 8) is 1 mm, a temperature change of 1° C. causes the alignment between the substrates 50A and 50B to be changed by 1 nm. A temperature change of several tens of degrees Celsius causes the alignment between the two substrates 50A and 50B to be largely changed by several tens to several hundreds of nanometers.

The above problem can be solved by disposing the first waveguides and the second waveguides on the same substrate. When these waveguides are disposed on the common substrate, the first waveguides and the second waveguides can be easily aligned with each other. Moreover, a change in the alignment between the first waveguides and the second waveguides due to thermal expansion can be prevented. Therefore, light can be more efficiently introduced from the first waveguides into the second waveguides.

In the present embodiment, the "second waveguide" corresponds to the "waveguide element" in the preceding embodiment. In some embodiments of the present disclosure, the first waveguide whose refractive index and thickness are maintained constant is disposed upstream of the second waveguide, and light is inputted to the first waveguide. The first waveguide propagates the inputted light, and the light is inputted to the second waveguide from its end surface. An end surface of the first waveguide may be directly connected to the end surface of the second waveguide, or, for example, a gap may be provided between these end surfaces.

In the above structure, since the first waveguide is disposed upstream of the second waveguide (i.e., the waveguide element), a reduction in coupling efficiency due to scanning (i.e., loss of energy) can be suppressed even when the incident angle of light incident on the first waveguide is held constant.

When the first and second waveguides are disposed on the same substrate, the first and second waveguides are easily aligned with each other. Moreover, a change in the alignment between the first and second waveguides due to thermal expansion can be suppressed. Therefore, light can be efficiently introduced from the first waveguide into the second waveguide.

<Coupling of Guided Light Through Grating>

The present inventors have found that the coupling efficiency of light can be further improved by modifying the structure shown in FIG. 9.

An optical device according to a first item of the present disclosure includes: a first waveguide that propagates light in a first direction; and a second waveguide including a first mirror, a second mirror, and an optical waveguide layer, the first mirror extending in the first direction and having a first reflecting surface, the second mirror extending in the first direction and having a second reflecting surface facing the first reflecting surface, the optical waveguide layer being located between the first mirror and the second mirror and propagating the light in the first direction. A forward end portion of the first waveguide is disposed inside the optical waveguide layer. In a region in which the first waveguide and the second waveguide overlap each other when viewed in a direction perpendicular to the first reflecting surface, at least part of the first waveguide and/or at least part of the second waveguide includes at least one grating whose refractive index varies periodically in the first direction.

In this optical device, the light propagating through the first waveguide can propagate through the at least one grating into the second waveguide, which is a slow light waveguide.

According to a second item of the present disclosure, in the optical device according to the first item, the period of the at least one grating is larger than $\lambda/n_{e1}$ and smaller than $\lambda/(n_{e1}-1)$, where $n_{e1}$ is the effective refractive index for a waveguide mode of the light propagating through the first waveguide, and $\lambda$ is the wavelength of the light in air.

In this optical device, high coupling efficiency of the guided light can be achieved.

According to a third item of the present disclosure, in the region in which the first waveguide and the second waveguide overlap each other in the optical device according to the first or second item, the first waveguide has a first surface facing the first reflecting surface and a second surface facing the second reflecting surface. The at least one grating is provided on at least one of the first surface and the second surface.

In this optical device, high coupling efficiency of the guided light can be achieved.

According to a fourth item of the present disclosure, in the optical device according to any of the first to third items, the at least one grating is provided on at least one of the first reflecting surface and the second reflecting surface.

In this optical device, high coupling efficiency of the guided light can be achieved.

According to a fifth item of the present disclosure, in the optical device according to any of the first to fourth items, the at least one grating includes a plurality of recessed portions or protruding portions arranged in the first direction. The number of the plurality of recessed portions or protruding portions is 4 or more.

In this optical device, high coupling efficiency of the guided light can be achieved.

According to a sixth item of the present disclosure, in the optical device according to the fifth item, the number of the plurality of recessed portions or protruding portions is from 4 to 64 inclusive.

In this optical device, high coupling efficiency of the guided light can be achieved.

According to a seventh item of the present disclosure, in the optical device according to any of the first to sixth items, the at least one grating includes a plurality of recessed portions arranged in the first direction. The depth of each of the recessed portions is from ⅓ to ⅚₁₅ inclusive of the thickness of the first waveguide.

In this optical device, high coupling efficiency of the guided light can be achieved.

According to an eighth item of the present disclosure, in the optical device according to any of the first to seventh items, the at least one grating includes a plurality of gratings. The periods of the plurality of gratings are mutually different.

In this optical device, the light propagating through the first waveguide can propagate through the plurality of gratings having mutually different periods into the second waveguide serving as a slow light waveguide at high efficiency.

Therefore, a reduction in coupling efficiency due to production errors can be prevented.

According to a ninth item, in the optical device according to the eighth item, the plurality of gratings include at least two gratings arranged in the first direction.

In this optical device, high coupling efficiency of the guided light can be achieved.

According to a tenth item, in the optical device according to the eighth or ninth item, the plurality of gratings include at least two gratings adjacent to each other in a second direction intersecting the first direction.

In this optical device, high coupling efficiency of the guided light can be achieved.

An optical device according to an eleventh item includes: a first waveguide that propagates light in a first direction; and a second waveguide including a first mirror, a second mirror, and an optical waveguide layer, the first mirror extending in the first direction and having a first reflecting surface, the second mirror extending in the first direction and having a second reflecting surface facing the first reflecting surface, the optical waveguide layer being located between the first mirror and the second mirror and propagating the light in the first direction. A forward end portion of the first waveguide is disposed inside the optical waveguide layer. In a region in which the first waveguide and the second waveguide overlap each other when viewed in a direction perpendicular to the first reflecting surface, at least part of the first waveguide and/or at least part of the second waveguide includes a grating whose refractive index varies in the first direction. The grating includes a plurality of periodic components.

In this optical device, the light propagating through the first waveguide can propagate through the grating including the plurality of periodic components into the second waveguide, which is a slow light waveguide.

According to a twelfth item, in the optical device according to the eleventh item, the period of each of the plurality of periodic components is larger than $\lambda/n_{e1}$ and smaller than $\lambda/(n_{e1}-1)$, where $n_{e1}$ is the effective refractive index for a waveguide mode of the light propagating through the first waveguide, and $\lambda$ is the wavelength of the light in air.

In this optical device, high coupling efficiency of the guided light can be achieved.

According to a thirteenth item of the present disclosure, the optical device according to any of the first to twelfth items further includes two non-waveguide regions sandwiched between the first mirror and the second mirror with the optical waveguide layer interposed between the two non-waveguide regions. The average refractive index of the optical waveguide layer is higher than the average refractive index of each of the non-waveguide regions.

In this optical device, the light can propagate through the optical waveguide layer in the second waveguide without leaking to the non-waveguide regions.

According to a fourteenth item of the present disclosure, in the optical device according to the thirteenth item, each of the two non-waveguide regions includes at least two members with different refractive indexes.

In this optical device, the same effects as those in the eleventh item can be obtained.

According to a fifteenth item of the present disclosure, in the optical device according to the thirteenth or fourteenth item, the optical waveguide layer and the two non-waveguide regions include respective regions formed of a common material.

In this optical device, by using a low-cost material as the common material, the cost of production can be reduced.

According to a sixteenth item of the present disclosure, the optical device according to any of the first to fifteenth items further includes a dielectric layer that supports the first waveguide. The second mirror supports the dielectric layer.

In this optical device, the second mirror is used as a common substrate for the first waveguide and the second waveguide, and the first waveguide is supported by the dielectric layer. This facilitates the production of the optical device.

According to a seventeenth item of the present disclosure, inside the optical waveguide layer in the optical device according to the sixteenth item, the width of the dielectric layer in the second direction is the same as the width of the optical waveguide layer in the second direction.

In this optical device, light scattering loss can be reduced.

According to an eighteenth item of the present disclosure, inside the optical waveguide layer in the optical device according to the seventeenth item, the width of the first waveguide in the second direction is smaller than the width of the dielectric layer in the second direction.

In this optical device, the light scattering loss can be reduced.

According to a nineteenth item of the present disclosure, inside the optical waveguide layer in the optical device according to the seventeenth item, the width of the first waveguide in the second direction is the same as the width of the dielectric layer in the second direction.

In this optical device, the light scattering loss can be reduced.

According to a twentieth item of the present disclosure, outside the optical waveguide layer in the optical device according to any of the first to nineteenth items, the first waveguide includes a portion whose width in a second direction intersecting the first direction increases monotonically toward the second waveguide.

In this optical device, the first waveguide has a tapered structure outside the optical waveguide layer. In the first waveguide, the light enters a large-width waveguide from a small-width waveguide through the tapered structure. The tapered structure can prevent the light entering the large-width waveguide from being reflected.

According to a twenty-first item of the present disclosure, in the optical device according to any of the first to twentieth items, the first mirror has a higher light transmittance than the second mirror and allows part of the light propagating through the optical waveguide layer to be emitted in a third direction intersecting the first reflecting surface.

In this optical device, the light propagating through the optical waveguide layer in the second waveguide is emitted to the outside through the first mirror.

According to a twenty-second item of the present disclosure, in the optical device according to any of the first to twentieth items, the first mirror has a higher light transmittance than the second mirror. The optical waveguide layer allows light entering the optical waveguide layer through the first mirror from a third direction intersecting the first reflecting surface to propagate in the first direction.

In this optical device, the light entering from the outside can propagate into the optical waveguide layer in the second waveguide through the first mirror.

According to a twenty-third item of the present disclosure, in the optical device according to the twenty-first or twenty-second item, at least part of the optical waveguide layer has a structure whose refractive index and/or thickness can be adjusted. By adjusting the refractive index and/or the thickness, the third direction is changed.

In this optical device, by adjusting the refractive index and/or the thickness, the direction of light emitted from the optical device according to the twenty-first item or the direction of light received by the optical device according to the twenty-second item can be changed.

According to a twenty-fourth item of the present disclosure, the optical device according to the twenty-third item further includes: a pair of electrodes that sandwich therebetween the at least part of the optical waveguide layer; and a control circuit that applies a voltage to the pair of electrodes to change the refractive index of the at least part of the optical waveguide layer. The at least part of the optical waveguide layer contains a liquid crystal material or an electrooptical material.

In this optical device, the at least part of the optical waveguide layer contains a liquid crystal material or an electrooptical material. By sandwiching the at least part of optical waveguide layer between the pair of electrodes and applying a voltage thereto, the effects of the optical device according to the twenty-third item can be achieved.

According to a twenty-fifth item of the present disclosure, in the optical device according to the twenty-fourth item, the pair of electrodes sandwich therebetween a portion of the optical waveguide layer that differs from a portion thereof overlapping the first waveguide when viewed in the direction perpendicular to the first reflecting surface.

In this optical device, the voltage can be applied to the portion of the optical waveguide layer that differs from the portion overlapping the first waveguide.

According to a twenty-sixth item of the present disclosure, in the optical device according to the twenty-fifth item, the pair of electrodes are a first pair of electrodes, and the optical device further includes a second pair of electrodes that sandwich therebetween at least part of the portion of the optical waveguide layer that overlaps the first waveguide when viewed in the direction perpendicular to the first reflecting surface. The control circuit applies voltages independently to the first pair of electrodes and the second pair of electrodes to independently adjust the refractive index of the portion of the optical waveguide layer that is located between the first pair of electrodes and the refractive index of the portion of the optical waveguide layer that is sandwiched between the second pair of electrodes.

In this optical device, voltages can be applied independently to at least part of the portion of the optical waveguide layer that overlaps the first waveguide and at least part of the other portion of the optical waveguide layer. This allows the refractive index of the at least part of the portion of the optical waveguide layer that overlaps the first waveguide and the refractive index of the at least part of the other portion of the optical waveguide layer to be adjusted independently.

According to a twenty-seventh item of the present disclosure, the optical device according to the twenty-third item further include: at least one actuator connected to at least one of the first mirror and the second mirror; and a control circuit that controls the at least one actuator to change the distance between the first mirror and the second mirror to thereby change the thickness of the optical waveguide layer.

In this optical device, the at least one actuator is connected to at least one of the first mirror and the second mirror. By controlling the at least one actuator to change the distance between the first mirror and the second mirror, the effects of the optical device according to the twenty-third item can be achieved.

According to a twenty-eighth item of the present disclosure, the optical device according to any of the first to twenty-seventh items further includes a plurality of waveguide units each including the first waveguide and the second waveguide. The plurality of waveguide units are arranged in a second direction intersecting the first direction.

In this optical device, the plurality of waveguide units are arrayed. Each of the plurality of waveguide units includes the first waveguide and the second waveguide. The allows two-dimensional scanning and two-dimensional light reception to be achieved.

According to a twenty-ninth item of the present disclosure, the optical device according to any of the twenty-first to twenty-seventh items further includes a plurality of waveguide units each including the first waveguide and the second waveguide. The plurality of waveguide units are arranged in a second direction intersecting the first direction. The optical device further includes a plurality of phase shifters connected to the respective waveguide units, each of the plurality of phase shifters including a waveguide connected to the first waveguide of a corresponding one of the plurality of waveguide units directly or through another waveguide. By changing the differences in phase between light beams passing through the plurality of phase shifters, the third direction is changed.

In this optical device, the phase shifters can change the direction of light scanning and the direction of light reception.

A photodetection system according to a thirtieth item of the present disclosure includes: the optical device according to any of the first to twenty-ninth items; a photodetector that detects light emitted from the optical device and reflected from an object; and a signal processing circuit that generates distance distribution data based on an output from the photodetector.

In this photodetection system, the distance distribution data about the object can be obtained by measuring the time until light reflected from the object is returned.

Figure 10:
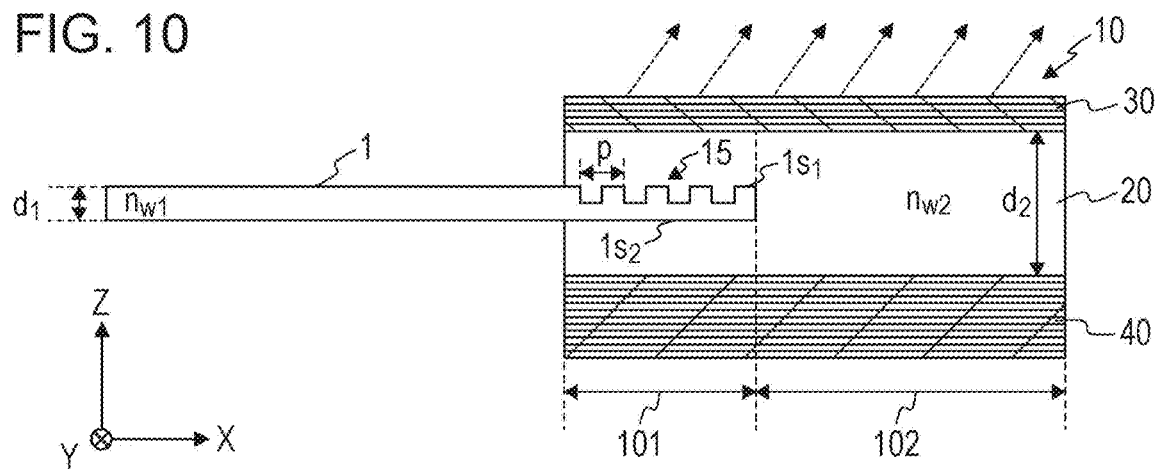
FIG. 10 is an illustration schematically showing an optical device in an embodiment of the present disclosure.

FIG. 10 is a cross-sectional view schematically showing an optical device in an exemplary embodiment of the present disclosure. Total reflection waveguides 1 and slow light waveguides 10 in the present embodiment and modifications of the present embodiment may be applied to any of optical devices in the present disclosure.

In the present embodiment, a forward end portion of the first waveguide 1, which is a total reflection waveguide, is located inside an optical waveguide layer 20 of the second waveguide 10, which is a slow light waveguide. Hereinafter, the first waveguide 1 may be referred to as a "total reflection waveguide 1," and the second waveguide 10 may be referred to as a "slow light waveguide 10." In a region 101 in which the total reflection waveguide 1 and the slow light waveguide 10 overlap each other when viewed in the Z direction, the total reflection waveguide 1 includes a grating 15 whose refractive index varies with period p in the X direction. The grating 15 shown in FIG. 10 has a plurality of recessed portions arranged in the X direction. Only four recessed portions are illustrated in FIG. 10. However, in practice, a larger number of recessed portions may be provided. Instead of the plurality of recessed portions, a plurality of protruding portions may be provided. The number of recessed portions or protruding portions arranged in the X direction in the grating 15 is preferably 4 or more. The number of recessed portions or protruding portions may be from 4 to 64 inclusive. In one example, the number of recessed portions or protruding portions may be from 8 to 32 inclusive. In another example, the number of recessed portions or protruding portions may be from 8 to 16 inclusive. The number of recessed portions or protruding portions can be adjusted according to the diffraction efficiency of each of the recessed portions or protruding portions. The diffraction efficiency of each recessed portion or protruding portion depends on its dimensional conditions such as its depth or height and width. Therefore, the number of recessed portions or protruding portions is adjusted according to the dimensions of each recessed portion or protruding portion such that the grating 15 as a whole has good characteristics.

The total reflection waveguide 1 has a first surface $1s_1$ facing the reflecting surface of a mirror 30 in the region 101 and a second surface $1s2$ facing the reflecting surface of a mirror 40 in the region 101. In the example shown in FIG. 10, the grating 15 is disposed on the first surface $1s_1$ of the total reflection waveguide 1. The grating 15 may be disposed on the second surface $1s2$. The grating 15 may be disposed on at least one of the first surface $1s1$ and the second surface $1s2$ of the total reflection waveguide 1.

The position of the grating 15 is not limited to the interface between the total reflection waveguide 1 and the slow light waveguide 10, and the grating 15 may be disposed in another position. A plurality of gratings may be provided. In the region 101 in which the waveguide 1 and the waveguide 10 overlap each other when viewed in a direction perpendicular to the reflecting surface of the mirror 30, at least part of the waveguide 1 and the waveguide 10 may include at least one grating. The refractive index of the grating varies periodically in the X direction in which the waveguide 1 and the waveguide 10 extend.

A portion of the total reflection waveguide 1 that is located outside the optical waveguide layer 20 may be supported by another dielectric layer or may be sandwiched between two dielectric layers.

The X direction size of the region 101 may be, for example, about 4 μm to 50 μm. A grating 15 with about 8 to about 32 periods can be formed inside the region 101 having the above size. The X direction size of a region 102 of the slow light waveguide 10 other than the region 101 may be, for example, about 100 μm to about 5 mm. The X direction size of the region 101 may be, for example, about several hundredths to several tenths of the size of the region 102. However, the sizes of these members are not limited to the above sizes and are determined according to the required characteristics.

In the region 101, the first mirror 30 may not have a higher transmittance than the second mirror 40. In the region 102 also, the first mirror 30 may not have a higher transmittance than the second mirror 40 in a region close to the region 101. The region 101 is provided in order to increase the coupling efficiency of light. Therefore, in the vicinity of the region 101, it is not always necessary that the slow light waveguide 10 emit light.

Let the propagation constant of a waveguide mode in the total reflection waveguide 1 be $\beta_1 = 2\pi n_{e1}/\lambda$, and the propagation constant of a waveguide mode in the slow light waveguide 10 be $\beta_2 = 2\pi n_{e2}/\lambda$. Here, $\lambda$ is the wavelength of the light in air. $n_{e1}$ and $n_{e2}$ are the effective refractive indexes (also referred to as the equivalent refractive indexes) of the total reflection waveguide 1 and the slow light waveguide 10, respectively. The light propagating through the total reflection waveguide 1 is not coupled to the outside air. The effective refractive index for such a waveguide mode is $n_{e1} > 1$. However, part of the light propagating through the optical waveguide layer 20 in the slow light waveguide 10 is emitted to the outside air. The effective refractive index for such a waveguide mode is $0 < n_{e2} < 1$. Therefore, $\beta_1$ and $\beta_2$ differ largely from each other. Thus, generally, the coupling efficiency of guided light from the total reflection waveguide 1 into the slow light waveguide 10 is low.

When the total reflection waveguide 1 has the grating 15 in the region 101, diffraction due to the grating 15 occurs. In this case, the propagation constant $\beta_1$ of a waveguide mode in the total reflection waveguide 1 is shifted by an integer multiple of the reciprocal lattice $2\pi/p$. For example, when $\beta_1$ is shifted to $\beta_1 - (2\pi/p)$ by −first-order diffraction, $\beta_1 - (2\pi/p) = \beta_2$ can be satisfied by appropriately setting p. In this case, the two propagation constants in the region 101 coincide with each other, so that the guided light is coupled from the total reflection waveguide 1 into the slow light waveguide 10 at high efficiency. From $\beta_1 - (2\pi/p) = \beta_2$, the period p is represented by the following formula (5).

$$p = \frac{\lambda}{n_{e1} - n_{e2}} \tag{5}$$

Since $0 < n_{e2} < 1$, the period p satisfies the following formula (6).

$$\frac{\lambda}{n_{e1}} < p = \frac{\lambda}{n_{e1} - n_{e2}} < \frac{\lambda}{n_{e1} - 1} \tag{6}$$

In the slow light waveguide 10, waveguide modes in the region 101 are the same as those in the other region 102, so that the guided light is coupled at high efficiency.

Figure 11:
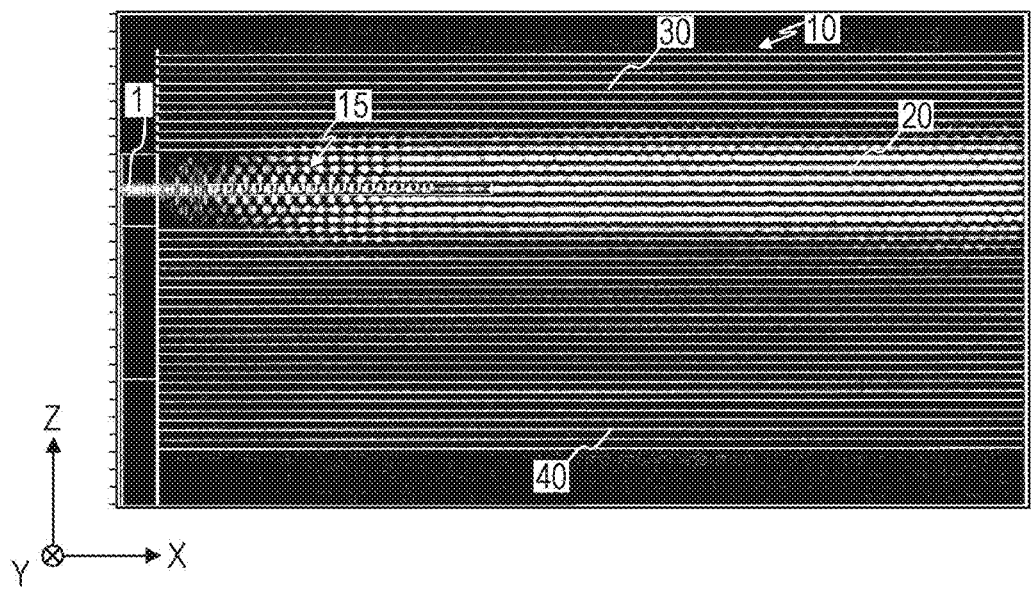
FIG. 11 is a graph showing propagation of light from a total reflection waveguide to a slow light waveguide through a grating.

FIG. 11 is a graph showing a computational example of the electric field distribution when light propagates from the total reflection waveguide into the slow light waveguide through the grating. ModePROP available from Synopsys was used for the computation. As shown in FIG. 11, the light propagating through the total reflection waveguide 1 propagates efficiently through the grating 15 into the slow light waveguide 10.

The computational conditions in the example shown in FIG. 11 are as follows.

The refractive index of the total reflection waveguide 1 is $n_{w1}=1.88$, and its thickness in the Z direction is $d_1=300$ nm. The refractive index of the slow light waveguide 10 is $n_{w2}=1.6$, and its thickness in the Z direction is $d_2=2.1$ μm. The number of recessed portions in the grating is 16. The period of the grating is p=800 nm. The depth of the recessed portions is 200 nm. The light propagating through the total reflection waveguide 1 and the slow light waveguide 10 has a wavelength of λ=940 nm in air. The effective refractive index $n_{e1}$ for a propagation mode of light in the total reflection waveguide 1 is 1.69, and the effective refractive index $n_{e2}$ for a propagation mode of light in the slow light waveguide 10 in the region 101 is 0.528.

In this example, the coupling efficiency of the guided light from the total reflection waveguide 1 into the slow light waveguide 10 was 61.4%. It was found that the coupling efficiency is significantly improved as compared with that in the structure without the grating 15 and that in the structure in which an end face of the total reflection waveguide 1 and an end face of the slow light waveguide 10 are directly connected to each other.

Figure 12:
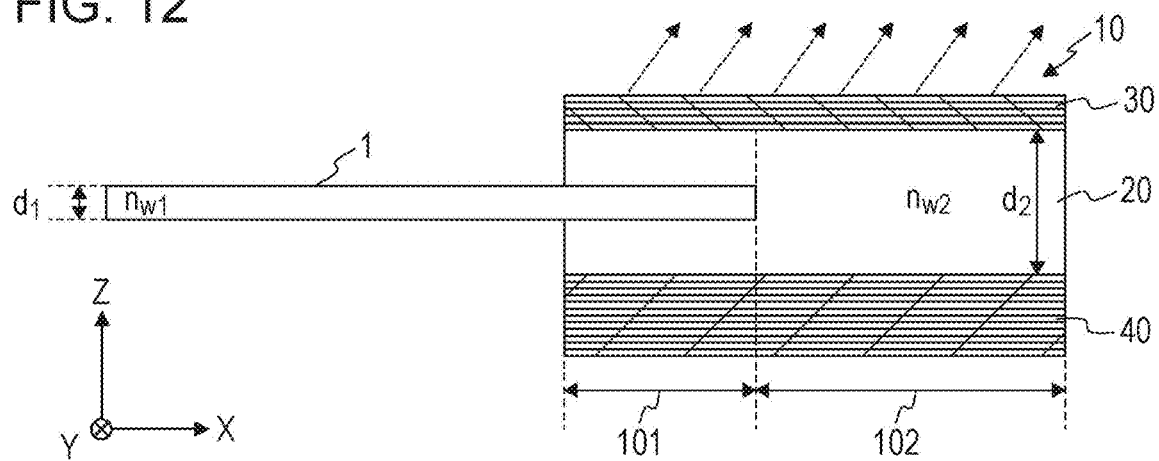
FIG. 12 is an illustration showing an example of a structure in which no grating is present.

For comparison purposes, the same computation was performed on a structure having no grating as shown in FIG. 12. The same computational conditions as the above conditions were used except that no grating was present. In this case, the coupling efficiency was 1.8%. It was found that, also in the structure in which an end face of the total reflection waveguide 1 and an end face of the slow light waveguide 10 are connected directly to each other, the coupling efficiency is only several percent.

Next, waveguide modes in the total reflection waveguide 1 and the waveguide 10 will be described.

Figure 13A:
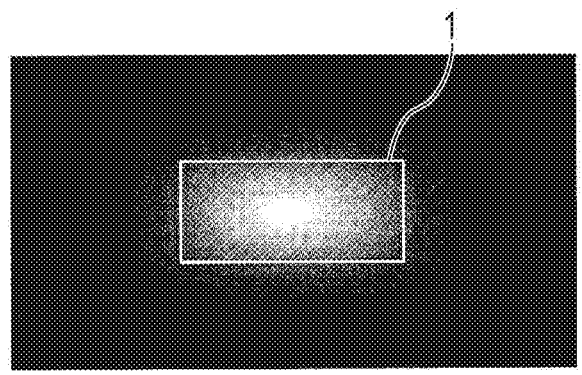
FIG. 13A is a graph showing an electric field intensity distribution of a waveguide mode in a total reflection waveguide.
Figure 13B:
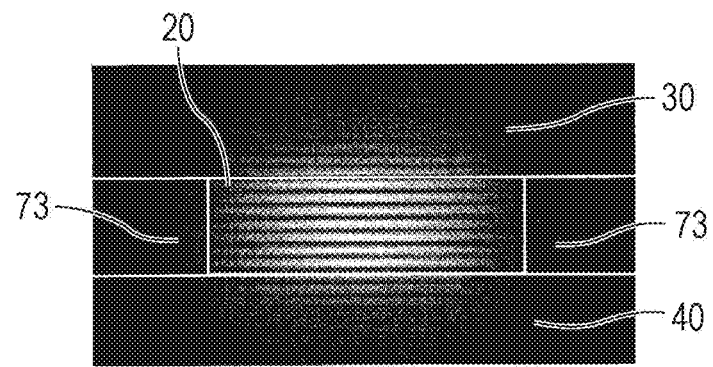
FIG. 13B is a graph showing an electric field intensity distribution of a higher-order waveguide mode in a slow light waveguide.

FIG. 13A is a graph showing an example of the electric field intensity distribution of a waveguide mode in the total reflection waveguide 1. FIG. 13B is a graph showing the electric field intensity distribution of a higher waveguide mode in the slow light waveguide 10. The examples shown in FIGS. 13A and 13B show the electric field intensity distributions in the YZ plane. In the example shown in FIG. 13B, the optical waveguide layer 20 disposed between the first mirror 30 and the second mirror 40 is located between two non-waveguide regions 73.

The waveguide mode in the total reflection waveguide 1 shown in FIG. 13A is a single mode. The waveguide mode in the slow light waveguide 10 shown in FIG. 13B is a higher-order mode with m=7 in formula (3). The effective refractive index of the total reflection waveguide 1 is $n_{e1}=1.69$, and the effective refractive index of the slow light waveguide 10 is $n_{e2}=0.528$.

Even when the distributions of the waveguide modes differ significantly as shown in FIGS. 13A and 13B, the coupling efficiency of the guided light can be high when the grating 15 is used.

The higher-order mode in the slow light waveguide 10 has the following advantage. In the slow light waveguide 10, the ratio of the electric field intensity distribution of the higher-order mode in the optical waveguide layer 20 to the overall electric field intensity distribution is higher than the ratio of the electric field intensity distribution of a lower-order mode. Specifically, in the higher-order mode, the amount of light confined in the optical waveguide layer 20 is larger. Therefore, the emission angle of the light emitted from the slow light waveguide 10 varies largely in response to a change in the refractive index of the optical waveguide layer 20.

Of course, the waveguide mode in the slow light waveguide 10 is not limited to the higher-order mode with m=7 in formula (3). By adjusting the p in formula (5), another waveguide mode can be excited in the slow light waveguide 10.

In the example shown in FIGS. 10 and 11, the following phenomenon can occur when the distances between the total reflection waveguide 1 in the region 101 and the mirrors are small. When the first mirror 30 and/or the second mirror 40 has a higher refractive index than the total reflection waveguide 1, evanescent light in the total reflection waveguide 1 tends to be transferred to the first mirror 30 and/or the second mirror 40. Therefore, the light propagating through the total reflection waveguide 1 may leak to the outside through the first mirror 30 and/or the second mirror 40. Thus, the distances between the total reflection waveguide 1 in the region 101 and the mirrors are larger than λ/4. This can prevent a reduction in the coupling efficiency of the guided light from the total reflection waveguide 1 into the slow light waveguide 10.

Figure 14:
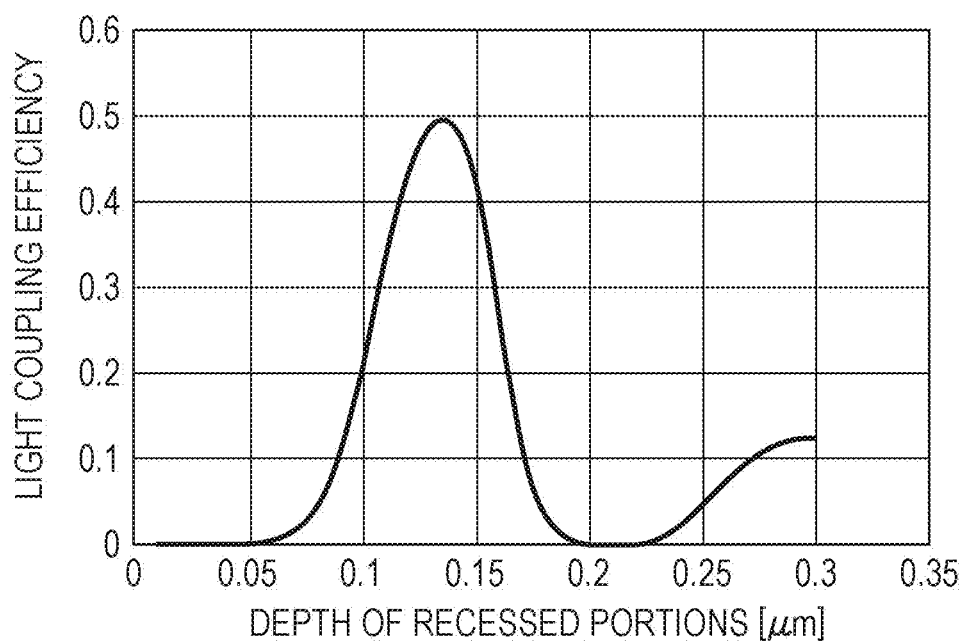
FIG. 14 is a graph showing the relation between the depth of recessed portions of a grating and coupling efficiency.

FIG. 14 is a graph showing an example of the relation between the depth of the recessed portions of the grating 15 and the coupling efficiency of the guided light. In this example, the wavelength of the light is 940 nm. The refractive index $n_{w1}$ of the total reflection waveguide 1 is 1.88. The thickness $d_1$ of the total reflection waveguide 1 is 300 nm. The refractive index $n_{w2}$ of the slow light waveguide 10 is 1.68. The thickness $d_2$ of the slow light waveguide is 2.1 μm. The period p of the grating 15 is 800 nm. The number of recessed portions of the grating 15 is 32.

In the example shown in FIG. 14, the coupling efficiency increases monotonically as the depth of the recessed portions increases when the depth of the recessed portions is within the range of 0 of 0.13 μm. In the range in which the depth of the recessed portions is larger than 0.13 μm, the coupling efficiency decreases and then oscillates as the depth of the recessed portions increases.

In the example shown in FIG. 14, when the depth of the recessed portions is 0.13 μm, the coupling efficiency is maximized and is about 50%. In this example, particularly high coupling efficiency is achieved when the depth of the recessed portions of the grating 15 is from ⅓ to 8/15 inclusive of the thickness $d_1$ of the total reflection waveguide 1.

The results shown in FIG. 14 can be explained as follows. The coupling efficiency between the mode in the total reflection waveguide 1 and the mode in the slow light waveguide 10 depends on the structure of the grating 15. The coupling efficiency is proportional to the overlap integral of a normalized electric field distribution in the total reflection waveguide 1 in the region in which the grating 15 is present and a normalized electric field distribution in the slow light waveguide 10 in this region. Therefore, as the depth of the recessed portions of the grating 15 increases, the light coupling efficiency generally increases. However, if the coupling efficiency is excessively high, the guided light converted to a slow light mode is again converted to a total reflection waveguide mode. Therefore, the light coupling efficiency decreases. As the depth of the recessed portions further increases, the coupling efficiency increases again and then oscillates.

Figure 15:
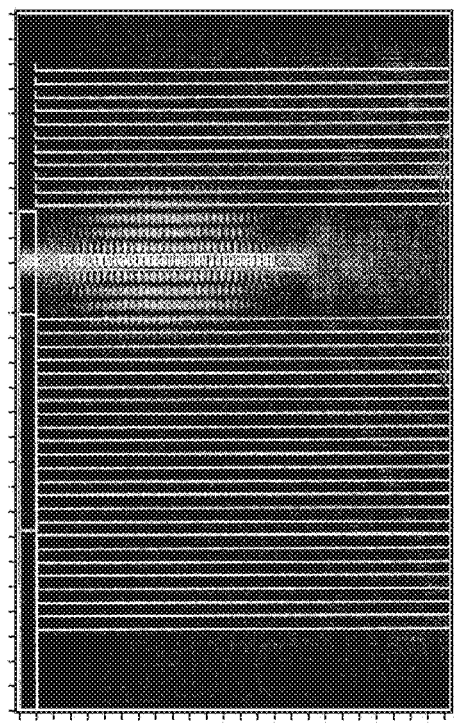
FIG. 15 is a graph showing light propagation computed under the condition that the coupling efficiency is low.

FIG. 15 is a graph showing an electric field intensity distribution when the depth of the recessed portions in the example shown in FIG. 14 is 0.2 μm. As illustrated, in the above conditions, the ratio of guided light converted to the slow light mode is not high.

Figure 16:
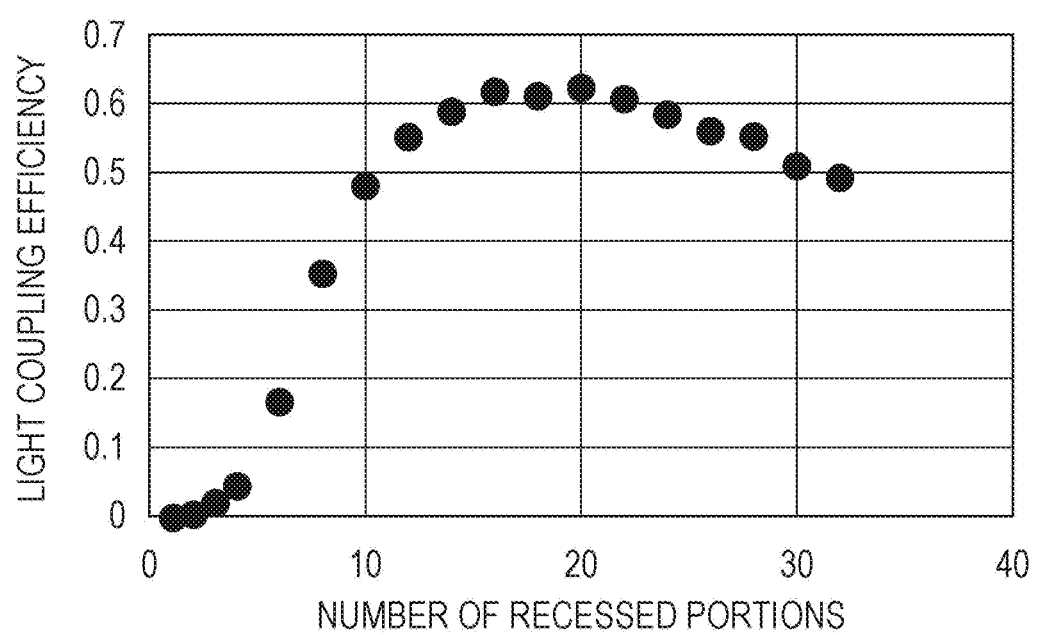
FIG. 16 is a graph showing an example of the relation between the number of recessed portions of the grating and the coupling efficiency.

FIG. 16 shows an example of the dependence of the coupling efficiency on the number of recessed portions of the grating 15. Even when the depth of the recessed portions is approximately the same as the film thickness $d_1$, the coupling efficiency of the guided light is low if the number of the grating structures is small. To increase the coupling efficiency to some extent, the number of recessed portions or protruding portions may be set to, for example, 4 or more.

In the above example, the computation was performed by setting the length of a recessed portion in the X direction per period in the grating, i.e., the duty cycle, to 50%, but the duty cycle is not limited to 50%. The duty cycle of the grating may be appropriately changed according to the depth of the recessed portions of the grating and the number of recessed portions. The maximum value of the coupling efficiency of the guided light can be determined by the depth of the recessed portions of the grating, the number of recessed portions, and the duty cycle of the grating.

Next, modifications of the connection between the total reflection waveguide and the slow light waveguide through the grating 15 will be described.

Figure 17A:
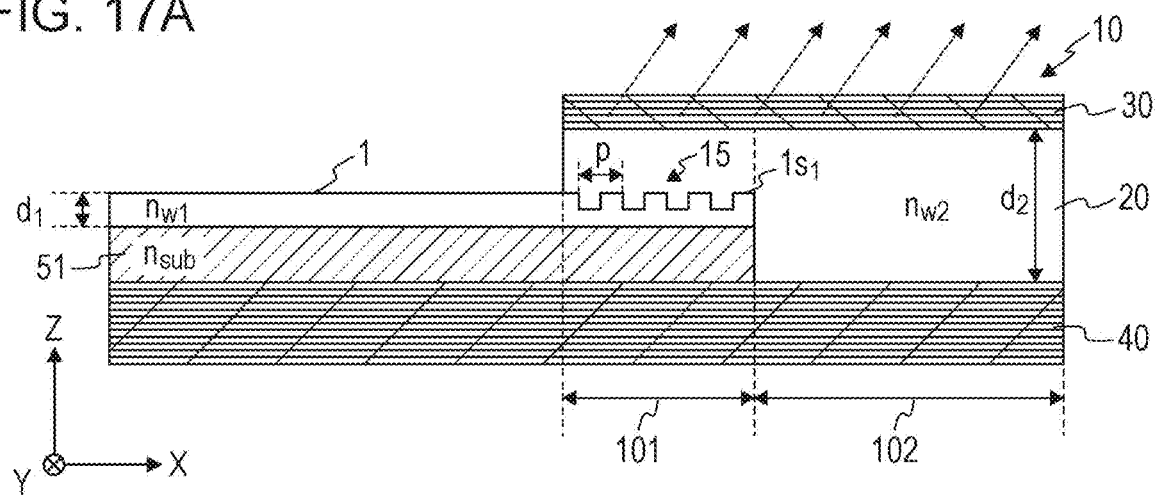
FIG. 17A is a cross-sectional view schematically showing a first modification of the optical device.
Figure 17B:
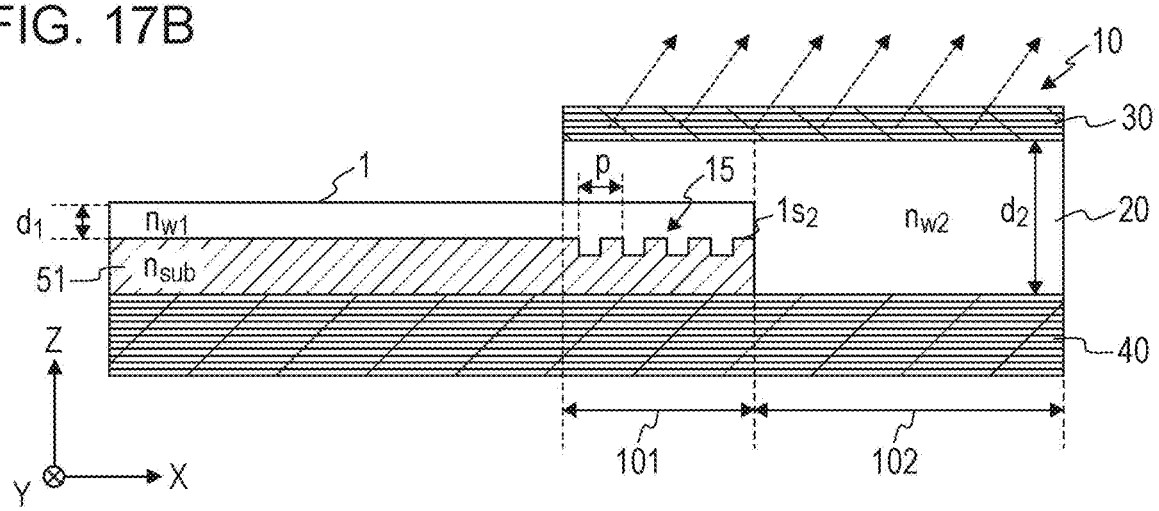
FIG. 17B is a cross-sectional view schematically showing a second modification of the optical device.
Figure 17C:
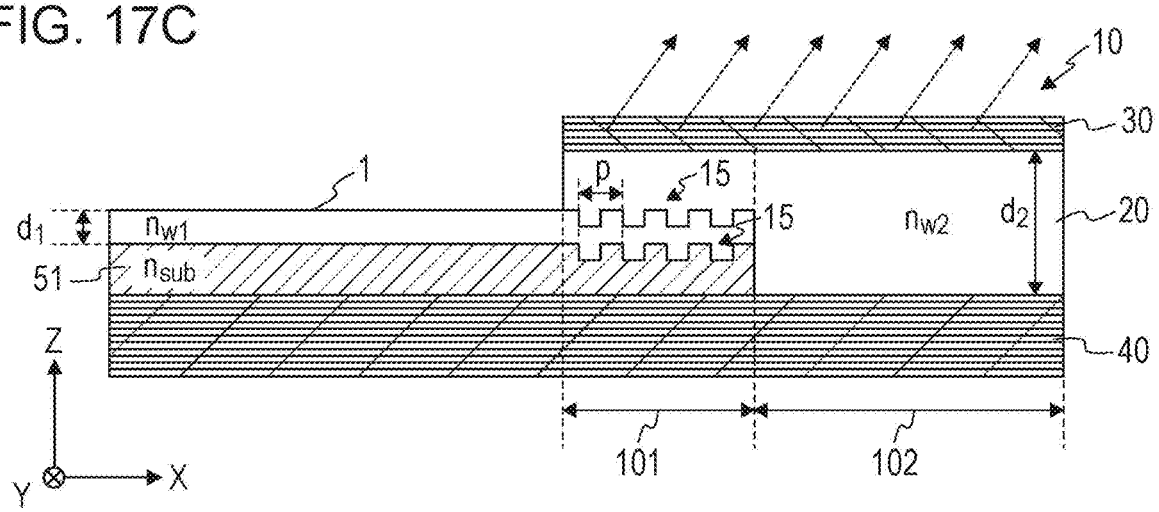
FIG. 17C is a cross-sectional view schematically showing a third modification of the optical device.

FIGS. 17A to 17C are cross-sectional views schematically showing modifications of the example shown in FIG. 10. In the examples shown in FIGS. 17A to 17C, the total reflection waveguide 1 is supported by a dielectric layer 51, and the dielectric layer 51 is supported by the second mirror 40. The total reflection waveguide 1 and the slow light waveguide 10 share the second mirror 40. The dielectric layer 51 is formed of, for example, $SiO_2$. The refractive index $n_{sub}$ of the dielectric layer 51 is smaller than the refractive index $n_{w1}$ of the total reflection waveguide 1. Therefore, the light propagating through the total reflection waveguide 1 does not leak to the dielectric layer 51. The dielectric layer 51 may not be supported by the second mirror 40. In a region other than the region 101 and the region 102, the second mirror 40 may be replaced with a structure made of the same material as the material of the dielectric layer 51.

In the example shown in FIG. 17A, the total reflection waveguide 1 has a grating 15 on the first surface $1s_1$. In the example shown in FIG. 17B, the total reflection waveguide 1 has a grating 15 on the second surface $1s_2$. In the example shown in FIG. 17C, the total reflection waveguide 1 has gratings 15 on both the first surface $1s_1$ and the second surface $1s_2$.

As described above, the total reflection waveguide 1 may have a grating 15 on at least one of the first surface $1s_1$ and the second surface $1s2$.

Figure 18A:
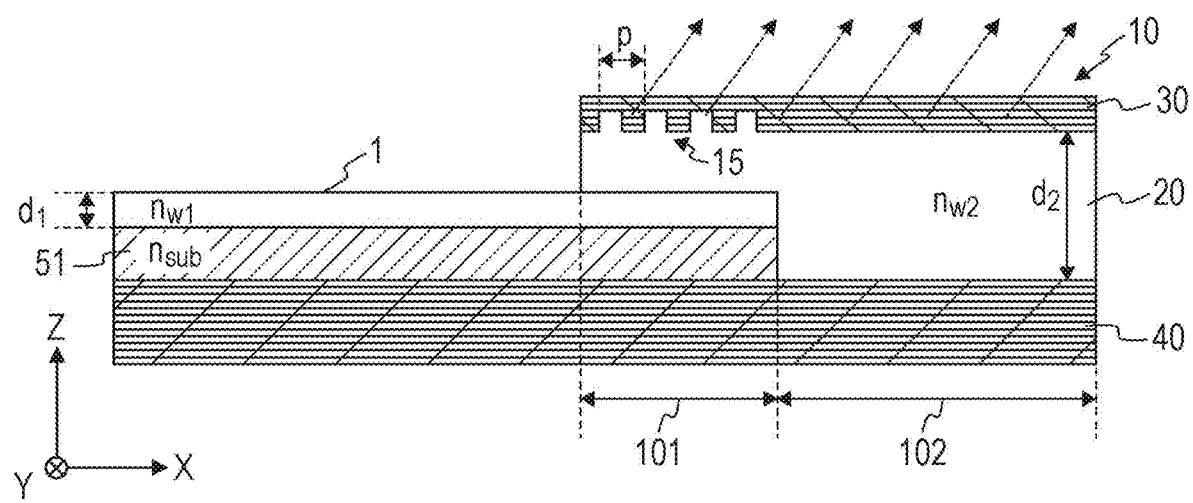
FIG. 18A is a cross-sectional view schematically showing a fourth modification of the optical device.
Figure 18B:
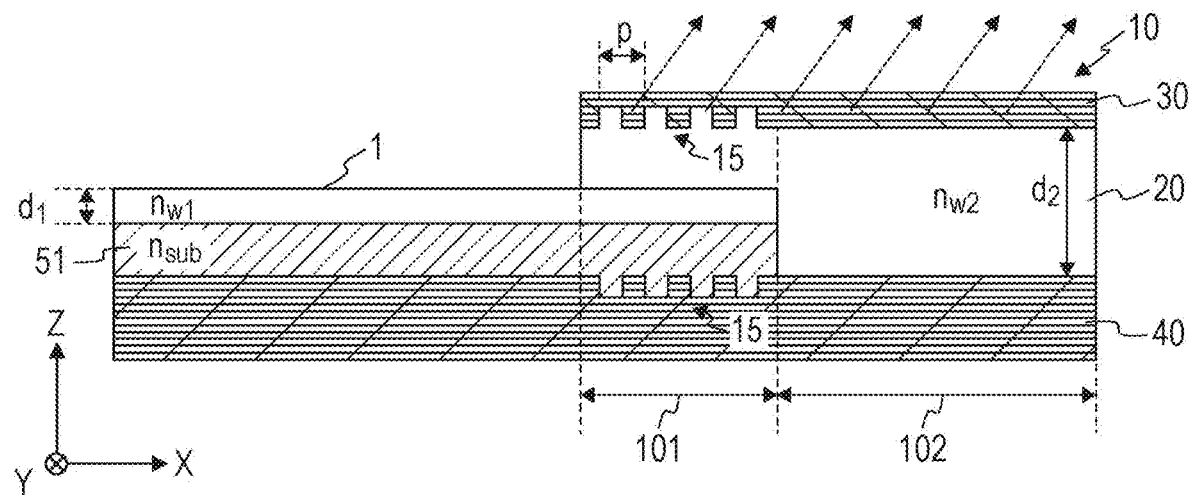
FIG. 18B is a cross-sectional view schematically showing a fifth modification of the optical device.

FIGS. 18A and 18B are cross-sectional views schematically showing other modifications of the example shown in FIG. 10. In the examples shown in FIGS. 18A and 18B, as in the examples shown in FIGS. 17A to 17C, the total reflection waveguide 1 is supported by the dielectric layer 51, and the dielectric layer 51 is supported by the second mirror 40.

In the examples in FIGS. 18A and 18B, a grating 15 is provided not in the total reflection waveguide 1 but on the reflecting surface of the first mirror 30 and/or the reflecting surface of the second mirror 40. In the example shown in FIG. 18A, the slow light waveguide 10 has a grating 15 on the reflecting surface of the first mirror 30. In the example shown in FIG. 18B, the slow light waveguide 10 has gratings 15 on the reflecting surfaces of the first and second mirrors 30 and 40.

In the examples shown in FIGS. 18A and 18B, the Z direction distance between the total reflection waveguide 1 and the first mirror 30 and/or the second mirror 40 is relatively small. In this case, evanescent light in the total reflection waveguide 1 is diffracted by the grating 15. Therefore, the coupling efficiency of the guided light from the total reflection waveguide 1 into the slow light waveguide 10 can be increased, as in the above examples.

As described above, the slow light waveguide 10 may have a grating 15 on at least one of the reflecting surface of the first mirror 30 and the reflecting surface of the second mirror 40.

One of the examples shown in FIGS. 10 and 17A to 17C may be combined with FIG. 18A or 18B. Specifically, the total reflection waveguide 1 may have a grating 15 on at least one of the first surface $1s1$ and the second surface $1s2$, and the slow light waveguide 10 may have a grating 15 on at least one of the reflecting surface of the first mirror 30 and the reflecting surface of the second mirror 40.

Next, the relation between the Y direction width of the total reflection waveguide 1 and the Y direction width of the optical waveguide layer 20 inside the slow light waveguide 10 will be described.

FIGS. 19A to 19D are cross-sectional views schematically showing examples of the positional relation between the total reflection waveguide 1 and the slow light waveguide 10 in the YZ plane. FIGS. 19A to 19D show the structures of the total reflection waveguide 1 and the slow light waveguide 10 when they are viewed in the X direction from the total reflection waveguide 1 side. In the examples shown in FIGS. 19A to 19D, two non-waveguide regions 73 are sandwiched between the first mirror 30 and the second mirror 40, and the optical waveguide layer 20 is located between the two non-waveguide regions 73. The average refractive index of the optical waveguide layer 20 is higher than the average refractive index of the non-waveguide regions 73. Therefore, light can propagate through the optical waveguide layer 20 without leaking to the non-waveguide regions 73.

Figure 19A:
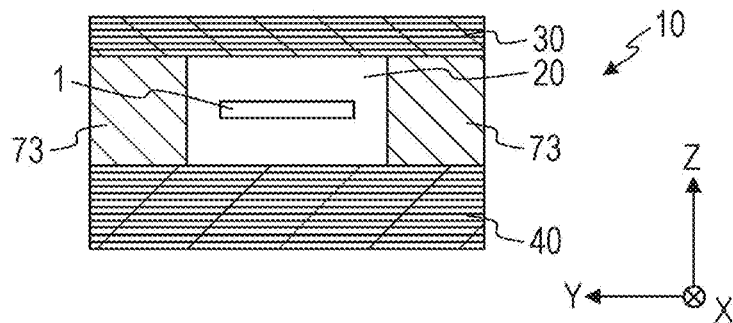
FIG. 19A is a cross-sectional view schematically showing a first example of the connection between the total reflection waveguide and the slow light waveguide.

In the example shown in FIG. 19A, the total reflection waveguide 1 is not supported by the dielectric layer 51. The Y direction width of the total reflection waveguide 1 is smaller than the Y direction width of the optical waveguide layer 20.

Figure 19B:
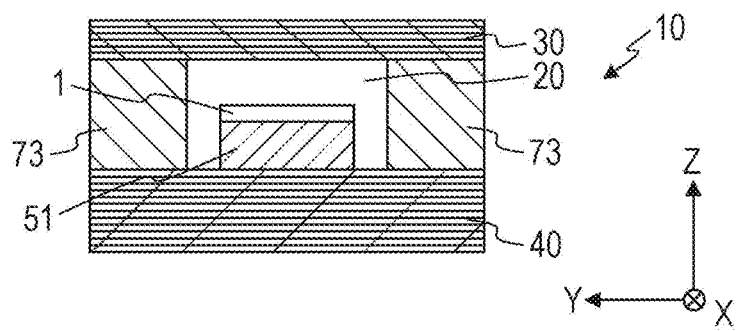
FIG. 19B is a cross-sectional view schematically showing a second example of the connection between the total reflection waveguide and the slow light waveguide.

In the example shown in FIG. 19B, the total reflection waveguide 1 is supported by the dielectric layer 51. The Y direction width of the total reflection waveguide 1 is smaller than the Y direction width of the optical waveguide layer 20. The Y direction width of the dielectric layer 51 is the same as the Y direction width of the total reflection waveguide 1.

Figure 19C:
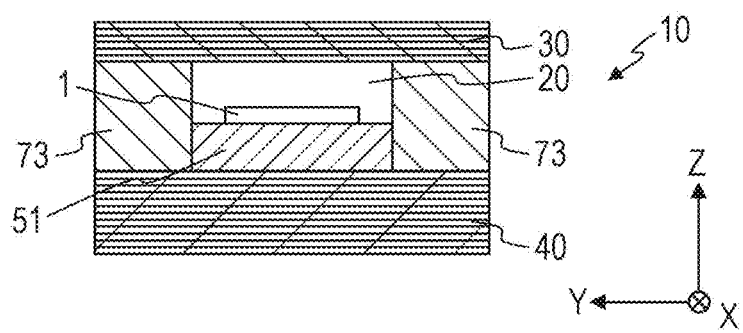
FIG. 19C is a cross-sectional view schematically showing a third example of the connection between the total reflection waveguide and the slow light waveguide.

In the example shown in FIG. 19C, the total reflection waveguide 1 is supported by the dielectric layer 51. The Y direction width of the total reflection waveguide 1 is smaller than the Y direction width of the optical waveguide layer 20. The Y direction width of the dielectric layer 51 is the same as the Y direction width of the optical waveguide layer 20.

Figure 19D:
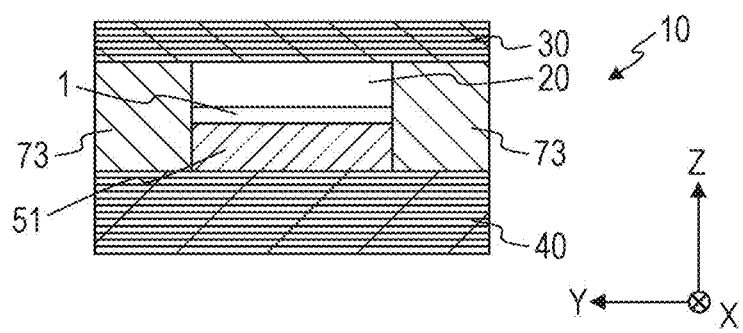
FIG. 19D is a cross-sectional view schematically showing a fourth example of the connection between the total reflection waveguide and the slow light waveguide.

In the example shown in FIG. 19D, the total reflection waveguide 1 is supported by the dielectric layer 51. The Y direction width of the total reflection waveguide 1 is the same as the Y direction width of the optical waveguide layer 20. The Y direction width of the dielectric layer 51 is the same as the Y direction width of the total reflection waveguide 1.

Light scattering loss when the guided light is coupled from the total reflection waveguide 1 into the slow light waveguide 10 is lower in the examples shown in FIGS. 19C and 19D than in the examples shown in FIGS. 19A and 19B. The light scattering loss is largest in the example shown in FIG. 19A and is smallest in the example shown in FIG. 19D. In the example shown in FIG. 19D, the Y direction width of the total reflection waveguide 1 is the same as the Y direction width of the optical waveguide layer 20. Therefore, in the waveguide mode in the slow light waveguide 10, the electric field intensity distribution in the YZ plane in the region 101 widely overlaps the electric field intensity distribution in the YZ plane in the region 102. Thus, the light scattering loss is smallest.

When the Y direction width of the dielectric layer 51 is the same as the Y direction width of the optical waveguide layer 20 as shown in FIGS. 19C and 19D, the light scattering loss can be effectively reduced.

Figure 20:
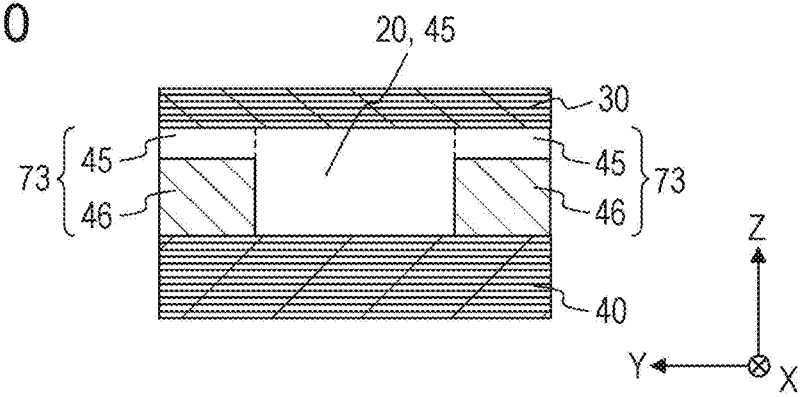
FIG. 20 is a cross-sectional view schematically showing another example of the slow light waveguide.

FIG. 20 is a cross-sectional view schematically showing another modification of the slow light waveguide 10. In the example shown in FIG. 20, a cross-sectional view in the region 102 is shown. As shown in FIG. 20, each non-waveguide region 73 may include two or more members having different refractive indexes. In the example shown in FIG. 20, the optical waveguide layer 20 and the two non-waveguide regions 73 include respective regions formed of a common material 45. Each of the non-waveguide regions 73 includes a member 46 and the common material 45. When the average refractive index of the optical waveguide layer 20 is higher than the average refractive index of the non-waveguide regions 73, light can propagate through the optical waveguide layer 20 without leaking to the non-waveguide regions 73.

Next, an example of the structure of a portion of the total reflection waveguide 1 that is located outside the optical waveguide layer 20 will be described.

Figure 21:
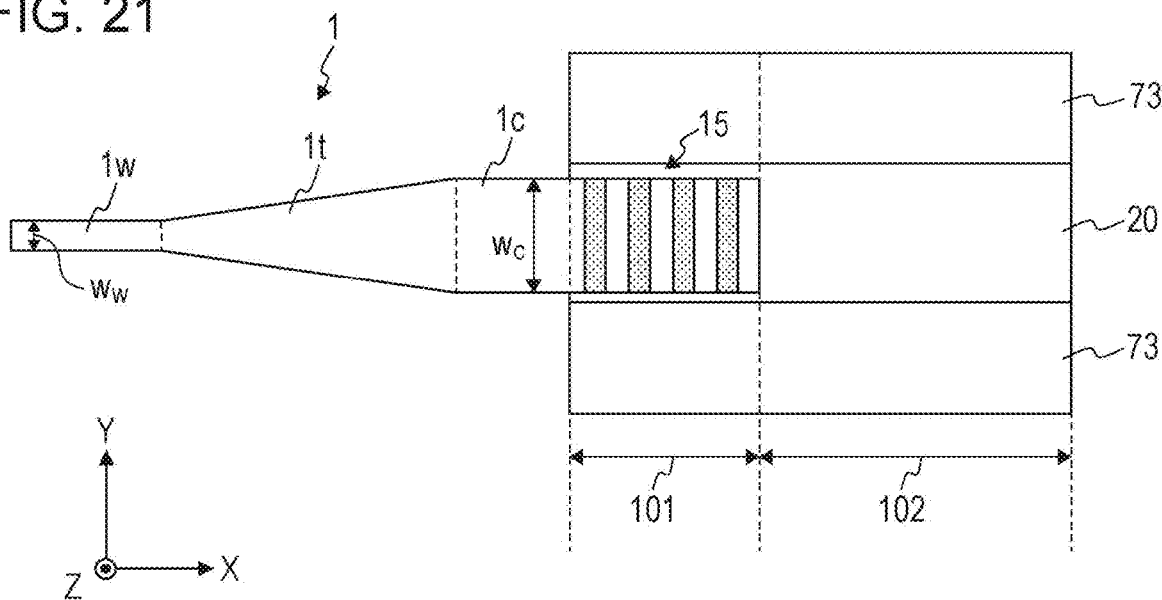
FIG. 21 is a cross-sectional view schematically showing another example of the connection between the total reflection waveguide and the slow light waveguide.

FIG. 21 is an illustration schematically showing an example of the connection between the total reflection waveguide and the slow light waveguide. In the example shown in FIG. 21, the total reflection waveguide 1 includes a portion which is located outside the optical waveguide layer 20 and whose width, i.e., Y direction size, monotonically increases toward the slow light waveguide 10. Specifically, part of the total reflection waveguide 1 has a tapered structure 1t. The width $w_w$ of a portion of the total reflection waveguide 1 that is far from the optical waveguide layer 20 is smaller than the width $w_c$ of the total reflection waveguide 1 in the region 101 serving as a connection portion. $w_w$ can be, for example, one hundredth to one half of $w_c$. The tapered structure 1t is present between a small-width waveguide portion 1w and a large-width waveguide portion 1c of the total reflection waveguide 1. By using the above structure, it is possible to reduce reflection of light propagating through the small-width waveguide portion 1w when the light enters the large-width waveguide portion 1c.

At least part of the optical waveguide layer 20 may have a structure whose refractive index and/or thickness can be adjusted. By adjusting the refractive index and/or the thickness, the X direction component of the direction of the light emitted from the first mirror 30 is changed.

The optical waveguide layer 20 may contain a liquid crystal material or an electrooptical material in order to adjust the refractive index of at least part of the optical waveguide layer 20. The optical waveguide layer 20 may be sandwiched between a pair of electrodes. The refractive index of the optical waveguide layer 20 can be changed by applying a voltage to the pair of electrodes.

In the optical waveguide layer 20, the refractive index of the region 101 and the refractive index of the region 102 may be adjusted simultaneously. However, when the refractive index of the region 101 is adjusted, the condition of formula (5) may be changed. In this case, the coupling efficiency of the guided light from the total reflection waveguide 1 into the slow light waveguide 10 may decrease. Therefore, the refractive index of the region 101 may be maintained constant, and only the refractive index of the region 102 may be adjusted. Even when the refractive indexes of the region 101 and the region 102 differ from each other, the influence of reflection of the guided light at the interface between the region 101 and the region 102 is small.

In this case, the pair of electrodes (referred to as a "first pair of electrodes") sandwich therebetween a portion of the optical waveguide layer 20 that differs from its portion overlapping the first waveguide when viewed in a direction perpendicular to the reflecting surface of the first mirror. When an unillustrated control circuit applies a voltage to the pair of electrodes, the refractive index of the at least part of the optical waveguide layer 20 in the region 102 can be adjusted.

It is sufficient that the condition of formula (5) be satisfied as designed. However, in practice, the condition of formula (5) may not be fully satisfied due to production errors. For the purpose of compensation in such a case, the function of adjusting the refractive index in the region 101 may be added to the optical device, in addition to the adjustment of the refractive index in the region 102.

In this case, in addition to the first pair of electrodes, a second pair of electrodes may be provided. The second pair of electrodes sandwich therebetween at least part of the portion of the optical waveguide layer 20 that overlaps the first waveguide when viewed from the direction perpendicular to the reflecting surface of the first mirror. The control circuit applies voltages to the first and second pairs of electrodes independently, and the refractive index of the portion of the optical waveguide layer that is located between the first pair of electrodes and the refractive index of the portion of the optical waveguide layer that is located between the second pair of electrodes can thereby be adjusted independently.

For example, at least one actuator may be connected to at least one of the first mirror 30 and the second mirror 40 in order to adjust the thickness of the optical waveguide layer 20. The control circuit controls the at least one actuator to change the distance between the first mirror 30 and the second mirror 40, and the thickness of the optical waveguide layer 20 can thereby be changed. When the optical waveguide layer 20 is formed of liquid, the thickness of the optical waveguide layer 20 can be easily changed.

The at least one actuator may be connected to at least one of the first mirror 30 and the second mirror 40 in the region 102. The thickness of the optical waveguide layer 20 in the region 102 can be changed using the actuator. In this case, the condition of formula (5) does not change.

The at least one actuator may include two actuators. One of the actuators may be connected to at least one of the first mirror 30 and the second mirror 40 in the region 101. The other actuator may be connected to at least one of the first mirror 30 and the second mirror 40 in the region 102. Using the two actuators, the thickness of the optical waveguide layer 20 in the region 101 and the thickness of the optical waveguide layer 20 in the region 102 can be changed separately. This allows compensation when the condition of formula (5) is not satisfied as designed.

Examples of a specific structure for adjusting the refractive index and/or thickness of the optical waveguide layer 20 will be described later.

The dimensions such as the thickness of the optical waveguide layer 20 may deviate from its design values because of production errors. When the dimensions of the optical waveguide layer 20 deviate from the design values, an error also occurs in the effective refractive index $n_{e2}$ in formula (5). One problem in this case is that the coupling efficiency of the guided light decreases. How the coupling efficiency of the guided light depends on the thickness of the optical waveguide layer 20 will next be described.

Figure 22:
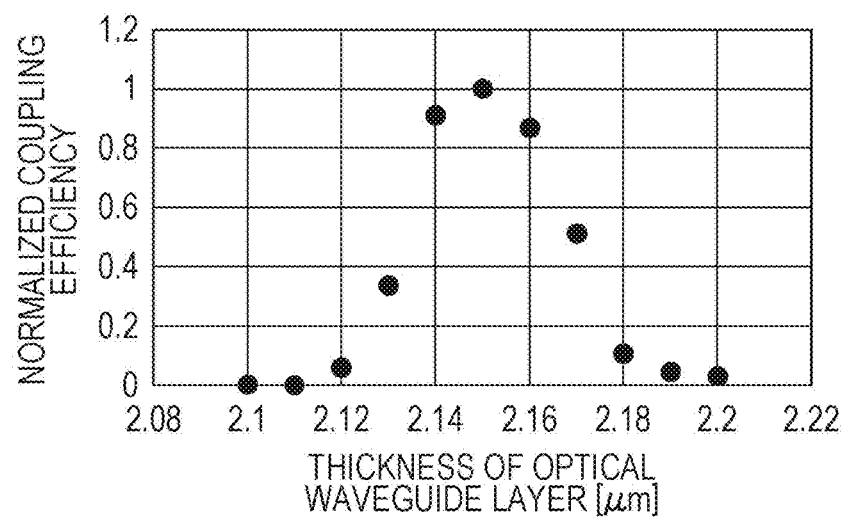
FIG. 22 is a graph showing the relation between the thickness of an optical waveguide layer in the example shown in FIG. 17A and the coupling efficiency of guided light.

FIG. 22 is a graph showing the relation between the thickness of the optical waveguide layer and the coupling efficiency of the guided light in the example shown in FIG. 17A. The horizontal axis represents the thickness $d_2$ of the optical waveguide layer 20, and the vertical axis represents the coupling efficiency of the guided light normalized by its maximum value. The computation conditions in the example shown in FIG. 22 are as follows.

The refractive index of the total reflection waveguide 1 is $n_{w1}=2.0$, and its Z direction thickness is $d_1=300$ nm. The refractive index of the dielectric layer 51 is $n_{sub}=1.44$. The refractive index of the slow light waveguide 10 is $n_{w2}=1.61$. The number of recessed portions of the grating is 16. The period of the grating is p=795 nm. The depth of the recessed portions is 85 nm. The light propagating through the total reflection waveguide 1 and the slow light waveguide 10 has a wavelength $\lambda$ of 940 nm in air.

As shown in FIG. 22, the coupling efficiency has one peak. Under the above conditions, the coupling efficiency is maximized at $d_2=2.15$ μm. When the thickness of the optical waveguide layer 20 deviates from $d_2=2.15$ μm, the coupling efficiency decreases.

To prevent a reduction in coupling efficiency due to production errors, a plurality of gratings having different periods may be provided in the region 101. By providing the plurality of gratings, it is possible to compensate for a production error in the thickness $d_2$ of the optical waveguide layer 20.

In the following embodiments, the refractive indexes of the plurality of gratings vary periodically in the X direction. The periods of at least two of the plurality of gratings differ from each other. The period of each of the plurality of gratings is within the range of formula (6). Each of the plurality of gratings may have the same structure as the grating in any of the above examples. The total reflection waveguides 1 and the slow light waveguides 10 in the embodiments and modifications of the embodiments described later may be applied to any of the optical devices of the present disclosure.

Figure 23A:
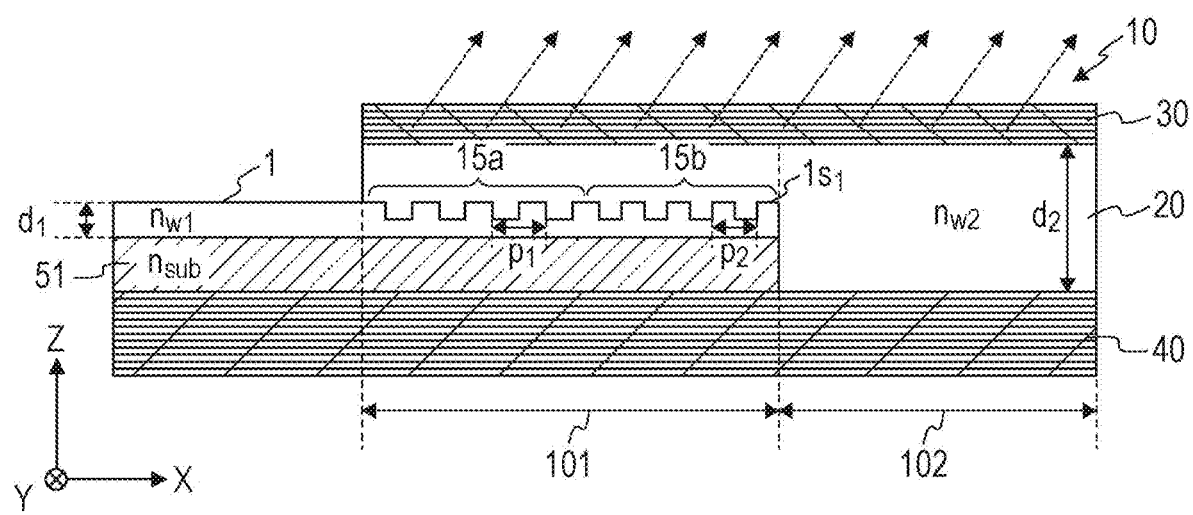
FIG. 23A is an illustration schematically showing an optical device having two gratings in the example shown in FIG. 17A.
Figure 23B:
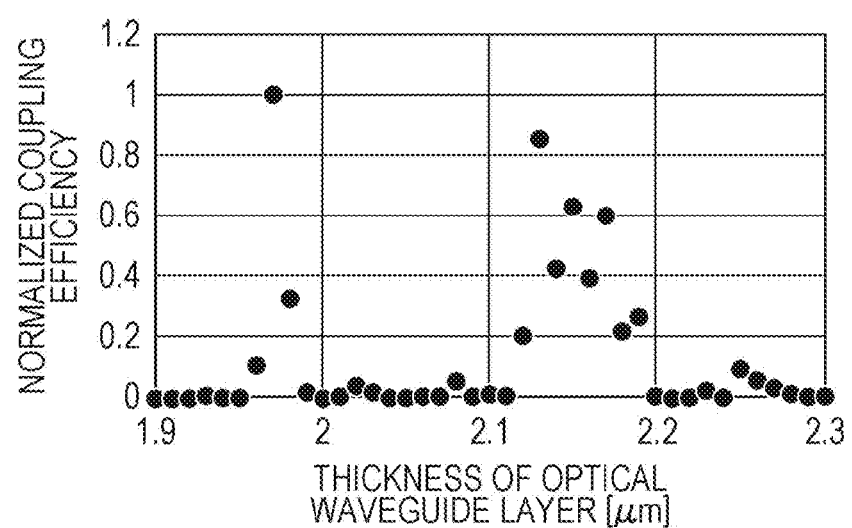
FIG. 23B is a graph showing the relation between the thickness of an optical waveguide layer and the coupling efficiency of guided light in the example shown in FIG. 23A.

FIG. 23A is an illustration schematically showing an optical device having two gratings in the example shown in FIG. 17A. FIG. 23B is a graph showing the relation between the thickness of the optical waveguide layer and the coupling efficiency of the guided light in the example shown in FIG. 23A.

In the example shown in FIG. 23A, a grating 15a and a grating 15b are arranged in the X axis direction. The computation conditions for the example shown in FIG. 23B are as follows.

The number of recessed portions of the grating 15a and the number of recessed portions of the grating 15b are 16. The period of the grating 15a is p1=795 nm, and the period of the grating 15b is p2=610 nm. The depth of the recessed portions is 85 nm. The other computation conditions are the same as the computation conditions for the example shown in FIG. 22.

As shown in FIG. 23B, the coupling efficiency has a narrow first peak at 1.95 μm<$d_2$<2.0 μm and a second peak with a large width on average at 2.1 μm<$d_2$<2.2 μm. The reason that the width of the first peak is small is that $n_{e2}$ changes largely with a change in $d_2$. The first and second peaks are due to the grating 15b with a period $p_2$ of 610 nm and the grating 15a with a period $p_1$ of 795 nm, respectively.

Figure 23C:
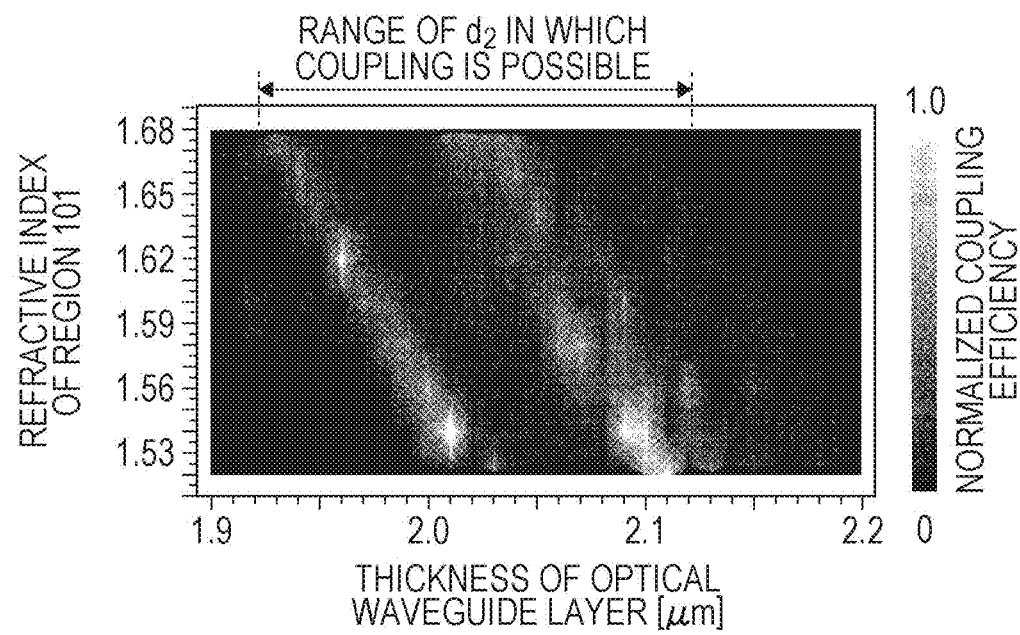
FIG. 23C is a graph showing the relation between the thickness of the optical waveguide layer, the refractive index of a region 101, and the coupling efficiency of guided light in the example shown in FIG. 23A.

FIG. 23C is another graph showing the relation of the coupling efficiency of the guided light to the thickness of the optical waveguide layer and the refractive index of the region 101 in the example shown in FIG. 23A. The plurality of periods and the function of adjusting the refractive index in the region 101 can be appropriately combined. In this manner, the range of $d_2$ in which the guided light can be coupled can be broadened in a continuous manner as shown in FIG. 23C.

In the example shown in FIG. 23C, the period $p_2=610$ nm, and the period $p_1=710$ nm. As shown in FIG. 23C, the range of $d_2$ for the period $p_2=610$ nm in which the guided light can be coupled is 1.92 μm<$d_2$<2.03 μm, and the range of $d_2$ for the period $p_1=710$ nm in which the guided light can be coupled is 2.01 μm<$d_2$<2.12 μm. Specifically, the sum of the two ranges of $d_2$ in which the guided light can be coupled is 1.92 μm<$d_2$<2.12 μm and is wider than each of the ranges of $d_2$ in which the guided light can be coupled. Under the computation conditions shown for FIG. 23C, the refractive index of the region 101 was changed from 1.52 to 1.68. The rest of the computation conditions are the same as the computation conditions in the example shown in FIG. 23B.

Figure 23D:
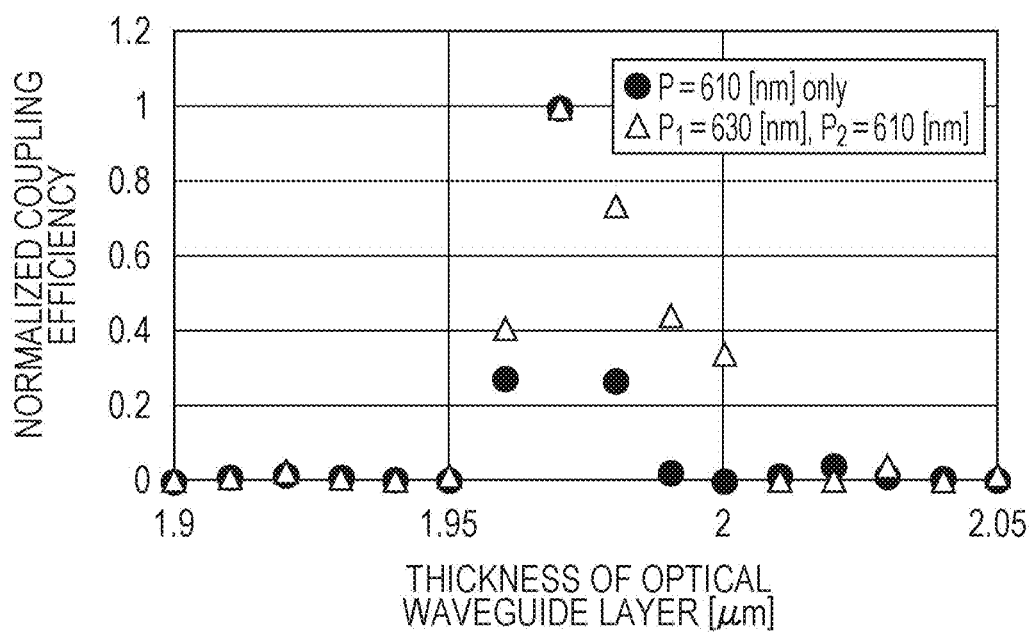
FIG. 23D is another graph showing the relation between the thickness of the optical waveguide layer and the coupling efficiency of the guided light in the example shown in FIG. 23A.

FIG. 23D is another graph showing the relation between the thickness of the optical waveguide layer and the coupling efficiency of the guided light in the example shown in FIG. 23A. The computation conditions in the example shown in FIG. 23D are as follows.

Solid circles represent the coupling efficiency in the case of only a period of 610 nm. The rest of the computation conditions are the same as the computation conditions in the example shown in FIG. 22. Open triangles represent the coupling efficiency in the case where the period of the grating 15a is $p_1=630$ nm and the period of the grating 15b is $p_2=610$ nm. The rest of the computation conditions are the same as the computation conditions in the example shown in FIG. 23B.

In the example shown in FIG. 23B, as $p_1$ gradually approaches $p_2$, the second peak approaches the first peak. Therefore, even when the refractive index in the region 101 is maintained constant, two peaks are present as shown by the open triangles in FIG. 23D, and a broader peak is obtained. Therefore, the range of $d_2$ in which the guided light can be coupled is broadened.

When a plurality of grating are present in the region 101 as described above, a reduction in the coupling efficiency of the guided light can be prevented even when there is a production error in the thickness $d_2$ of the optical waveguide layer 20.

FIG. 23A shows the two gratings 15a and 15b having respective different periods. However, three or more grating having respective different periods may be used.

Next, modifications of the optical device including a plurality of gratings with respective different periods will be described.

FIGS. 24A to 24D are cross-sectional views schematically showing modifications of the example shown in FIG. 23A.

Figure 24A:
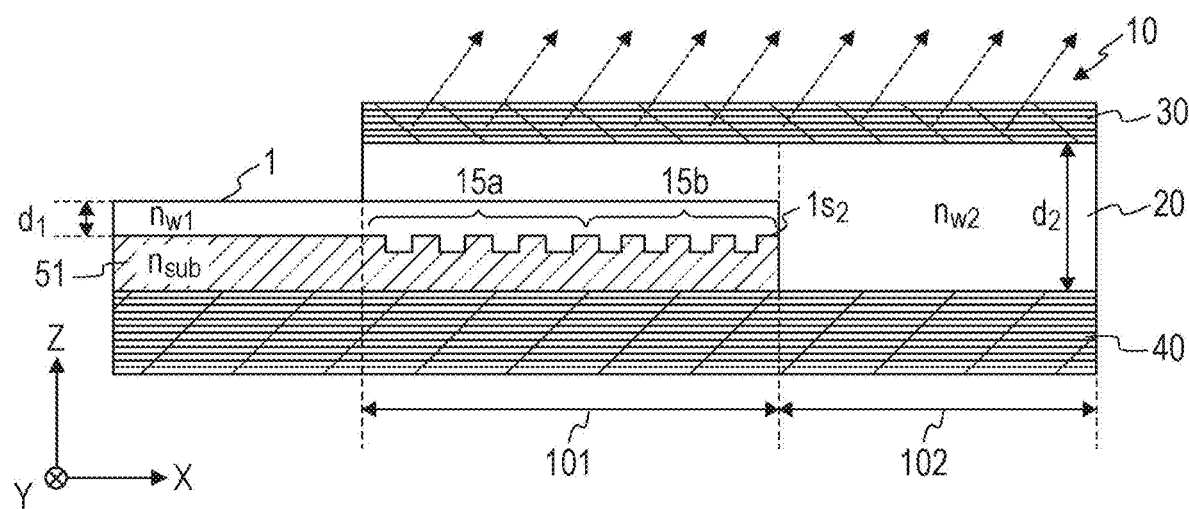
FIG. 24A is a cross-sectional view schematically showing a modification of the example shown in FIG. 23A.

In the example shown in FIG. 24A, the total reflection waveguide 1 includes a grating 15a and a grating 15b on the second surface $1s_2$. In the example shown in FIG. 24B, the total reflection waveguide 1 includes gratings 15a and gratings 15b on both the first surface $1s1$ and the second surface $1s_2$. In the example shown in FIG. 24C, the slow light waveguide 10 includes a grating 15a and a grating 15b on the reflecting surface of the first mirror 30. In the example shown in FIG. 24D, the slow light waveguide 10 includes a grating 15a and a grating 15b on the reflecting surface of the second mirror 40.

In the embodiments of the present disclosure, at least one of the first surface $1s_1$ and the second surface $1s_2$ of the total reflection waveguide or at least one of the reflecting surface of the first mirror 30 and the reflecting surface of the second mirror 40 may include a plurality of gratings.

Figure 24B:
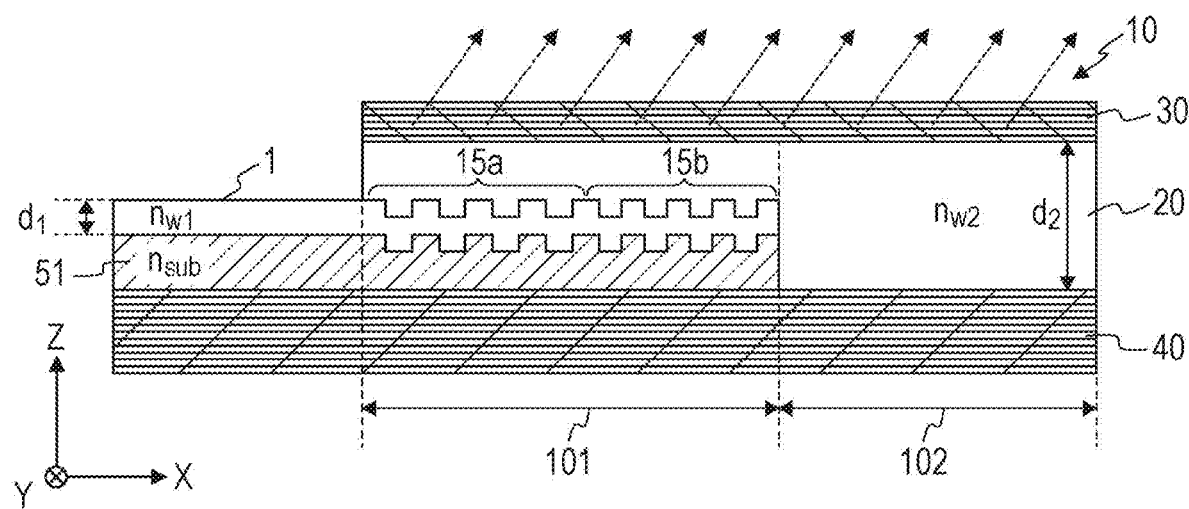
FIG. 24B is a cross-sectional view schematically showing another modification of the example shown in FIG. 23A.
Figure 24C:
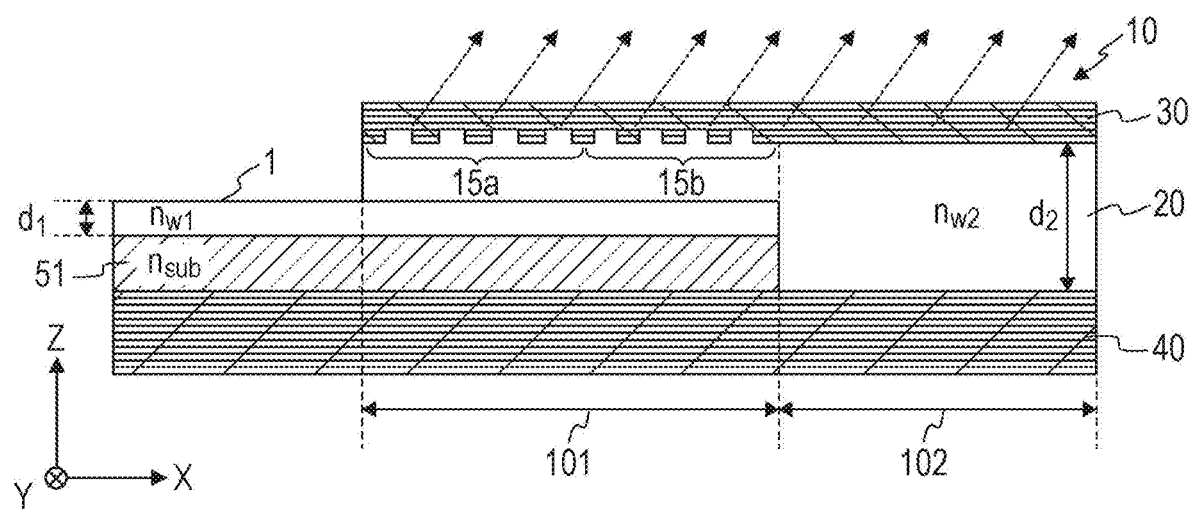
FIG. 24C is a cross-sectional view schematically showing another modification of the example shown in FIG. 23A.
Figure 24D:
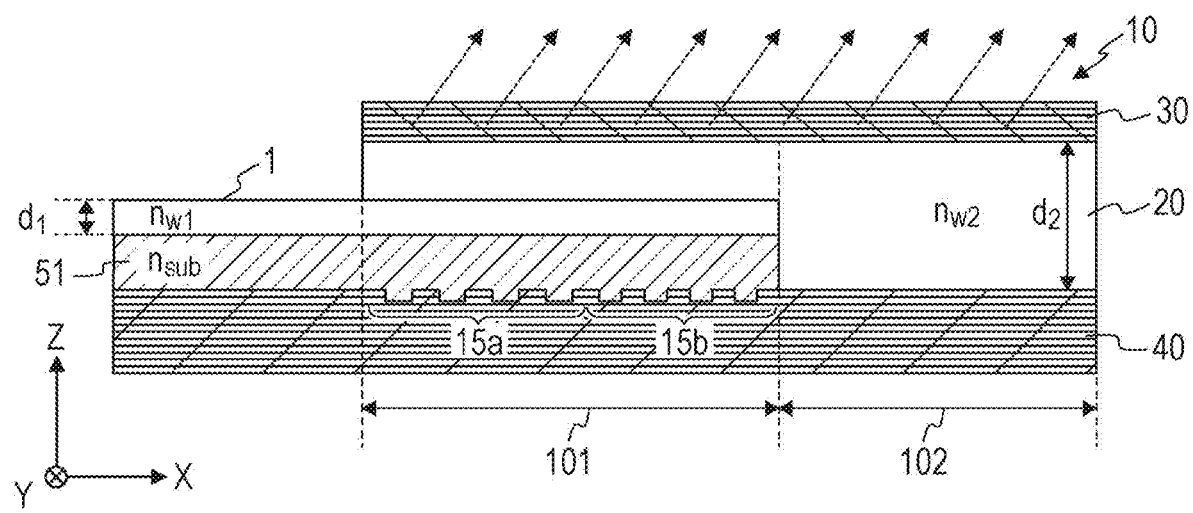
FIG. 24D is a cross-sectional view schematically showing another modification of the example shown in FIG. 23A.

At least one of the examples shown in FIGS. 23A, 24A, and 24B may be combined with one of FIGS. 24C and 24D. Specifically, in the embodiments of the present disclosure, at least one of the first surface $1s_1$ and the second surface $1s_2$ of the total reflection waveguide and at least one of the reflecting surface of the first mirror 30 and the reflecting surface of the second mirror 40 may include a plurality of gratings.

In the above examples, the plurality of gratings include two or more gratings arranged in the X direction. However, this is not a limitation, and the plurality of gratings may include two or more gratings adjacent in the Y direction. The "two or more gratings adjacent in the Y direction" may be in contact with each other in the Y direction or may be adjacent to each other with a gap therebetween.

Figure 25A:
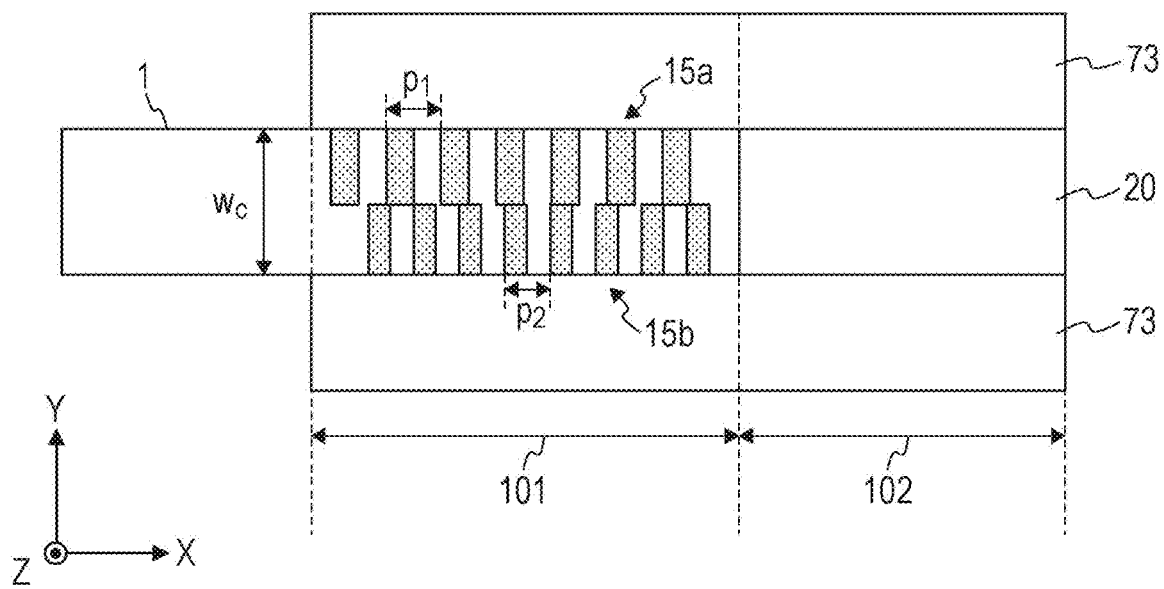
FIG. 25A is an illustration schematically showing an example in which two gratings are arranged in the Y direction.

FIG. 25A is an illustration schematically showing an example in which two gratings are arranged in the Y direction.

In the example shown in FIG. 25A, the Y direction width of a grating 15a and a grating 15b is $w_e/2$. Although their Y direction width is small, the number of recessed portions of the gratings 15a and 15b in the X direction may be increased. In this manner, it can be expected to obtain the same effects as in the example shown in FIG. 23A. In the example shown in FIG. 23A, the gratings 15a and 15b whose Y direction width is we are arranged in the X direction.

The phrase "the plurality of gratings adjacent in the Y direction" is intended to encompass the case in which the period of the gratings in the X direction varies continuously with a change in position in the Y direction.

Figure 25B:
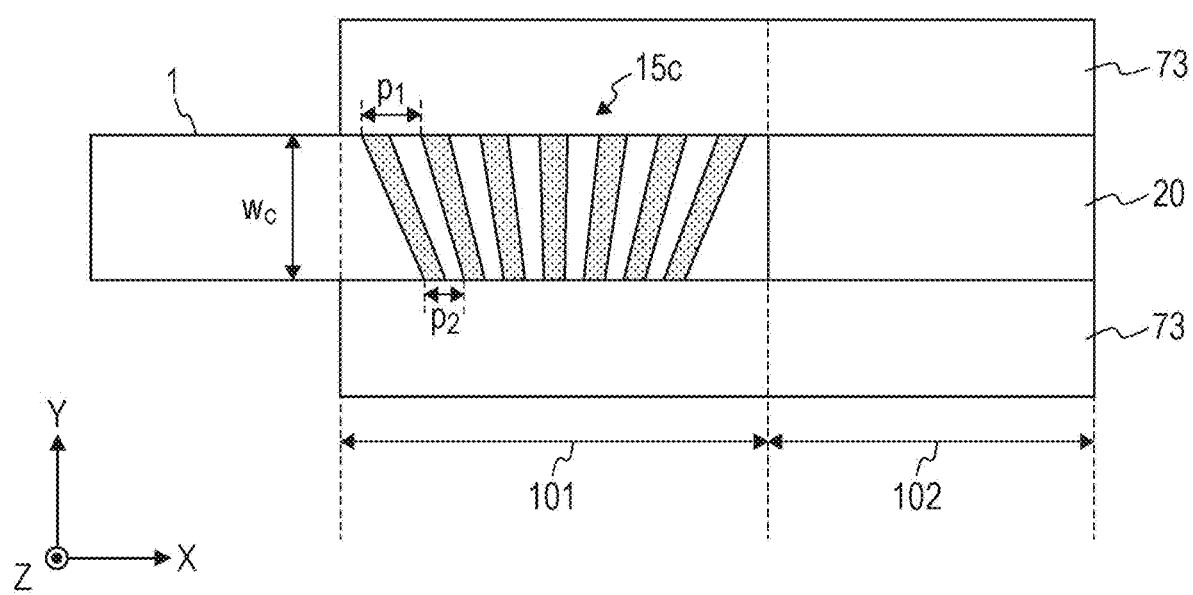
FIG. 25B is an illustration schematically showing an example in which the period of a grating varies continuously from $p_2$ to $p_1$ with a change in position in the Y direction.

FIG. 25B is an illustration schematically showing an example in which the period of a grating varies continuously from $p_2$ to $p_1$ with a change in position in the Y direction. In this case, $p_1$ is larger than $p_2$.

In the example shown in FIG. 25B, the propagation constant $\beta_1$ of a waveguide mode in the total reflection waveguide 1 is continuously shifted from $\beta_1-(2\pi/p_2)$ to $\beta_1-(2\pi/p_1)$ due to −first-order diffraction by the grating 15c. Therefore, even when there is a production error in the thickness $d_2$ of the optical waveguide layer 20, the guided light is coupled from the total reflection waveguide 1 into the slow light waveguide 10 at high efficiency so long as $p_1-(2\pi/p_2) \le \beta_2 \le p_1-(2\pi/p_1)$.

It is unnecessary that the plurality of gratings be spatially separated from each other. A grating may include a plurality of periodic components. In the present specification, even this case is interpreted as having "a plurality of gratings with different periods." The refractive index of the grating varies in the X direction. The periods of the plurality of periodic components satisfy formula (6).

Figure 26:
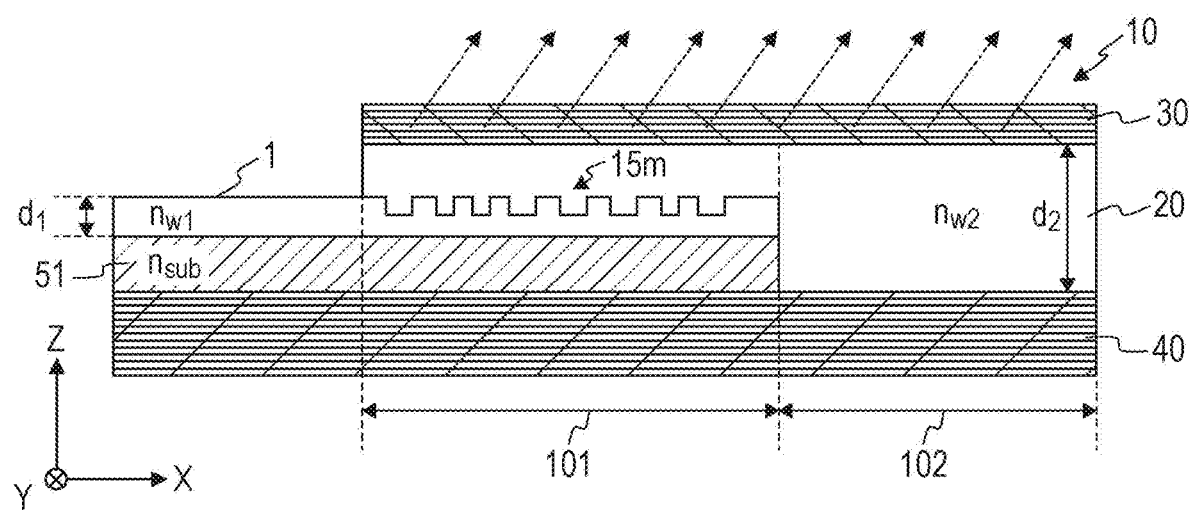
FIG. 26 is another illustration schematically showing an example in which a grating containing two period components is present.

FIG. 26 is an illustration schematically showing an example in which a grating with two periodic components is present. In the example shown in FIG. 26, two different types of periods are randomly arranged in a grating 15m.

Whether the grating 15m includes a plurality of periodic components can be known by subjecting spatial changes in the refractive index of the grating 15m to Fourier transformation. By subjecting the spatial changes n(x) in the refractive index to Fourier transformation, a Fourier component, $N(k) = \int n(x) \exp(-ikx) \, dx$, is obtained. For example, when two periods, a period $p_1$ and a period $p_2$, are present, the Fourier component N(k) has peaks at $k=(2\pi/p_1)m_1$ and $k=(2\pi/p_2)m_2$. $m_1$ and $m_2$ are integers.

Even when a plurality of gratings are present in the region 101, at least part of the optical waveguide layer 20 may have a structure whose refractive index and/or thickness can be adjusted, as described above. The optical device having a plurality of gratings may have any of the structures shown in FIGS. 19A to 21.

By forming an optical device including a plurality of sets of the total reflection waveguide 1 and the slow light waveguide 10, two-dimensional optical scanning can be performed. Such an optical scanning device includes a plurality of waveguide units arranged in the Y direction. Each of the waveguide units includes the above-described total reflection waveguide 1 and the above-described slow light waveguide 10. In this optical scanning device, a plurality of phase shifters are connected to the plurality of waveguide units. Each of the plurality of phase shifters includes a waveguide connected to the total reflection waveguide 1 of a corresponding one of the plurality of waveguide units directly or through another waveguide. By changing the differences in phase between light beams passing through the plurality of phase shifters, the Y direction component of the direction of the light emitted from the optical scanning device can be changed. A photoreceiver device can be formed using a similar structure.

Figure 27A:
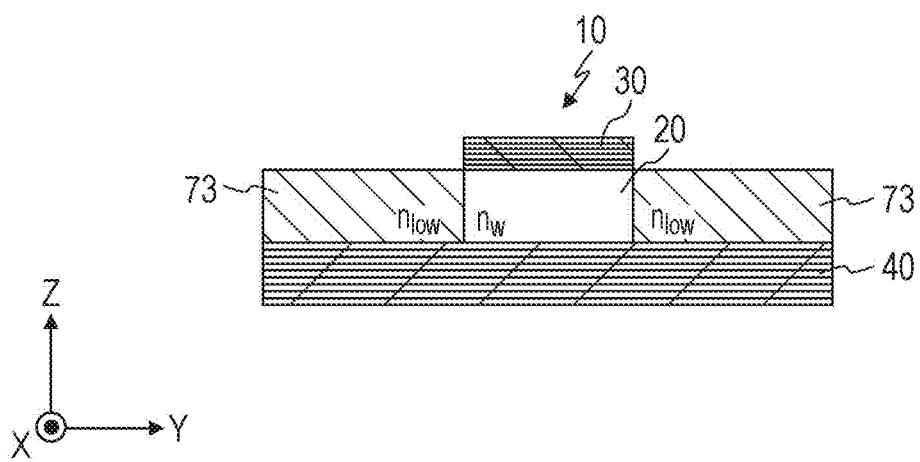
FIG. 27A is an illustration schematically showing a structural example in which spacers are disposed on both sides of an optical waveguide layer.

FIG. 27A is a cross-sectional view of a waveguide element 10 in the YZ plane, schematically showing a structural example in which non-waveguide regions 73 (hereinafter referred to also as "spacers 73") are disposed on both sides of an optical waveguide layer 20 located between a first mirror 30 and a second mirror 40. The refractive index $n_{low}$ of the spacers 73 is lower than the refractive index $n_w$ of the optical waveguide layer ($n_{low}<n_w$). The spacers 73 may be, for example, air. The spacers 73 may be, for example, $TiO_2$, $Ta_2O_5$, SiN, AlN, $SiO_2$, etc., so long as the spacers 73 have a lower refractive index than the optical waveguide layer.

Figure 27B:
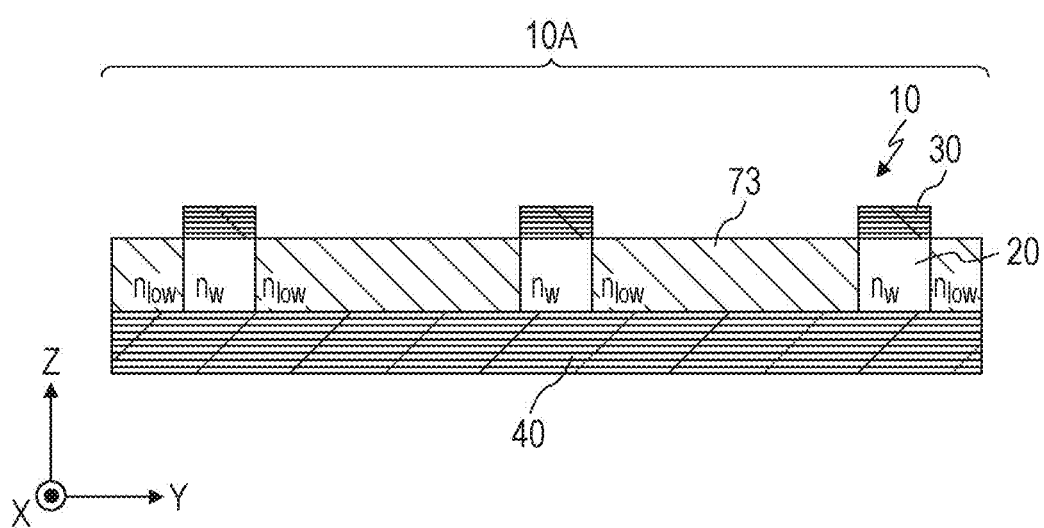
FIG. 27B is an illustration schematically showing a structural example of a waveguide array.

FIG. 27B is a cross-sectional view of an optical scanning device in the YZ plane, schematically showing a structural example of a waveguide array 10A in which the waveguide elements 10 in FIG. 27A are arranged in the Y direction. In the structural example in FIG. 27B, the width of the first mirrors 30 in the Y direction is the same as the width of the optical waveguide layers 20. When the width of the first mirror 30 is larger than the width of the optical waveguide layer 20, leakage of guided light from regions in which no first mirror 30 is present can be reduced. In an array of a plurality of waveguide elements 10 including a plurality of reflective waveguides, leakage of guided light can be prevented when at least one of the width of first mirrors 30 and the width of second mirrors 40 is larger than the width of the optical waveguide layers 20. However, such an idea has not been employed previously.

To improve light scanning performance, it is desirable to reduce the width of each of the waveguide elements 10 of the waveguide array 10A. However, in this case, the guided light leakage problem becomes more prominent.

Figure 28:
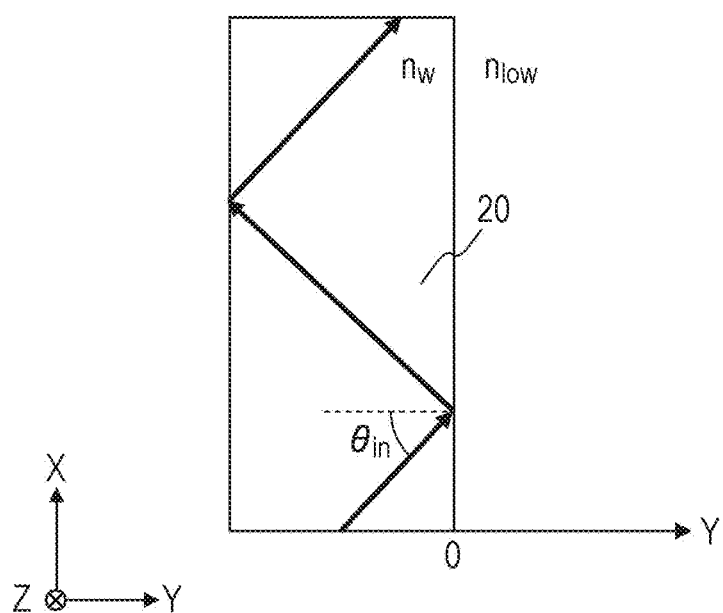
FIG. 28 is an illustration schematically showing propagation of guided light in an optical waveguide layer.

FIG. 28 is an illustration schematically showing propagation of guided light in the X direction within an optical waveguide layer 20. Since $n_w>n_{low}$, the guided light is confined by total reflection in the ±Y directions and propagates in the X direction. However, in practice, evanescent light leaks out from the Y direction edge surfaces of the optical waveguide layer 20. As shown in FIG. 2, the guided light propagates in the X direction at an angle smaller than the total reflection angle $\theta_{in}$ while reflected by the first mirror 30 and the second mirror 40 in the ±Z directions. In this case, in the regions with no first mirror 30 shown in FIG. 27B, the evanescent light is not reflected and leaks to the outside. This unintended light loss may cause the amount of light used for optical scanning to be reduced.

The above problem can be solved by setting at least one of the width of the first mirrors 30 in the arrangement direction of the plurality of waveguide elements 10 and the width of the second mirrors 40 to be larger than the width of the optical waveguide layers 20. This can reduce the unintended light loss described above. Therefore, a reduction in the amount of light used for optical scanning is prevented.

Figure 29A:
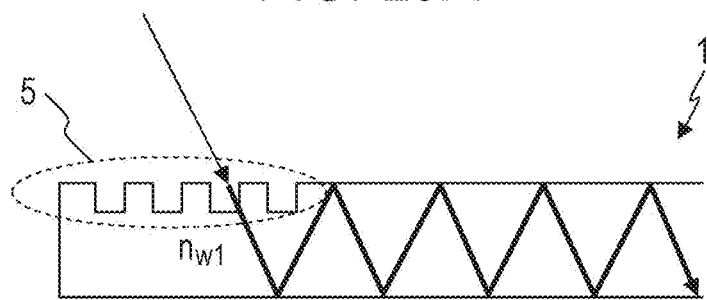
FIG. 29A is an illustration showing an example in which light is introduced into a first waveguide through a grating.
Figure 29B:
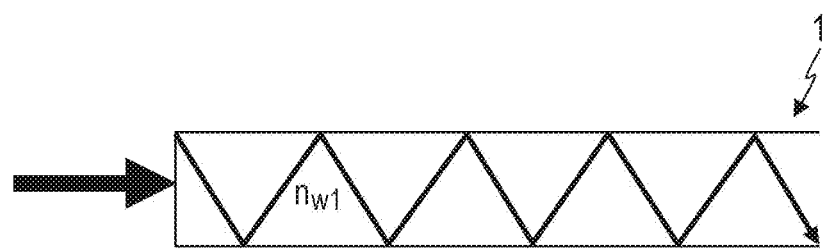
FIG. 29B is an illustration showing an example in which light is inputted from an end surface of the first waveguide.
Figure 29C:
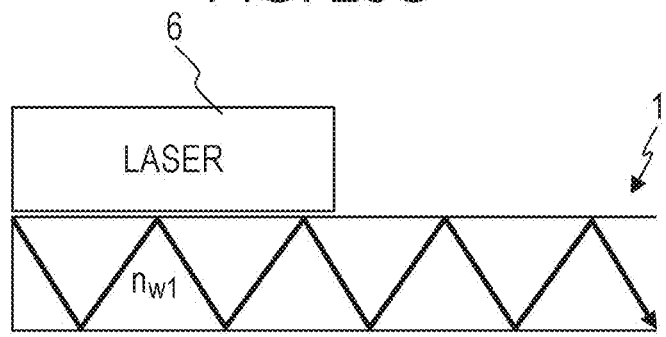
FIG. 29C is an illustration showing an example in which light is inputted from a laser light source to the first waveguide.

FIGS. 29A to 29C are illustrations showing examples of a method for inputting light into the first waveguide 1 in a structure configured such that the light is inputted to the first waveguide 1. FIG. 29A shows an example in which light is introduced into a first waveguide 1 through a grating 5 formed on a surface of the first waveguide 1. FIG. 29B shows an example in which light is inputted from an end surface of a first waveguide 1. FIG. 29C shows an example in which light is inputted from a laser light source 6 disposed on a surface of a first waveguide 1 through this surface. The structure shown in FIG. 29C is disclosed in, for example, M. Lamponi et al., "Low-Threshold Heterogeneously Integrated InP/SOI Lasers With a Double Adiabatic Taper Coupler," IEEE PHOTONICS TECHNOLOGY LETTERS, VOL. 24, NO. 1, Jan. 1, 2012, pp 76-78. The entire disclosure of this document is incorporated herein. With any of the above structures, light can be efficiently introduced into the waveguide 1.

Next, a description will be given of a structure for implementing two-dimensional optical scanning using a plurality of pairs of the first and second waveguides 1 and 10 in the present embodiment (these are referred to as "waveguide units" in the present specification). An optical scanning device that can implement two-dimensional scanning includes: a plurality of waveguide units arranged in a first direction; and an adjusting element (e.g., a combination of an actuator and a control circuit) that controls the waveguide units. The adjusting element changes the refractive index or thickness, or both, of the optical waveguide layer 20 of the second waveguide 10 of each of the waveguide units. In this manner, the direction of light emitted from the second waveguides 10 can be changed. When light beams with appropriately controlled phase differences are inputted to the second waveguides 10 of the plurality of waveguide units, two-dimensional optical scanning can be performed as described with reference to FIG. 1. An embodiment for implementing two-dimensional scanning will next be described in more detail.

<Operating Principle of Two-Dimensional Scanning>

In a waveguide array in which a plurality of waveguide elements (i.e., second waveguides) 10 are arranged in one direction, interference of light beams emitted from the waveguide elements 10 causes the emission direction of the light to change. By controlling the phases of the light beams to be supplied to the waveguide elements 10, the emission direction of the light can be changed. The principle of this will next be described.

Figure 30A:
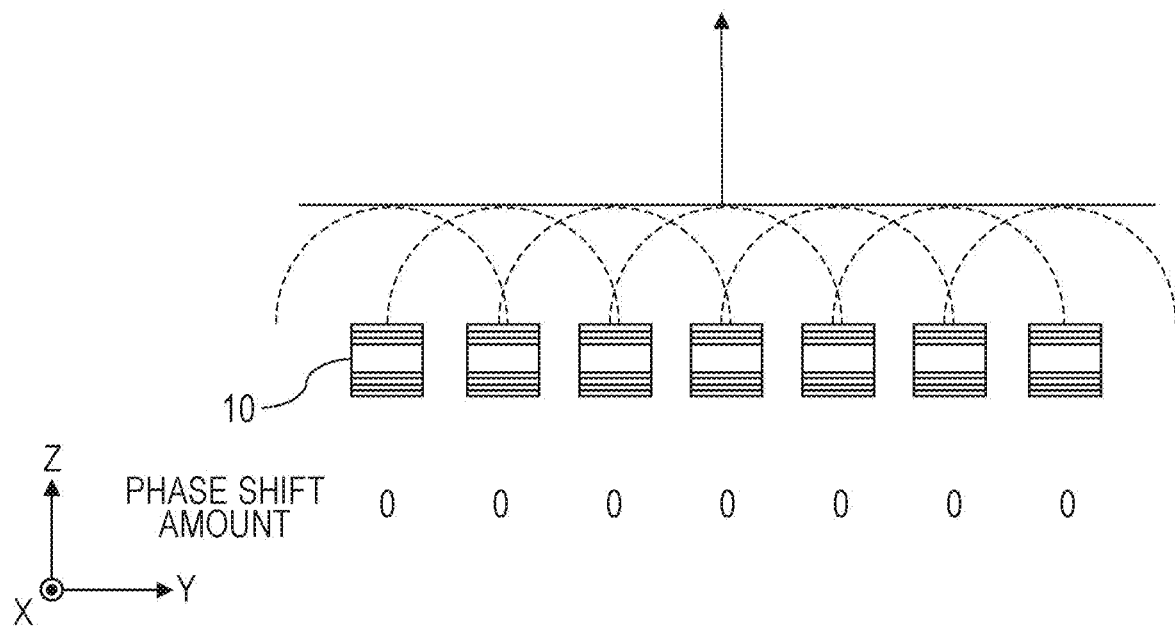
FIG. 30A is an illustration showing a cross section of a waveguide array that emits light in a direction perpendicular to the emission surface of the waveguide array.

FIG. 30A is an illustration showing a cross section of the waveguide array that emits light in a direction perpendicular to the emission surface of the waveguide array. In FIG. 30A, phase shift amounts of the light beams propagating through the waveguide elements 10 are shown. The phase shift amounts are values with respect to the phase of a light beam propagating through the leftmost waveguide element 10. The waveguide array in the present embodiment includes the plurality of waveguide elements 10 arranged at regular intervals. In FIG. 30A, broken line arcs represent wave fronts of the light beams emitted from the waveguide elements 10. A straight line represents a wave front formed as a result of interference of the light beams. An arrow represents the direction of the light emitted from the waveguide array (i.e., the direction of the wave vector). In the example in FIG. 30A, the phases of the light beams propagating through the optical waveguide layers 20 of the waveguide elements 10 are the same. In this case, the light is emitted in a direction (the Z direction) perpendicular to the arrangement direction (the Y direction) of the waveguide elements 10 and to the extending direction (the X direction) of the optical waveguide layers 20.

Figure 30B:
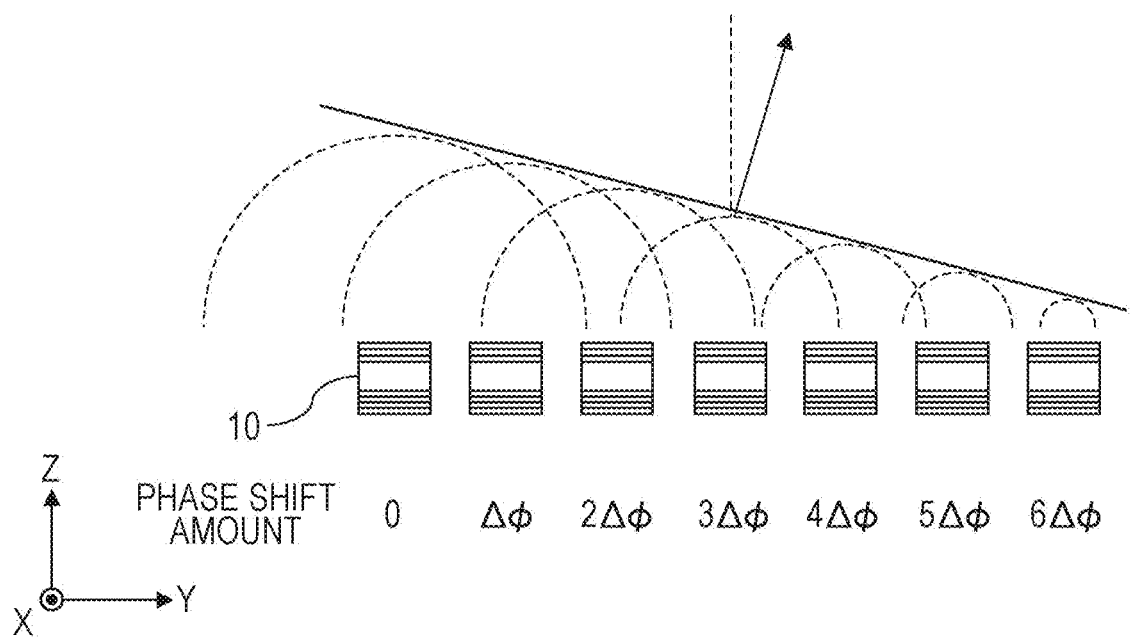
FIG. 30B is an illustration showing a cross section of a waveguide array that emits light in a direction different from the direction perpendicular to the emission surface of the waveguide array.

FIG. 30B is an illustration showing a cross section of the waveguide array that emits light in a direction different from the direction perpendicular to the emission surface of the waveguide array. In the example in FIG. 30B, the phases of the light beams propagating through the optical waveguide layers 20 of the plurality of waveguide elements 10 differ from each other in the arrangement direction by a constant amount ($\Delta\phi$). In this case, light is emitted in a direction different from the Z direction. By changing $\Delta\phi$, the Y direction component of the wave vector of the light can be changed.

The direction of the light emitted from the waveguide array to the outside (air in this case) can be quantitatively discussed as follows.

FIG. 31 is a perspective view schematically showing the waveguide array in a three-dimensional space. In the three-dimensional space defined by mutually orthogonal X, Y, and Z directions, a boundary surface between the waveguide array and a region to which light is emitted to air is set to be $Z=z_0$. The boundary surface contains the emission surfaces of the plurality of waveguide elements 10. In a region in which $Z<z_0$ holds, the plurality of waveguide elements 10 are arranged in the Y direction at regular intervals and extend in the X direction. In a region in which $Z>z_0$ holds, the electric-field vector E(x, y, z) of light emitted to air is represented by formula (7) below.

$$E(x,y,z) = E_0 \exp[-j(k_x x + k_y y + k_z z)] \quad (7)$$

Here, $E_0$ is the amplitude vector of the electric field. $k_x$, $k_y$, and $k_z$ are the wave numbers in the X, Y, and Z directions, respectively, and j is the imaginary unit. In this case, the direction of the light emitted to air is parallel to a wave vector ($k_x$, $k_y$, $k_z$) indicated by a thick arrow in FIG. 31. The magnitude of the wave vector is represented by formula (8) below.

$$\sqrt{k_x^2 + k_y^2 + k_z^2} = \frac{2\pi}{\lambda} \quad (8)$$

From the boundary condition for the electric field at $Z=z_0$, wave vector components $k_x$ and $k_y$ parallel to the boundary surface agree with the wave numbers of light in the X and Y directions, respectively, in the waveguide array. This corresponds to the condition in which the wavelengths, in the plane directions, of the light on the air side at the boundary surface agree with the wavelengths, in the plane directions, of the light on the waveguide array side, as in the Snell's law in formula (2).

$k_x$ is equal to the wave number of the light propagating through the optical waveguide layer 20 of a waveguide element 10 extending in the X direction. In the waveguide element 10 shown in FIG. 2 above, $k_x$ is represented by formula (9) below using formulas (2) and (3).

$$k_x = \frac{2\pi}{\lambda} n_w \sin\theta_w = \frac{2\pi}{\lambda} \sqrt{n_w^2 - \left(\frac{m\lambda}{2d}\right)^2} \quad (9)$$

$k_y$ is derived from the phase difference between light beams in two adjacent waveguide elements 10. The centers of N waveguide elements 10 arranged in the Y direction at regular intervals are denoted by $y_q$ (q=0, 1, 2, . . . , N−1), and the distance (center-to-center distance) between two adjacent waveguide elements 10 is denoted by p. In this case, the electric-field vectors (formula (7)) of light emitted to air at $y_q$ and $y_{q+1}$ on the boundary surface (Z=$z_0$) satisfy formula (10) below.

$$E(x,y_{q+1},z_0)=\exp[-jk_y(y_{q+1}-y_q)]E(x,y_q,z_0)= \exp[-jk_yp]E(x,y_q,z_0) \quad (10)$$

When the phases in any two adjacent waveguide elements 10 are set such that the phase difference is $\Delta\phi=k_y p$ (constant), $k_y$ satisfies the relation of formula (11) below.

$$k_y = \frac{\Delta\phi}{p} \quad (11)$$

In this case, the phase of light at $y_q$ is represented by $\phi_q=\phi_0+q\Delta\phi(\phi_{q+1}-\phi_q=\Delta\phi)$. Specifically, the phase $\phi_q$ is constant ($\Delta\phi$=0), linearly increases in the Y direction ($\Delta\phi$>0), or linearly decreases in the Y direction ($\Delta\phi$<0). When the waveguide elements 10 are arranged in the Y direction at non-regular intervals, the phases at $y_q$ and $y_{q+1}$ may be set such that, for example, the phase difference for a given $k_y$ is $\Delta\phi q=*q+1-*q=k_y(y_q+1-y_q)$. In this case, the phase of the light at $y_q$ is represented by $\Delta\phi_q=\phi_0+k_y(y_q-y_0)$. Using $k_x$ and $k_y$ obtained from formulas (10) and (11), respectively, $k_z$ is derived from formula (8). The emission direction of the light (i.e., the direction of the wave vector) can thereby be obtained.

For example, as shown in FIG. 31, the angle between the wave vector ($k_x$, $k_y$, $k_z$) of the emitted light and a vector (0, $k_y$, $k_z$) obtained by projecting the wave vector onto the YZ plane is denoted by θ. θ is the angle between the wave vector and the YZ plane. θ is represented by formula (12) below using formulas (8) and (9).

$$\sin\theta = \frac{k_x}{\sqrt{k_x^2+k_y^2+k_z^2}} = \frac{\lambda}{2\pi}k_x = \sqrt{n_w^2 - \left(\frac{m\lambda}{2d}\right)^2} \quad (12)$$

Formula (12) is exactly the same as formula (3) derived when the emitted light is restricted to be parallel to the XZ plane. As can be seen from formula (12), the X component of the wave vector changes depending on the wavelength of the light, the refractive index of the optical waveguide layers 20, and the thickness of the optical waveguide layers 20.

Similarly, as shown in FIG. 31, the angle between the wave vector ($k_x$, $k_y$, $k_z$) of the emitted light (zeroth-order light) and a vector ($k_x$, 0, $k_z$) obtained by projecting the wave vector onto the XZ plane is denoted by $\alpha_0$. $\alpha_0$ is the angle between the wave vector and the XZ plane. $\alpha_0$ is represented by formula (13) below using formulas (8) and (9).

$$\sin\alpha_0 = \frac{k_y}{\sqrt{k_x^2+k_y^2+k_z^2}} = \frac{\lambda}{2\pi}k_y = \frac{\Delta\phi\lambda}{2\pi p} \quad (13)$$

As can be seen from formula (13), the Y component of the wave vector of the light changes depending on the phase difference $\Delta\phi$ of the light.

As described above, θ and $\alpha_0$ obtained from formulas (12) and (13), respectively, may be used instead of the wave vector ($k_x$, $k_y$, $k_z$) to identify the emission direction of the light. In this case, the unit vector representing the emission direction of the light can be represented by (sin θ, sin $\alpha_0$, $(1-\sin^2\alpha_0-\sin^2\theta)^{1/2}$). For light emission, all these vector components must be real numbers, and therefore $\sin^2\alpha_0+\sin^2\theta\le 1$ is satisfied. Since $\sin^2\alpha_0\le 1-\sin^2\theta=\cos^2\theta$, the emitted light is changed within an angle range in which $-\cos\theta\le\sin\alpha_0\le\cos\theta$ is satisfied. Since $-1\le\sin\alpha_0<1$, the emitted light is changed within the angle range of $-90°\le\alpha_0\le 90°$ at θ=0°. However, as θ increases, cos θ decreases, so that the angle range of $\alpha_0$ is narrowed. When θ=90° (cos θ=0), light is emitted only at $\alpha_0$=0°.

The two-dimensional optical scanning in the present embodiment can be implemented using at least two waveguide elements 10. When the number of waveguide elements 10 is small, the divergence angle $\Delta\alpha$ of $\alpha_0$ is large. As the number of waveguide elements 10 increases, $\Delta\alpha$ decreases. This can be explained as follows. For the sake of simplicity, θ is assumed to be 0° in FIG. 31. Specifically, the emission direction of the light is parallel to the YZ plane.

Assume that light beams having the same emission intensity and the above-described phases $\phi_q$ are emitted from N waveguide elements 10 (N is an integer of 2 or more). In this case, the absolute value of the total amplitude distribution of the light beams (electric fields) emitted from the N waveguide elements 10 in a far field is proportional to F(u) represented by formula (14) below.

$$F(u) = \left|\frac{\sin(Nu/2)}{\sin(u/2)}\right| \quad (14)$$

Here, u is represented by formula (15) below.

$$u = \frac{2\pi p}{\lambda}(\sin\alpha - \sin\alpha_0) \quad (15)$$

Here, α is the angle between the Z axis and a line connecting the origin and an observation point in the YZ plane. $\alpha_0$ satisfies formula (13). F(u) in formula (14) is N (maximum) when u=0 ($\alpha$=$\alpha_0$) and is 0 when u=±2π/N. Let the angle satisfying u=−2π/N be $\alpha_1$, and the angle satisfying u=2π/N be $\alpha_2$ ($\alpha_1<\alpha_0<\alpha_2$). Then the divergence angle of $\alpha_0$ is $\Delta\alpha=\alpha_2-\alpha_1$. A peak within the range of −2π/N<u<2π/N ($\alpha_1<\alpha<\alpha_2$) is generally referred to as a main lobe. A plurality of small peaks referred to as side lobes are present on both sides of the main lobe. By comparing the width $\Delta u=4\pi/N$ of the main lobe and $\Delta u=2\pi p\Delta(\sin\alpha)/\lambda$ obtained from formula (15), $\Delta(\sin\alpha)=2\lambda/(Np)$ is obtained. When $\Delta\alpha$ is small, $\Delta(\sin\alpha)=\sin\alpha_2-\sin\alpha_1=[(\sin\alpha_2-\sin\alpha_1)/(\alpha_2-\alpha_1)]\Delta\alpha\approx[d(\sin\alpha)/d\alpha]_{\alpha=\alpha 0}\Delta\alpha=\cos\alpha_0\Delta\alpha$. Therefore, the divergence angle is represented by formula (16) below.

$$\Delta\alpha = \frac{2\lambda}{Np\cos\alpha_0} \quad (16)$$

Thus, as the number of waveguide elements 10 increases, the divergence angle $\Delta\alpha$ decreases, and high resolution optical scanning can be performed on a distant target. The same discussion is applicable to the case when $\theta \neq 0°$ in FIG. 31.

<Diffracted Light Emitted from Waveguide Array>

In addition to the zeroth-order light beam, higher-order diffracted light beams may be emitted from the waveguide array. For the sake of simplicity, $\theta$ is assumed to be $0°$ in FIG. 31. Specifically, the emission direction of the diffracted light is parallel to the YZ plane.

Figure 32A:
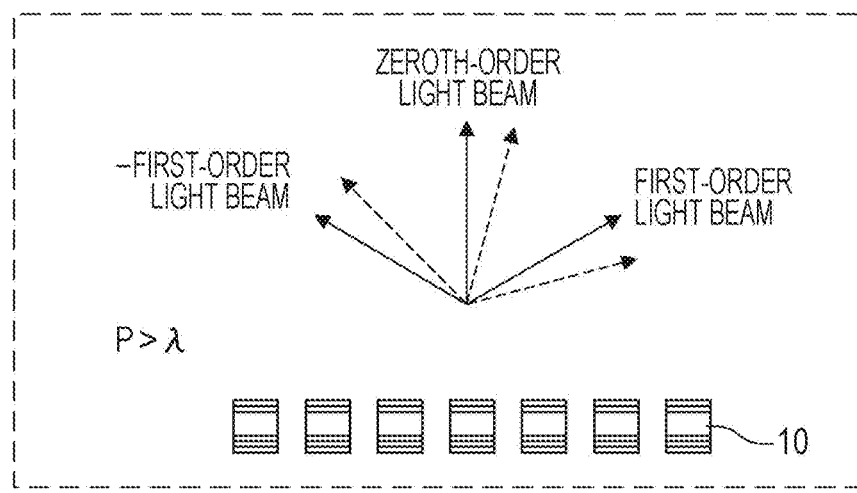
FIG. 32A is a schematic diagram showing how diffracted light is emitted from the waveguide array when p is larger than $\lambda$.

FIG. 32A is a schematic diagram showing how diffracted light is emitted from the waveguide array when p is larger than $\lambda$. In this case, when there is no phase shift ($\alpha_0 = 0°$), zeroth-order and ±first-order light beams are emitted in directions indicated by solid arrows shown in FIG. 32A (higher-order diffracted light beams may be emitted, but this depends on the magnitude of p). When a phase shift is given to this state ($\alpha_0 \neq 0°$), the emission angles of the zeroth-order and ±first-order light beams rotate in the same rotation direction as shown by broken line arrows in FIG. 32A. Higher-order light beams such as the ±first-order light beams can be used for beam scanning. However, to configure a simpler device, only the zeroth-order light beam is used. To avoid a reduction in gain of the zeroth-order light beam, the distance p between two adjacent waveguide elements 10 may be reduced to be less than $\lambda$ to suppress the emission of higher-order light beams. Even when $p > \lambda$, only the zeroth-order light beam can be used by physically blocking the higher-order light beams.

Figure 32B:
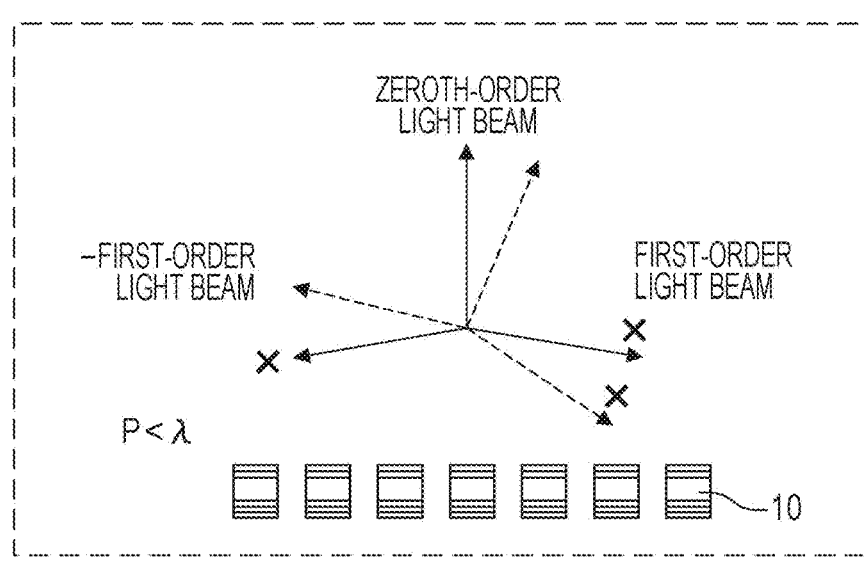
FIG. 32B is a schematic diagram showing how diffracted light is emitted from the waveguide array when p is smaller than $\lambda$.

FIG. 32B is a schematic diagram showing how diffracted light is emitted from the waveguide array when p is smaller than $\lambda$. In this case, when there is no phase shift ($\alpha_0 = 0°$), no higher-order light beams are present because the diffraction angles of the higher-order light beams exceed 90 degrees, and only the zeroth-order light beam is emitted forward. However, in the case where p is close to $\lambda$, when a phase shift is given ($\alpha_0 \neq 0°$), the emission angles change, and the ±first-order light beams may be emitted.

Figure 32C:
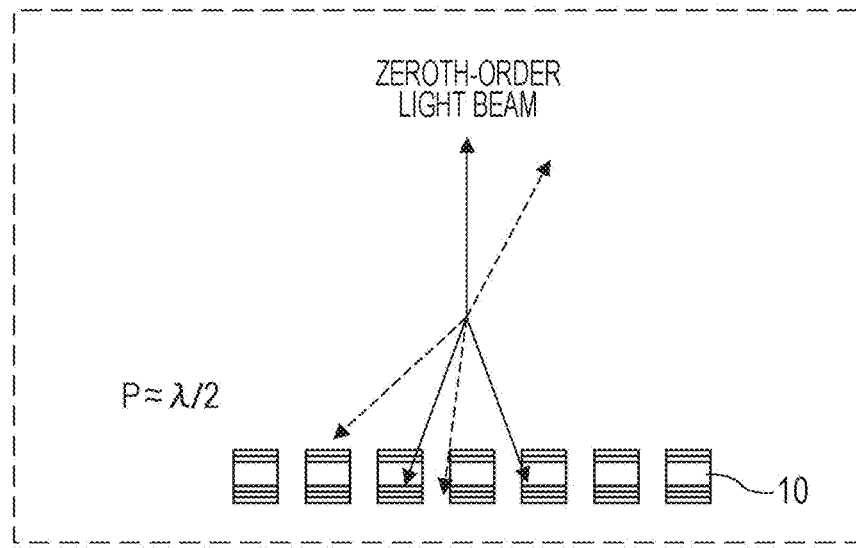
FIG. 32C is a schematic diagram showing how diffracted light is emitted from the waveguide array when p is substantially equal to $\lambda/2$.

FIG. 32C is a schematic diagram showing how diffracted light is emitted from the waveguide array when $p \approx \lambda/2$. In this case, even when a phase shift is given ($\alpha_0 \neq 0°$), the ±first-order light beams are not emitted. Even when the ±first-order light beams are emitted, they are emitted at considerably large angles. When $p < \lambda/2$, even when a phase shift is given, no higher-order light beams are emitted. However, even when p is further reduced, no particular advantage is expected. Therefore, p may be set to be, for example, $\lambda/2$ or more.

The relation between the zeroth-order light beam and ±first-order light beams emitted to air in FIGS. 32A to 32C can be quantitively explained as follows. F(u) in formula (14) is $F(u) = F(u + 2\pi)$ and is a function with a period of $2\pi$. When $u = \pm 2m\pi$, $F(u) = N$ (maximum). In this case, ±m-th order light beams are emitted at emission angles $\alpha$ satisfying $u = \pm 2m\pi$. Peaks around $u = \pm 2m\pi (m \neq 0)$ (peak width: $\Delta u = 4\pi/N$) are referred to as grating lobes.

Only ±first-order light beams contained in higher-order light are considered ($u = \pm 2\pi$). The emission angles $\alpha_\pm$ of the ±first-order light beams satisfy formula (17) below.

$$\sin\alpha_\pm = \sin\alpha_0 \pm \frac{\lambda}{p} \quad (17)$$

$p < \lambda/(1 - \sin\alpha_0)$ is obtained from the condition $\sin\alpha_0 > 1$ indicating that the +first-order light beam is not emitted.

Similarly, $p < \lambda/(1 + \sin\alpha_0)$ is obtained from the condition $\sin\alpha_0 < -1$ indicating that the −first-order light beam is not emitted.

Conditions indicating whether or not the ±first-order light beams are emitted in addition to the zeroth-order light beam at an emission angle $\alpha_0$ ($>0$) are classified as follows. When $p \geq \lambda/(1 - \sin\alpha_0)$, both ±first-order light beams are emitted. When $\lambda/(1 + \sin\alpha_0) \leq p < \lambda/(1 - \sin\alpha_0)$, the +first-order light beam is not emitted, but the −first-order light beam is emitted. When $p < \lambda/(1 + \sin\alpha_0)$, the ±first-order light beams are not emitted. In particular, when $p < \lambda/(1 + \sin\alpha_0)$ is satisfied, the ±first-order light beams are not emitted even when $\theta \neq 0°$ in FIG. 31. For example, to achieve scanning over 10° on one side when the ±first-order light beams are not emitted, $\alpha_0$ is set to 10°, and p is set such that the relation $p \leq \lambda/(1 + \sin 10°) \approx 0.85\lambda$ is satisfied. For example, by combining this formula and the above-described lower limit of p, $\lambda/2 \leq p \leq V/(1 + \sin 10°)$ is satisfied.

However, to satisfy the condition that the ±first-order light beams are not emitted, p must be very small. This makes it difficult to produce the waveguide array. Therefore, it is contemplated that the angle range of $0° < \alpha_0 < \alpha_{max}$ is scanned with the zeroth-order light beam irrespective of the presence or absence of the ±first-order light beams. However, it is assumed that the ±first-order light beams are not present in this angle range. To satisfy this condition, the emission angle of the +first-order light beam when $\alpha_0 = 0°$ must be $\alpha + \geq \alpha_{max}$ (i.e., $\sin\alpha + = (\lambda/p) \geq \sin\alpha_{max}$), and the emission angle of the −first-order light beam when $\alpha_0 = \alpha_{max}$ must be $\alpha - \leq 0$ (i.e., $\sin\alpha - = \sin\alpha_{max} - (\lambda/p) \leq 0$). These restrictions give $p \leq \lambda/\sin\alpha_{max}$.

As can be seen from the above discussion, the maximum value $\alpha_{max}$ of the emission angle $\alpha_0$ of the zeroth-order light beam when the first-order light beams are not present within the scanning angle range satisfies formula (18) below.

$$\sin\alpha_{max} = \frac{\lambda}{p} \quad (18)$$

For example, to achieve scanning over 10° on one side when the ±first-order light beams are not present within the scanning angle range, $\alpha_{max}$ is set to 10°, and p is set such that $p \leq \lambda/\sin 10° \approx 5.76\lambda$ is satisfied. For example, by combining this formula and the above-described condition for the lower limit of p, p satisfies $\lambda/2 \leq p \leq \lambda/\sin 10°$. Since this upper limit of p ($p \approx 5.76\lambda$) is sufficiently larger than the upper limit ($p \approx 0.85\lambda$) when the ±first-order light beams are not emitted, the waveguide array can be produced relatively easily. When the light used is not single-wavelength light, $\lambda$ is the center wavelength of the light used.

As described above, to scan over a wider angle range, it is necessary to reduce the distance p between waveguides. However, to reduce the divergence angle $\Delta\alpha$ of the emitted light in formula (16) when p is small, it is necessary to increase the number of waveguides in the array. The number of waveguides in the array is appropriately determined according to its intended application and the required performance. The number of waveguides in the array may be, for example, 16 or more and may be 100 or more in some applications.

<Phase Control of Light Introduced into Waveguide Array>

To control the phase of light emitted from each waveguide element 10, a phase shifter that changes the phase of the light before introduction into the waveguide element 10 may be disposed, for example, upstream of the waveguide element 10. The optical scanning device 100 in the present embodiment further includes a plurality of phase shifters connected to the respective waveguide elements 10 and a second adjusting element that changes the phases of light beams propagating through of the phase shifters. Each phase shifter includes a waveguide that is connected to the optical waveguide layer 20 of a corresponding one of the plurality of waveguide elements 10 directly or through another waveguide. The second adjusting element changes the phase differences between the light beams propagating from the plurality of phase shifters to the plurality of waveguide elements 10 to thereby change the direction (i.e., the third direction D3) of light emitted from the plurality of waveguide elements 10. In the following description, the plurality of arranged phase shifters may be referred to as a "phase shifter array," as in the case of the waveguide array.

Figure 33:
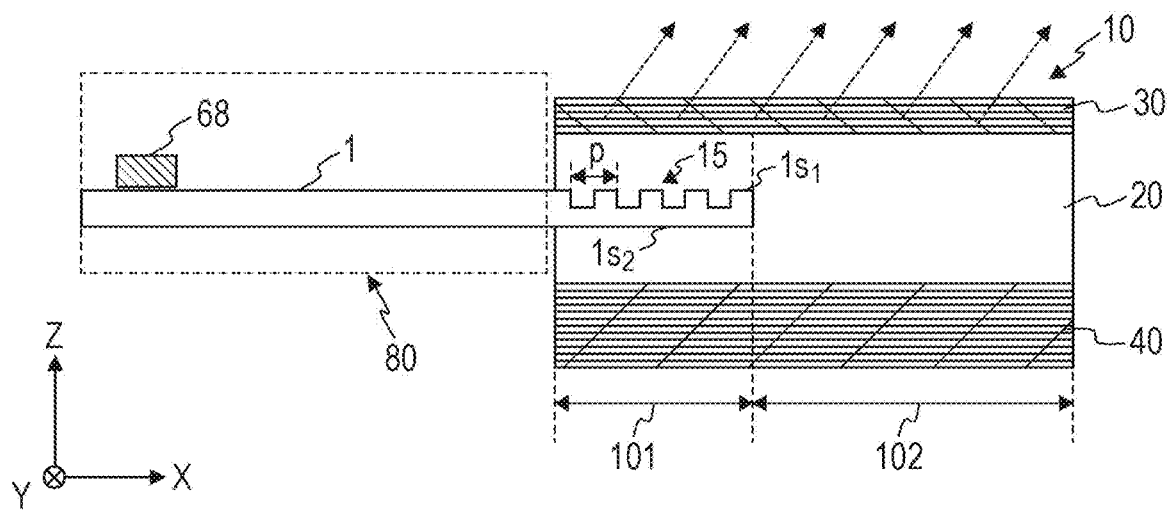
FIG. 33 is a schematic diagram showing an example of a structure in which a phase shifter is directly connected to a waveguide element.

FIG. 33 is a schematic diagram showing an example of a structure in which a phase shifter 80 is connected directly to a waveguide element 10. In FIG. 33, a portion surrounded by a broken line frame corresponds to the phase shifter 80. This phase shifter 80 includes the above-described total reflection waveguide 1 and a heater 68 disposed near the total reflection waveguide 1. The heater 68 is controlled by an external control circuit and generates heat to thereby change the refractive index of the waveguide 1. The phase of light propagating through the waveguide 1 is thereby changed. In this example, the phase shifter 80 includes the above-described "first waveguide." The "first waveguide" may serve as the phase shifter as described above.

The structure of the phase shifter 80 is not limited to the structure in FIG. 33. The phase shifter 80 may include an additional waveguide having a variable refractive index and connected to the waveguide 1. In this case, by modulating the refractive index of the additional waveguide, a phase shift can be generated. The additional waveguide may be a slow light waveguide similar to the waveguide element 10. The refractive index can be modulated by the same method as that for the waveguide element 10.

Figure 34:
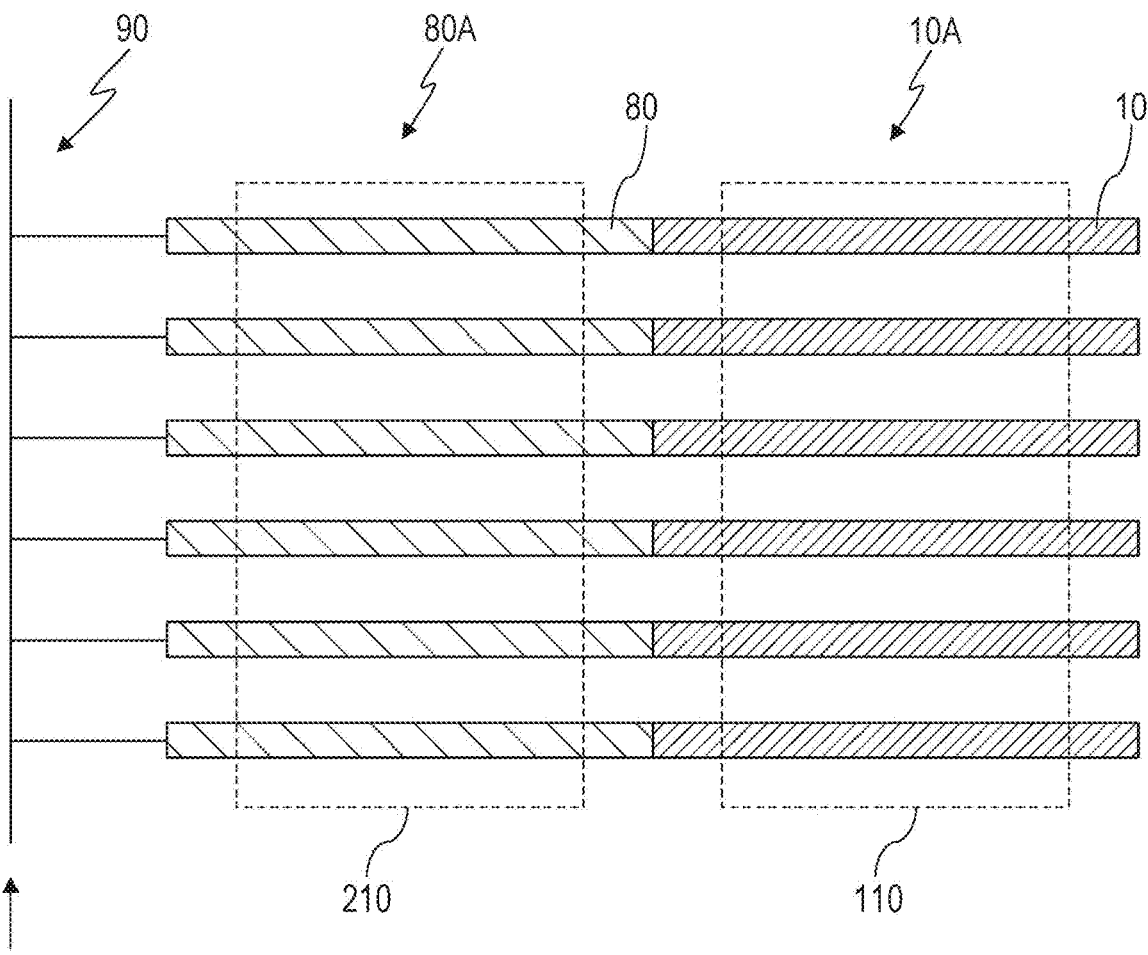
FIG. 34 is a schematic diagram showing a waveguide array and a phase shifter array as viewed in a direction normal to a light-emission surface (in the Z direction)

FIG. 34 is a schematic diagram of a waveguide array 10A and a phase shifter array 80A as viewed in a direction normal to a light-emission surface (in the Z direction). In the example shown in FIG. 34, all the phase shifters 80 have the same propagation characteristics, and all the waveguide elements 10 have the same propagation characteristics. The phase shifters 80 may have the same length or may have different lengths, and the waveguide elements 10 may have the same length or may have different lengths. When the phase shifters 80 have the same length, a driving voltage, for example, may be changed to control the phase shift amount of each of the phase shifters 80. When the phase shifters 80 have lengths that differ in equal steps, the same driving voltage can be used to give phase shifts that differ in equal steps. This optical scanning device 100 further includes an optical divider 90 that divides light and supplies divided light beams to the plurality of phase shifters 80, a first driving circuit 110 that drives each of the waveguide elements 10, and a second driving circuit 210 that drives each of the phase shifters 80. A straight arrow in FIG. 34 indicates light input. The first driving circuit 110 and the second driving circuit 210 that are disposed separately are controlled independently to implement two-dimensional scanning. In this example, the first driving circuit 110 serves as a component of the first adjusting element, and the second driving circuit 210 serves as a component of the second adjusting element.

As described later, the first driving circuit 110 changes at least one of the refractive index and thickness of the optical waveguide layer 20 of each of the waveguide elements 10 to thereby change the angle of light emitted from the optical waveguide layer 20. As described later, the second driving circuit 210 changes the refractive index of the waveguide 20a of each of the phase shifters 80 to thereby change the phase of light propagating inside the waveguide 20a. The optical divider 90 may be composed of waveguides in which light propagates by total reflection or reflective waveguides similar to the waveguide elements 10.

The phases of light beams divided by the optical divider 90 may be controlled, and then the resulting light beams may be introduced into the phase shifters 80. To control the phases, for example, a passive phase control structure in which the lengths of waveguides connected to the phase shifters 80 are adjusted to control the phases of the light beams may be used. Alternatively, phase shifters that have the same function as the phase shifters 80 and are controllable using an electric signal may be used. By using any of these methods, the phases of the light beams may be adjusted before they are introduced into the phase shifters 80 such that, for example, light beams having the same phase are supplied to all the phase shifters 80. By adjusting the phases as described above, the second driving circuit 210 can control each of the phase shifters 80 in a simpler manner.

Figure 35:
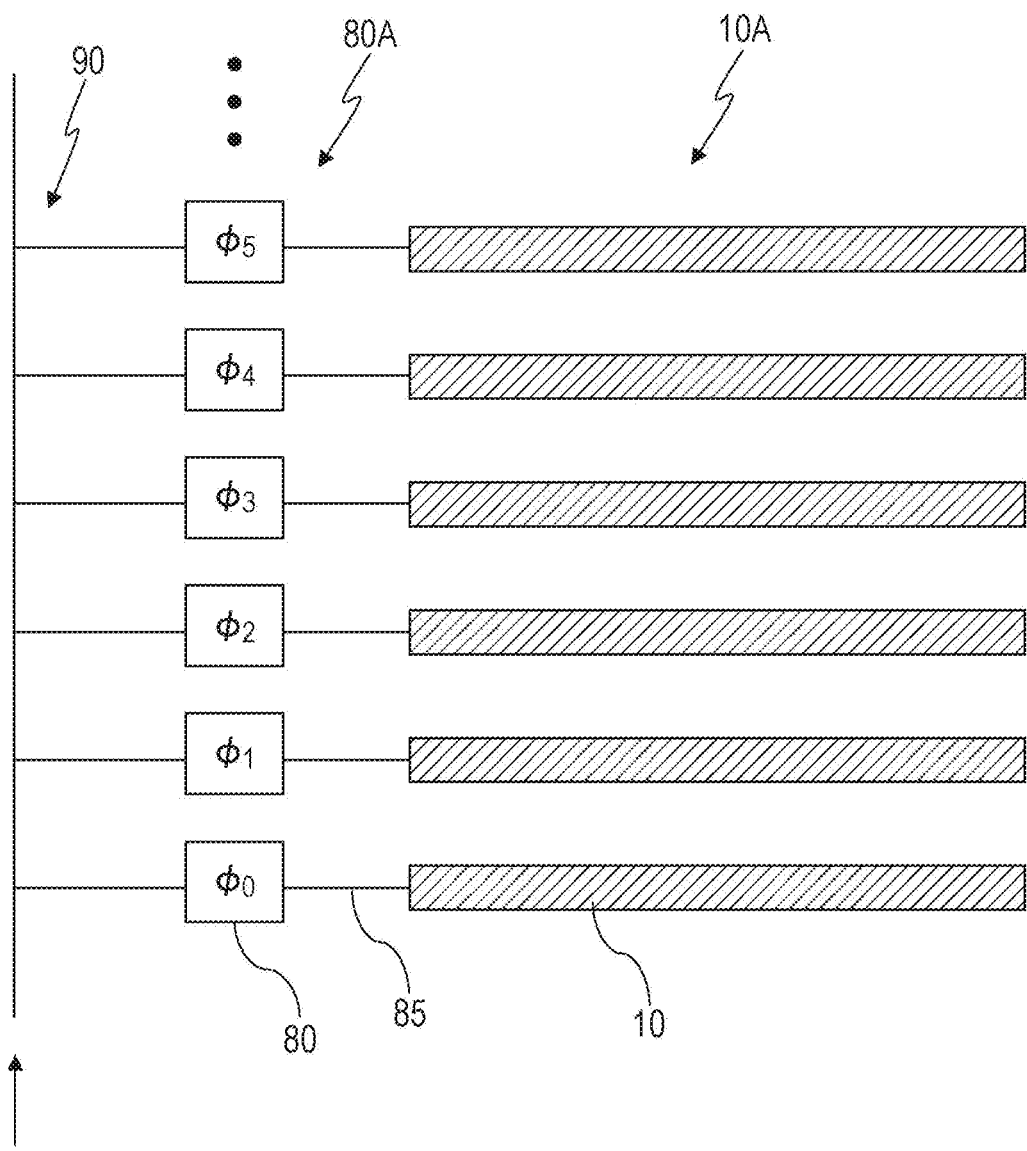
FIG. 35 is an illustration schematically showing an example of a structure in which waveguides of phase shifters are connected to optical waveguide layers of waveguide elements through additional waveguides.

FIG. 35 is an illustration schematically showing an example of a structure in which the waveguides of the phase shifters 80 are connected to the optical waveguide layers 20 of the waveguide elements 10 through additional waveguides 85. Each of the additional waveguides 85 may be any of the above-described first waveguides 1. Each phase shifter 80 may have the same structure as the phase shifter 80 shown in FIG. 33 or may have a different structure. In FIG. 35, the phase shifters 80 are simply represented by symbols $\phi_0$ to $\phi_5$ that indicate the phase shift amounts. The same representation may be used in later figures. A waveguide that can propagate light using total reflection may be used for each phase shifter 80.

Figure 36:
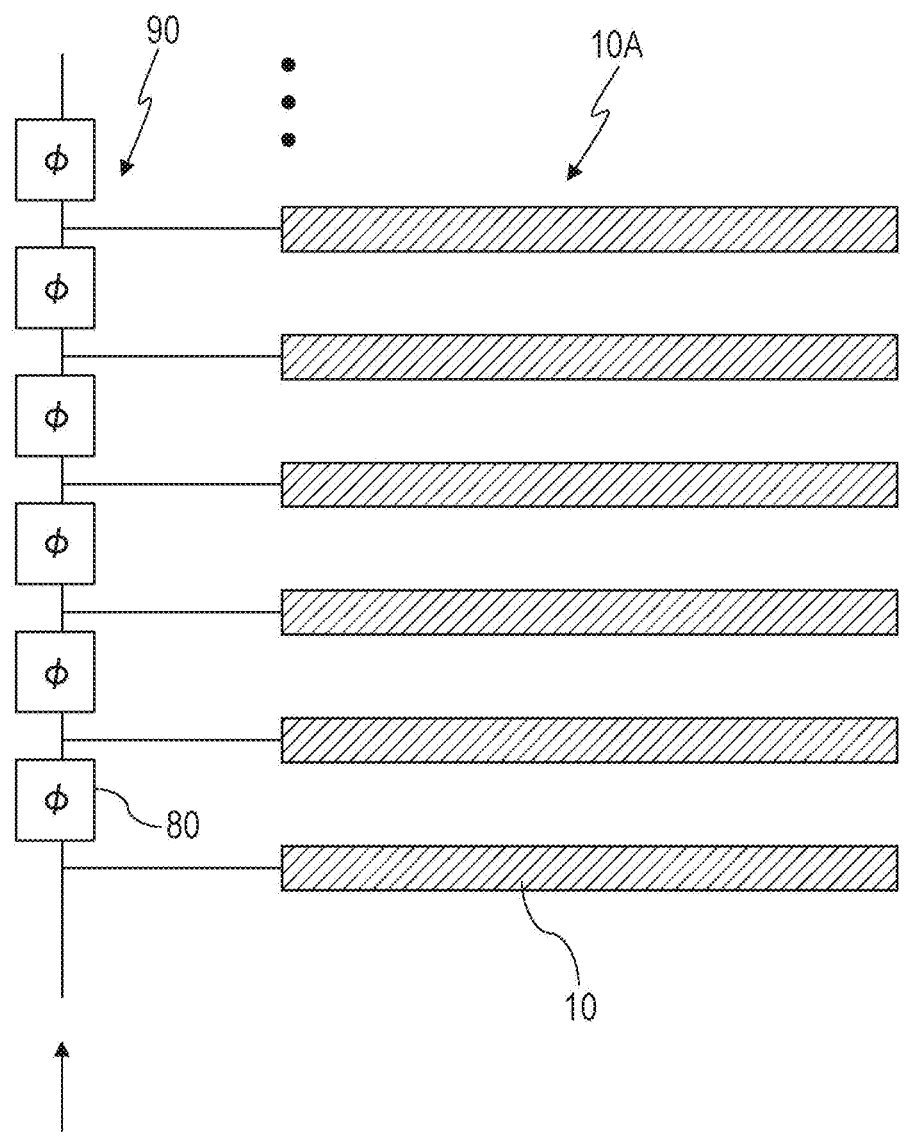
FIG. 36 is an illustration showing a structural example in which a plurality of phase shifters arranged in a cascaded manner are inserted into an optical divider.

FIG. 36 is an illustration showing a structural example in which a plurality of phase shifters 80 arranged in a cascaded manner are inserted into the optical divider 90. In this example, the plurality of phase shifters 80 are connected to intermediate points of a channel of the optical divider 90. The phase shifters 80 give the same phase shift amount $\phi$ to light propagating therethrough. When the phase shift amounts given by the phase shifters 80 are the same, the phase differences between any two adjacent waveguide elements 10 are the same. Therefore, the second adjusting element can transmit a common phase control signal to all the phase shifters 80. This is advantageous in that the structure is simplified.

Waveguides can be used to efficiently propagate light between the optical divider 90, the phase shifters 80, the waveguide elements 10, etc. An optical material having a higher refractive index than its surrounding material and absorbing less light can be used for the waveguides. For example, materials such as Si, GaAs, GaN, $SiO_2$, $TiO_2$, $Ta_2O_5$, AlN, and SiN can be used. Any of the above-described first waveguides 1 may be used to propagate light from the optical divider 90 to the waveguide elements 10.

The phase shifters 80 require a mechanism for changing a light path length in order to give a phase difference to light. In the present embodiment, the refractive index of the waveguide of each phase shifter 80 is modulated to change the light path length. In this manner, the phase difference between light beams to be supplied from two adjacent phase shifters 80 to their respective waveguide elements 10 can be adjusted. More specifically, the refractive index of a phase shift material in the waveguide of each phase shifter 80 is modulated, and the phase shift can thereby be given. A specific example of the structure for refractive index modulation will be described later.

Examples of First Adjusting Element

Next, a description will be given of structural examples of the first adjusting element that adjusts at least one of the refractive index and thickness of the optical waveguide layer 20 of each waveguide element 10.

First, a structural example when the refractive index is adjusted will be described.

Figure 37A:
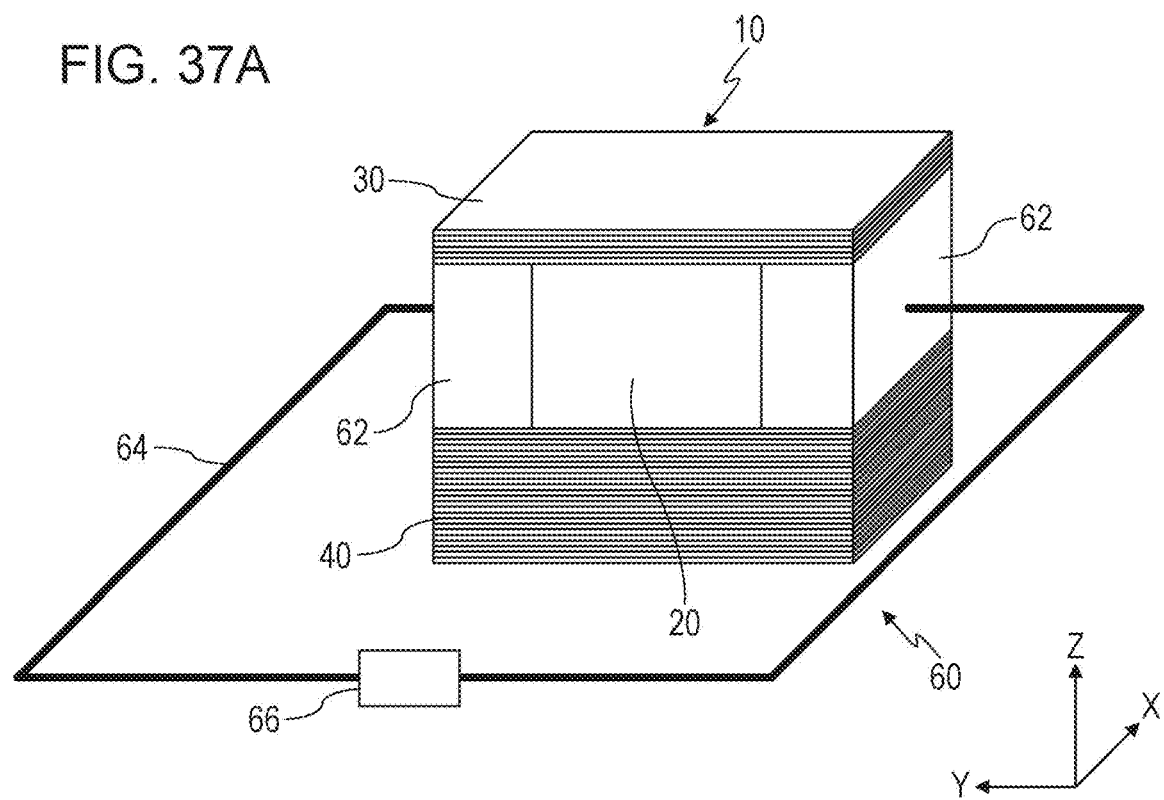
FIG. 37A is a perspective view schematically showing an example of the structure of a first adjusting element.

FIG. 37A is a perspective view schematically showing an example of the structure of the first adjusting element 60 (hereinafter may be referred to simply as an adjusting element). In the example shown in FIG. 37A, the adjusting element 60 includes a pair of electrodes 62 and is installed in the waveguide element 10. The optical waveguide layer 20 is sandwiched between the pair of electrodes 62. The optical waveguide layer 20 and the pair of electrodes 62 are disposed between a first mirror 30 and a second mirror 40. The entire side surfaces (the surfaces parallel to the XZ plane) of the optical waveguide layer 20 are in contact with the electrodes 62. The optical waveguide layer 20 contains a refractive index modulatable material whose refractive index for the light propagating through the optical waveguide layer 20 is changed when a voltage is applied. The adjusting element 60 further includes wiring lines 64 led from the pair of electrodes 62 and a power source 66 connected to the wiring lines 64. By turning on the power source 66 to apply a voltage to the pair of electrodes 62 through the wiring lines 64, the refractive index of the optical waveguide layer 20 can be modified. Therefore, the adjusting element 60 may be referred to as a refractive index modulatable element.

Figure 37B:
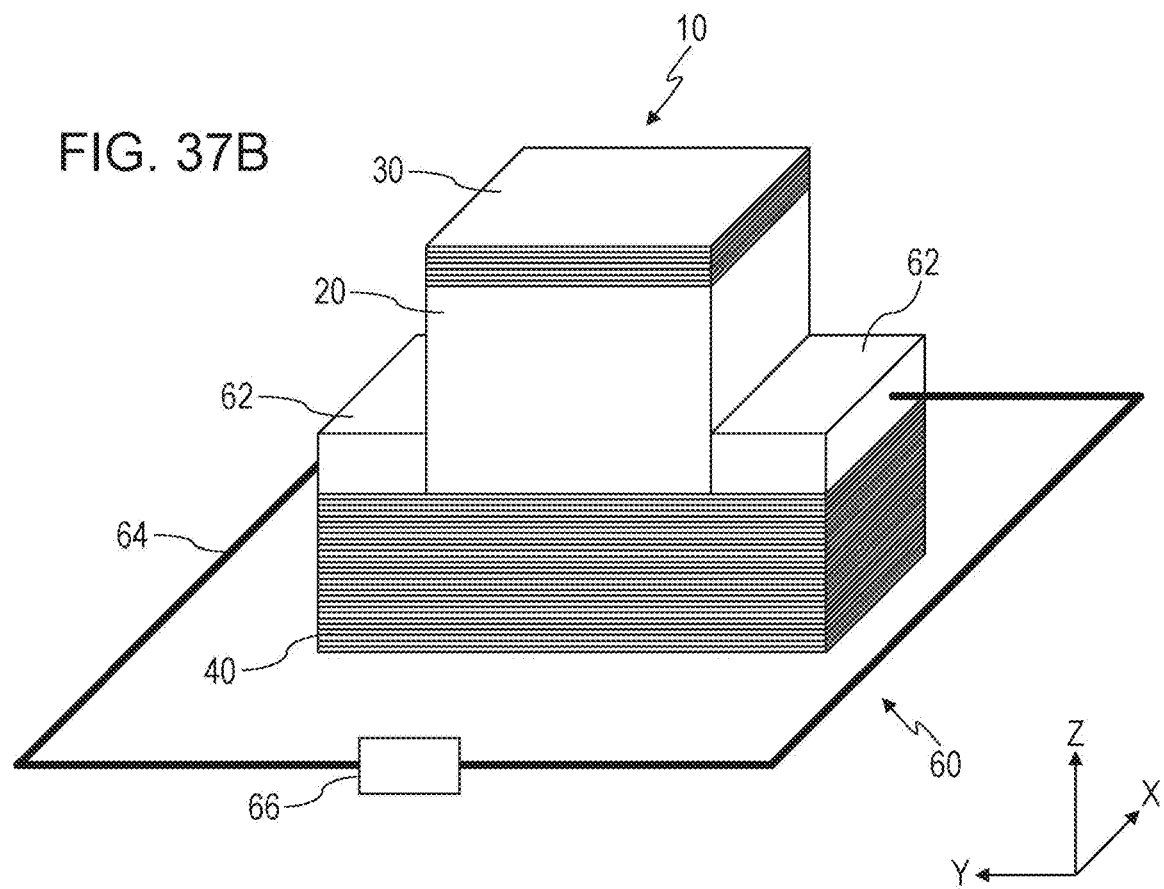
FIG. 37B is a perspective view schematically showing another example of the structure of the first adjusting element.

FIG. 37B is a perspective view schematically showing another example of the structure of the first adjusting element 60. In this example, only parts of the side surfaces of the optical waveguide layer 20 are in contact with the electrodes 62. The rest of the structure is the same as that shown in FIG. 37A. Even with the structure in which the refractive index of part of the optical waveguide layer 20 is changed, the direction of emitted light can be changed.

Figure 37C:
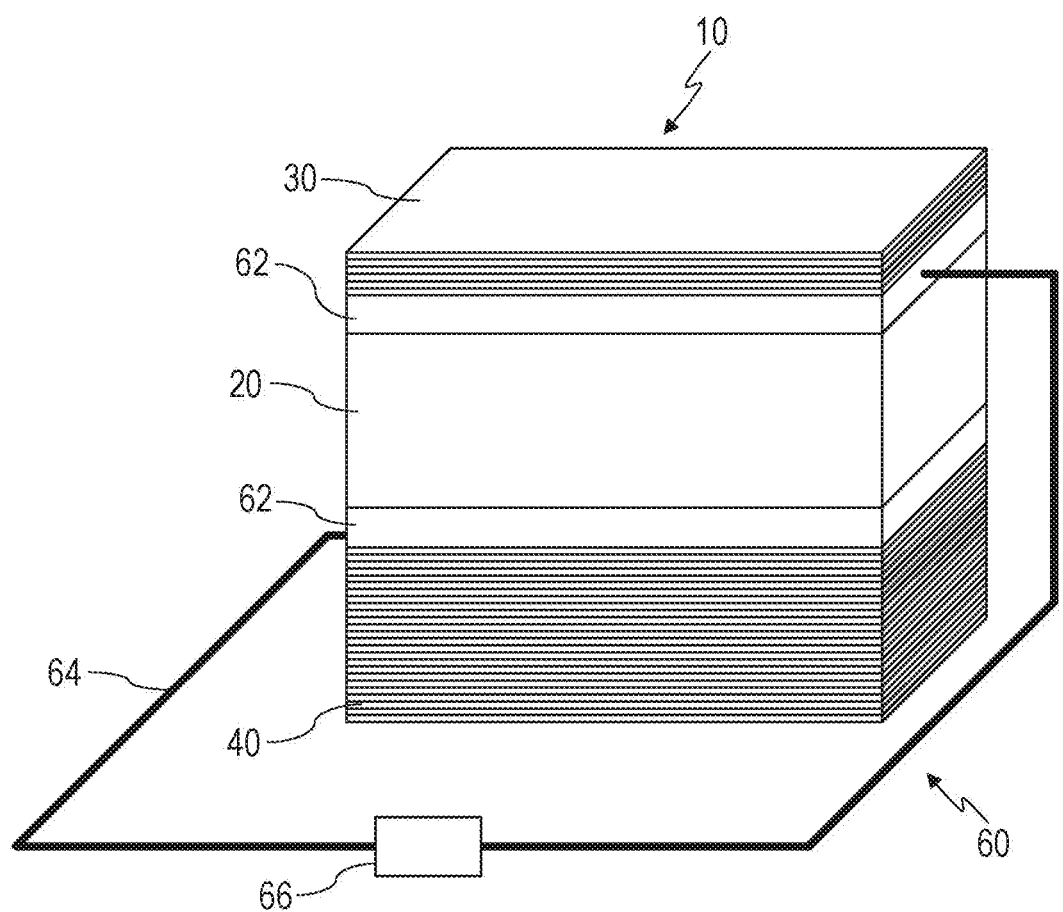
FIG. 37C is a perspective view schematically showing yet another example of the structure of the first adjusting element.

FIG. 37C is a perspective view schematically showing yet another example of the structure of the adjusting element 60. In this example, the pair of electrodes 62 have a layer shape approximately parallel to the reflecting surfaces of the mirrors 30 and 40. One of the electrodes 62 is sandwiched between the first mirror 30 and the optical waveguide layer 20. The other electrode 62 is sandwiched between the second mirror 40 and the optical waveguide layer 20. When this structure is employed, transparent electrodes may be used as the electrodes 62. This structure is advantageous in that it can be produced relatively easily.

In the examples shown in FIGS. 37A to 37C, the optical waveguide layer 20 of each waveguide element 10 contains a material whose refractive index for the light propagating through the optical waveguide layer 20 is changed when a voltage is applied. The first adjusting element 60 includes the pair of electrodes 62 sandwiching the optical waveguide layer 20 and changes the refractive index of the optical waveguide layer 20 by applying a voltage to the pair of electrodes 62. The voltage is applied using the first driving circuit 110 (see FIG. 34) described above.

Examples of the materials used for the above components will be described.

The material used for the mirrors 30, 40, 30a, and 40a may be, for example, a dielectric multilayer film. A mirror using a multilayer film can be produced by, for example, forming a plurality of films having an optical thickness of ¼ wavelength and having different refractive indexes periodically. Such a multilayer film mirror can have high reflectance. The materials of the films used may be, for example, $SiO_2$, $TiO_2$, $Ta_2O_5$, Si, and SiN. The mirrors are not limited to multilayer film mirrors and may be formed of a metal such as Ag or Al.

Various conductive materials can be used for the electrodes 62 and the wiring lines 64. For example, conductive materials including metal materials such as Ag, Cu, Au, Al, Pt, Ta, W, Ti, Rh, Ru, Ni, Mo, Cr, and Pd, inorganic compounds such as ITO, tin oxide, zinc oxide, IZO (registered trademark), and SRO, and conductive polymers such as PEDOT and polyaniline can be used.

Various light-transmitting materials such as dielectric materials, semiconductors, electrooptical materials, and liquid crystal molecules can be used for the material of the optical waveguide layer 20. Examples of the dielectric materials include $SiO_2$, $TiO_2$, $Ta_2O_5$, SiN, and AlN. Examples of the semiconductor materials include Si-based, GaAs-based, and GaN-based materials. Examples of the electrooptical materials include lithium niobate ($LiNbO_3$), barium titanate ($BaTiO_3$), lithium tantalate ($LiTaO_3$), zinc oxide (ZnO), lead lanthanum zirconate titanate (PLZT), and potassium tantalate niobate (KTN).

To modulate the refractive index of the optical waveguide layer 20, for example, methods utilizing a carrier injection effect, an electrooptical effect, a birefringent effect, and a thermooptical effect can be used. Examples of these methods will next be described.

The method utilizing the carrier injection effect can be implemented by a structure utilizing a pin junction of semiconductors. In this method, a structure in which a semiconductor material with a low dopant concentration is sandwiched between a p-type semiconductor and an n-type semiconductor is used, and the refractive index of the semiconductor is modulated by injecting carriers into the semiconductor. In this structure, the optical waveguide layer 20 of each of the waveguide elements 10 contains a semiconductor material. One of the pair of electrodes 62 may contain a p-type semiconductor, and the other one may contain an n-type semiconductor. In the first adjusting element 60, a voltage is applied to the pair of electrodes 62 to inject carriers into the semiconductor material, and the refractive index of the optical waveguide layer 20 is thereby changed. Specifically, the optical waveguide layer 20 may be produced using a non-doped or low-dopant concentration semiconductor, and the p-type semiconductor and the n-type semiconductor may be disposed in contact with the optical waveguide layer 20. A complex structure may be used in which the p-type semiconductor and the n-type semiconductor are disposed in contact with the low-dopant concentration semiconductor and conductive material layers are in contact with the p-type semiconductor and the n-type semiconductor. For example, when carriers of about $10^{20}$ $cm^{-3}$ are injected into Si, the refractive index of Si is changed by about 0.1 (see, for example, "Free charge carrier induced refractive index modulation of crystalline Silicon," $7^{th}$ IEEE International Conference on Group IV Photonics, P102-104, 1-3 Sep. 2010). When this method is used, a p-type semiconductor and an n-type semiconductor may be used as the materials of the pair of electrodes 62 in FIGS. 37A to 37C. Alternatively, the pair of electrodes 62 may be formed of a metal, and the optical waveguide layer 20 itself or layers between the optical waveguide layer 20 and the electrodes 62 may contain a p-type or n-type semiconductor.

The method utilizing the electrooptical effect can be implemented by applying a voltage to an optical waveguide layer 20 containing an electrooptical material. In particular, when KTN is used as the electrooptical material, the electrooptical effect obtained can be large. The relative dielectric constant of KTN increases significantly at a temperature slightly higher than its tetragonal-to-cubic phase transition temperature, and this effect can be utilized. For example, according to "Low-Driving-Voltage Electro-Optic Modulator With Novel KTa1−xNbxO3 Crystal Waveguides," Jpn. J. Appl. Phys., Vol. 43, No. 8B (2004), an electrooptical constant of $g=4.8\times10^{-15}$ m$^2$/V$^2$ is obtained for light with a wavelength of 1.55 μm. For example, when an electric field of 2 kV/mm is applied, the refractive index is changed by about 0.1 ($=gn^3E^3/2$). With the structure utilizing the electrooptical effect, the optical waveguide layer 20 of each of the waveguide elements 10 contains an electrooptical material such as KTN. The first adjusting element 60 changes the refractive index of the electrooptical material by applying a voltage to the pair of electrodes 62.

In the method utilizing the birefringent effect of a liquid crystal, an optical waveguide layer 20 containing the liquid crystal material is driven using the electrodes 62 to change the refractive index anisotropy of the liquid crystal. In this manner, the refractive index for the light propagating through the optical waveguide layer 20 can be modulated. Generally, a liquid crystal has a birefringence of about 0.1 to 0.2, and a change in refractive index comparable to the birefringence can be obtained by changing the alignment direction of the liquid crystal using an electric field. In the structure using the birefringent effect of the liquid crystal, the optical waveguide layer 20 of each of the waveguide elements 10 contains the liquid crystal material. The first adjusting element 60 changes the refractive index anisotropy of the liquid crystal material by applying a voltage to the pair of electrodes 62 to thereby change the refractive index of the optical waveguide layer 20.

The thermooptical effect is a change in the refractive index of a material due to a change in its temperature. When the thermooptical effect is used for driving, an optical waveguide layer 20 containing a thermooptical material may be heated to modulate its refractive index.

Figure 38:
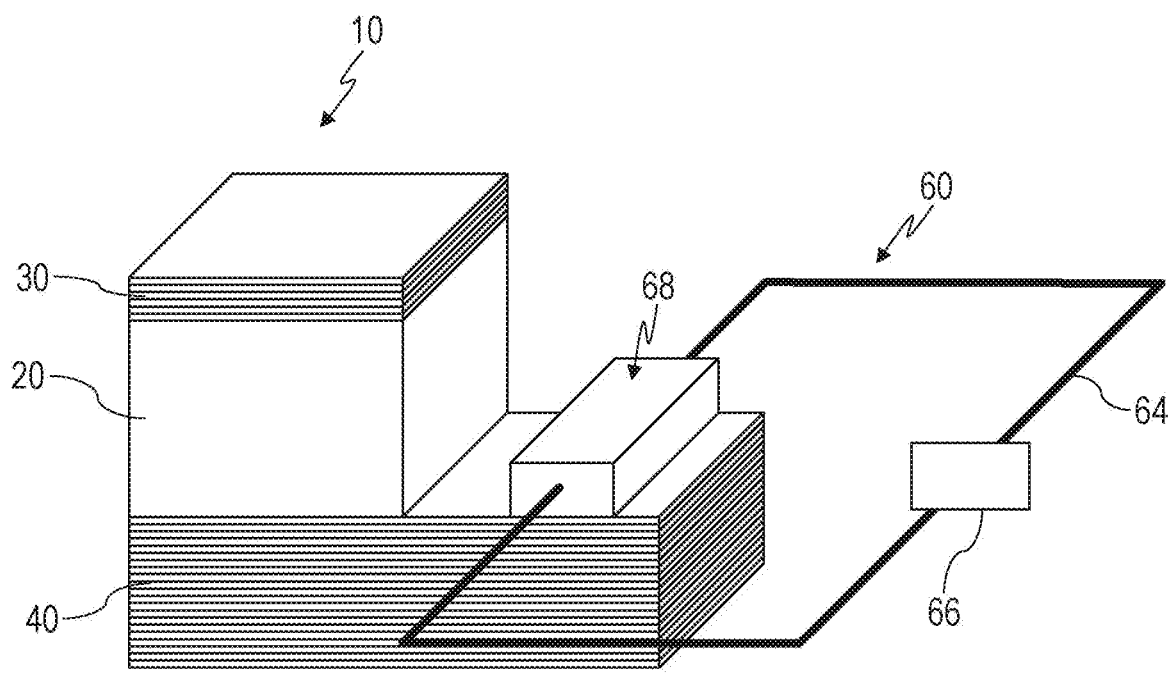
FIG. 38 is an illustration showing an example of a structure in which a waveguide element is combined with an adjusting element including a heater.

FIG. 38 is an illustration showing an example of a structure in which a waveguide element 10 is combined with an adjusting element 60 including a heater 68 formed of a material having high electrical resistance. The heater 68 may be disposed near an optical waveguide layer 20. When a power source 66 is turned on, a voltage is applied to the heater 68 through wiring lines 64 containing a conductive material, and the heater 68 can thereby be heated. The heater 68 may be in contact with the optical waveguide layer 20. In the present structural example, the optical waveguide layer 20 of each of the waveguide elements 10 contains a thermooptical material whose refractive index is changed with a change in temperature. The heater 68 included in the first adjusting element 60 is disposed in contact with or near the optical waveguide layer 20. In the first adjusting element 60, the thermooptical material is heated by the heater 68 to thereby change the refractive index of the optical waveguide layer 20.

The optical waveguide layer 20 itself may be formed of a high-electric resistance material and sandwiched directly between a pair of electrodes 62, and a voltage may be applied to the pair of electrodes 62 to heat the optical waveguide layer 20. In this case, the first adjusting element 60 includes the pair of electrodes 62 sandwiching the optical waveguide layer 20. In the first adjusting element 60, a voltage is applied to the pair of electrodes 62 to heat the thermooptical material (e.g., a high-electric resistance material) in the optical waveguide layer 20, and the refractive index of the optical waveguide layer 20 is thereby changed.

The high-electric resistance material used for the heater 68 or the optical waveguide layer 20 may be a semiconductor or a high-resistivity metal material. Examples of the semiconductor used include Si, GaAs, and GaN. Examples of the high-resistivity metal material used include iron, nickel, copper, manganese, chromium, aluminum, silver, gold, platinum, and alloys of combinations of these materials. For example, the temperature dependence dn/dT of the refractive index of Si for light with a wavelength of 1,500 nm is $1.87\times10^{-4}$ (K$^{-1}$) (see "Temperature-dependent refractive index of silicon and germanium," Proc. SPIE 6273, Optomechanical Technologies for Astronomy, 62732J). Therefore, by changing temperature by 500° C., the refractive index can be changed by about 0.1. When the heater 68 is disposed near the optical waveguide layer 20 to heat it locally, a large temperature change of 500° C. can be achieved at a relatively fast speed.

The speed of response to change in refractive index by carrier injection is determined by the life of the carriers. Generally, the life of carriers is of the order of nanoseconds (ns), and the speed of response is about 100 MHz to about 1 GHz.

When an electrooptical material is used, an electric field is applied to induce polarization of electrons, and the refractive index is thereby changed. The speed of polarization induction is generally very high. In materials such as LiNbO$_3$ and LiTaO$_3$, the response time is of the order of femtoseconds (fs), and this allows high-speed driving at higher than 1 GHz.

When a thermooptical material is used, the speed of response to change in refractive index is determined by the rate of temperature increase or decrease. By heating only a portion in the vicinity of the waveguide, a steep temperature increase is obtained. By turning off the heater after the temperature is locally increased, the heat is dissipated to the surroundings, and the temperature can be steeply reduced. The speed of response can be as high as about 100 KHz.

In the above examples, the first adjusting element 60 changes the refractive indexes of the optical waveguide layers 20 by a constant value simultaneously to change the X component of the wave vector of the emitted light. In the refractive index modulation, the amount of modulation depends on the properties of the material. To obtain a large amount of modulation, it is necessary to apply a high electric field or to align the liquid crystal. The direction of the light emitted from the waveguide elements 10 depends also on the distance between the mirrors 30 and 40. Therefore, the thickness of each optical waveguide layer 20 may be changed by changing the distance between the mirrors 30 and 40. Next, examples of a structure in which the thickness of the optical waveguide layer 20 is changed will be described.

To change the thickness of the optical waveguide layer 20, the optical waveguide layer 20 may be formed from an easily deformable material such as a gas or a liquid. By moving at least one of the mirror 30 and the mirror 40 sandwiching the optical waveguide layer 20, the thickness of the optical waveguide layer 20 can be changed. In this case, to maintain the parallelism between the upper and lower mirrors 30 and 40, a structure in which the deformation of the mirror 30 or the mirror 40 is minimized may be employed.

Figure 39:
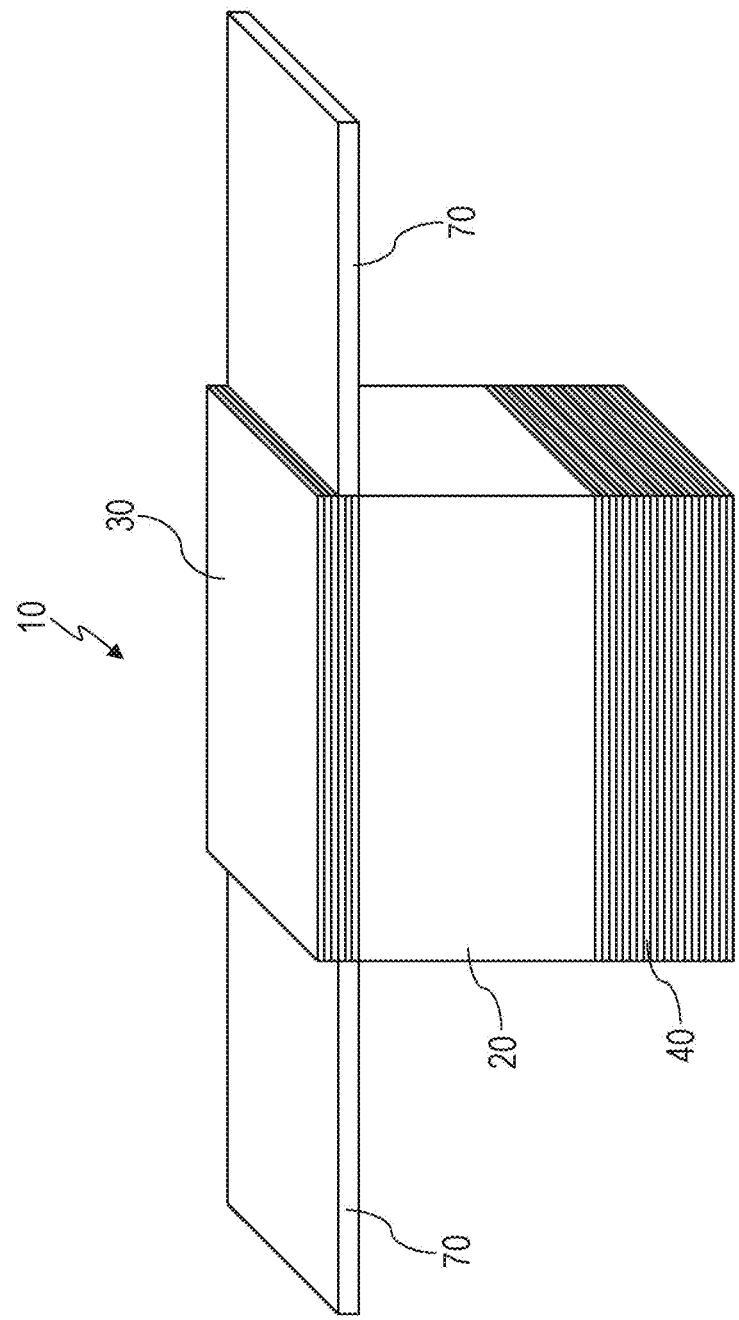
FIG. 39 is an illustration showing a structural example in which a mirror is held by support members.

FIG. 39 is an illustration showing a structural example in which a mirror 30 is held by support members 70 formed of an easily deformable material. Each support member 70 may include a thin member or a narrow frame more easily deformable than the mirror 30. In this example, the first adjusting element includes an actuator connected to the first mirror 30 of each waveguide element 10. The actuator changes the distance between the first and second mirrors 30 and 40 to thereby change the thickness of the optical waveguide layer 20. The actuator may be connected to at least one of the first mirror 30 and the second mirror 40. The actuator used to drive the mirror 30 may be any of various actuators that utilize, for example, electrostatic force, electromagnetic induction, a piezoelectric material, a shape-memory alloy, and heat.

In a structure using electrostatic force, the actuator in the first adjusting element moves the mirror 30 and/or the mirror 40 using an attractive or repulsive force generated between electrodes by the electrostatic force. Some examples of such a structure will next be described.

Figure 40:
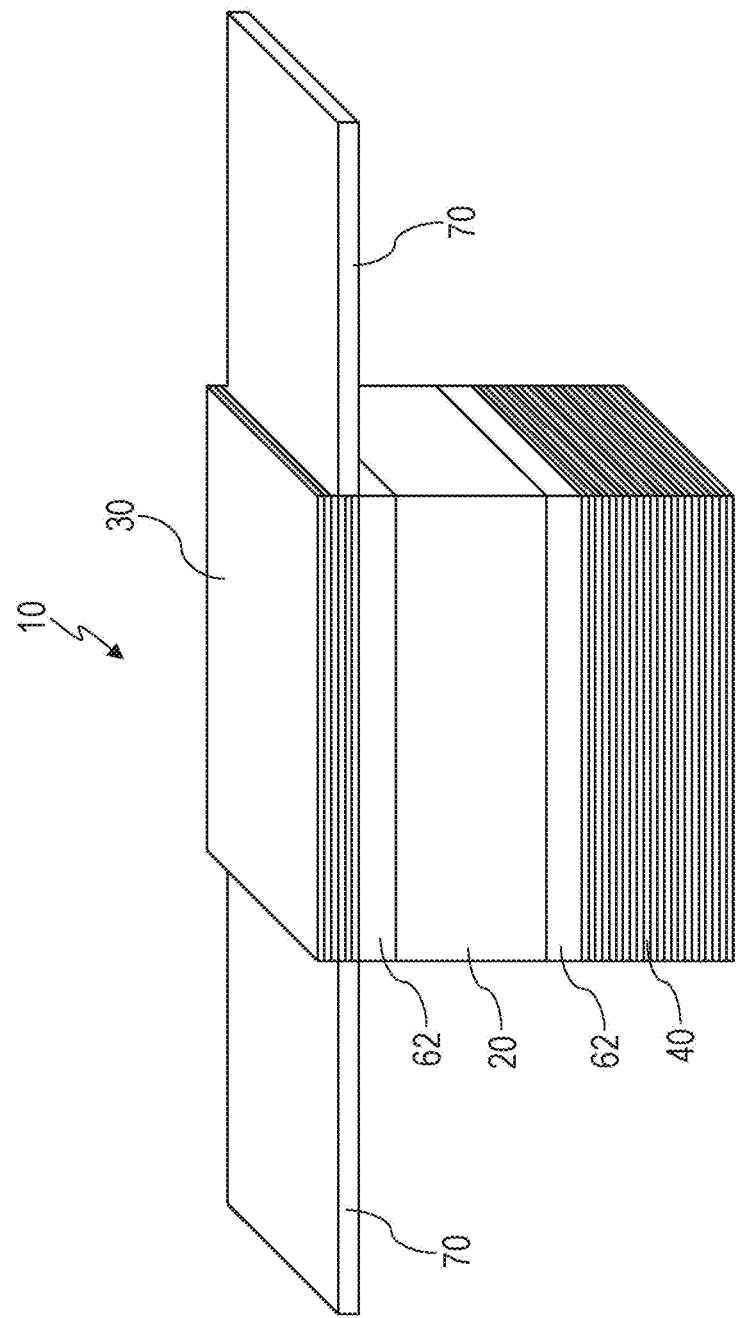
FIG. 40 is an illustration showing an example of a structure in which mirrors are moved.

FIG. 40 is an illustration showing an example of a structure in which the mirror 30 and/or the mirror 40 is moved by an electrostatic force generated between electrodes. In this example, a light-transmitting electrode 62 (e.g., transparent electrode) is disposed between the optical waveguide layer 20 and the mirror 30, and another light-transmitting electrode 62 is disposed between the optical waveguide layer 20 and the mirror 40. Support members 70 are disposed on both sides of the mirror 30. One end of each support member 70 is fixed to the mirror 30, and the other end is fixed to an unillustrated casing. When positive and negative voltages are applied to the pair of electrodes 62, an attractive force is generated, and the distance between the mirrors 30 and 40 is reduced. When the application of the voltage is stopped, the restoring force of the support members 70 holding the mirror 30 allows the distance between the mirrors 30 and 40 to be returned to the original length. It is unnecessary that the electrodes 62 generating the attractive force be provided over the entire mirror surfaces. The actuator in this example includes the pair of electrodes 62. One of the pair of electrodes 62 is fixed to the first mirror 30, and the other one of the pair of electrodes 62 is fixed to the second mirror 40. In the actuator, an electrostatic force is generated between the pair of electrodes by applying a voltage to the electrodes to thereby change the distance between the first and second mirrors 30 and 40. The above-described first driving circuit 110 (e.g., FIG. 34) is used to apply the voltage to the electrodes 62.

Figure 41:
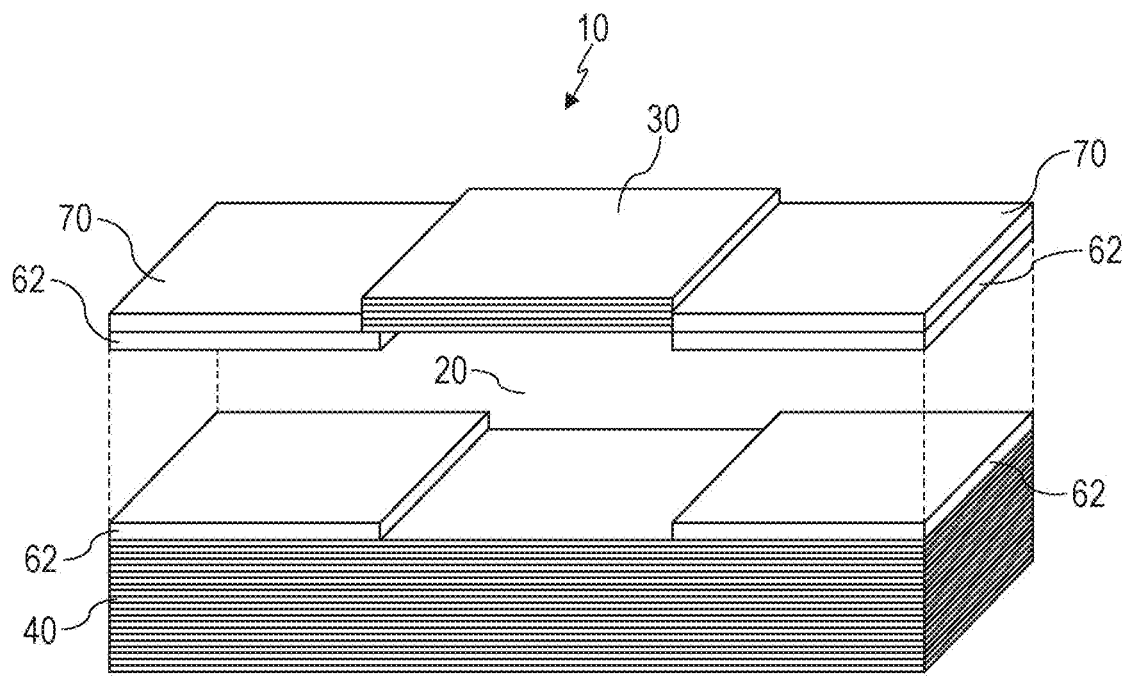
FIG. 41 is an illustration showing a structural example in which electrodes are disposed in portions that do not impede propagation of light.

FIG. 41 is an illustration showing a structural example in which electrodes 62 that generate an attractive force are disposed in portions that do not impede propagation of light. In this example, it is not necessary that the electrodes 62 be transparent. As shown in FIG. 36, it is unnecessary that the electrodes 62 fixed to the mirror 30 and 40 be single electrodes, and the electrodes 62 may be divided. The distance between the mirrors 30 and 40 can be measured by measuring the electrostatic capacitance between parts of the divided electrodes, and feedback control can be performed to adjust, for example, the parallelism between the mirrors 30 and 40.

Instead of using the electrostatic force between the electrodes, electromagnetic induction that generates an attractive or repulsive force in a magnetic material in a coil may be used to drive the mirror 30 and/or the mirror 40.

In an actuator that uses a piezoelectric material, a shape-memory alloy, or deformation by heat, a phenomenon in which a material is deformed by energy applied from the outside is utilized. For example, lead zirconate titanate (PZT), which is a typical piezoelectric material, expands and contracts when an electric field is applied in its polarization direction. The use of this piezoelectric material allows the distance between the mirrors 30 and 40 to be changed directly. However, since the piezoelectric constant of PZT is about 100 pm/V, the amount of displacement is very small, e.g., about 0.01%, even when an electric field of 1 V/μm is applied. Therefore, when the piezoelectric material is used, a sufficient mirror moving distance cannot be obtained. However, a structure called unimorph or bimorph may be used to increase the amount of deformation.

Figure 42:
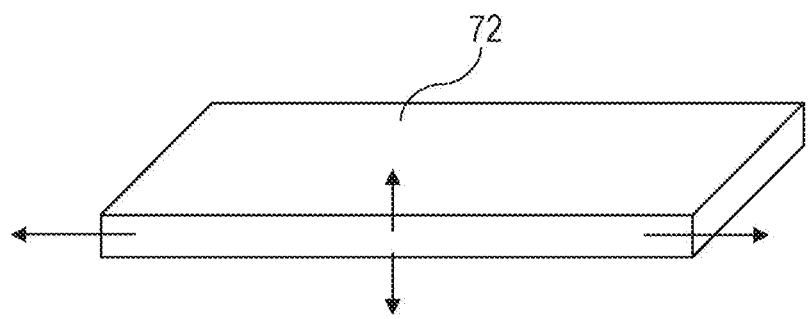
FIG. 42 is an illustration showing an example of a piezoelectric element.

FIG. 42 is an illustration showing an example of a piezoelectric element 72 containing a piezoelectric material. Arrows represent the deformation directions of the piezoelectric element 72, and the sizes of the arrows represent the amounts of deformation. As shown in FIG. 42, since the amounts of deformation of the piezoelectric element 72 depend on the length of the material, the amount of deformation in the plane direction is larger than the amount of deformation in the thickness direction.

Figure 43A:
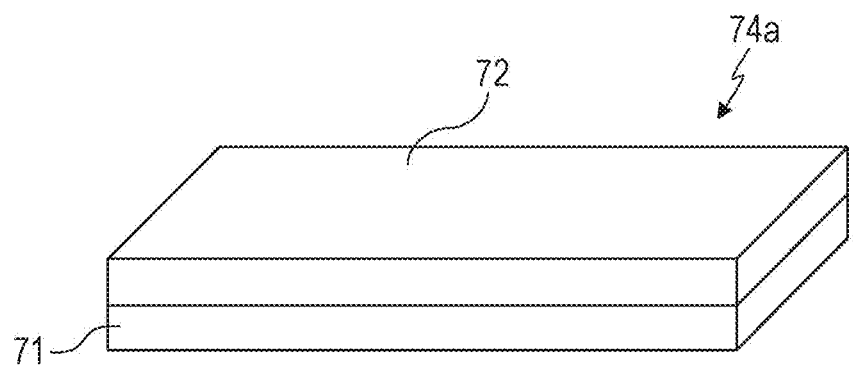
FIG. 43A is an illustration showing a structural example of a support member having a unimorph structure.

FIG. 43A is an illustration showing a structural example of a support member 74a having a unimorph structure using the piezoelectric element 72 shown in FIG. 42. This support member 74a has a structure in which one piezoelectric element 72 and one non-piezoelectric element 71 are stacked. This support member 74a is fixed to at least one of the mirrors 30 and 40. Then, by deforming the support member 74a, the distance between the mirrors 30 and 40 can be changed.

Figure 43B:
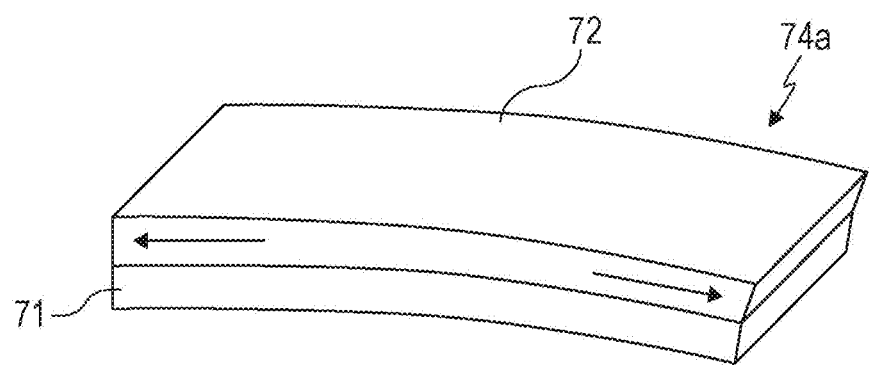
FIG. 43B is an illustration showing an example of a state in which the support member is deformed.

FIG. 43B is an illustration showing an example of a state in which the support member 74a is deformed by applying a voltage to the piezoelectric element 72. When a voltage is applied to the piezoelectric element 72, only the piezoelectric element 72 expands in a plane direction, and the entire support member 74a is thereby bent. The amount of deformation is larger than that when the non-piezoelectric element 71 is not provided.

Figure 44A:
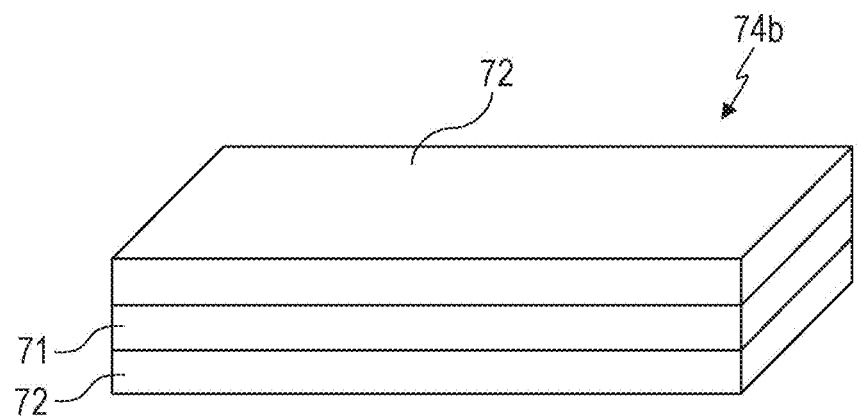
FIG. 44A is an illustration showing a structural example of a support member having a bimorph structure.

FIG. 44A is an illustration showing a structural example of a support member 74b having a bimorph structure using the piezoelectric element 72 shown in FIG. 42. This support member 74b has a structure in which two piezoelectric elements 72 are stacked with one non-piezoelectric element 71 disposed therebetween. This support member 74b is fixed to at least one of the mirrors 30 and 40. Then, by deforming the support member 74b, the distance between the mirrors 30 and 40 can be changed.

Figure 44B:
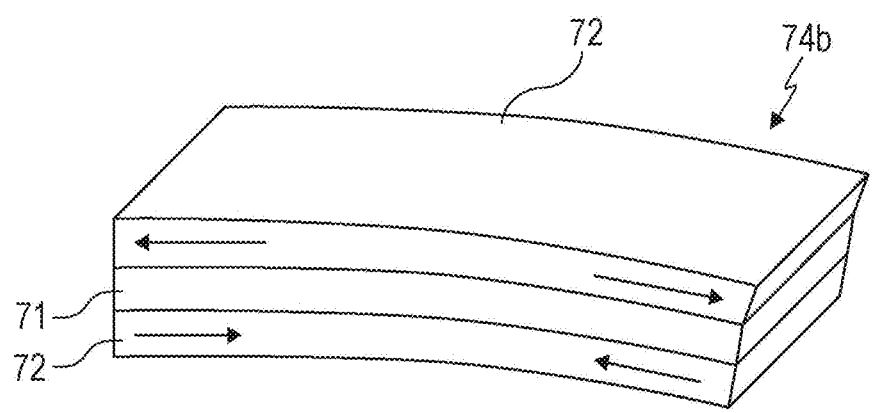
FIG. 44B is an illustration showing an example of a state in which the support member is deformed.

FIG. 44B is an illustration showing a state in which the support member 74a is deformed by applying a voltage to the piezoelectric elements 72 on both sides. In the bimorph structure, the deformation direction of the upper piezoelectric element 72 is opposite to the deformation direction of the lower piezoelectric element 72. Therefore, when the bimorph structure is used, the amount of deformation can be larger than that using the unimorph structure.

FIG. 45 is an illustration showing an example of an actuator in which the support members 74a shown in FIG. 43A are disposed on both sides of a mirror 30. By using this piezoelectric actuator, each support member 74a can be deformed just like a beam is bent, and the distance between the mirrors 30 and 40 can thereby be changed. Instead of the support members 74a shown in FIG. 43A, the support members 74b shown in FIG. 44A may be used.

Figure 46A:
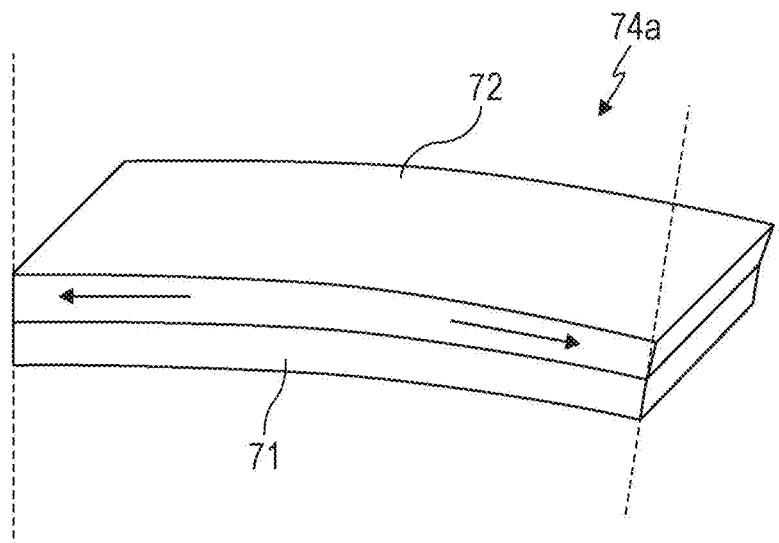
FIG. 46A is an illustration showing the inclination of a forward end of the support member.
Figure 46B:
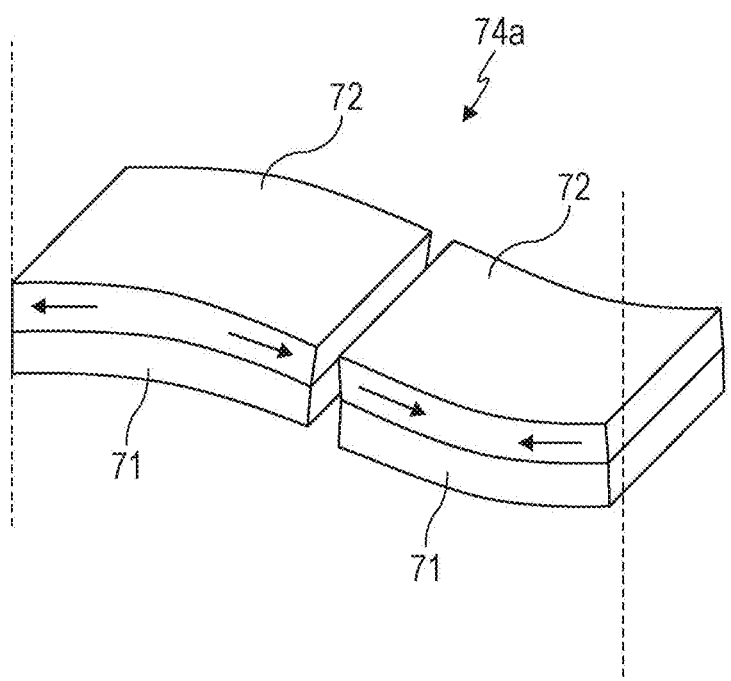
FIG. 46B is an illustration showing an example in which two unimorph-type support members having different expansion-contraction directions are connected in series.

The unimorph-type actuator deforms into an arc shape. Therefore, as shown in FIG. 46A, a non-fixed end of the actuator is inclined. If the stiffness of the mirror 30 is low, it is difficult to maintain the parallelism between the mirrors 30 and 40. As shown in FIG. 46B, two unimorph-type support members 74a with different expansion directions may be connected in series. In the support members 74a in the example in FIG. 46B, the bending direction of a contracted region is opposite to the bending direction of an extended region. This can prevent the non-fixed end from being inclined. By using the above support members 74a, the inclination of the mirrors 30 and 40 can be prevented.

By laminating materials with different thermal expansion coefficients, a bendable-deformable beam structure can be obtained, as in the above case. Such a beam structure can be obtained by using a shape-memory alloy. Any of them can be used to control the distance between the mirrors 30 and 40.

The distance between the mirrors 30 and 40 can be changed also by the following method. A closed space is used as the optical waveguide layer 20, and air or liquid is pumped into or out of the closed space using, for example, a small pump to thereby change the volume of the optical waveguide layer 20.

As described above, various structures can be used for the actuator of the first adjusting element to change the thickness of the optical waveguide layer 20. The thicknesses of the plurality of waveguide elements 10 may be changed separately or together. In particular, when all the plurality of waveguide elements 10 have the same structure, the distances between the mirrors 30 and 40 of the waveguide elements 10 are controlled uniformly. Therefore, one actuator can be used to drive all the waveguide elements 10 collectively.

Figure 47:
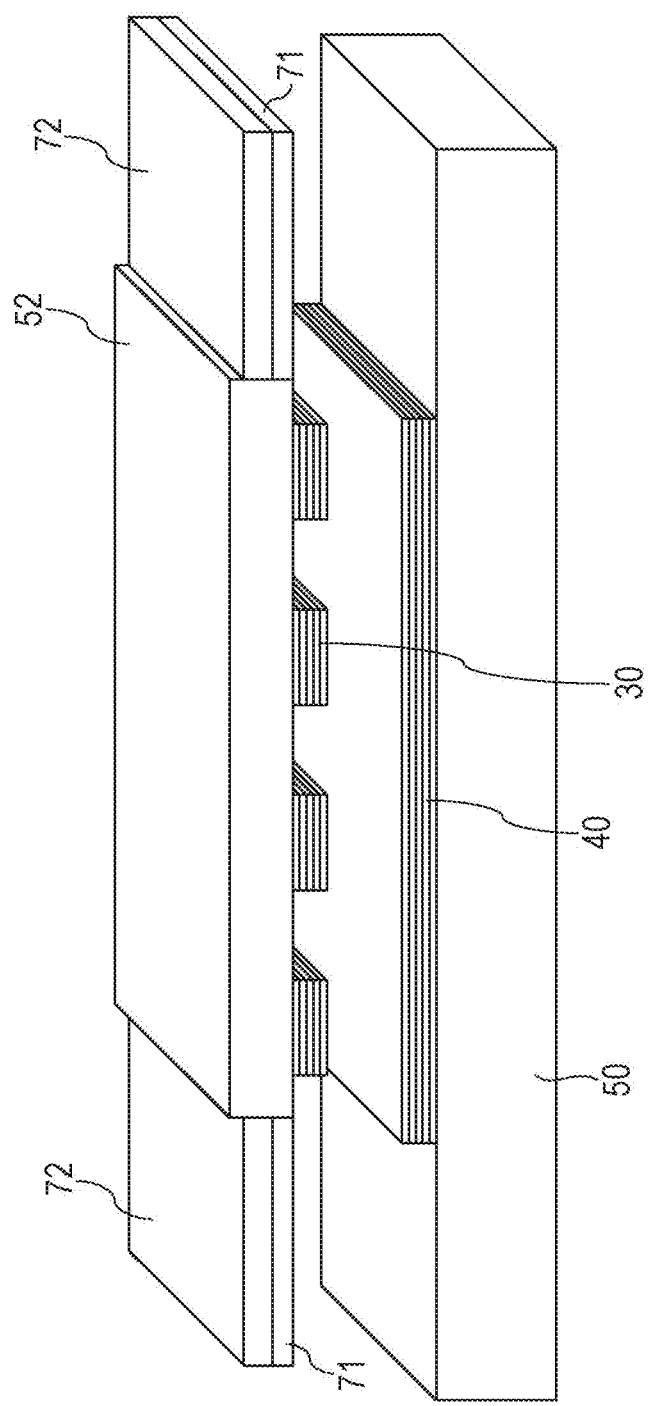
FIG. 47 is an illustration showing an example of a structure in which a plurality of first mirrors held by a support member are collectively driven by an actuator.

FIG. 47 is an illustration showing an example of a structure in which a plurality of first mirrors 30 held by a support member (i.e., an auxiliary substrate) 52 are collectively driven by an actuator. In FIG. 47, one plate-shaped mirror is used as the second mirror 40. The mirror 40 may be divided into a plurality of mirrors, as in the above embodiment. The support member 52 is formed of a light-transmitting material, and unimorph-type piezoelectric actuators are disposed on both sides of the support member 52.

Figure 48:
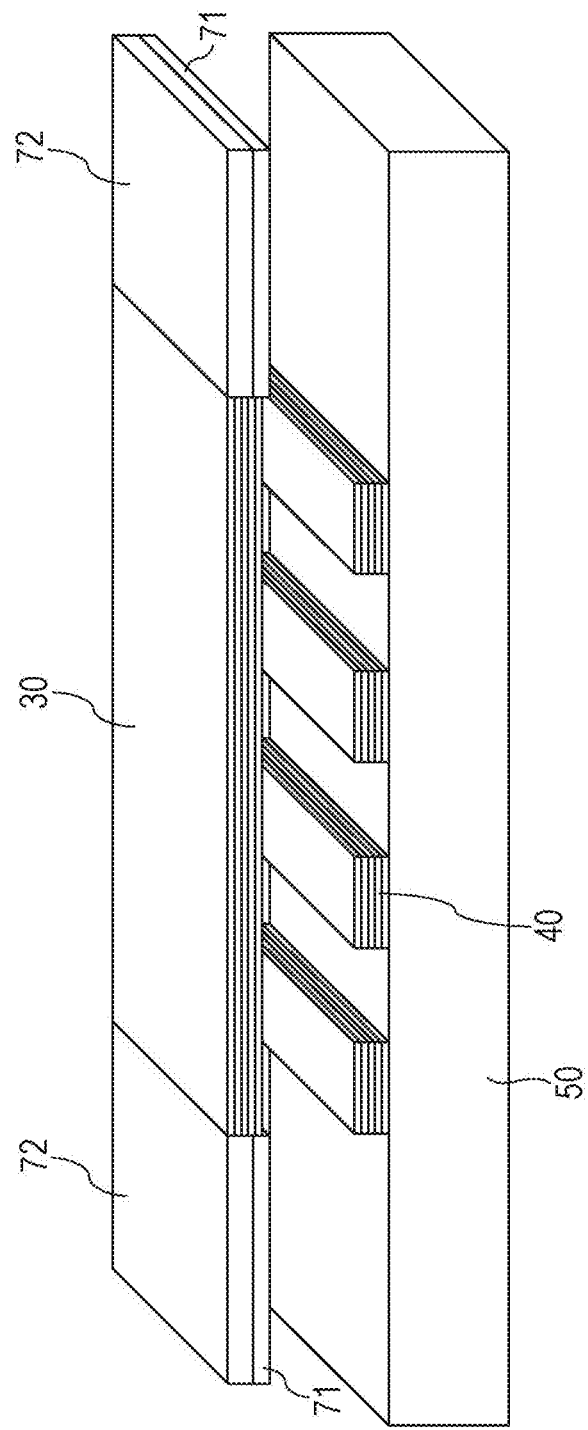
FIG. 48 is an illustration showing a structural example in which one plate-shaped first mirror is used for a plurality of waveguide elements.

FIG. 48 is an illustration showing a structural example in which one plate-shaped first mirror 30 is used for a plurality of waveguide elements 10. In this example, divided second mirrors 40 are provided for respective waveguide elements 10. As in the examples shown in FIGS. 47 and 48, the mirrors 30 or the mirrors 40, or both, of the waveguide elements 10 may be portions of single plate-shaped mirrors. The actuator may move the plate-shaped mirrors to change the distance between the mirrors 30 and 40.

Specific Examples of Structure Using Liquid Crystal Material

Next, a description will be given of specific examples of a structure in which a liquid crystal material is used for the optical waveguide layer 20.

As described above, in the method utilizing the birefringent effect of a liquid crystal, the optical waveguide layer 20 containing the liquid crystal material is driven using the electrodes 62 to change the refractive index anisotropy of the liquid crystal. In this manner, the refractive index for the light propagating through the optical waveguide layer 20 can be modulated. Generally, a liquid crystal has a birefringence of about 0.1 to 0.2, and a change in refractive index comparable to the birefringence can be obtained by changing the alignment direction of the liquid crystal using an electric field. In the structure using the birefringent effect of the liquid crystal, the optical waveguide layer 20 of each of the waveguide elements 10 contains the liquid crystal material. The driving circuit of the first adjusting element 60 can change the refractive index anisotropy of the liquid crystal material by applying a voltage to the pair of electrodes 62 to thereby change the refractive index of the optical waveguide layer 20.

To increase the change in refractive index upon application of a voltage, it is desirable that the relation between the arrangement of the pair of electrodes 62 and the alignment direction of the liquid crystal material, i.e., the longitudinal direction of the liquid crystal molecules, is appropriate. Moreover, it is desirable that linearly polarized light is used as the light inputted to the optical waveguide layer 20 and that the polarization direction of the linearly polarized light is set to an appropriate direction.

The birefringence of a liquid crystal is caused by the difference between the dielectric constant of the liquid crystal molecules in its longitudinal direction and the dielectric constant in the lateral direction. Therefore, by appropriately controlling the alignment direction of the liquid crystal molecules in the optical waveguide layer 20 according to the polarization direction of the inputted light, the refractive index can be more effectively changed.

Figure 49A:
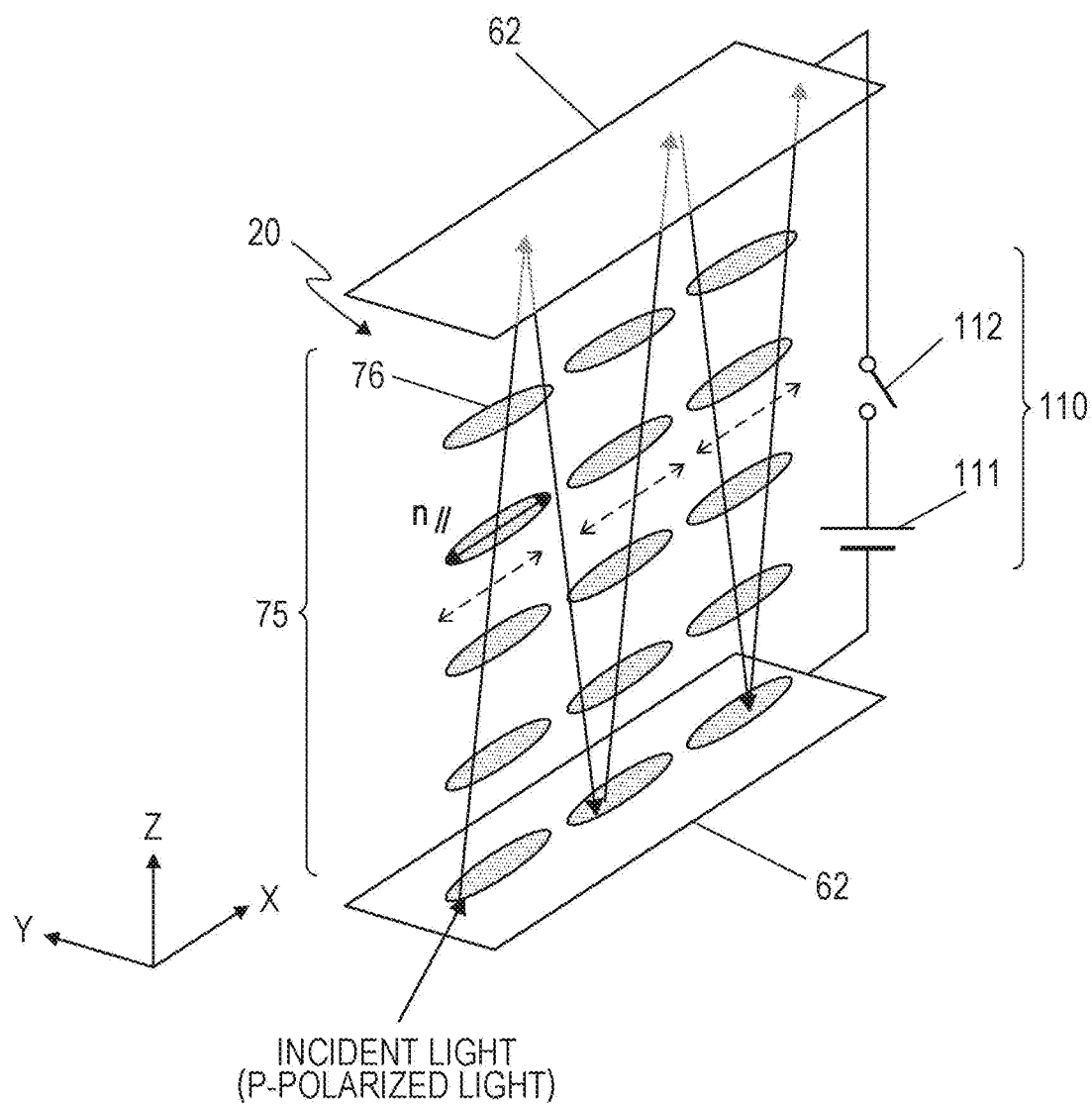
FIG. 49A is an illustration showing a first example of a structure in which a liquid crystal material is used for the optical waveguide layer.
Figure 49B:
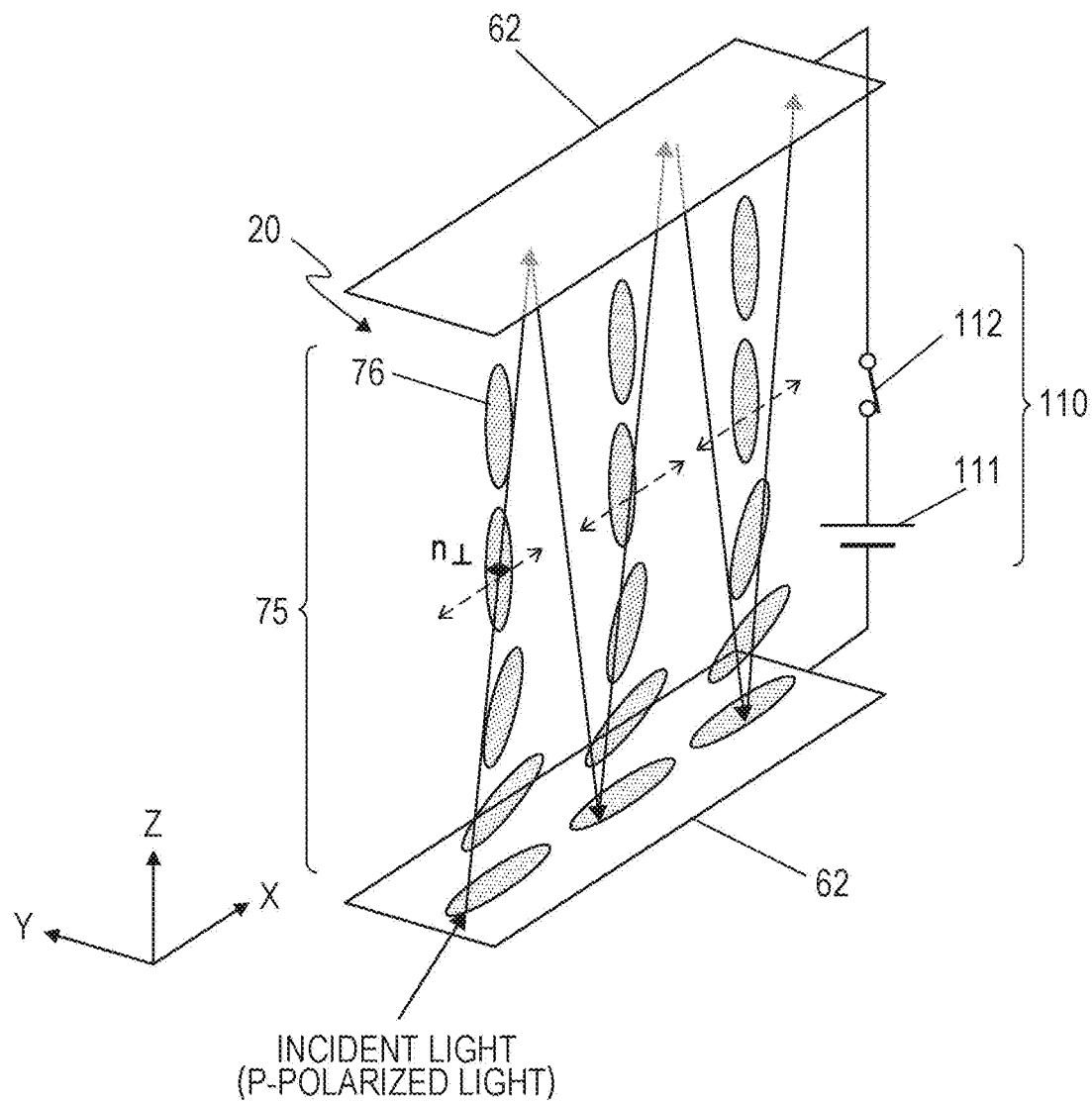
FIG. 49B is an illustration showing the first example of the structure in which the liquid crystal material is used for the optical waveguide layer.

FIGS. 49A and 49B show a first example of the structure in which a liquid crystal material 75 is used for the optical waveguide layer 20. FIGS. 49A and 49B show the optical waveguide layer 20 sandwiched between a pair of electrodes 62 and a driving circuit 110 for applying a voltage to the pair of electrodes 62. The driving circuit 110 in this example includes a driving power source 111 and a switching element 112 (hereinafter may be referred to also as a switch 112). FIG. 49A shows the state in which the switch 112 is OFF, and FIG. 49B shows the state in which the switch 112 is ON.

The pair of electrodes 62 are transparent electrodes. The pair of electrodes 62 are disposed parallel to unillustrated first and second mirrors. Specifically, the pair of electrodes 62 are disposed such that, when a voltage is applied thereto, an electric field is generated in the Z direction, which is a direction normal to the mirrors. As shown in FIG. 49A, the longitudinal direction of the liquid crystal molecules 76 is parallel to the extending direction of the optical waveguide layer 20 (the X direction) when no voltage is applied to the pair of electrodes 62.

Solid arrows in FIGS. 49A and 49B indicate the propagating directions of light, and broken arrows indicate the polarization direction. In this example, P-polarized light is inputted to the optical waveguide layer 20. The P-polarized light is linearly polarized light whose electric field vibrates parallel to an incidence plane of the light. The incidence plane of the light is a plane formed by the directions of the light incident on the reflecting surfaces of the mirrors and the directions of the light reflected from the reflecting surfaces. In the present embodiment, the incidence plane of the light is substantially parallel to the XZ plane. Let the incident angle and the reflecting angle of the light on the reflecting surface of each mirror be θ. Then the direction of vibration of the electric field of the P-polarized light is a direction inclined an angle of θ from the X direction in the XZ plane. However, in FIGS. 49A and 49B and subsequent figures, the angle θ is assumed to be sufficiently small, and the broken arrows indicating the polarization direction of the P-polarized light are parallel to the X direction in order to clearly distinguish the P-polarized light from S-polarized light.

The Z direction size (height) of the optical waveguide layer 20 may be set to, for example, a value from 0.1 μm to 10 μm and more preferably to a value from 0.2 μm to 3 μm. The Y direction size (width) of the optical waveguide layer 20 may be set to, for example, a value from 1 μm to 100 μm and more preferably to a value from 1 μm to 30 μm. The X direction size (length) of the optical waveguide layer 20 may be set to, for example, a value from 100 μm to 100 mm and more preferably to a value from 1 mm to 30 mm.

The liquid crystal material may be, for example, a nematic liquid crystal. The molecular structure of the nematic liquid crystal is as follows.

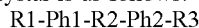

R1-Ph1-R2-Ph2-R3

Here, R1 represents one selected from the group consisting of an amino group, a carbonyl group, a carboxyl group, a cyano group, an amine group, a nitro group, a nitrile group, and alkyl chains. R3 represents one selected from the group consisting of an amino group, a carbonyl group, a carboxyl group, a cyano group, an amine group, a nitro group, a nitrile group, and alkyl chains. Ph1 represents an aromatic group such as a phenyl group or a biphenyl group. Ph2 represents an aromatic group such as a phenyl group or a biphenyl group. R2 represents one selected from the group consisting of a vinyl group, a carbonyl group, a carboxyl group, a diazo group, and an azoxy group.

The liquid crystal is not limited to the nematic liquid crystal. For example, a smectic liquid crystal may be used. When the liquid crystal is a smectic liquid crystal, the smectic liquid crystal may exhibit, for example, a smectic C (SmC) phase. The liquid crystal exhibiting the smectic C (SmC) phase may be, for example, a ferroelectric liquid crystal exhibiting a chiral smectic (SmC*) phase in which the liquid crystal molecules have a chiral center (e.g., an asymmetric carbon atom).

The molecular structure of the SmC* phase is represented as follows.

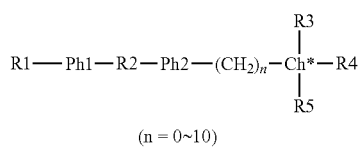

R1 and R4 are each independently one selected from the group consisting of an amino group, a carbonyl group, a carboxyl group, a cyano group, an amine group, a nitro group, a nitrile group, and alkyl chains. Ph1 is an aromatic group such as a phenyl group or a biphenyl group. Ph2 is an aromatic group such as a phenyl group or a biphenyl group. R2 is one selected from the group consisting of a vinyl group, a carbonyl group, a carboxyl group, a diazo group, and an azoxy group. Ch* represents a chiral center. The chiral center is typically carbon (C*). R3 is one selected from the group consisting of hydrogen, a methyl group, an amino group, a carbonyl group, a carboxyl group, a cyano group, an amine group, a nitro group, a nitrile group, and alkyl chains. R5 is one selected from the group consisting of hydrogen, a methyl group, an amino group, a carbonyl group, a carboxyl group, a cyano group, an amine group, a nitro group, a nitrile group, and alkyl chains. R3, R4, and R5 are mutually different functional groups.

The liquid crystal material may be a mixture of a plurality of types of liquid crystal molecules with different compositions. For example, a mixture of nematic liquid crystal molecules and smectic liquid crystal molecules may be used as the material of the optical waveguide layers 20.

Generally, before a liquid crystal material is poured into a liquid crystal cell, the temperature of the liquid crystal cell is increased in order to increase the flowability of the liquid crystal material, and then the liquid crystal material is poured into the liquid crystal cell. It is therefore known that the liquid crystal molecules strongly tend to be aligned in a direction of the flow of the liquid crystal molecules during pouring. In the case where the liquid crystal is poured into the optical waveguide layer 20 shown in FIG. 49A, when the liquid crystal material is poured from an edge surface of the optical waveguide layer 20 that is parallel to the YZ plane, the liquid crystal molecules 76 are aligned parallel to the longitudinal direction of the optical waveguide layer 20 (the X direction).

As shown in FIG. 49A, when the switching element 112 of the driving circuit 110 is OFF, i.e., no driving voltage is applied to the optical waveguide layer 20, the polarization direction of the propagating light is close to parallel to the longitudinal direction of the liquid crystal molecules. Strictly speaking, the polarization direction and the longitudinal direction of the liquid crystal molecules intersect at angle θ as described above. In this state, the optical waveguide layer 20 has a relatively high refractive index for the propagating light. The refractive index $n_{//}$ of the liquid crystal in this case is about 1.6 to about 1.7 when the liquid crystal is a commonly used liquid crystal material. In this state, the emergent angle of the light emitted from the optical waveguide layer 20 is relatively large.

However, as shown in FIG. 49B, when the switching element 112 of the driving circuit 110 is turned ON, i.e., the driving voltage is applied to the optical waveguide layer 20, the liquid crystal molecules 76 are aligned so as to be perpendicular to the transparent electrodes 62. Therefore, the angle between the polarization direction of the propagating light and the longitudinal direction of the liquid crystal molecules becomes close to 90 degrees. Strictly speaking, the polarization direction and the longitudinal direction of the liquid crystal molecules intersect at an angle of (90°−θ). In this state, the optical waveguide layer 20 has a relatively low refractive index for the propagating light. The refractive index $n_\perp$ of the liquid crystal in this case is about 1.4 to about 1.5 when the liquid crystal is a commonly used liquid crystal material. In this state, the emergent angle of the light emitted from the optical waveguide layer 20 is relatively small.

FIG. 49B shows an example in which an alignment film is present between the optical waveguide layer 20 and the lower electrode 62 in the figure. Since the alignment film is present, liquid crystal molecules 76 on the lower side in the figure tend not to be aligned vertically. The alignment film may be disposed on the upper electrode 62 or may not be provided.

By using the liquid crystal material for the optical waveguide layer 20 as described above, the refractive index can be changed by about 0.1 to 0.2 by switching the applied voltage between ON and OFF. The emergent angle of the light emitted from the optical waveguide layer 20 can thereby be changed.

In this example, the driving circuit 110 includes the driving power source 111 and the switching element 112, but this structure is not a limitation. For example, the driving circuit 110 may use a voltage control circuit such as a voltage amplifier instead of the switching element 112. By using this structure, the alignment of the liquid crystal molecules 76 can be changed continuously, so that the emission angle can be controlled freely.

Figure 50:
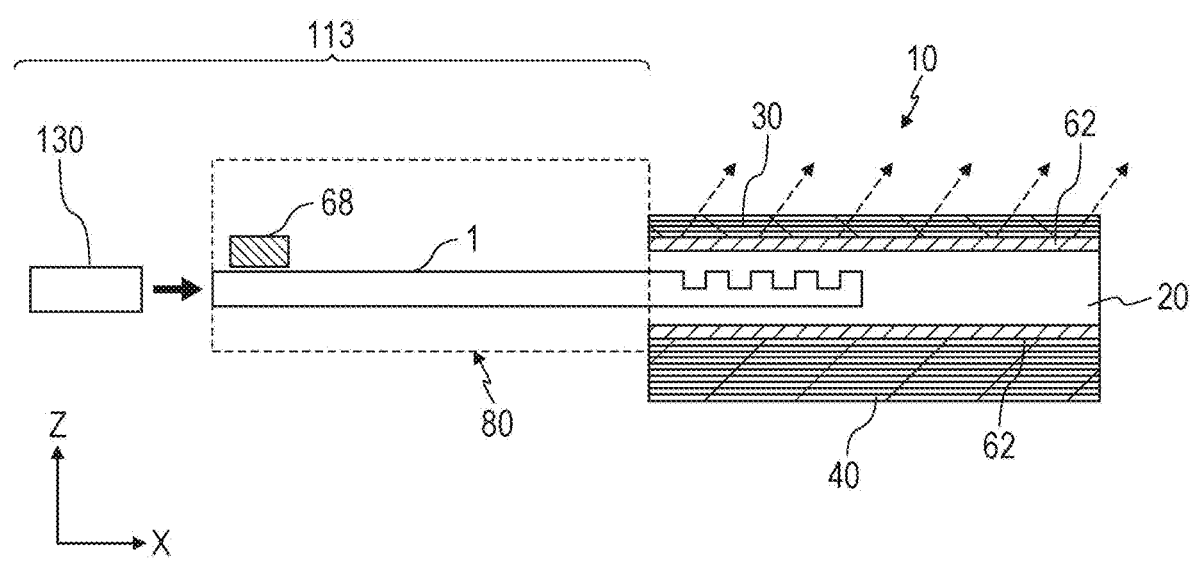
FIG. 50 is a cross sectional view showing an example of an optical scanning device including a light input device.

FIG. 50 is a cross-sectional view schematically showing a structural example of a light input device 113 for inputting light into the optical waveguide layer 20. The light input device 113 in this example includes a light source 130 and a waveguide 1 that propagates light emitted from the light source 130 to input the light into the optical waveguide layer 20. The waveguide 1 in this example is a phase shifter 80 having the structure shown in FIG. 33, but a waveguide having a different structure may be used.

The light source 130 emits linearly polarized light whose electric field vibrates in the XZ plane in FIG. 50. The linearly polarized light emitted from the light source 130 enters the optical waveguide layer 20 through the phase shifter 80 and propagates as P-polarized light. As described above, the optical scanning device may include the light input device 113 that inputs the P-polarized light into the optical waveguide layer 20. When S-polarized light, i.e., linearly polarized light whose electric field vibrates in the Y direction, is inputted to the optical waveguide layer 20, as in examples described later, the light source 130 may have a structure that emits S-polarized light.

Figure 51A:
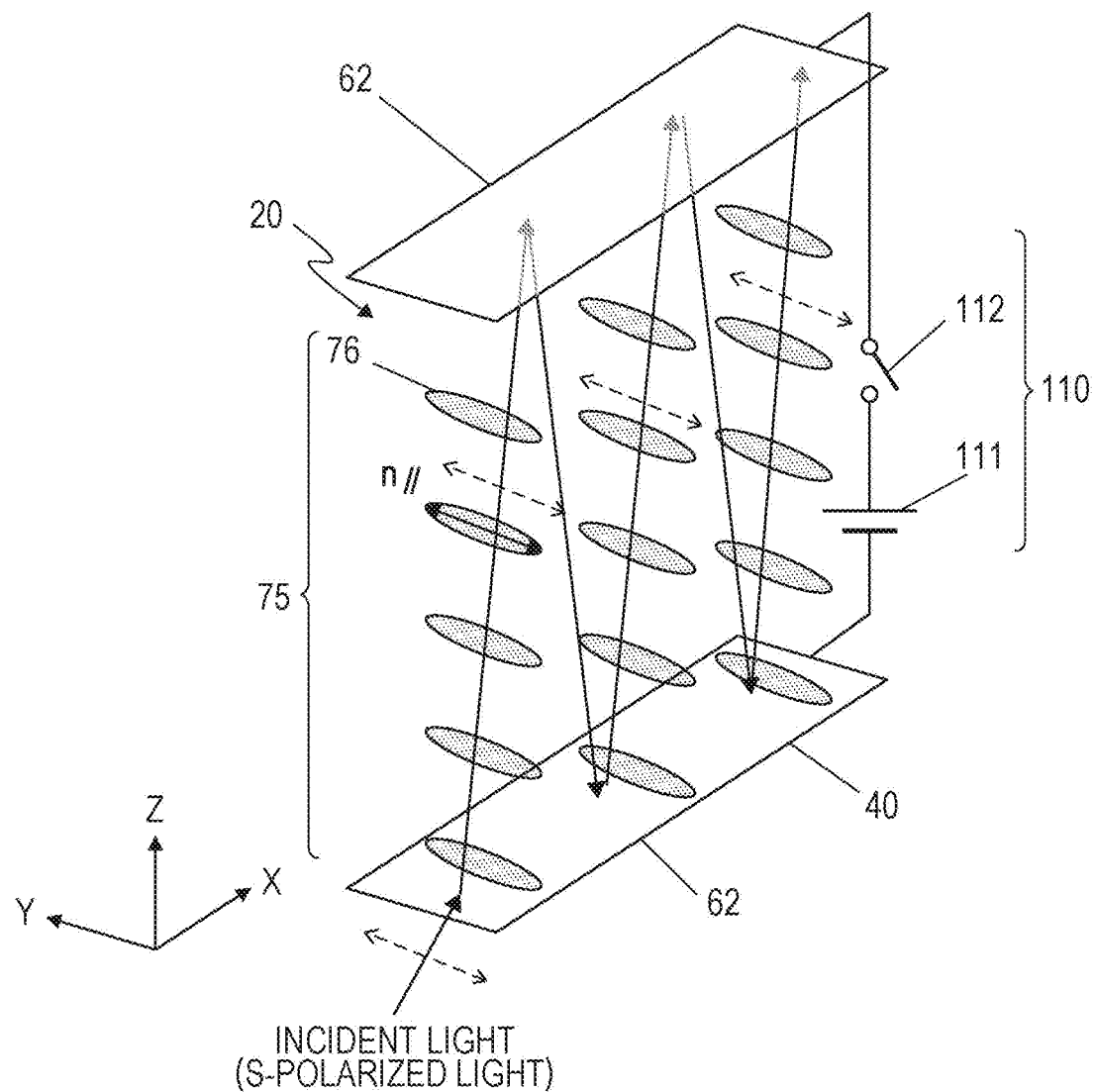
FIG. 51A is an illustration showing a second example of the structure in which the liquid crystal material is used for the optical waveguide layer.
Figure 51B:
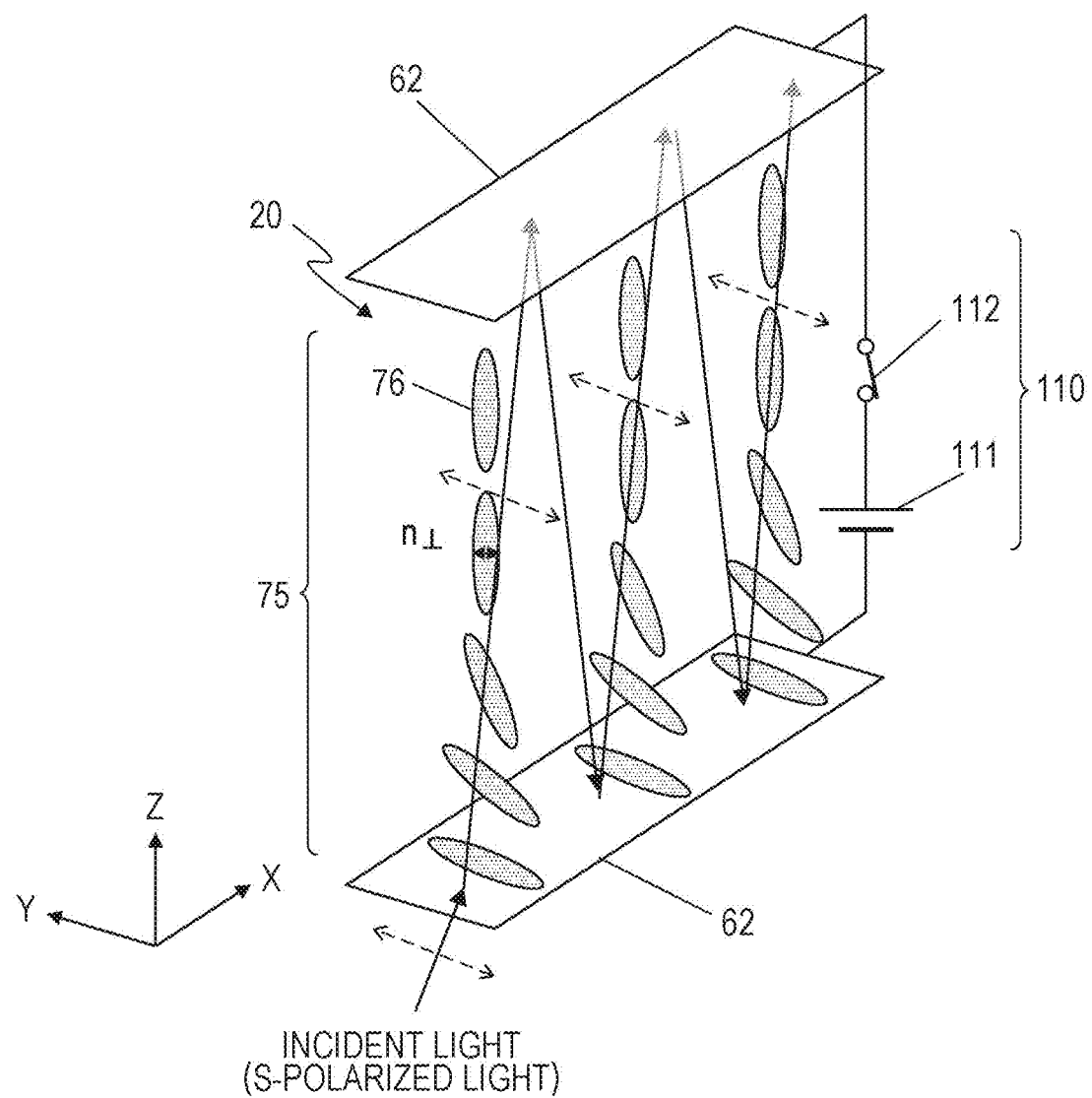
FIG. 51B is an illustration showing the second example of the structure in which the liquid crystal material is used for the optical waveguide layer.

FIGS. 51A and 51B show a second example of the structure in which the liquid crystal material is used for the optical waveguide layer 20. The second example differs from the first example in that the incident light is S-polarized light and that, when no voltage is applied to the pair of electrodes 62, the alignment direction of the liquid crystal molecules 76 is a direction (the Y direction) perpendicular to both the extending direction of the optical waveguide layer 20 (the X direction) and the direction normal to the mirrors (the Z direction). Since the incident light is the S-polarized light, the direction of its electric field is the Y direction perpendicular to the incidence plane.

The alignment direction of the liquid crystal molecules 76 can be controlled by rubbing the surfaces of the upper and lower electrodes 62 included in the liquid crystal cell before the liquid crystal is inserted. Alternatively, the alignment direction can be controlled by coating the surface of each of the upper and lower electrodes 62 with, for example, a polyimide to form an alignment layer (alignment film).

As shown in FIG. 51A, when the switching element 112 of the driving circuit 110 is OFF, i.e., no driving voltage is applied to the optical waveguide layer 20, the polarization direction of the propagating light is substantially parallel to the longitudinal direction of the liquid crystal molecules. In this state, the optical waveguide layer 20 has a relatively high refractive index for the propagating light. The refractive index $n_{//}$ of the liquid crystal in this case is about 1.6 to about 1.7 when the liquid crystal is a commonly used liquid crystal material. In this state, the emergent angle of the light emitted from the optical waveguide layer 20 is relatively large.

However, as shown in FIG. 51B, when the switching element 112 of the driving circuit 110 is turned ON, i.e., the driving voltage is applied to the optical waveguide layer 20, the liquid crystal molecules 76 are aligned so as to be perpendicular to the transparent electrodes 62. Therefore, the angle between the polarization direction of the propagating light and the longitudinal direction of the liquid crystal molecules becomes substantially 90 degrees. In this state, the optical waveguide layer 20 has a relatively low refractive index for the propagating light. The refractive index $n_\perp$ of the liquid crystal in this case is about 1.4 to about 1.5 when the liquid crystal is a commonly used liquid crystal material. In this state, the emergent angle of the light emitted from the optical waveguide layer 20 is relatively small.

In the structure shown in FIGS. 51A and 51B, when no voltage is applied, the polarization direction coincides with the alignment direction of the liquid crystal molecules 76. When a high voltage is applied, the polarization direction is orthogonal to the alignment direction of the liquid crystal molecules 76. Therefore, the change in the refractive index can be larger than that in the structure shown in FIGS. 49A and 49B even when the same voltage is applied. The emission angle of the light can thereby be changed more largely. However, the structure shown in FIGS. 49A and 49B is advantageous in that it can be produced easily.

Figure 52A:
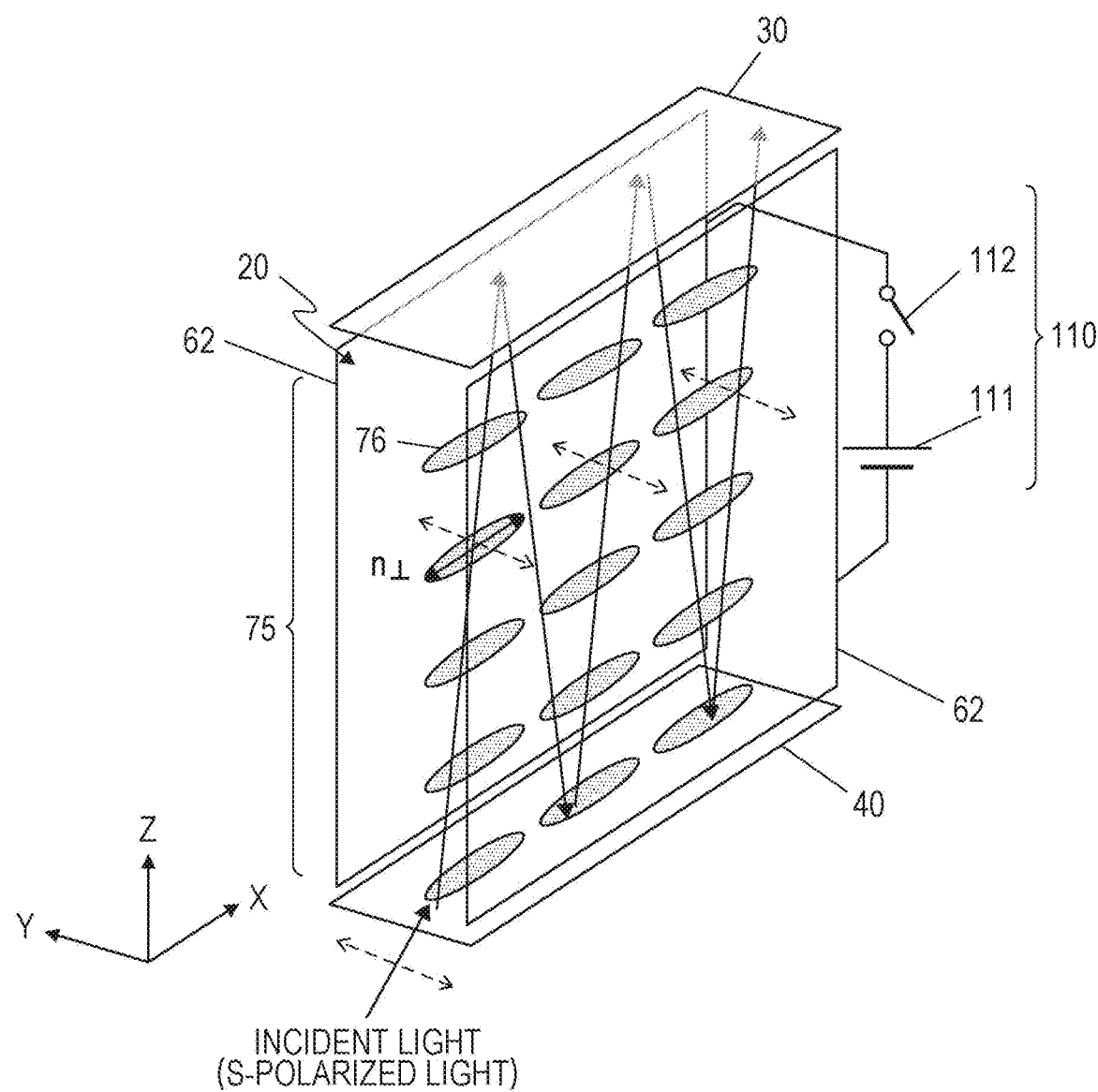
FIG. 52A is an illustration showing a third example of the structure in which the liquid crystal material is used for the optical waveguide layer.
Figure 52B:
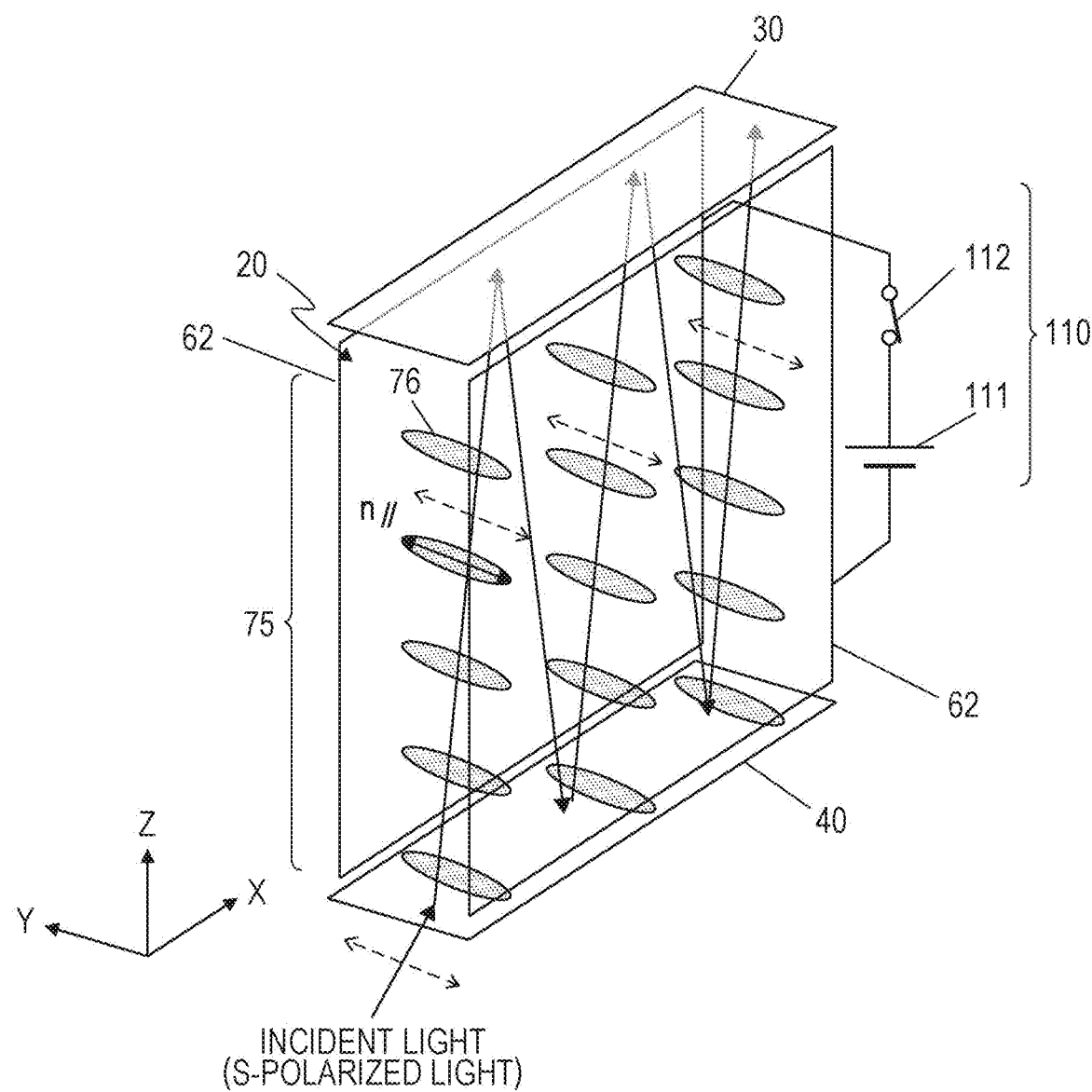
FIG. 52B is an illustration showing the third example of the structure in which the liquid crystal material is used for the optical waveguide layer.

FIGS. 52A and 52B show a third example of the structure in which the liquid crystal material is used for the optical waveguide layer 20. The third example differs from the first example in that the incident light is S-polarized light and that the pair of electrodes 62 are disposed parallel to the XZ plane with the optical waveguide layer 20 therebetween. The pair of electrodes 62 in this example are disposed substantially perpendicular to the first mirror 30 and the second mirror 40. When a voltage is applied, the pair of electrodes 62 generates an electric field in the Y direction that is perpendicular to both the extending direction of the optical waveguide layer 20 (the X direction) and the direction normal to the mirrors (the Z direction). When no voltage is applied to the pair of electrodes, the alignment direction of the liquid crystal material is parallel to the extending direction of the optical waveguide layer 20, as in the first example.

As shown in FIG. 52A, when the switching element 112 of the driving circuit 110 is OFF, i.e., no driving voltage is applied to the optical waveguide layer 20, the polarization direction of the propagating light is substantially perpendicular to the longitudinal direction of the liquid crystal molecules. In this state, the optical waveguide layer 20 has a relatively low refractive index for the propagating light. The refractive index $n_\perp$ of the liquid crystal in this case is about 1.4 to about 1.5 when the liquid crystal is a commonly used liquid crystal material. In this state, the emergent angle of the light emitted from the optical waveguide layer 20 is relatively small.

However, as shown in FIG. 52B, when the switching element 112 of the driving circuit 110 is turned ON, i.e., the driving voltage is applied to the optical waveguide layer 20, the longitudinal direction of the liquid crystal molecules 76 is changed to a direction (the Y direction) perpendicular to both the extending direction of the optical waveguide layer 20 (the X direction) and the direction normal to the mirrors 30 and 40 (the Z direction). Therefore, the polarization direction of the propagating light is substantially parallel to the longitudinal direction of the liquid crystal molecules. In this state, the optical waveguide layer 20 has a relatively high refractive index for the propagating light. The refractive index $n_{//}$ of the liquid crystal in this case is about 1.6 to about 1.7 when the liquid crystal is a commonly used liquid crystal material. In this state, the emergent angle of the light emitted from the optical waveguide layer 20 is relatively large.

Figure 53A:
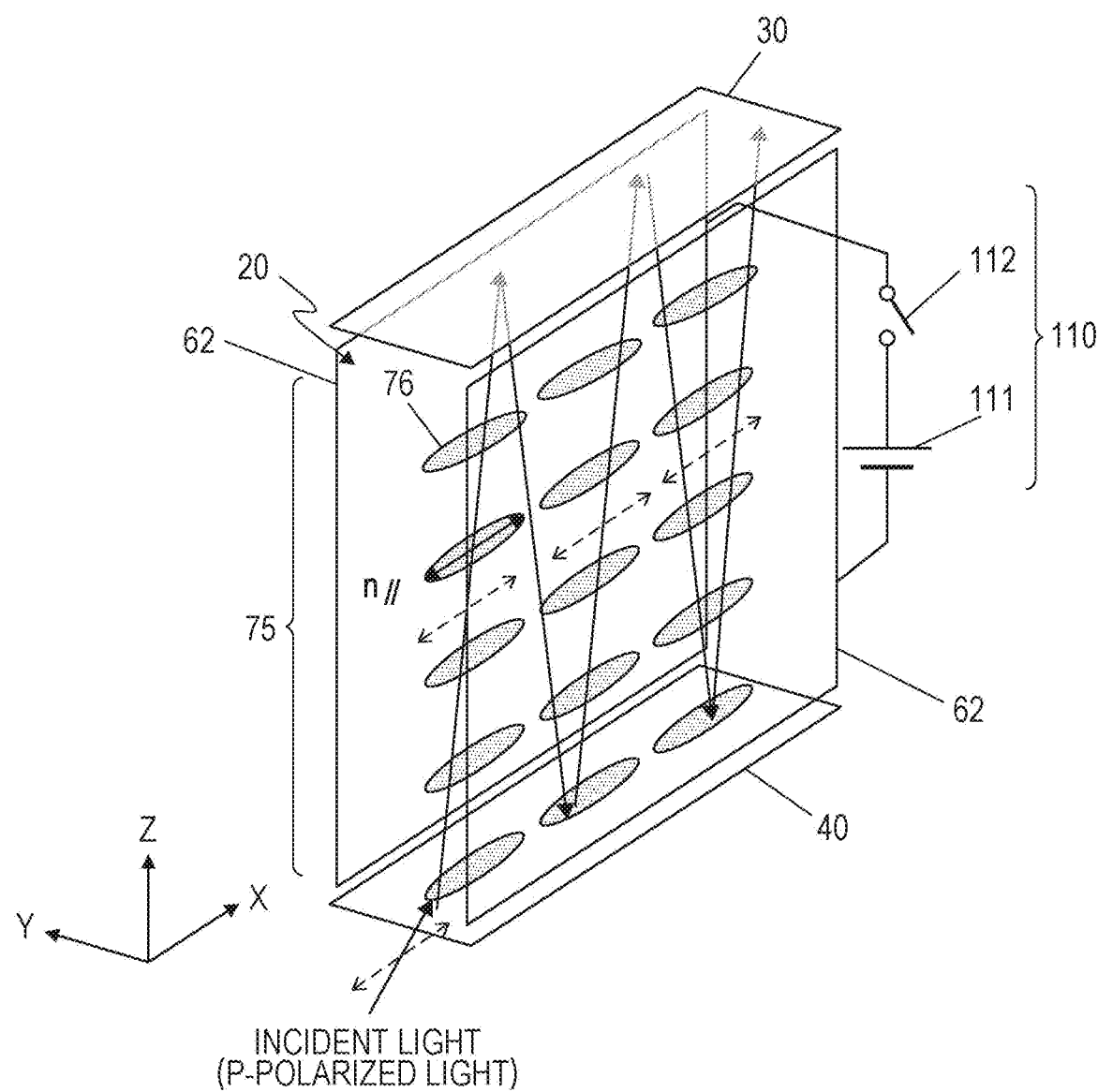
FIG. 53A is an illustration showing a fourth example of the structure in which the liquid crystal material is used for the optical waveguide layer.
Figure 53B:
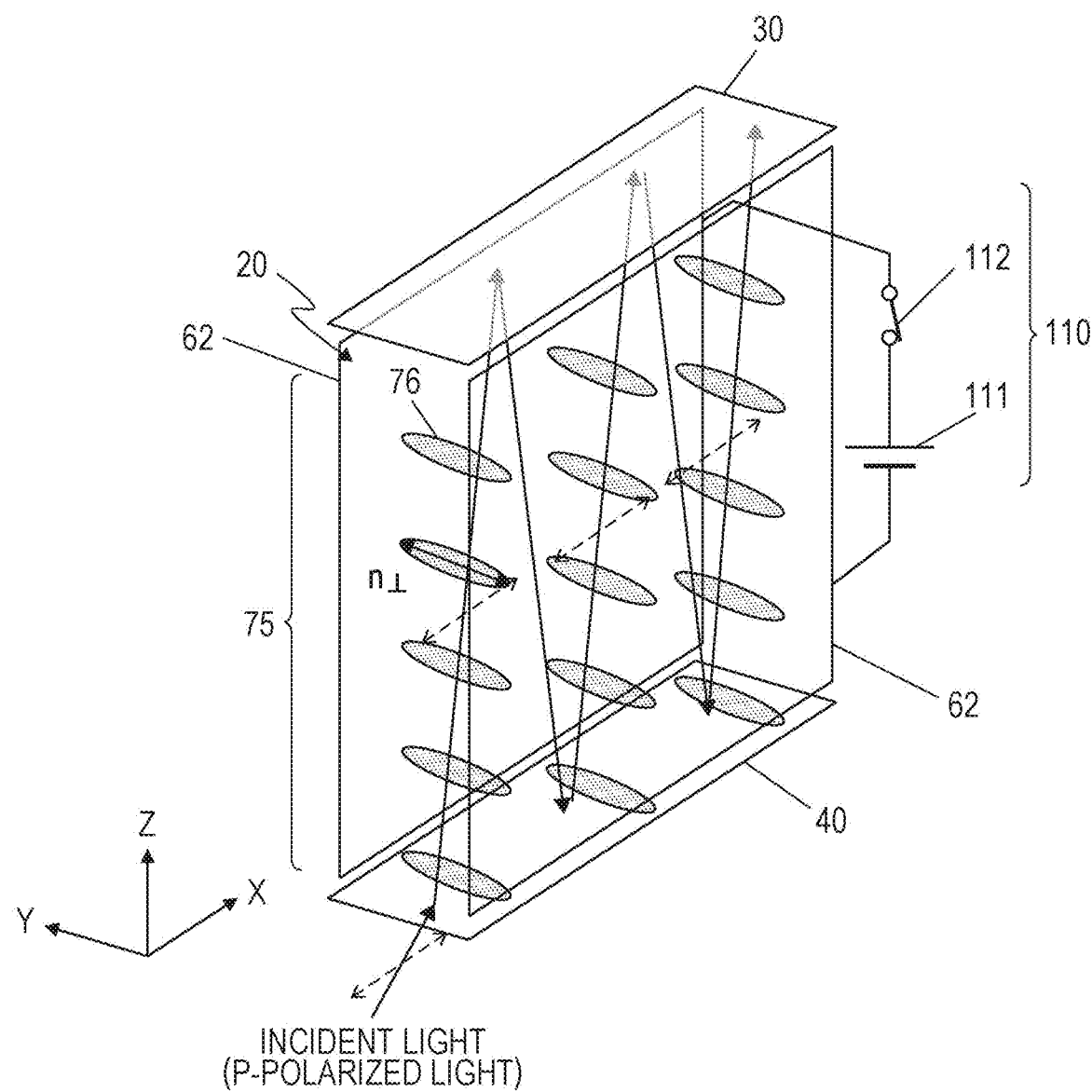
FIG. 53B is an illustration showing the fourth example of the structure in which the liquid crystal material is used for the optical waveguide layer.

FIGS. 53A and 53B show a fourth example of the structure in which the liquid crystal material is used for the optical waveguide layer 20. The fourth example differs from the third example in that the incident light is P-polarized light.

As shown in FIG. 53A, when the switching element 112 of the driving circuit 110 is OFF, i.e., no driving voltage is applied to the optical waveguide layer 20, the polarization direction of the propagating light is close to parallel to the longitudinal direction of the liquid crystal molecules. Strictly speaking, the polarization direction and the longitudinal direction of the liquid crystal molecules intersect at angle θ as described above. In this state, the optical waveguide layer 20 has a relatively high refractive index for the propagating light. The refractive index $n_{//}$ of the liquid crystal in this case is about 1.6 to about 1.7 when the liquid crystal is a commonly used liquid crystal material. In this state, the emergent angle of the light emitted from the optical waveguide layer 20 is relatively large.

However, as shown in FIG. 53B, when the switching element 112 of the driving circuit 110 is turned ON, i.e., the driving voltage is applied to the optical waveguide layer 20, the liquid crystal molecules 76 are aligned perpendicularly to the transparent electrodes 62. Therefore, the polarization direction of the propagating light is substantially perpendicular to the longitudinal direction of the liquid crystal molecules. In this state, the optical waveguide layer 20 has a relatively low refractive index for the propagating light. The refractive index $n_\perp$ of the liquid crystal in this case is about 1.4 to about 1.5 when the liquid crystal is a commonly used liquid crystal material. In this state, the emergent angle of the light emitted from the optical waveguide layer 20 is relatively small.

As described above, in the examples in which the liquid crystal material is used for the optical waveguide layer 20, the direction of the emission light can be controlled by appropriately setting the polarization direction of the light, the alignment direction of the liquid crystal molecules 76, and the arrangement of the pair of electrodes 62. Even when the polarization direction of the incident light is P-polarization or S-polarization, the direction of the light beam can be changed by chaining the emission angle according to the driving voltage.

Figure 54:
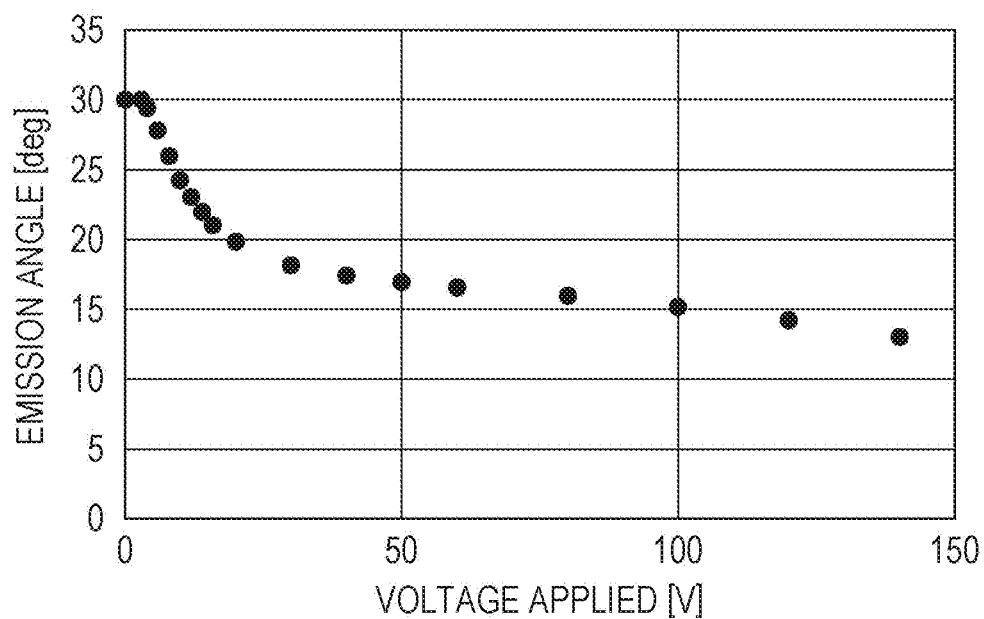
FIG. 54 is a graph showing the dependence of the emission angle of light on the voltage applied in a structure in which the liquid crystal material is used for the optical waveguide layer.
Figure 55:
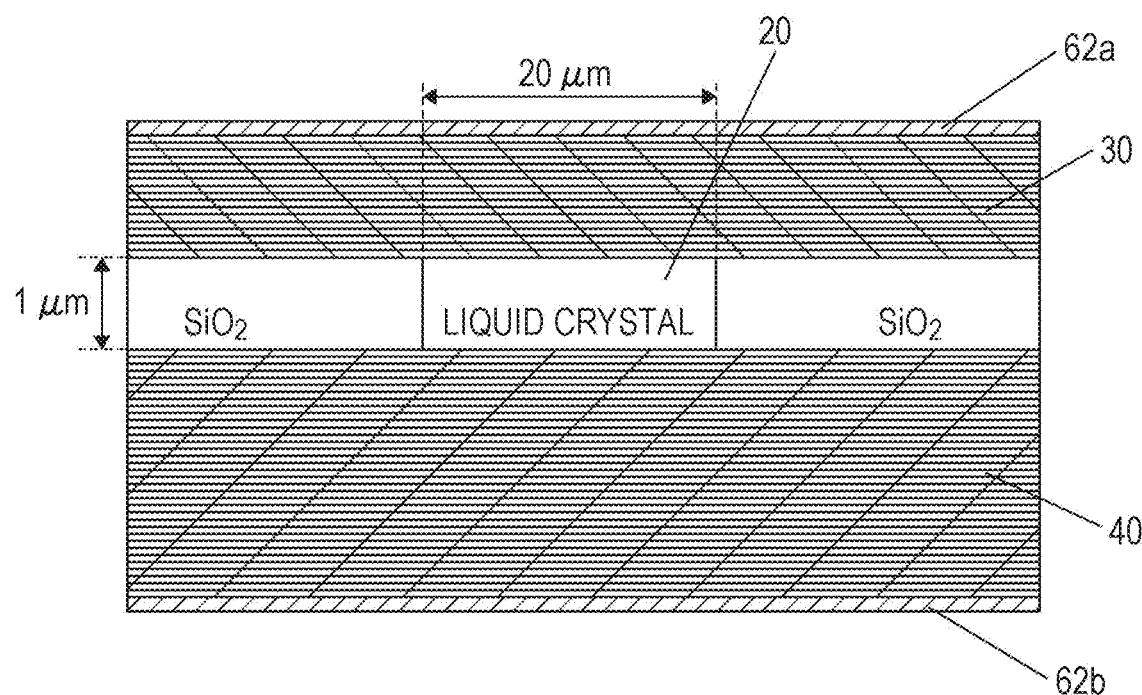
FIG. 55 is a cross-sectional view showing the structure of a waveguide element used in the experiment.

FIG. 54 is a graph showing the dependence of the light emission angle on the voltage applied in a structure in which the liquid crystal material is used for the optical waveguide layer 20. This graph shows the results of an experiment in which the emission angle of light emitted from the optical waveguide layer 20 was measured while the voltage applied was changed in the structure shown in FIGS. 49A and 49B. FIG. 55 is a cross-sectional view showing the structure of a waveguide element used in the experiment. In this waveguide element, an electrode 62b, a second mirror 40 that is a multilayer reflective film, an optical waveguide layer 20 that is a liquid crystal layer, a first mirror 30 that is a multilayer reflective film, and a transparent electrode 62a are stacked in this order. A $SiO_2$ layer is formed so as to sandwich the optical waveguide layer 20.

In this experiment, the liquid crystal material used is 5CB (4-cyano-4'-pentylbiphenyl). The alignment direction of the liquid crystal at 0 V is parallel to the extending direction of the optical waveguide layer 20, i.e., a direction perpendicular to the drawing sheet of FIG. 55. The thickness of the optical waveguide layer 20 is 1 μm, and the width of the optical waveguide layer 20 is 20 μm. The light used for the measurement is TM polarized light (P-polarized light) with a wavelength of 1.47 μm. The electrode 62b was deposited between the multilayer reflective film of the second mirror 40 and an unillustrated substrate. In this experiment, since the two multilayer reflective films were disposed between the electrodes 62a and 62b, a relatively high voltage was applied.

As shown in FIG. 54, when the voltage was applied, the emission angle could be changed by about 15°. In this example, the structure shown in FIGS. 49A and 49B was used. However, the same or higher effect can be obtained using other structures.

Specific Examples Using Electrooptical Material

Next, specific examples of a structure in which an electrooptical material is used for the optical waveguide layer 20 will be described.

In an optical scanning device in which the optical waveguide layer 20 contains an electrooptical material, the optical waveguide layer 20 is formed such that the direction of the polarization axis of the electrooptical material coincides with the direction of an electric field generated when a voltage is applied to the pair of electrodes 62. With this structure, the change in the refractive index of the electrooptical material caused by the application of the voltage to the pair of electrodes 62 can be increased.

Figure 56:
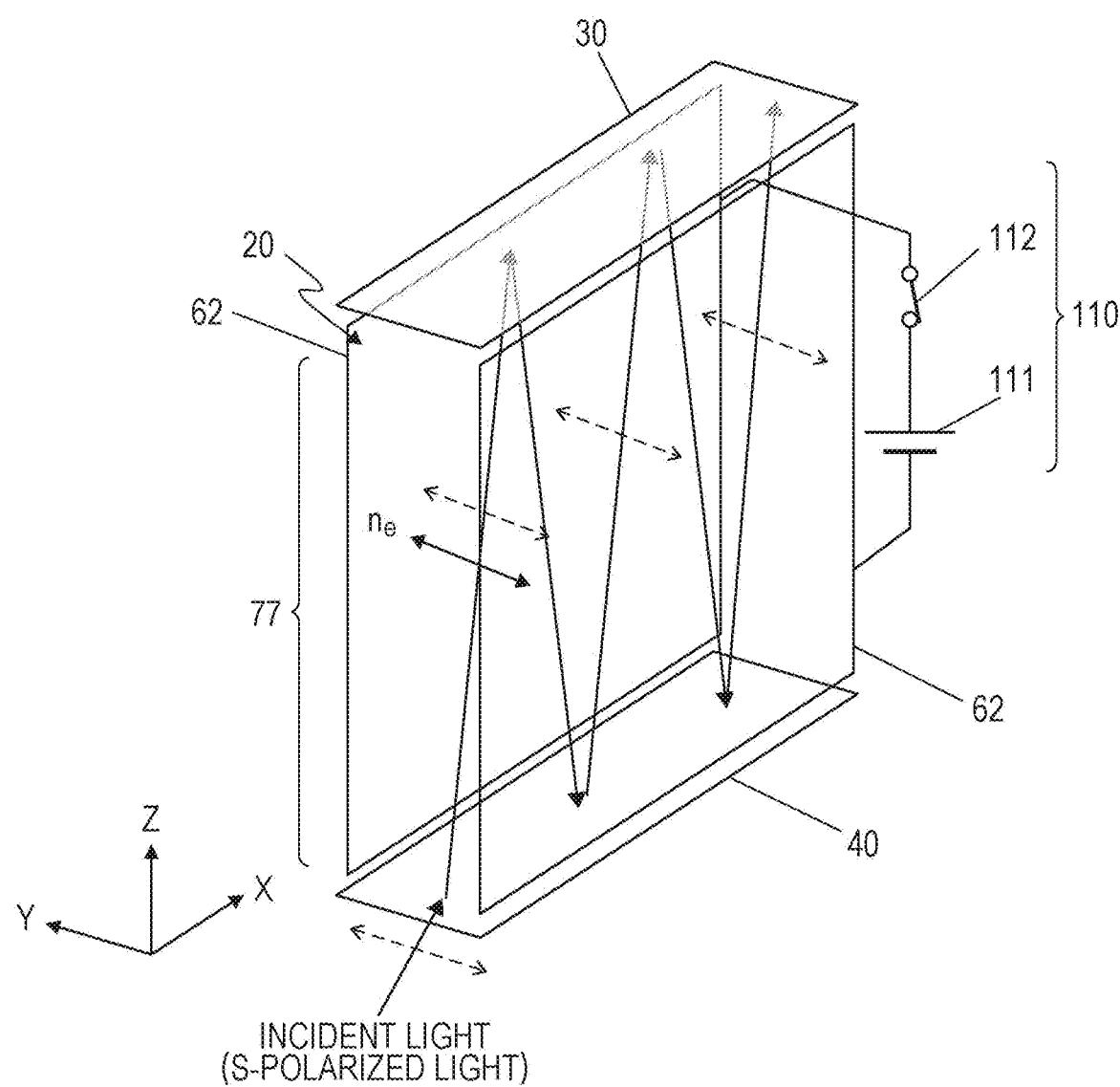
FIG. 56 is an illustration showing a first example of a structure in which an electrooptical material is used for the optical waveguide layer.

FIG. 56 shows a first example of the structure in which an electrooptical material 77 is used for the optical waveguide layer 20. In this example, the pair of electrodes 62 are disposed such that the direction of the electric field generated between the pair of electrodes 62 when a voltage is applied thereto coincides with a direction (the Y direction) perpendicular to both the extending direction of the optical waveguide layer 20 (the X direction) and the direction normal to the mirrors (the Z direction). The direction of the polarization axis of the electrooptical material in this example is the Y direction perpendicular to both the extending direction of the optical waveguide layer 20 and the direction normal to the mirrors. The driving circuit 110 applies a voltage to the pair of electrodes 62 to change the refractive index of the electrooptical material for the light propagating through the optical waveguide layer 20.

The direction of the polarization axis of the electrooptical material is a direction in which the change in refractive index when the voltage is applied is maximum. The polarization axis may be referred to also as an optical axis. In FIG. 56, the direction of the polarization axis is indicated by a solid two-directional arrow. The refractive index ne in a direction along the polarization axis changes according to the voltage applied.

The electrooptical material usable in the present embodiment may be, for example, a compound represented by $KTa_{1-x}Nb_xO_3$ or $K_{1-y}A_yTa_{1-x}Nb_xO_3$ (A is an alkali metal and is typically Li or Na). x represents the molar ratio of Nb, and y represents the molar ration of A. x and y are each independently a real number larger than 0 and smaller than 1.

The electrooptical material used may be any of the following compounds.

KDP ($KH_2PO_4$) crystals such as KDP, ADP ($NH_4H_2PO_4$), KDA ($KH_2AsO_4$), RDA ($RbH_2PO_4$), and ADA ($NH_4H_2AsO_4$)

Cubic crystal materials such as KTN, $BaTi_3$, $SrTi_3Pb_3MgNb_2O_9$, GaAs, CdTe, and InAs Tetragonal crystal materials such as $LiNbO_3$ and $LiTaO_3$ Zincblende materials such as ZnS, ZnSe, ZnTe, GaAs, and CuC Tungsten bronze materials such as $KLiNb_3$, $SrBaNb_2O_6$, KSrNbO, BaNaNbO, and $Ca_2Nb_2O_7$ As shown in FIG. 56, the polarization axis of the electrooptical material is set to a direction perpendicular to the pair of electrodes 62, and the voltage applied to the pair of electrodes 62 is changed by the driving circuit 110. In this manner, the refractive index can be changed. In this case, when the incident light is S-polarized light, the polarization plane is parallel to the polarization axis of the electrooptical material. Therefore, the change in refractive index due to the voltage is most effectively reflected on the incident light, and the change in the emission angle of the light can be increased.

Figure 57:
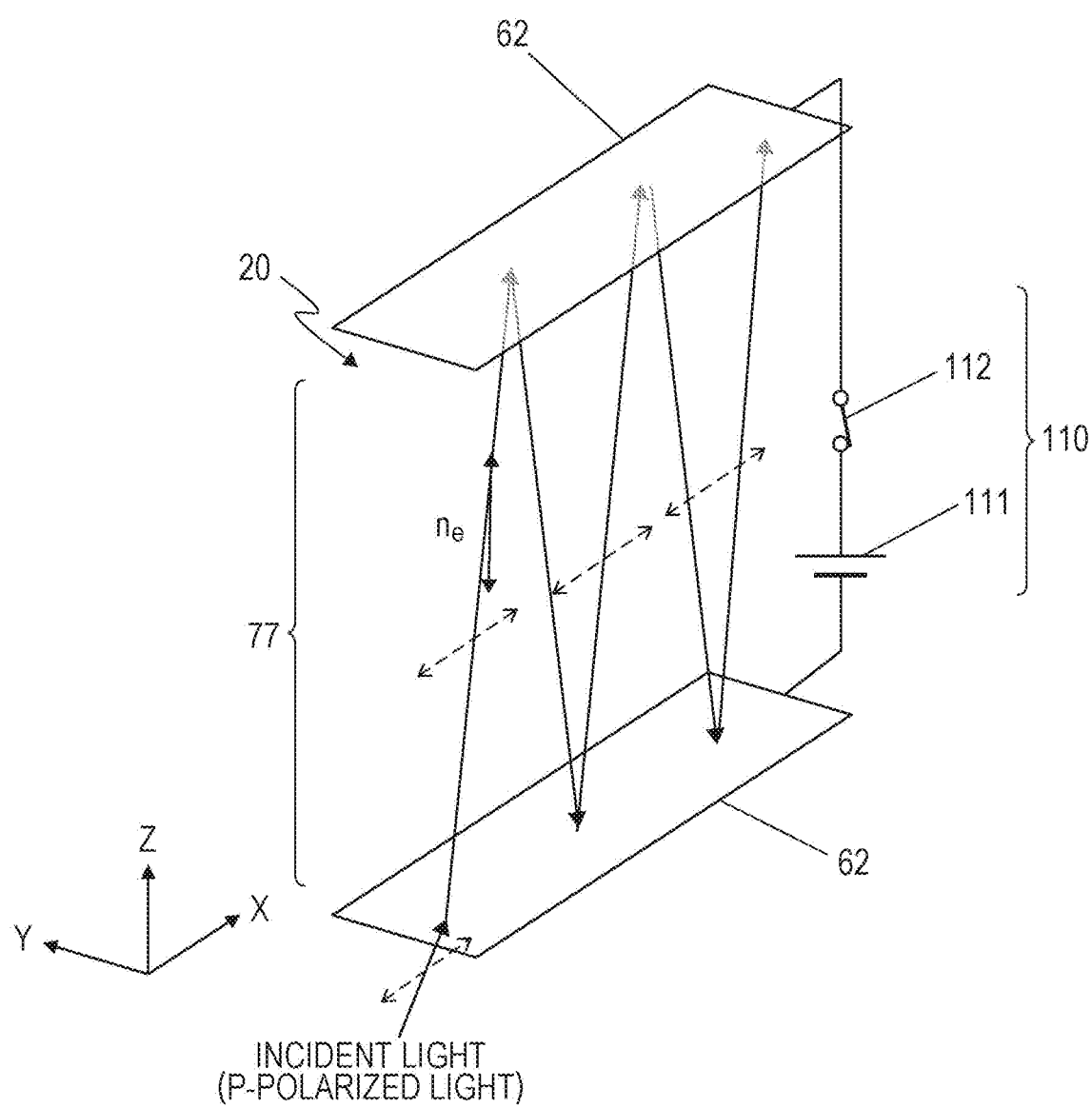
FIG. 57 is an illustration showing the first example of the structure in which the electrooptical material is used for the optical waveguide layer.

FIG. 57 shows a second example of the structure in which the electrooptical material 77 is used for the optical waveguide layer 20. The structure of the second example differs from that in FIG. 56 in that the pair of electrodes 62 are disposed parallel to unillustrated first and second mirrors. In this example, the direction of the electric field generated between the electrodes 62 during the application of the voltage, i.e., the direction normal to the electrodes 62, is the Z direction. Therefore, the direction of the polarization axis of the electrooptical material is also set to this direction. In this example, the incident light is P-polarized light, so that the polarization plane is parallel to the polarization axis of the electrooptical material. Therefore, the change in refractive index due to the voltage is reflected on the incident light, and the change in emission angle of the light can be increased.

As described above, by using the electrooptical material for the optical waveguide layer 20, setting the polarization direction of the light and the polarization axis of the electrooptical material to a direction perpendicular to the electrodes 62, and controlling the driving voltage applied, the emission angle of the light can be changed to control the direction of the light beam.

Figure 58A:
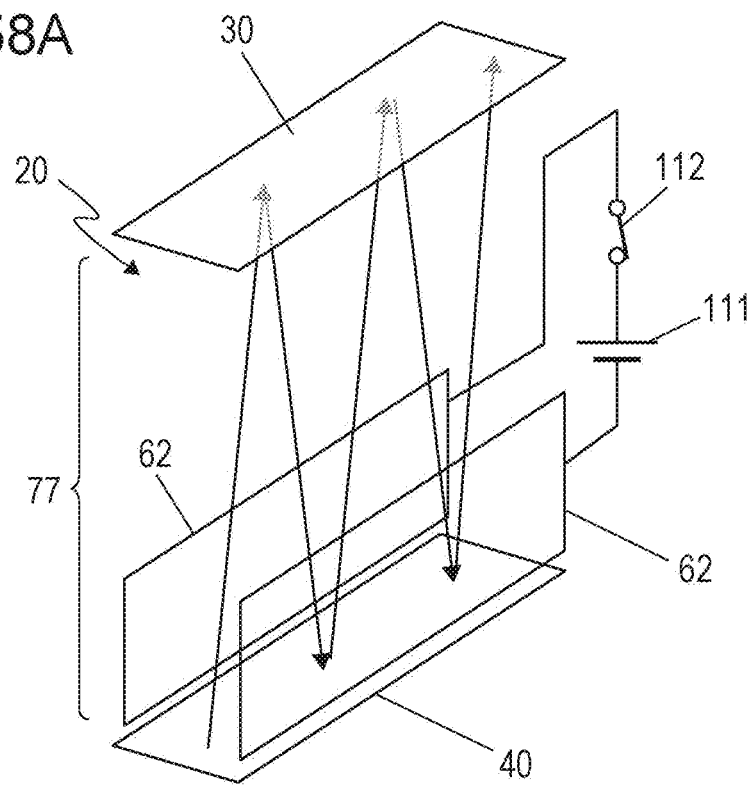
FIG. 58A is an illustration showing an example in which a pair of electrodes are disposed only in the vicinity of the second mirror.
Figure 58B:
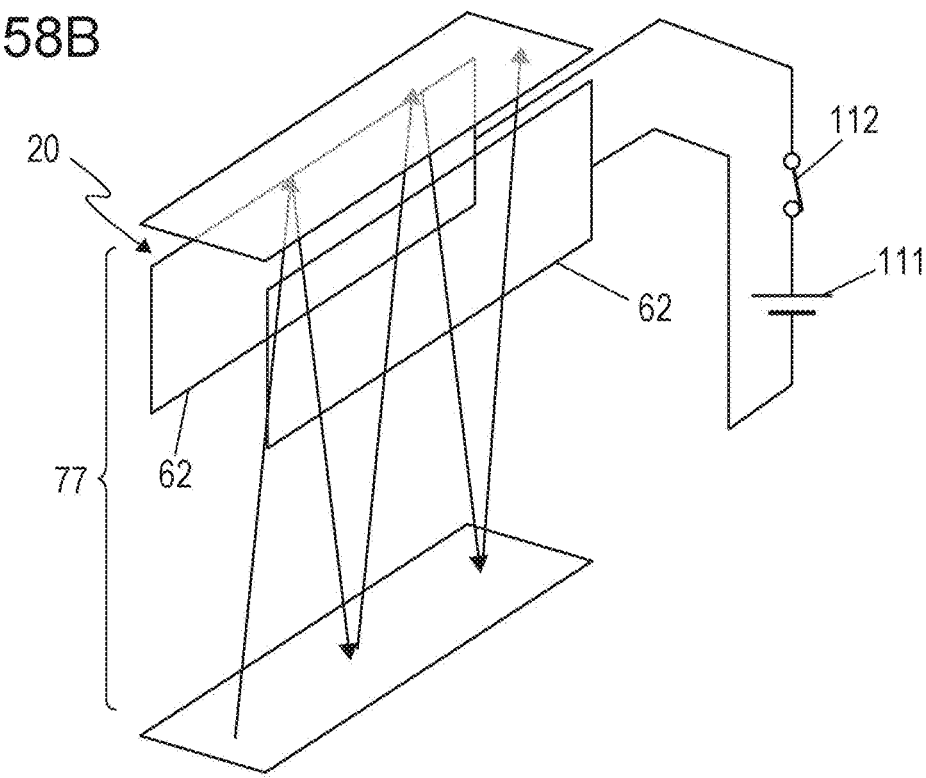
FIG. 58B is an illustration showing an example in which the pair of electrodes are disposed only in the vicinity of the first mirror.

FIGS. 58A and 58B show other examples of the arrangement of the pair of electrodes 62 perpendicular to the mirrors 30 and 40. In the example in FIG. 58A, the pair of electrodes 62 are disposed only in the vicinity of the second mirror 40. In the example in FIG. 58B, the pair of electrodes 62 are disposed only in the vicinity of the first mirror 30. The pair of electrodes 62 may be disposed on opposite sides of only part of the optical waveguide layer 20, as in these examples. These electrodes 62 may be disposed on the substrate supporting the second mirror 40 or the substrate supporting the first mirror 30. The structures in FIGS. 58A and 58B are applicable when the material of the optical waveguide layer 20 is the liquid crystal material and also when the material is the electrooptical material.

As described above, the optical waveguide layer 20 in each of the optical scanning devices shown in FIGS. 49A to 58B contains the liquid crystal material or the electrooptical material. When no voltage is applied to the pair of electrodes 62, the alignment direction of the liquid crystal material or the direction of the polarization axis of the electrooptical material is parallel or perpendicular to the extending direction of the optical waveguide layer 20. The driving circuit 110 applies a voltage to the pair of electrodes 62 to change the refractive index of the liquid crystal material or the electrooptical material for the light propagating through the optical waveguide layer 20, and the direction of the light emitted from the optical waveguide layer 20 is thereby changed. By appropriately setting the polarization direction of the incident light, the change in the refractive index of the optical waveguide layer 20 can be increased to increase the change in emission angle of the light.

The phrase "two directions are "parallel to each other" or "coincide with each other"" is intended to encompass not only the case in which they are perfectly parallel to each other but also the case in which the angle therebetween is 15 degrees or less. The phrase "two directions are "perpendicular to each other"" does not mean that the two direction are strictly perpendicular to each other but encompasses the case in which the angle between them is from 75 degrees to 105 degrees inclusive.

<Refractive Index Modulation for Phase Shifting>

A description will next be given of a structure for adjusting phases in a plurality of phase shifters 80 using the second adjusting element. The phases in the plurality of phase shifters 80 can be adjusted by changing the refractive indexes of waveguides 20a of the phase shifters 80. The refractive indexes can be changed using the same method as any of the above-described methods for adjusting the refractive index of the optical waveguide layer 20 of each of the waveguide elements 10. For example, any of the structures and methods for refractive index modulation described with reference to FIGS. 37A to 38 can be applied without any modification. Specifically, in the descriptions for FIGS. 37A to 38, the waveguide element 10 is replaced with the phase shifter 80, the first adjusting element 60 is replaced with the second adjusting element, the optical waveguide layer 20 is replaced with the waveguide 20a, and the first driving circuit 110 is replaced with the second driving circuit 210. Therefore, the detailed description of the refractive index modulation in the phase shifter 80 will be omitted.

The waveguide 20a of each of the phase shifters 80 contains a material whose refractive index is changed when a voltage is applied or temperature is changed. The second adjusting element changes the refractive index of the waveguide 20a of each of the phase shifters 80 by applying a voltage to the waveguide 20a or changing the temperature of the waveguide 20a. In this manner, the second adjusting element can change the phase differences between light beams propagating from the plurality of phase shifters 80 to the plurality of waveguide elements 10.

Each phase shifter 80 may be configured such that the phase of light can be shifted by at least $2\pi$ when the light passes through. When the amount of change in the refractive index per unit length of the waveguide 20a of the phase shifter 80 is small, the length of the waveguide 20a may be increased. For example, the size of the phase shifter 80 may be several hundreds of micrometers (μm) to several millimeters (mm) or may be lager for some cases. However, the length of each waveguide element 10 may be several tens of micrometers to several tens of millimeters.

<Structure for Synchronous Driving>

In the present embodiment, the first adjusting element drives the plurality of waveguide elements 10 such that light beams emitted from the waveguide elements 10 are directed in the same direction. To direct the light beams emitted from the plurality of waveguide elements 10 in the same direction, driving units are provided for their respective waveguide elements 10 and driven synchronously.

Figure 59:
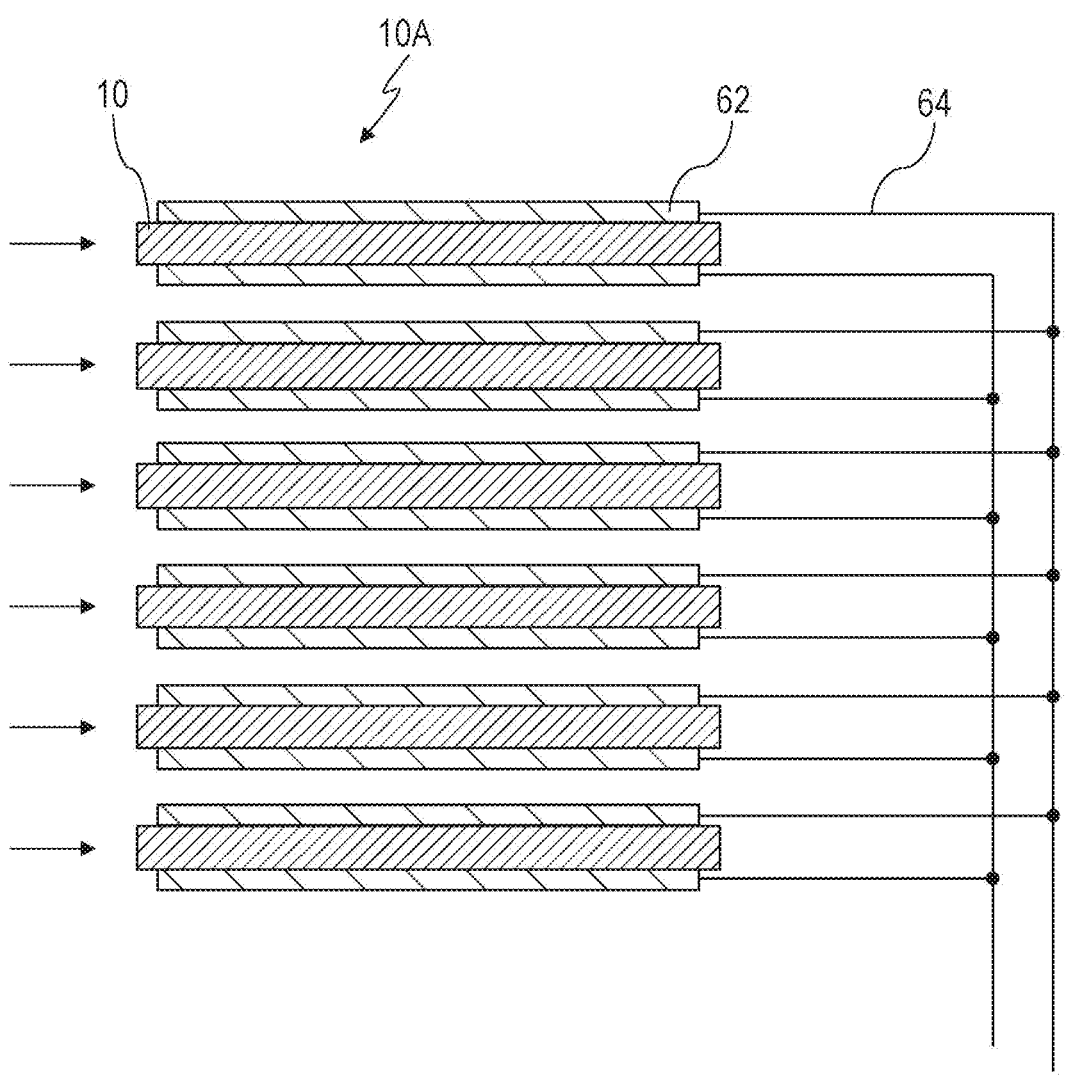
FIG. 59 is an illustration showing an example of a structure in which common wiring lines are led from electrodes of waveguide elements.
Figure 60:
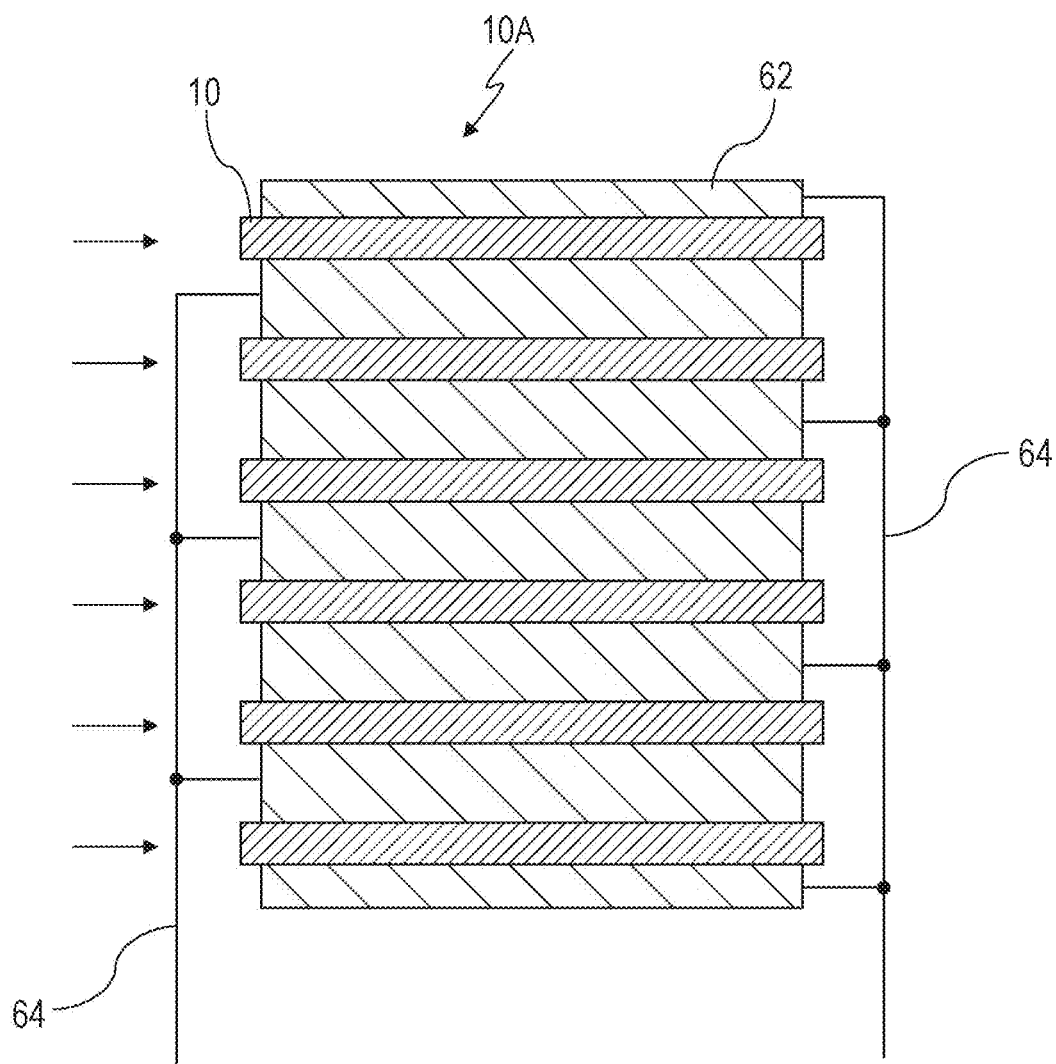
FIG. 60 is an illustration showing an example of a structure in which the wiring lines and some of the electrodes are shared.
Figure 61:
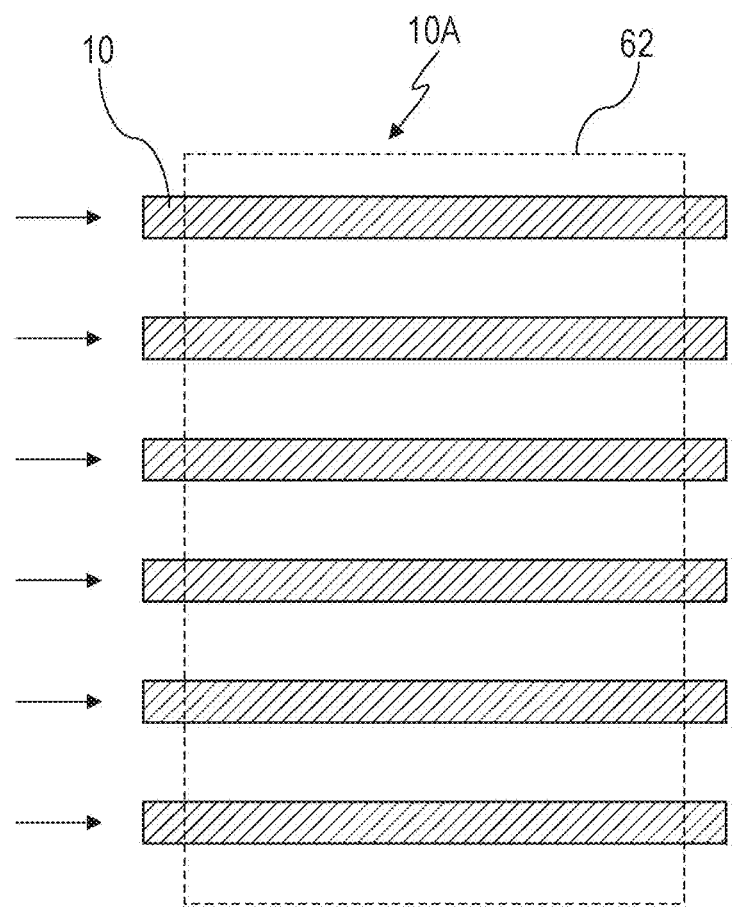
FIG. 61 is an illustration showing an example of a structure in which common electrodes are provided for a plurality of waveguide elements.

FIG. 59 is an illustration showing an example of a structure in which common wiring lines 64 are led from electrodes 62 of the waveguide elements 10. FIG. 60 is an illustration showing an example of a structure in which the wiring lines 64 and some of the electrodes 62 are shared. FIG. 61 is an illustration showing an example of a structure in which common electrodes 62 are provided for a plurality of waveguide elements 10. In FIGS. 59 to 61, each straight arrow indicates the input of light. With the structures shown in FIGS. 59 to 61, the wiring for driving the waveguide array 10A can be simplified.

With the structures in the present embodiment, two-dimensional optical scanning can be performed using a simple device structure. For example, when a waveguide array including N waveguide elements 10 is driven in a synchronous manner using independent driving circuits, N driving circuits are necessary. However, when common electrodes or wiring lines are used in an ingenious manner, only one driving circuit may be used for operation.

When the phase shifter array 80A is disposed upstream of the waveguide array 10A, additional N driving circuits are necessary to drive the phase shifters 80 independently. However, as shown in the example in FIG. 36, by arranging the phase shifters 80 in a cascaded manner, only one driving circuit may be used for driving. Specifically, with the structures in the present disclosure, a two-dimensional optical scanning operation can be implemented by using 2 to 2N driving circuits. The waveguide array 10A and the phase shifter array 80A may be operated independently, so that their wiring lines can be easily arranged with no interference.

<Production Method>

The waveguide array, the phase shifter array 80A, and the waveguides connecting them can be produced by a process capable of high-precision fine patterning such as a semiconductor process, a 3D printer, self-organization, or nanoimprinting. With such a process, all necessary components can be integrated in a small area.

In particular, the use of a semiconductor process is advantageous because very high processing accuracy and high mass productivity can be achieved. When the semiconductor process is used, various materials can be deposited on a substrate using vacuum evaporation, sputtering, CVD, application, etc. Fine patterning can be achieved by photolithography and an etching process. For example, Si, $SiO_2$, $Al_2O_3$, AlN, SiC, GaAs, GaN, etc. can be used as the material of the substrate.

<Modifications>

Modifications of the present embodiment will next be described.

Figure 62:
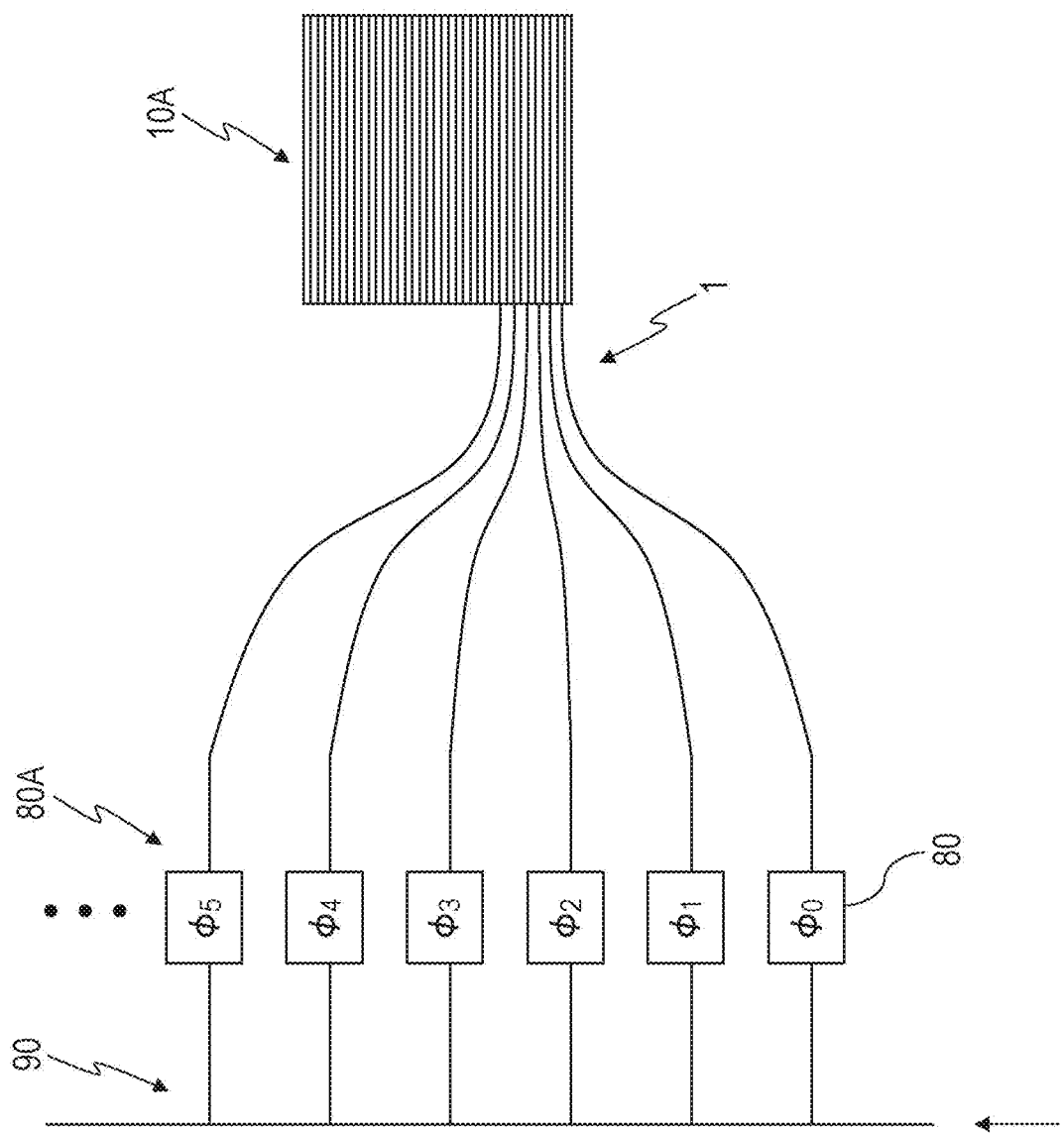
FIG. 62 is an illustration schematically showing an example of a structure in which waveguides are integrated into a small array while a large arrangement area is allocated for a phase shifter array.

FIG. 62 is an illustration schematically showing an example of a structure in which waveguides are integrated into a small array while a large arrangement area is allocated for the phase shifter array 80A. With this structure, even when the change in the refractive index of the material forming the waveguides of the phase shifters 80 is small, a sufficient phase shift amount can be ensured. When each phase shifter 80 is driven using heat, the influence on its adjacent phase shifters 80 can be reduced because large spacing can be provided between them.

Figure 63:
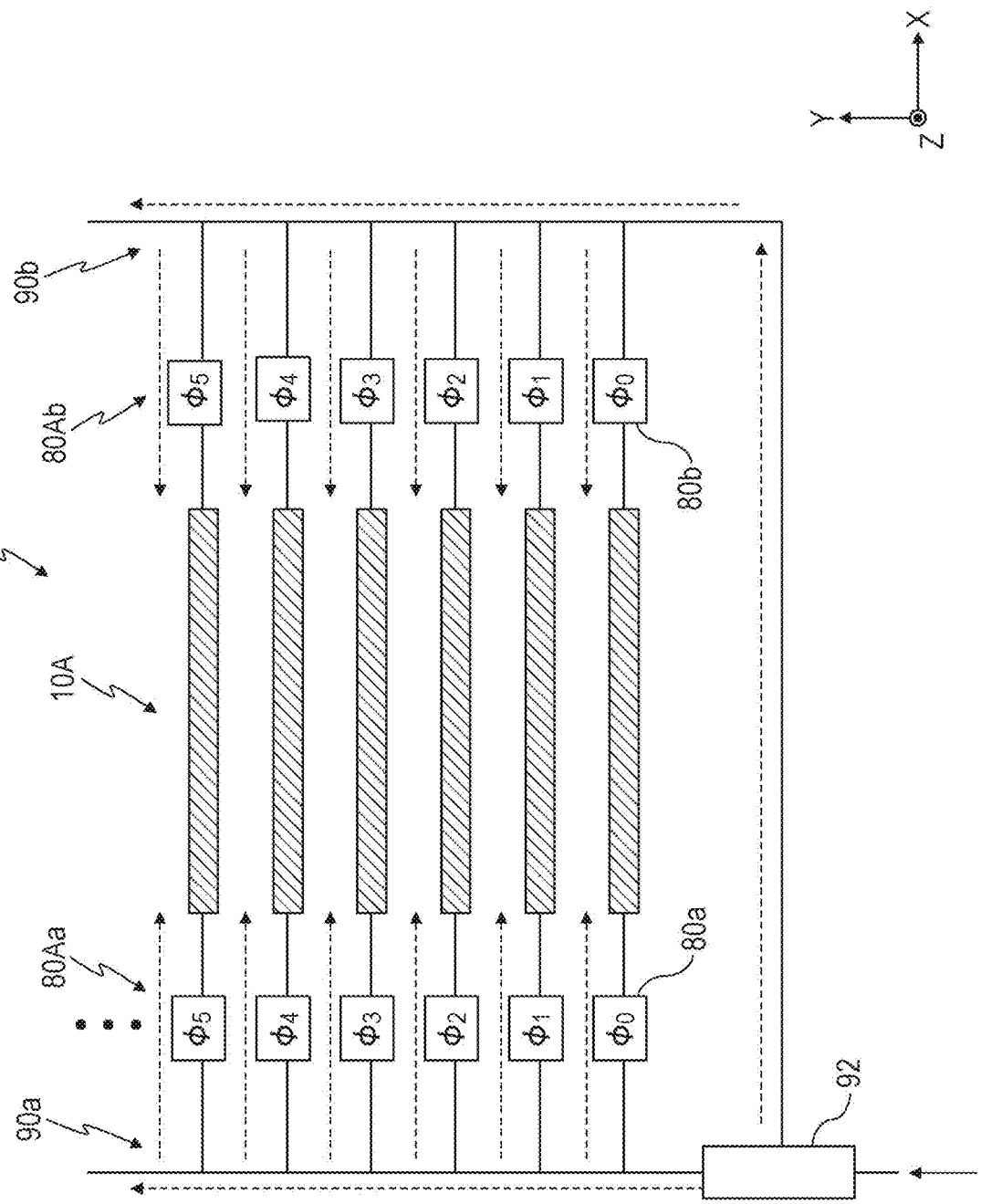
FIG. 63 is an illustration showing a structural example in which two phase shifter arrays are disposed on respective sides of a waveguide array.

FIG. 63 is an illustration showing a structural example in which a phase shifter array 80Aa and a phase shifter array 80Ab are disposed on respective sides of the waveguide array 10A. In the optical scanning device 100 in this example, an optical divider 90a, an optical divider 90b, and the phase shifter arrays 80Aa and 80Ab are disposed on respective sides of the waveguide array 10A. Dotted straight arrows in FIG. 63 indicate light beams propagating through the optical dividers 90a and 90b and the phase shifters 80a and 80b. The phase shifter array 80Aa and the optical divider 90a are connected to one side of the waveguide array 10A, and the phase shifter array 80Ab and the optical divider 90b are connected to the other side of the waveguide array 10A. The optical scanning device 100 further includes an optical switch 92 that switches between supply of light to the optical divider 90a and supply of light to the optical divider 90b. The optical switch 92 allows switching between the state in which light is inputted to the waveguide array 10A from the left side in FIG. 63 and the state in which light is inputted to the waveguide array 10A from the right side in FIG. 63.

The structure in this modification is advantageous in that the range of scanning in the X direction with the light emitted from the waveguide array 10A can be increased. In a structure in which light is inputted to the waveguide array 10A from one side, the direction of the light can be changed from the front direction (i.e., the +Z direction) toward one of the +X direction and the −X direction by driving the waveguide elements 10. In the present modification, when the light is inputted from the left optical divider 90a in FIG. 63, the direction of the light can be changed from the front direction toward the +X direction. When the light is inputted from the right optical divider 90b in FIG. 63, the direction of the light can be changed from the front direction toward the −X direction. Specifically, in the structure in FIG. 63, the direction of the light can be changed in both the left and right directions in FIG. 63 as viewed from the front. Therefore, the scanning angle range can be larger than that when the light is inputted from one side. The optical switch 92 is controlled by an electric signal from an unillustrated control circuit (e.g., a microcontroller unit). In this structural example, all the elements can be driven and controlled using electric signals.

Figure 64A:
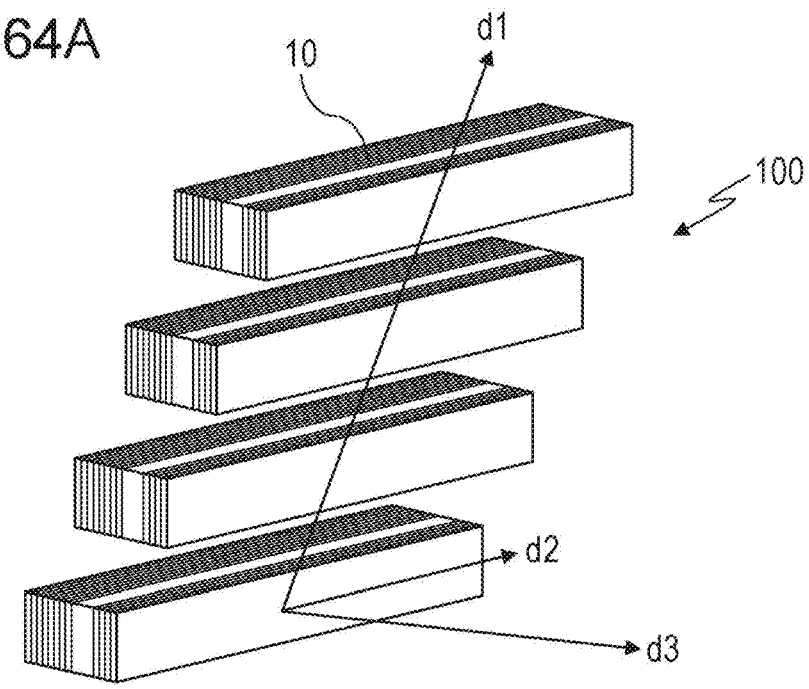
FIG. 64A shows a structural example of a waveguide array in which an arrangement direction of waveguide elements is not orthogonal to an extending direction of the waveguide elements.

In all the waveguide arrays in the above description, the arrangement direction of the waveguide elements 10 is orthogonal to the extending direction of the waveguide elements 10. However, it is unnecessary that these directions be orthogonal to each other. For example, a structure shown in FIG. 64A may be used. FIG. 64A shows a structural example of a waveguide array in which an arrangement direction d1 of waveguide elements 10 is not orthogonal to an extending direction d2 of the waveguide elements 10. In this example, the light-emission surfaces of the waveguide elements 10 may not be in the same plane. Even with this structure, the emission direction d3 of light can be changed two-dimensionally by appropriately controlling the waveguide elements 10 and the phase shifters.

Figure 64B:
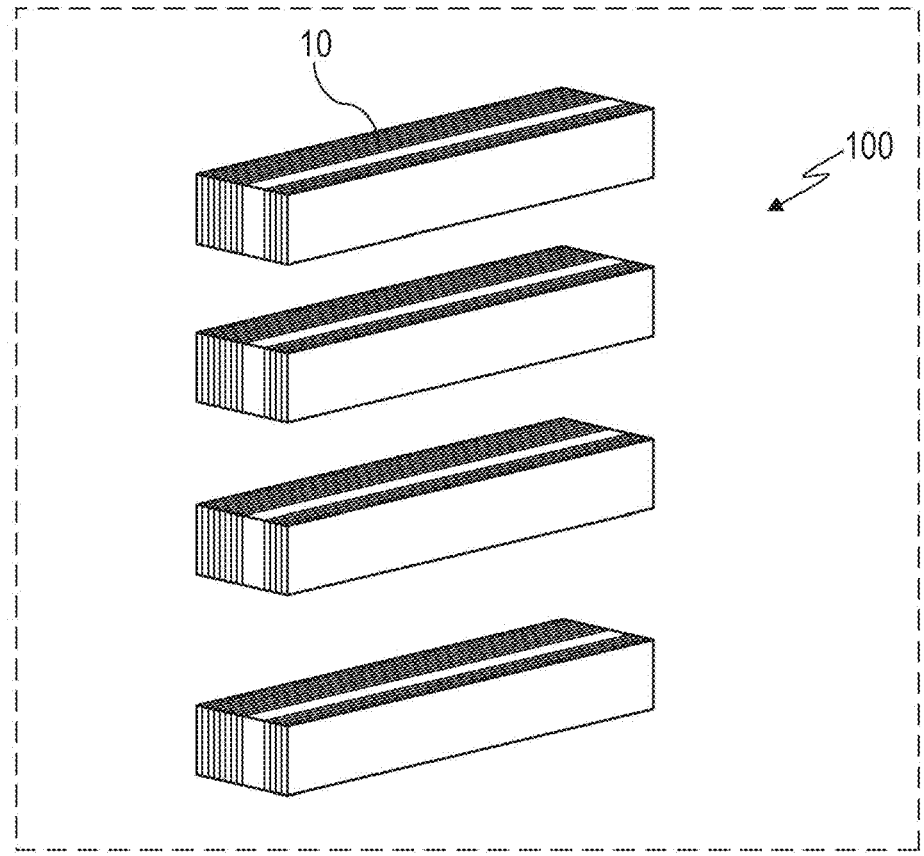
FIG. 64B shows a structural example of a waveguide array in which waveguide elements are arranged at non-regular intervals.

FIG. 64B shows a structural example of a waveguide array in which waveguide elements 10 are arranged at non-regular intervals. Even when this structure is employed, two-dimensional scanning can be performed by appropriately setting the phase shift amounts by the phase shifters. Also in the structure in FIG. 64B, the arrangement direction d1 of the waveguide array may not be orthogonal to the extending direction d2 of the waveguide elements 10.

Embodiment in which First and Second Waveguides are Disposed on Substrate

Next, an embodiment of an optical scanning device in which first and second waveguides are disposed on a substrate will be described.

The optical scanning device in the present embodiment includes: first waveguides; second waveguides connected to the first waveguides; and a substrate that supports the first and second waveguides. More specifically, the optical scanning device includes: a plurality of waveguide units arranged in a first direction; and the substrate that supports the plurality of waveguide units. Each of the plurality of waveguide units includes a first waveguide and a second waveguide. The second waveguide is connected to the first waveguide and propagates light in a second direction intersecting the first direction. The substrate supports the first waveguide and the second waveguide of each of the waveguide units.

The second waveguide corresponds to the reflective waveguide in the embodiment described above. Specifically, the second waveguide includes: a first mirror including a multilayer reflective film; a second mirror including a multilayer reflective film facing the multilayer reflective film of the first mirror, and an optical waveguide layer that is located between the first and second mirrors and propagates light inputted to the first waveguide and transmitted therethrough. The first mirror has a higher light transmittance than the second mirror and allows part of the light propagating through the optical waveguide layer to be emitted to the outside of the optical waveguide layer. The optical scanning device further includes an adjusting element that changes at least one of the refractive index and thickness of the optical waveguide layer of each of the second waveguides to thereby change the direction of light emitted from the each of the second waveguides.

In the present embodiment, the first and second waveguides are disposed on one substrate, so that the first waveguides 1 and the second waveguides 10 can be easily aligned with each other. In addition, positional displacement between the first and second waveguides due to thermal expansion is reduced. Therefore, light beams can be efficiently introduced from the first waveguides to the second waveguides.

Each optical waveguide layer may contain a material whose refractive index for the light propagating through the optical waveguide layer is changed when a voltage is applied. In this case, the adjusting element changes the refractive index of the optical waveguide layer by applying a voltage to the optical waveguide layer. In this manner, the adjusting element changes the direction of the light emitted from each second waveguide.

At least part of each first waveguide may have the function as the phase shifter described above. In this case, a mechanism that modulates the refractive index of the first waveguide is installed in the first waveguide. The optical scanning device may further include a second adjusting element that modulates the refractive index of at least a partial region of each first waveguide. The second adjusting element may be a heater disposed in the vicinity of the first waveguide. The refractive index of at least the partial region of the first waveguide can be changed by heat generated by the heater. In this manner, the phases of light beams inputted from the first waveguides to the second waveguides are adjusted. As described above, various structures can be used to adjust the phases of the light beams inputted from the first waveguides to the second waveguides. Any of these structures may be used.

The phase shifters may be disposed outside of the first waveguides. In this case, each first waveguide is disposed between a corresponding external phase shifter and a corresponding waveguide element (second waveguide). No clear boundary may be present between the phase shifter and the first waveguide. For example, the phase shifter and the first waveguide may share components such as a waveguide and the substrate.

Each first waveguide may be a general waveguide that utilizes total reflection of light or may be a reflective waveguide. The phase-modulated light beam passes through the first waveguide and is introduced into the corresponding second waveguide.

The embodiment of the optical scanning device in which the first and second waveguides are disposed on the substrate will be described in more detail. In the following description, the optical scanning device includes a plurality of waveguide units. The optical scanning device may include only one waveguide unit. Specifically, an optical scanning device including only one pair of first and second waveguides is included in the scope of the present disclosure.

FIG. 65A is an illustration schematically showing the optical scanning device in the present embodiment. This optical scanning device includes a plurality of waveguide units arranged in the Y direction and a substrate 50 that supports the plurality of waveguide units. Each of the waveguide units includes a first waveguide 1 and a second waveguide 10. The substrate 50 supports the first waveguide 1 and the second waveguide 10 of each of the waveguide units.

The substrate 50 extends along the XY plane. The upper and lower surfaces of the substrate 50 are disposed approximately parallel to the XY plane. The substrate 50 may be formed of a material such as glass Si, $SiO_2$, GaAs, or GaN.

A first waveguide array 1A includes a plurality of the first waveguides 1 arranged in the Y direction. Each of the first waveguides 1 has a structure extending in the X direction. A second waveguide array 10A includes a plurality of the second waveguides 10 arranged in the Y direction. Each of the second waveguides 10 has a structure extending in the X direction.

Figure 65B:
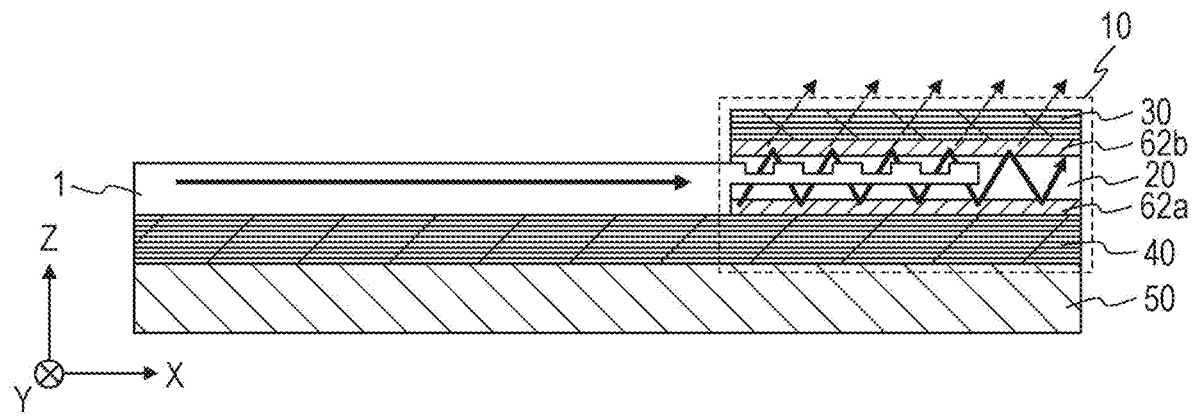
FIG. 65B is a cross-sectional view of the optical scanning device shown in FIG. 65A.

FIG. 65B is a cross-sectional view of the optical scanning device in the XZ plane shown by one of broken lines in FIG. 65A. A first waveguide 1 and a second waveguide 10 are disposed on the substrate 50. A second mirror 40 extends in a region between an optical waveguide layer 20 and the substrate 50 and between the first waveguide 1 and the substrate 50. The first waveguide 1 is, for example, a general waveguide that uses total reflection of light. One example of the waveguide 1 is a waveguide formed of a semiconductor such as Si or GaAs. The second waveguide 10 includes the optical waveguide layer 20, the first mirror 30, and the second mirror 40. The optical waveguide layer 20 is located between the first mirror 30 and the second mirror 40 facing each other. The optical waveguide layer 20 propagates light inputted to the first waveguide and transmitted therethrough.

The optical waveguide layer 20 in the present embodiment contains a material whose refractive index for the light beam propagating through the optical waveguide layer 20 is changed when a voltage is applied. The adjusting element includes a pair of electrodes. The pair of electrodes includes a lower electrode 62a and an upper electrode 62b. The lower electrode 62a is disposed between the optical waveguide layer 20 and the second mirror 40. The upper electrode 62b is disposed between the optical waveguide layer 20 and the first mirror 30. The adjusting element in the present embodiment changes the refractive index of the optical waveguide layer 20 by applying a voltage to the pair of electrodes 62a and 62b. In this manner, the adjusting element changes the direction of the light emitted from each second waveguide 10. Each of the electrodes 62a and 62b may be in contact with the optical waveguide layer 20 as shown in FIG. 50B or may not be in contact with the optical waveguide layer 20.

In the structural example in FIG. 65B, the second mirror 40 is stacked on the substrate 50 to form a common support, and other structures are disposed on the support. Specifically, a stack including the first waveguides 1, the first electrode 62a, the optical waveguide layers 20, the second electrodes 62b, and the first mirrors 30 is formed on the integrally formed support. Since the common support is used, the first waveguides 1 and the optical waveguide layers 20 are easily aligned with each other during production. In addition, positional displacement of connection portions between the first waveguides 1 and the optical waveguide layer 20 due to thermal expansion can be reduced. The support is, for example, a support substrate.

Figure 65C:
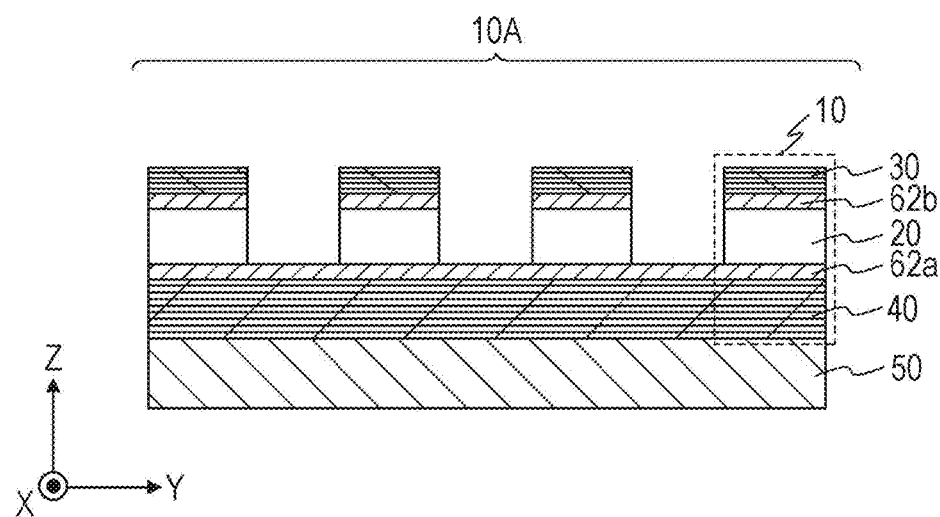
FIG. 65C is another cross-sectional view of the optical scanning device shown in FIG. 65A.

FIG. 65C is a cross-sectional view of the optical scanning device in the YZ plane shown by the other one of the broken lines in FIG. 65A. In this example, the second mirror 40 is shared by the plurality of second waveguides 10. Specifically, the second mirror 40 is not divided, and this non-divided second mirror 40 is used for the plurality of second waveguides 10. Similarly, the lower electrode 62a is shared by the plurality of second waveguides 10. This allows the production process to be simplified.

In the plurality of second waveguides 10, the optical waveguide layers 20 are separated from each other. The upper electrodes 62b are separated from each other, and the first mirrors 30 are separated from each other. In this manner, each optical waveguide layer 20 can propagate light in the X direction. The upper electrodes 62b and the first mirrors 30 may be a single non-divided upper electrode 62b and a single non-divided first mirror 30, respectively.

Modifications of the optical scanning device in the present embodiment will be described. In the following modifications, repeated description of the same components will be omitted.

Figure 66A:
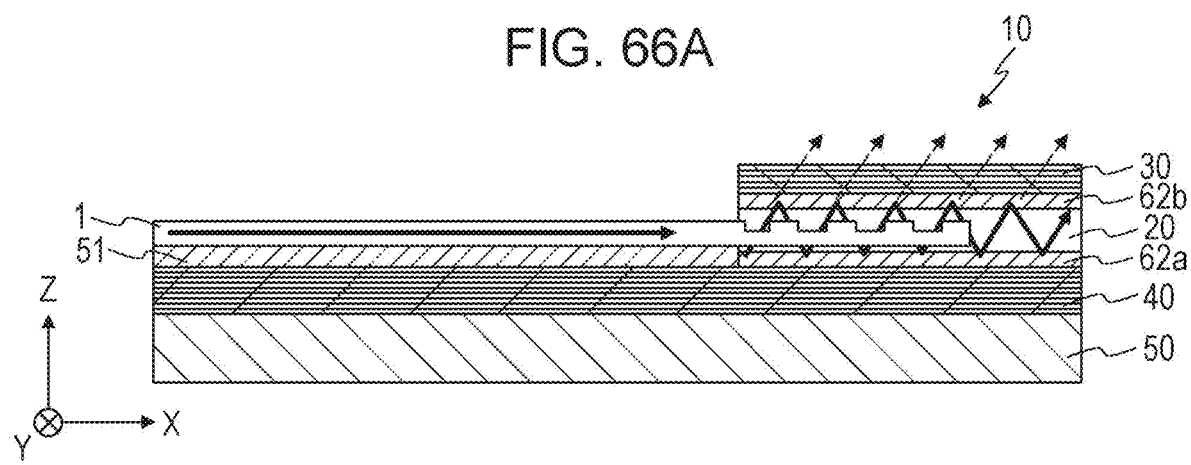
FIG. 66A is an illustration showing a structural example in which a dielectric layer is disposed between a second mirror and a waveguide.

FIG. 66A is an illustration showing a structural example in which a dielectric layer 51 is disposed between the second mirror 40 and the waveguide 1. The optical scanning device in this example further includes the dielectric layer 51 extending between the second mirror 40 and the first waveguide 1. The dielectric layer 51 serves as an adjustment layer for adjusting the height level of the first waveguide 1 relative to the height level of the optical waveguide layer 20. Hereinafter, the dielectric layer 51 is referred to as the adjustment layer 51. By adjusting the thickness of the adjustment layer 51 in the Z direction, the coupling efficiency of light from the first waveguide 1 to the optical waveguide layer 20 can be increased. The adjustment layer 51 serves also as a spacer that prevents the guided light in the first waveguide 1 from being absorbed, scattered, and reflected by the second mirror 40. The first waveguide 1 propagates light by total reflection. Therefore, the adjustment layer 51 is formed of a transparent material having a lower refractive index than the first waveguide 1. For example, the adjustment layer 51 may be formed of a dielectric material such as $SiO_2$.

Another dielectric layer serving as a protective layer may be disposed on the first waveguide 1.

Figure 66B:
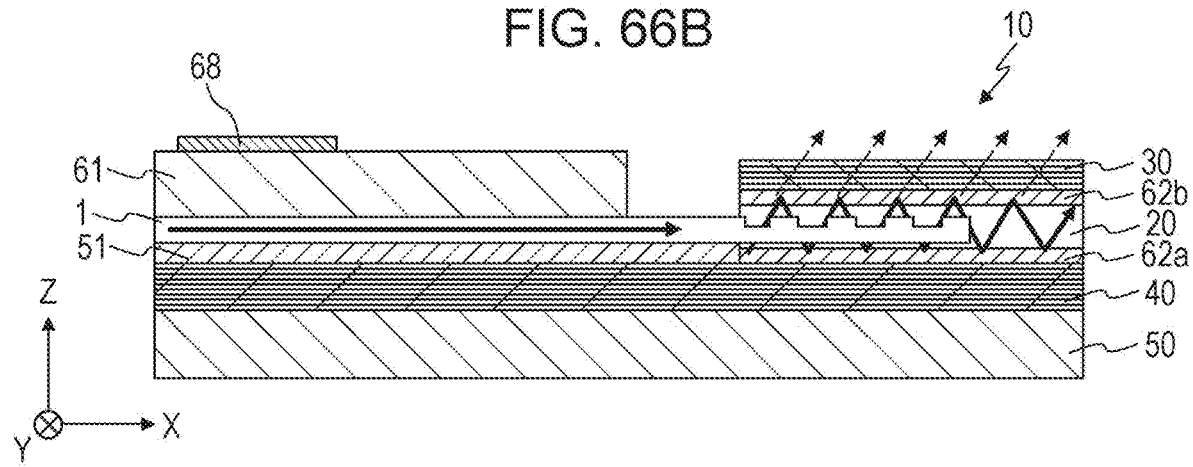
FIG. 66B is an illustration showing a structural example in which a second dielectric layer is disposed on the first waveguide.

FIG. 66B is an illustration showing a structural example in which a second dielectric layer 61 is disposed on the first waveguide 1. As described above, the optical scanning device may further include the second dielectric layer 61 that covers at least part of the first waveguide 1. The second dielectric layer 61 is in contact with the first waveguide 1 and is formed of a transparent material having a lower refractive index than the first waveguide 1. The second dielectric layer 61 serves also as the protective layer that prevents particles and dust from adhering to the first waveguide 1. This can reduce loss of the guided light in the first waveguide 1. Hereinafter, the second dielectric layer 61 is referred to as the protective layer 61.

The first waveguide 1 shown in FIG. 66B functions as a phase shifter. The optical scanning device further includes a second adjusting element that modulates the refractive index of the first waveguide 1 to thereby change the phase of the light introduced into the optical waveguide layer 20. When the first waveguide 1 contains a thermooptical material, the second adjusting element includes a heater 68. The second adjusting element modulates the refractive index of the first waveguide 1 using heat generated by the heater 68.

A wiring material such as a metal contained in the heater 68 can absorb, scatter, or reflect light. The protective layer 61 keeps the heater 68 at a distance from the first waveguide 1 to thereby reduce loss of the guided light in the first waveguide 1.

The protective layer 61 may be formed of the same material as the material (e.g., $SiO_2$) of the adjustment layer 51. The protective layer 61 may cover not only the first waveguide 1 but also at least part of the second waveguide 10. In this case, at least part of the first mirror 30 is covered with the protective layer 61. The protective layer 61 may cover only the second waveguide 10. When the protective layer 61 is formed of a transparent material, the light emitted from the second waveguide 10 passes through the protective layer 61. This allows the loss of light to be small.

Figure 67:
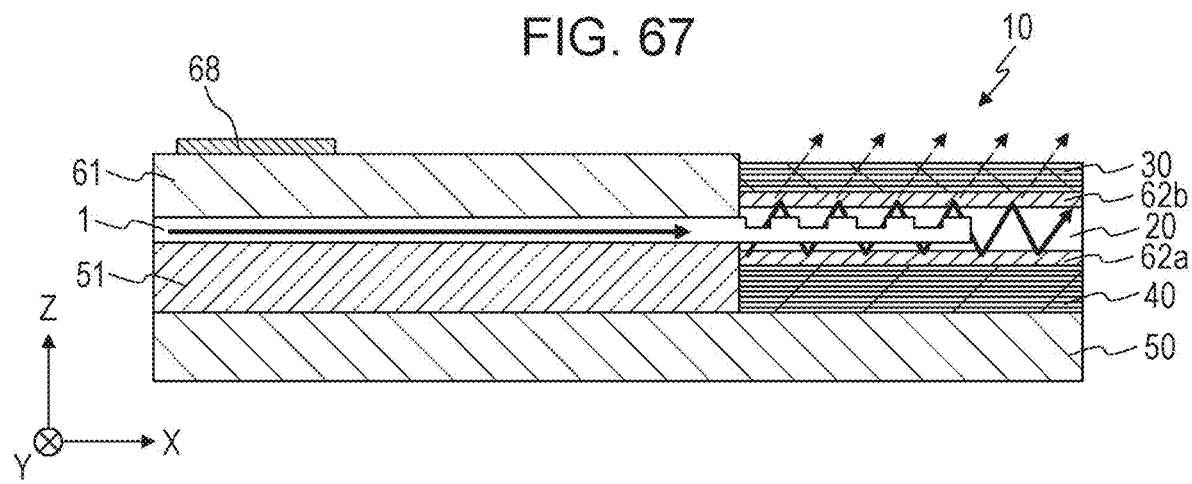
FIG. 67 is an illustration showing a structural example in which the second mirror is not disposed in a region between the first waveguide and the substrate.

FIG. 67 is an illustration showing a structural example in which the second mirror 40 is not disposed in a region between the first waveguide 1 and the substrate 50. The adjustment layer 51 in this example extends in the region between the first waveguide 1 and the substrate 50. The adjustment layer 51 is in contact with the first waveguide 1 and the substrate 50. Since the second mirror 40 is not present below the first waveguide 1, the guided light in the first waveguide 1 is not influenced by the second mirror 40.

Figure 68:
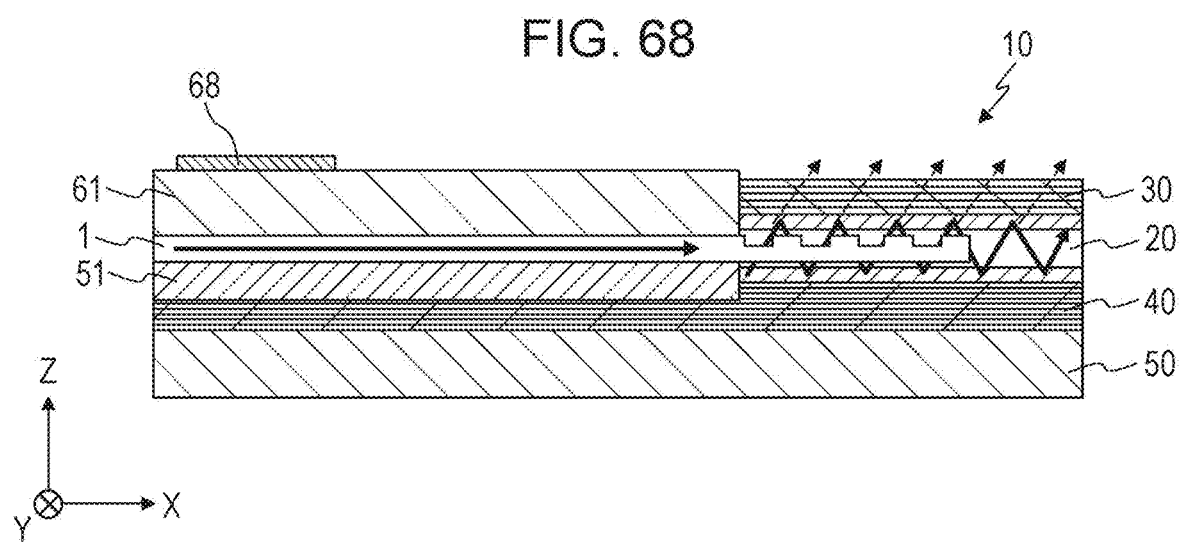
FIG. 68 is an illustration showing a structural example in which, between the first waveguide and the substrate, the second mirror is thinner.

FIG. 68 is an illustration showing a structural example in which, between the first waveguide 1 and the substrate 50, the second mirror 40 is thinner than the second mirror 40 in the structural example in FIG. 66B. The second mirror 40 may have a portion disposed between the first waveguide 1 and the substrate 50 and having a smaller thickness than a portion disposed between the second waveguide 10 and the substrate 50, as in this example. The adjustment layer 51 is disposed between the first waveguide 1 and the second mirror 40. In this structure, the guided light in the first waveguide 1 is less influenced by the second mirror 40. In the example in FIG. 68, a step is formed by the second mirror 40 at the junction between the first waveguide 1 and the optical waveguide layer 20, but the height of the step is smaller than that in the example in FIG. 67. Therefore, the second mirror 40 can be more easily processed.

The thickness of the second mirror 40 may vary along the waveguide 1. Such an example will next be described.

Figure 69A:
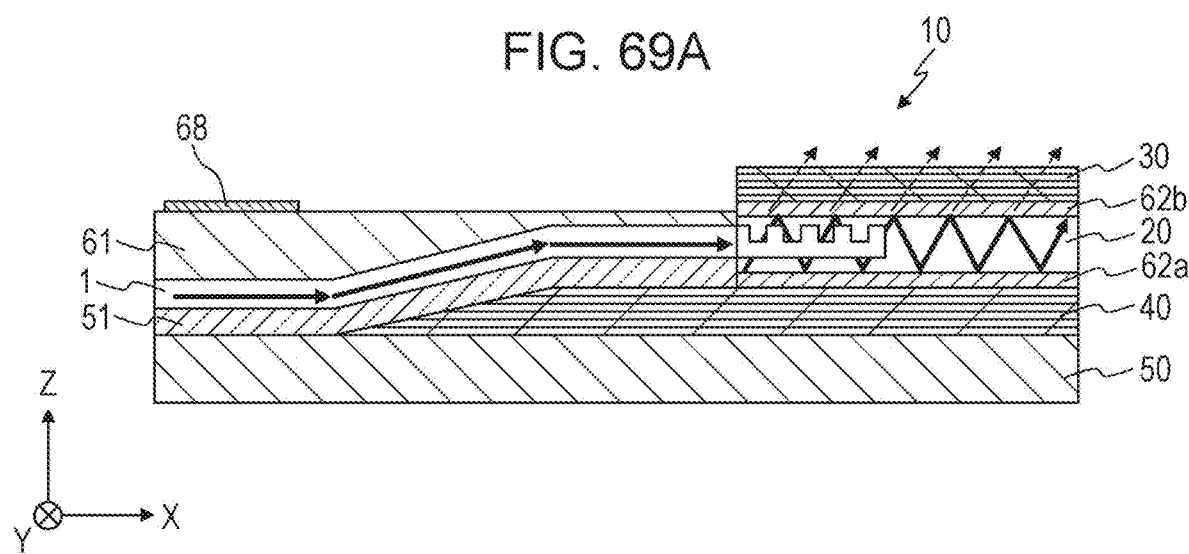
FIG. 69A is an illustration showing a structural example in which the thickness of the second mirror varies gradually.

FIG. 69A is an illustration showing a structural example in which the thickness of the second mirror 40 varies gradually. Between the first waveguide 1 and the substrate 50, the thickness of the second mirror 40 varies along the first waveguide 1.

In the example in FIG. 69A, the second mirror 40 is not present below a left portion of the first waveguide 1. The left portion of the first waveguide 1 is located lower than the optical waveguide layer 20. The second mirror 40 is present below a right portion of the first waveguide 1, i.e., its portion connected to the optical waveguide layer 20. The right portion of the first waveguide 1 is located at about the same height as the optical waveguide layer 20. By adjusting the thickness of the protective layer 61, the upper surface of the protective layer 61 can be made flat.

In the structural example in FIG. 69A, the heater 68 disposed on the protective layer 61 is sufficiently spaced apart from the first waveguide 1. Therefore, the guided light in the first waveguide 1 is less influenced by the wiring of the heater 68. The loss of the guided light in the first waveguide 1 can thereby be reduced.

Figure 69B:
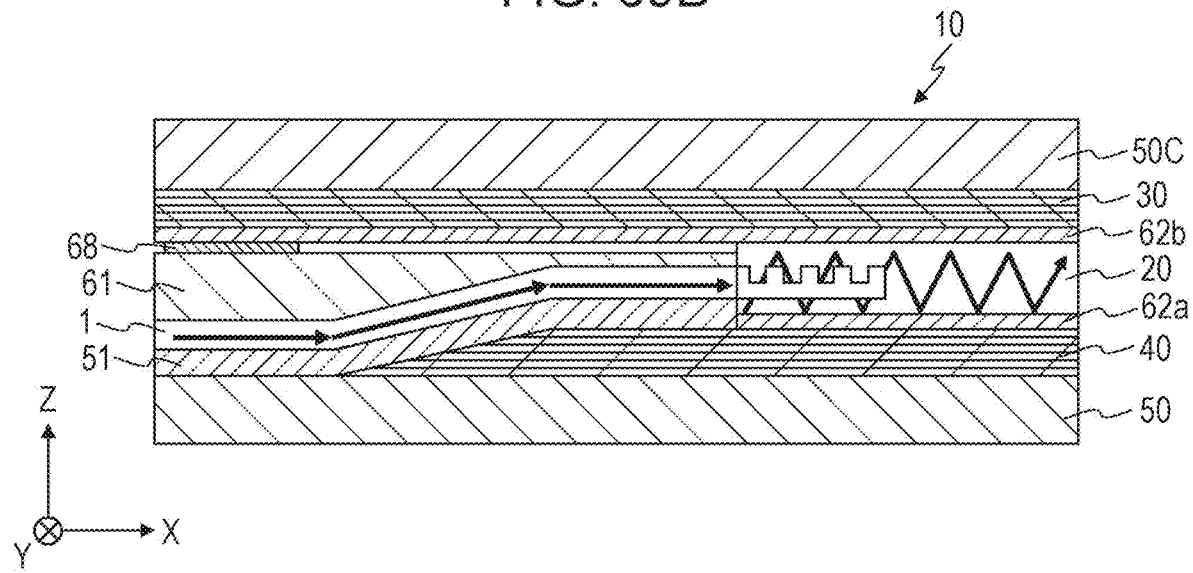
FIG. 69B is an illustration showing a structural example in which an upper electrode, a first mirror, and a second substrate are disposed so as to extend over a protective layer of the first waveguide and the optical waveguide layer of the second waveguide.
Figure 69C:
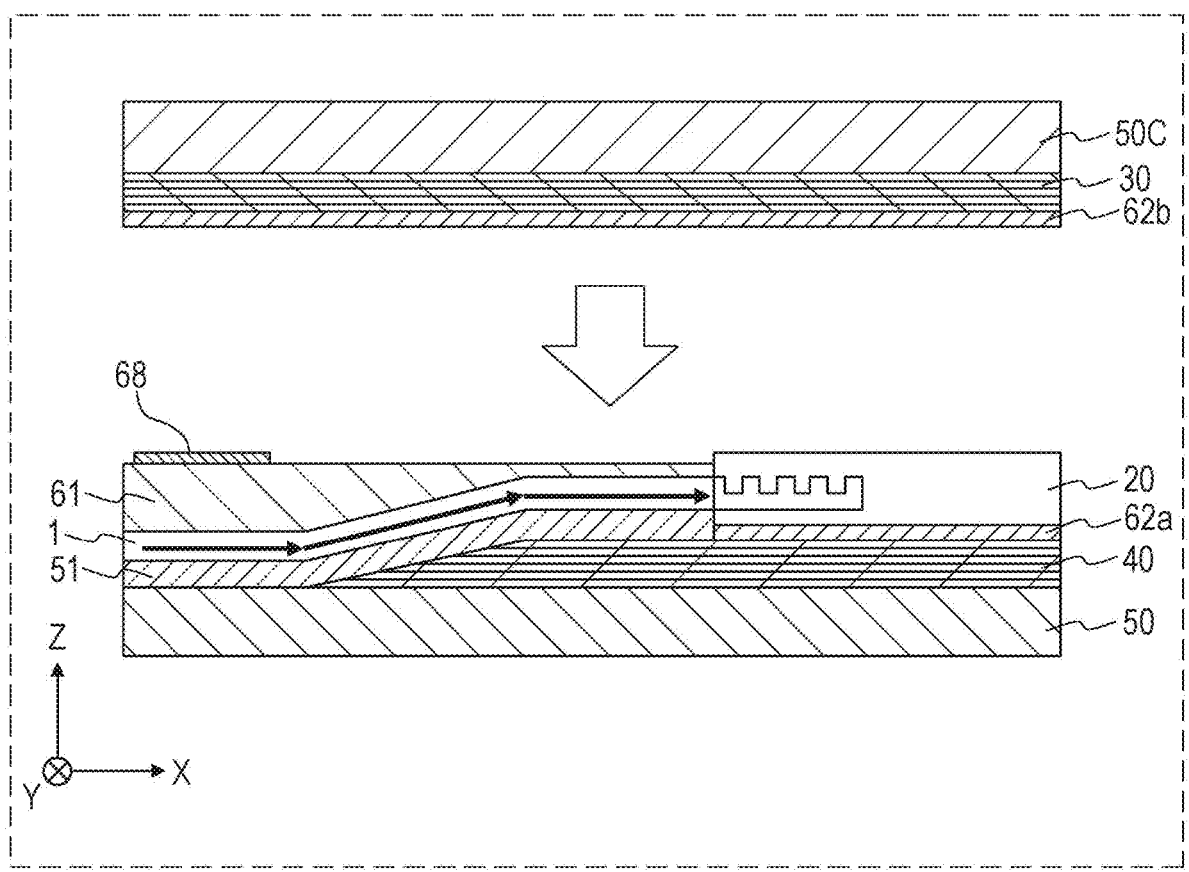
FIG. 69C is an illustration showing part of a production process in the structural example in FIG. 69B.

FIG. 69B is an illustration showing a structural example in which the upper electrode 62b, the first mirror 30, and a second substrate 50C are disposed so as to extend over the protective layer 61 of the first waveguide 1 and the optical waveguide layer 20 of the second waveguide 10. FIG. 69C is an illustration showing part of a production process in the structural example in FIG. 69B.

In the example in FIG. 69B, a structural body including the upper electrode 62b, the first mirror 30, and the second substrate 50C (hereinafter referred to as an "upper structural body") and a structural body lower than the upper electrode 62b (hereinafter referred to as a "lower structural body") are produced separately.

To produce the lower structural body, the second mirror 40 having an inclination is first formed on the first substrate 50. The adjustment layer 51, a layer of the waveguide 1, and the protective layer 61 are formed in this order on a portion of the second mirror 40 that includes the inclination. The lower electrode 62a and the optical waveguide layer 20 are formed on a flat portion of the second mirror 40.

The upper structural body is produced by stacking the first mirror 30 and the upper electrode 62b in this order on the second substrate 50C. As shown in FIG. 69C, the upper structural body is turned upside down and then laminated onto the lower structural body. With the above production method, it is unnecessary to precisely align the first waveguide 1 and the second waveguide 10 with each other.

The upper surface of the protective layer 61, i.e., its surface opposite to the surface in contact with the first waveguide 1, is lower than the upper surface of the optical waveguide layer 20 of the second waveguide 10. The upper surface of the heater 68 on the first waveguide 1 is at about the same level as the upper surface of the optical waveguide layer 20 of the second waveguide 10. In this case, the upper structural body and the lower structural body can be laminated together with no step. The upper structural body may be formed by, for example, vapor deposition or sputtering.

Figure 70:
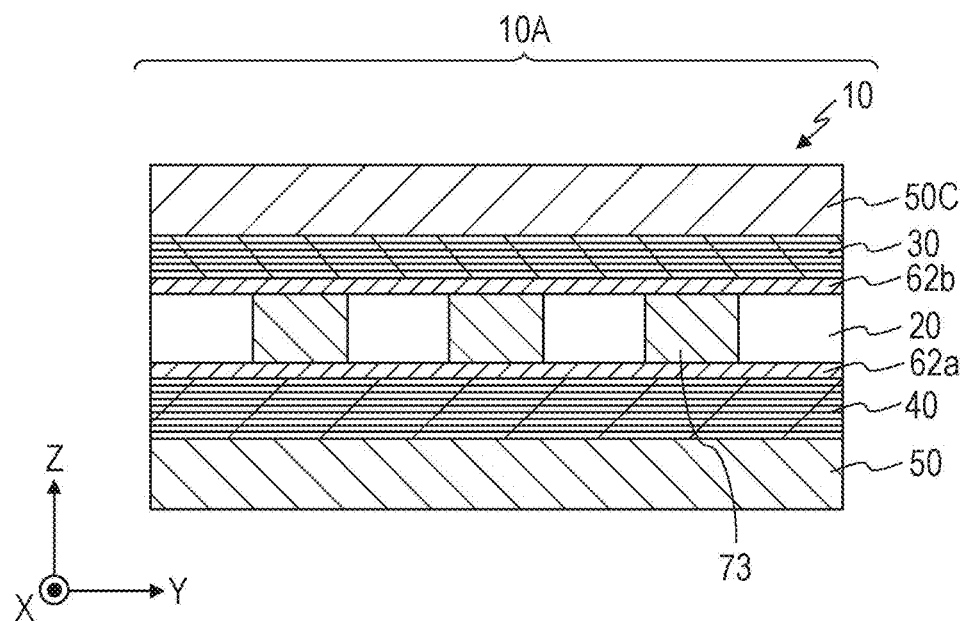
FIG. 70 is an illustration showing a cross section of a plurality of second waveguides.

FIG. 70 is an illustration showing a YZ-plane cross section of a plurality of second waveguides 10 in an optical scanning device having the structure shown in FIG. 69B. In this example, the plurality of second waveguides 10 share the first mirror 30, the second mirror 40, the electrode 62a, and the electrode 62b. A plurality of optical waveguide layers 20 are disposed between the common electrodes 62a and 62b. Regions between the plurality of optical waveguide layers 20 serve as spacers 73. The spacers 73 are, for example, air (or a vacuum) or a transparent material such as $SiO_2$, $TiO_2$, $Ta_2O_5$, SiN, or AlN. When the spacers 73 are formed of a solid material, the upper structural body can be formed by, for example, vapor deposition or sputtering. Each spacer 73 may be in direct contact with two adjacent optical waveguide layers 20.

It is unnecessary that the first waveguides 1 be general waveguides that use total reflection of light. For example, the first waveguides 1 may be reflective waveguides similar to the second waveguides 10.

Figure 71:
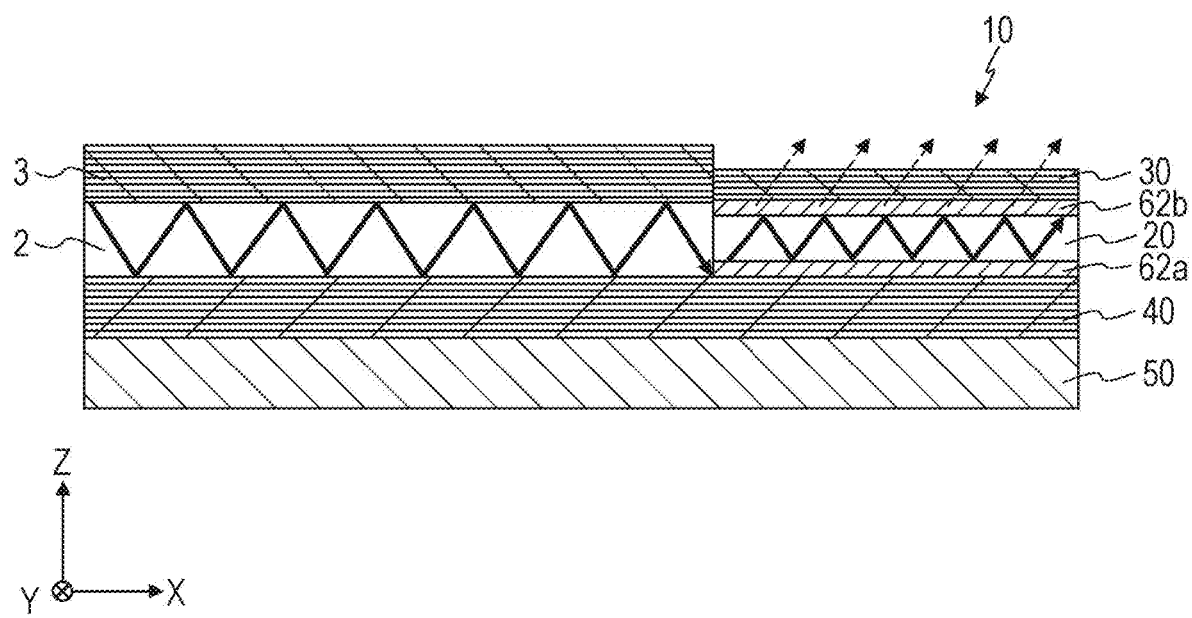
FIG. 71 is an illustration showing a structural example in which the first waveguide and the second waveguide are reflective waveguides.

FIG. 71 is an illustration showing a structural example in which the first waveguide 1 and the second waveguide 10 are reflective waveguides. The first waveguide 1 is sandwiched between a multilayer reflective film 3 and a multilayer reflective film 40 facing each other. The principle of light propagation through the first waveguide 1 is the same as the principle of light propagation through the second waveguide 10. When the thickness of the multilayer reflective film 3 is sufficiently large, no light is emitted from the first waveguide 1.

In the structural example in FIG. 71, the coupling efficiency of light can be increased by optimizing the connection conditions of the two reflective waveguides, as described above with reference to FIGS. 20, 21, etc. The optimization allows light to be efficiently introduced from the first waveguide 1 to the second waveguide 10.

Next, modifications of the arrangement of the pair of electrodes 62a and 62b will be described. In the examples in FIGS. 65A to 71, the pair of electrodes 62a and 62b are in contact with the optical waveguide layer 20 of the second waveguide 10. In the examples in FIGS. 65C and 70, the plurality of second waveguides 10 shares one or both of the electrodes 62a and 62b. However, the structure of the electrodes 62a and 62b is not limited to the above structures.

Figure 72:
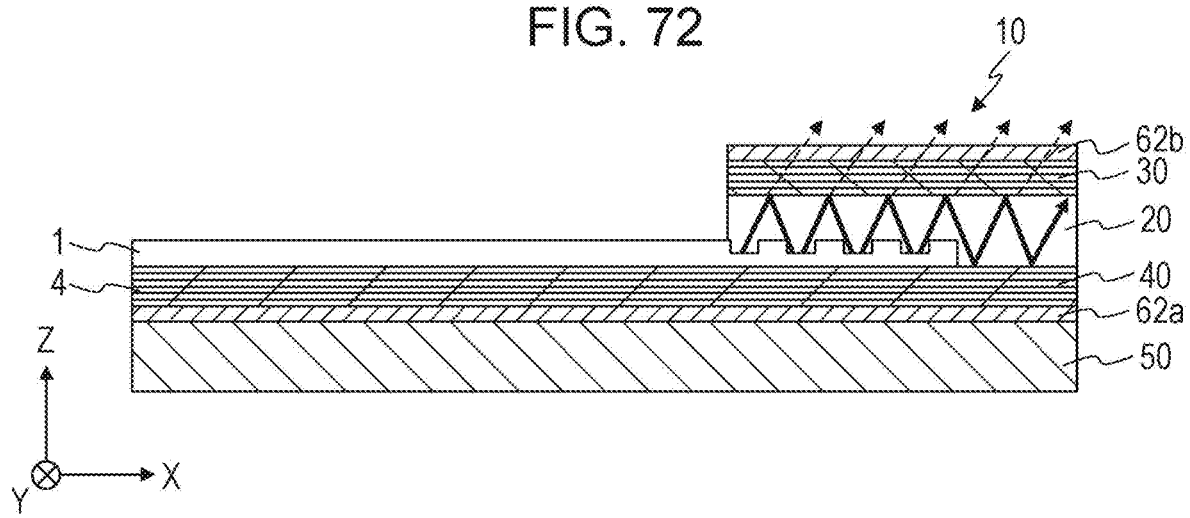
FIG. 72 is an illustration showing a structural example in which the upper electrode is disposed on the upper surface of the first mirror and the lower electrode is disposed on the lower surface of the second mirror.

FIG. 72 is an illustration showing a structural example in which the upper electrode 62b is disposed on the upper surface of the first mirror 30 and the lower electrode 62a is disposed on the lower surface of the second mirror 40. The first mirror 30 is disposed between the upper electrode 62b and the optical waveguide layer 20. The second mirror 40 is disposed between the lower electrode 62a and the optical waveguide layer 20. As shown in this example, the pair of electrodes 62a and 62b may sandwich the optical waveguide layer 20 indirectly through the first and second mirrors 30 and 40.

In the example in FIG. 72, the lower electrode 62a extends to the first waveguide 1 side. When a wiring line is led from the lower electrode 62a, a space below the first waveguide 1 can be used. Therefore, the design flexibility of the wiring line is increased.

In this example, the pair of electrodes 62a and 62b are not in contact with the optical waveguide layer 20. The guided light in the optical waveguide layer 20 is less influenced by absorption, scattering, and reflection by the pair of electrodes 62a and 62b. Therefore, the loss of the guided light in the optical waveguide layer 20 can be reduced.

Figure 73:
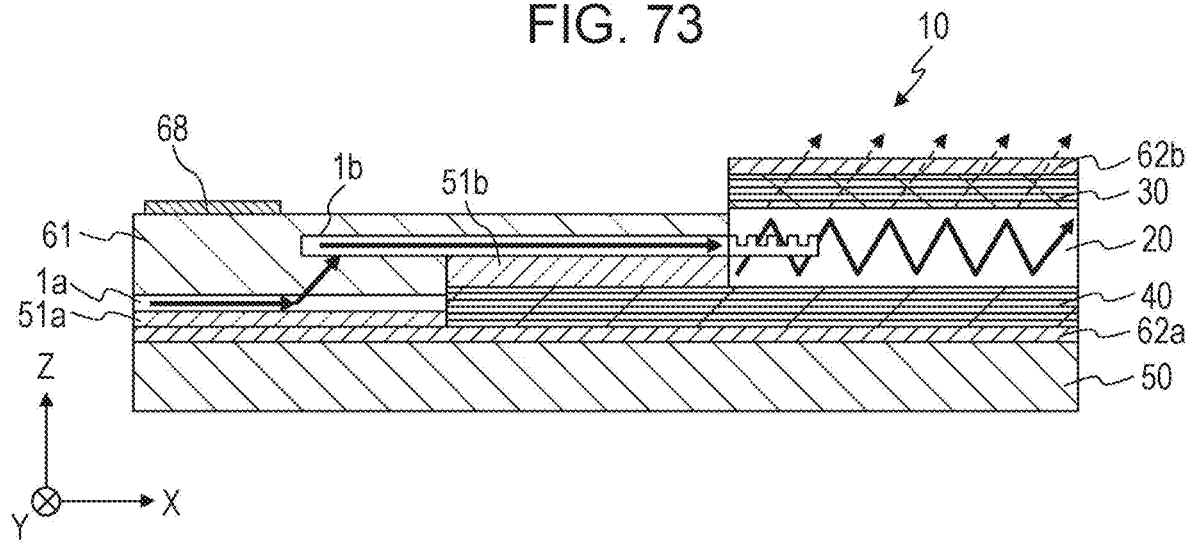
FIG. 73 is an illustration showing an example in which the first waveguide is separated into two portions.

FIG. 73 is a cross-sectional view showing another modification. In this example, the first waveguide 1 is separated into a first portion 1a and a second portion 1b. The first portion 1a is located at a lower position and spaced apart from the second waveguide 10. The second portion 1b is located at a higher position and connected to the optical waveguide layer 20 of the second waveguide 10. The first portion 1a and the second portion 1b overlap each other when viewed in the +Z direction. The first portion 1a and the second portion 1b are approximately parallel to each other and extend in the X direction. In this example, the adjustment layer 51 is also separated into a portion 51a and a portion 51b. The first portion 51a of the adjustment layer is disposed between the first portion 1a of the first waveguide and the lower electrode 62a. The second portion 51b of the adjustment layer is disposed between the second portion 1b of the first waveguide and the second mirror 40. The protective layer 61 is disposed on the first portion 1a and second portion 1b of the first waveguide. A part of the first portion 1a of the first waveguide faces a part of the second portion 1b of the first waveguide through the protective layer 61. The arrangement of the electrodes 62a and 62b is the same as the arrangement in FIG. 72.

In the structure shown in FIG. 73, the spacing between the first portion 1a and second portion 1b of the first waveguide, i.e., their distance in the Z direction, is equal to or less than the wavelength of light in the waveguide. In this case, the light can be propagated from the first portion 1a to the second portion 1b through evanescent coupling. In this example, unlike the example in FIG. 69A, it is unnecessary to change the thickness of the second mirror 40 along the first and second portions 1a and 1b of the first waveguide.

Figure 74:
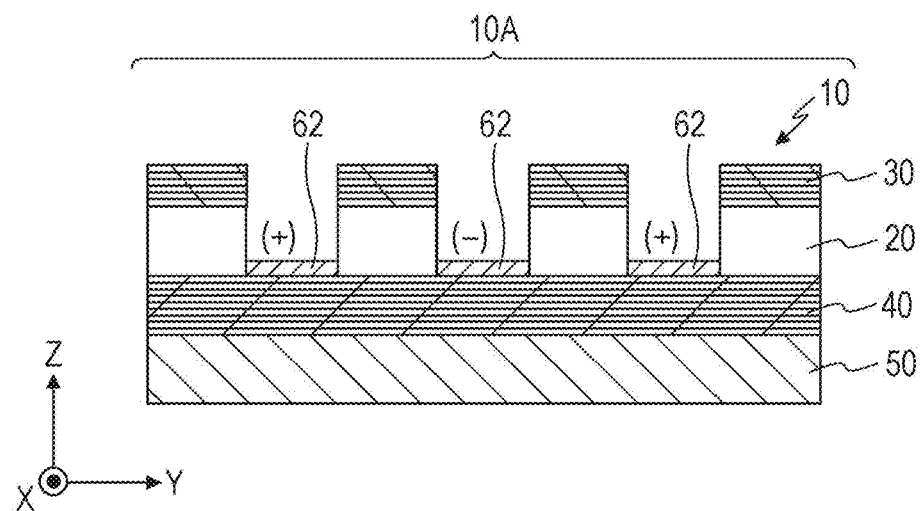
FIG. 74 is an illustration showing a structural example in which electrodes are disposed between adjacent optical waveguide layers.

FIG. 74 is an illustration showing a structural example in which electrodes 62 are disposed between adjacent optical waveguide layers 20. The adjusting element in this example includes the electrodes 62 and applies positive and negative voltages (denoted by "+" and "−" in the figure) to the electrodes 62 in an alternate manner. In this manner, electric fields in the left-right direction in FIG. 74 can be generated in the optical waveguide layers 20.

In the example in FIG. 74, two electrodes 62 adjacent in the Y direction are in contact with at least part of an optical waveguide layer 20 disposed therebetween. The area of contact between the optical waveguide layer 20 and each electrode 62 is small. Therefore, even when the electrodes 62 are formed of a material that absorbs, scatters, or reflects light, the loss of the guided light in the optical waveguide layer 20 can be reduced.

In the structural examples in FIGS. 65A to 74, light used for scanning is emitted through the first mirror 30. The light used for scanning may be emitted through the second mirror 40.

Figure 75:
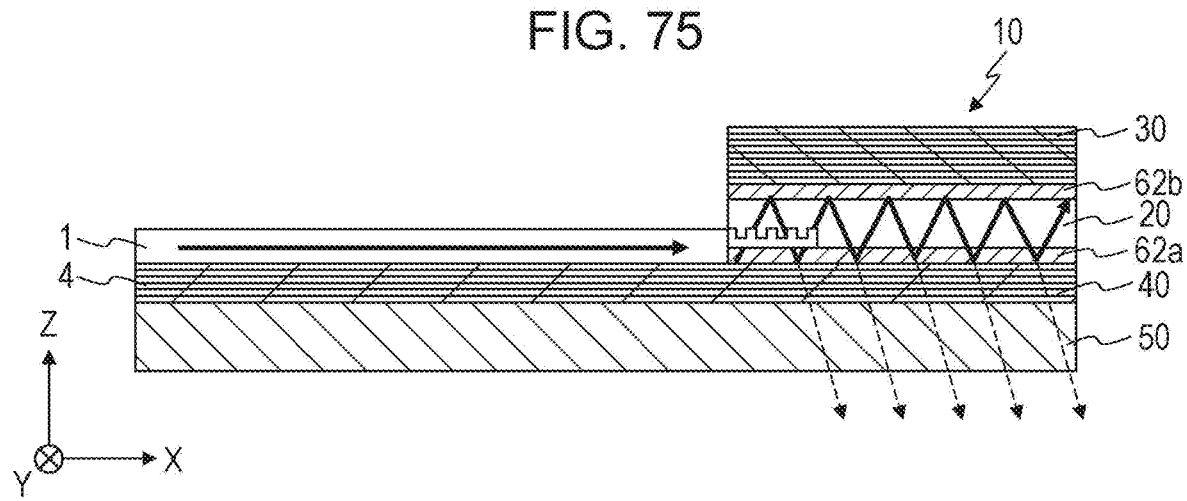
FIG. 75 is an illustration showing a structural example in which the first mirror is thick and the second mirror is thin.

FIG. 75 is an illustration showing a structural example in which the first mirror 30 is thick and the second mirror 40 is thin. In the example in FIG. 75, light passes through the second mirror 40 and is emitted from the substrate 50 side. The substrate 50 in this example is formed of a light-transmitting material. When the light emitted from the substrate 50 is used for scanning, the design flexibility of the optical scanning device increases.

<Discussion about Width of Mirrors>

Figure 76:
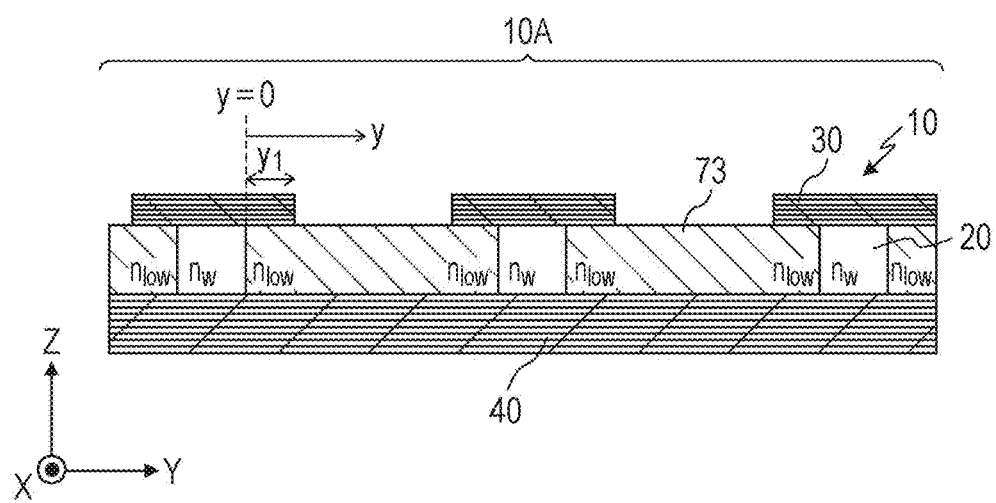
FIG. 76 is a cross-sectional view of an optical scanning device in an embodiment.

FIG. 76 is a cross-sectional view of an optical scanning device in the YZ plane, schematically showing a structural example of a waveguide array 10A in an embodiment in which a plurality of waveguide elements 10 are arranged in the Y direction. In the structural example in FIG. 76, the width of the first mirrors 30 in the Y direction is larger than the width of the optical waveguide layers 20. The plurality of waveguide elements 10 share one second mirror 40. In other words, the second mirror 40 in each waveguide element 10 is a part of one integrated mirror. Each first mirror 30 has portions protruding in the Y direction from edge surfaces of a corresponding optical waveguide layer 20. The Y direction size of the protruding portions is denoted by $y_1$. The distance from an edge surface of the optical waveguide layer 20 in the Y direction is denoted by y·y=0 corresponds to the edge surface of the optical waveguide layer 20.

When the guided light propagates through the optical waveguide layer 20 in the X direction, evanescent light leaks from the optical waveguide layer 20 in the Y direction. The intensity I of the evanescent light in the Y direction is represented by the following formula.

$$I = I_0 \exp\left(-\frac{y}{y_d}\right) \quad (19)$$

Here, $y_d$ is the distance in the Y direction between the edge surface of the optical waveguide layer 20 and a position at which the light intensity of evanescent light from the optical waveguide layer 20 is 1/e of the light intensity of the evanescent light from the optical waveguide layer 20 at the edge surface of the optical waveguide layer 20. $y_d$ satisfies the following formula.

$$y_d = \frac{\lambda}{4\pi\sqrt{n_w^2 \sin^2\theta_{in} - n_{low}^2}} \quad (20)$$

Here, $I_0$ is the intensity of the evanescent light at y=0. The total reflection angle $\theta_{in}$ is shown in FIG. 28. At $y=y_d$, the intensity of the evanescent light is $I_0$ times 1/e. Here, e is the base of natural logarithm.

For the sake of simplicity, the guided light in the optical waveguide layer 20 is approximated as a ray of light, as shown in FIG. 28. As shown in the structural example in FIG. 76, when no first mirror 30 is present in a region satisfying $y > y_1$, light leakage, or light loss ($L_{loss}$), per reflection of the guided light at y=0 is represented by the following formula.

$$L_{loss} = \frac{\int_{y_1}^{\infty} I_0 \exp\left(-\frac{y}{y_d}\right) dy}{\int_{0}^{\infty} I_0 \exp\left(-\frac{y}{y_d}\right) dy} = \exp\left(-\frac{y_1}{y_d}\right) \quad (21)$$

As shown in formula (4), to set the divergence angle div of light emitted from the waveguide element 10 to 0.1° or less, it is preferable that the propagation length L in the waveguide element 10 in the X direction is 1 mm or more. Let the width of the optical waveguide layer 20 in the Y direction be "a." Then the number of total reflections in the ±Y directions in FIG. 28 is 1,000/(a·tan $\theta_{in}$) or more. When a=1 μm and $\theta_{in}$=45°, the number of total reflections is 1,000 or more. Using formula (21) representing the light loss per reflection, the light loss after β reflections is represented by the following formula.

$$L_{loss}^{(\beta)} = 1 - \left\{1 - \exp\left(-\frac{y_1}{y_d}\right)\right\}^{\beta} \quad (22)$$

Figure 77:
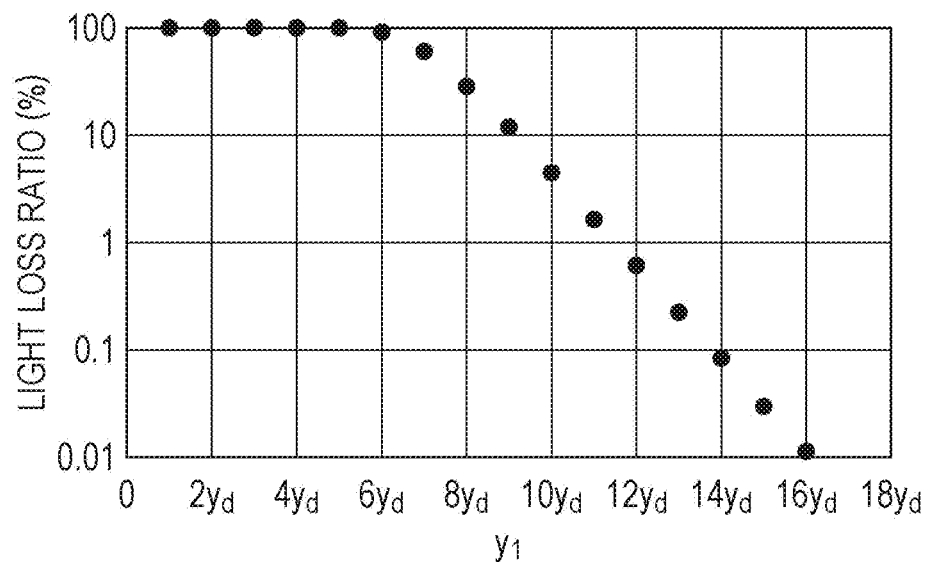
FIG. 77 is a graph showing the relation between the ratio of light loss and $y_1$.

FIG. 77 is a graph showing the relation between the ratio of light loss ($L^{(\beta)}$ loss) and $y_1$ when β=1,000. The vertical axis represents the ratio of light loss, and the horizontal axis represents $y_1$. As shown in FIG. 77, to reduce the ratio of light loss to 50% or less, it is necessary that, for example, $y_1 \leq 7y_d$ holds. Similarly, to reduce the ratio of light loss to 10% or less, it is necessary that, for example, $y_1 \leq 9y_d$ holds. To reduce the ratio of light loss to 1% or less, it is necessary that, for example, $y_1 \geq 11y_d$ holds.

As shown by formula (21), in principle, the light loss can be reduced by increasing $y_1$. However, the light loss does not become zero.

Figure 78:
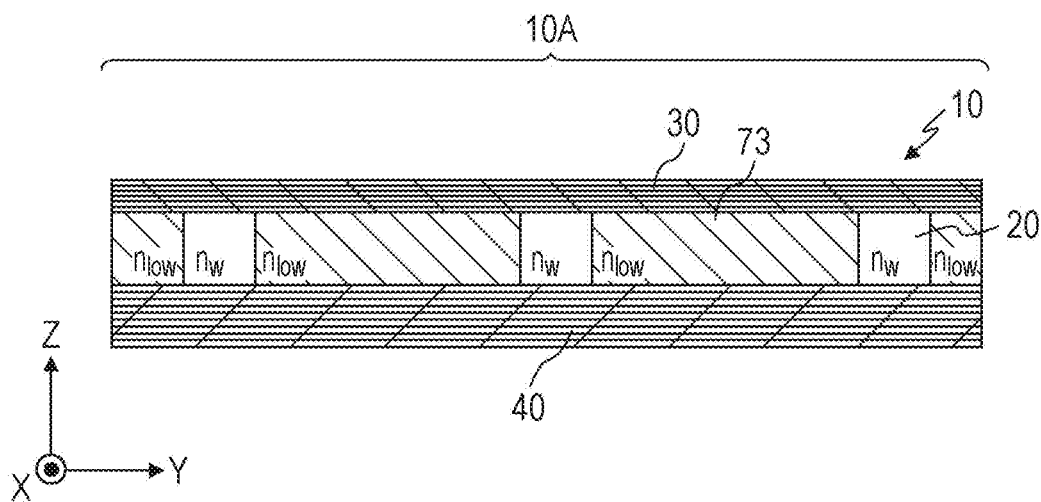
FIG. 78 is a cross-sectional view of an optical scanning device, schematically showing another example of the waveguide array in the present embodiment.

FIG. 78 is a cross-sectional view of an optical scanning device in the YZ plane, schematically showing another example of the waveguide array 10A in the present embodiment in which the plurality of waveguide elements 10 are arranged in the Y direction. In the structural example in FIG. 78, the plurality of waveguide elements 10 share the first and second mirrors 30 and 40. In other words, the first mirror 30 of each waveguide element 10 is a part of one integrated mirror, and the second mirror 40 of each waveguide element 10 is a part of one integrated mirror. In principle, this can minimize the light loss.

Next, leakage of evanescent light from each optical waveguide layer 20 was numerically computed for each of the structural examples in FIGS. 27B and 78, and the results were compared.

Figure 79A:
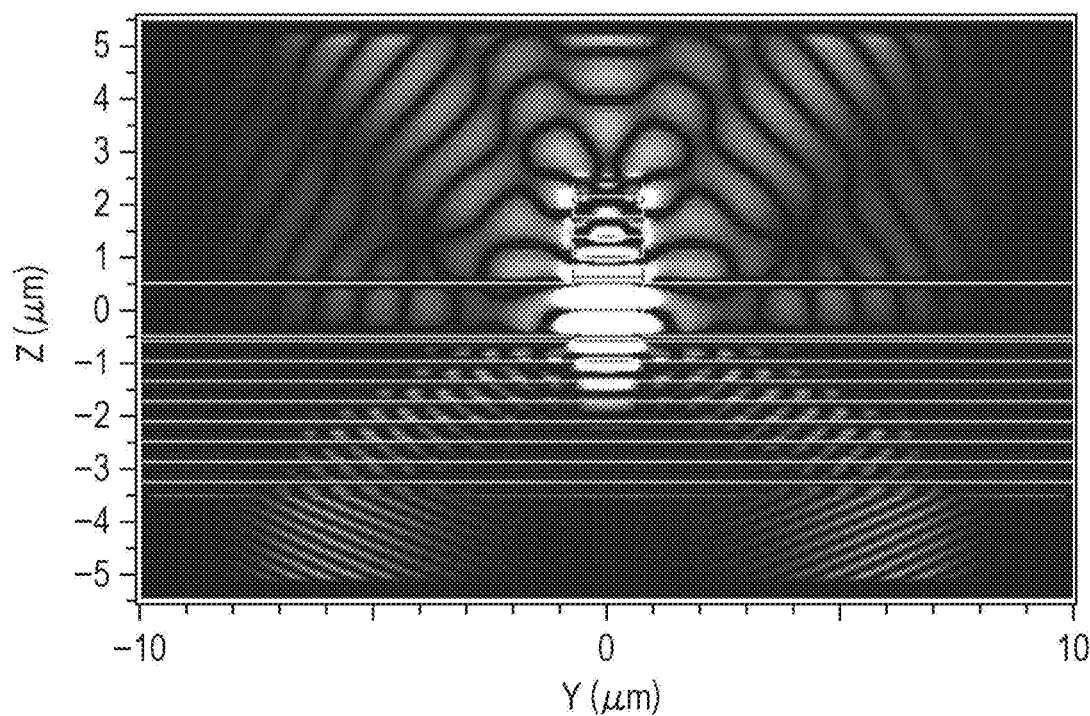
FIG. 79A is a graph showing the results of computations of an electric field intensity distribution in the structural example in FIG. 27B.
Figure 79B:
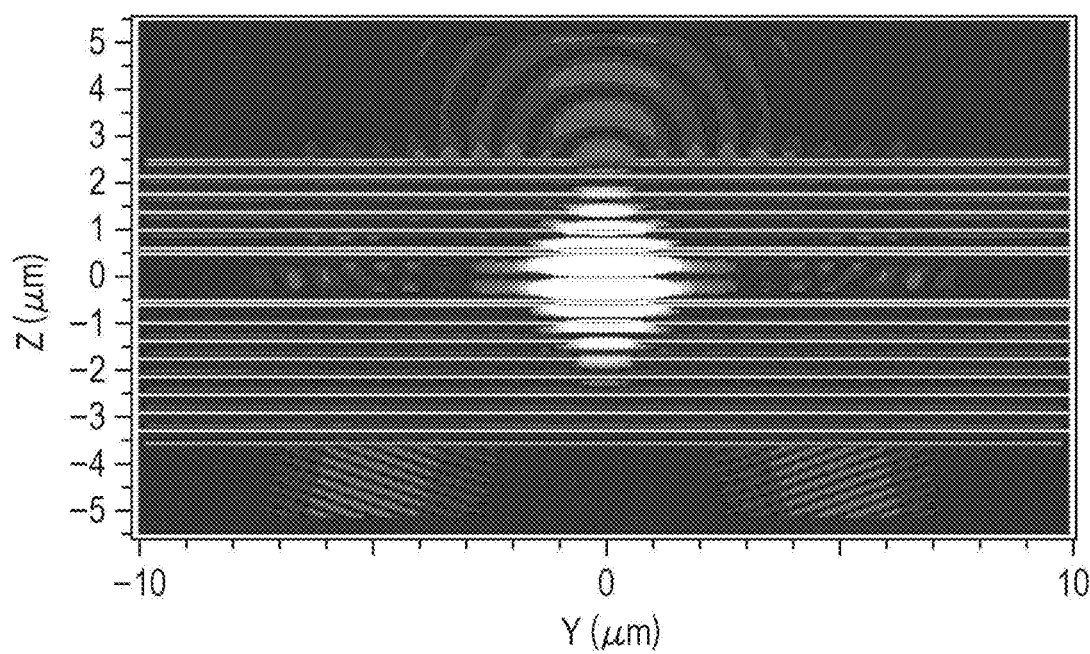

FIG. 79A is a graph showing the results of computations of an electric field intensity distribution in the structural example in FIG. 27B. FIG. 79B is a graph showing the results of computations of an electric field intensity distribution in the structural example in FIG. 78. FemSim available from Synopsys was used for the numerical computations. In FIGS. 79A and 79B, the width of the optical waveguide layer 20 in the Y direction is 1.5 μm, and the thickness of the optical waveguide layer 20 in the Z direction is 1 μm. The wavelength of the light is 1.55 μm. $n_w$ is 1.68, and $n_{low}$ is 1.44. This combination of $n_w$ and $n_{low}$ corresponds to the case in which, for example, a liquid crystal material contained in the optical waveguide layer 20 is enclosed by $SiO_2$ spacers 73.

As can be seen from FIG. 79A, in the structural example in FIG. 27B, evanescent light leaks from regions in which no first mirror 30 is present. However, as can be seen from FIG. 79B, in the structural example in FIG. 78, the leakage of evanescent light is negligible. In FIGS. 79A and 79B, when the guided light propagates in the X direction, the intensity of the guided light decreases because of light emission from the first mirror 30 and leakage of evanescent light. The X direction propagation length of the guided light at which the intensity of the guided light is reduced by a factor of e was computed. The propagation length of the light in FIG. 79A was 7.8 μm, and the propagation length in FIG. 79B was 132 μm.

In the present embodiment, the spacers 73 may be formed of two or more different mediums.

Figure 80:
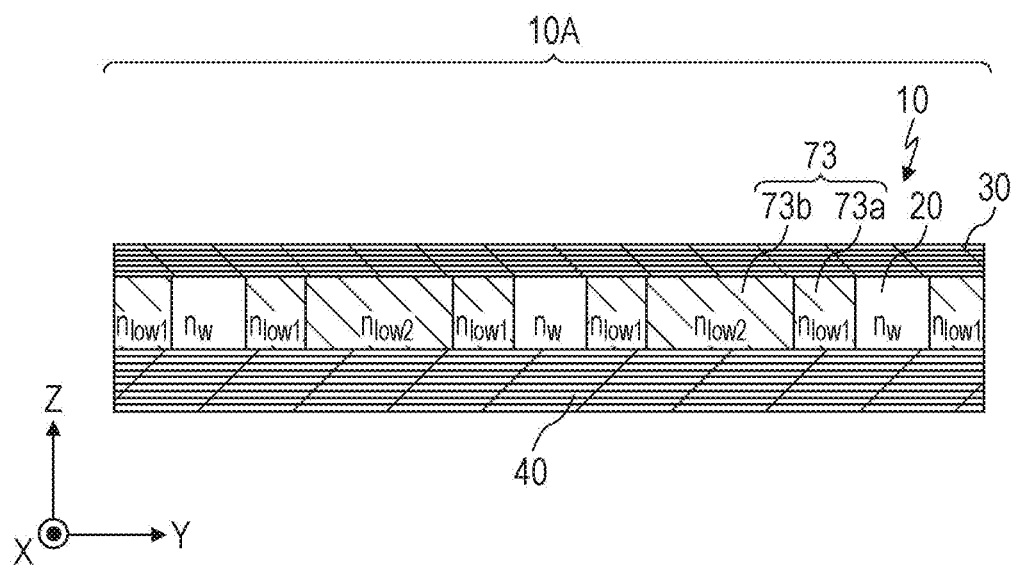

FIG. 80 is a cross-sectional view of an optical scanning device in the YZ plane, schematically showing a structural example in the present embodiment in which the spacers 73 include spacers 73a and 73b having different refractive indexes. In the structural example in FIG. 80, the refractive index $n_{low1}$ of the spacers 73a adjacent to the optical waveguide layers 20 is higher than the refractive index $n_{low2}$ of the spacers 73b not adjacent to the optical waveguide layers 20 ($n_{low1}>n_{low2}$). For example, when the optical waveguide layers 20 contain a liquid crystal material, $SiO_2$ may be used for the spacers 73a in order to enclose the liquid crystal material. The spacers 73b may be air. When the refractive index $n_{low2}$ of the spacers 73b is low, leakage of evanescent light from the optical waveguide layers 20 can be suppressed.

Figure 81:
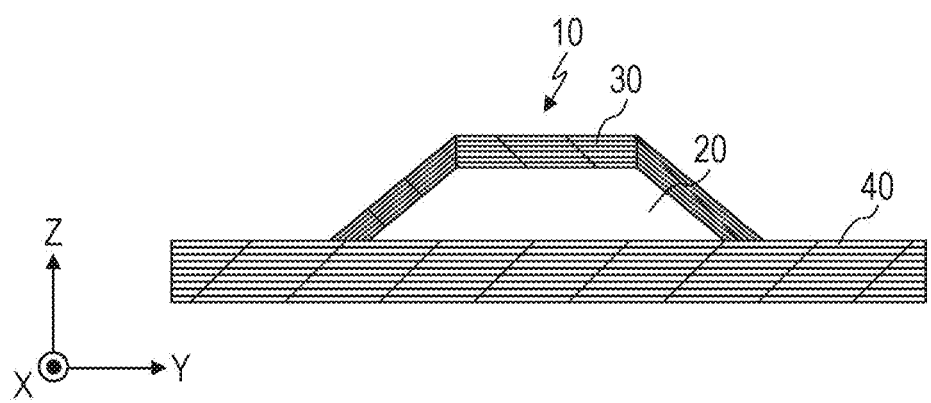

FIG. 81 is a cross-sectional view of an optical scanning device in the YZ plane, schematically showing a structural example of a waveguide element 10 in a modification of the present embodiment. In the structural example in FIG. 81, the optical waveguide layer 20 has a trapezoidal cross section in the YZ plane. The first mirror 30 is disposed not only on the upper side of the optical waveguide layer 20 but also on its left and right sides. In this manner, light leakage from the left and right sides of the optical waveguide layer 20 can be prevented.

Next, the materials of the optical waveguide layers 20 and the spacers 73 will be described.

In the structural examples in FIGS. 76, 78, and 80, the refractive index $n_w$ of the optical waveguide layers 20 and the refractive index $n_{low}$ of the spacers 73 satisfy the relation $n_w>n_{low}$. Specifically, the spacers 73 contain a material having a lower refractive index than the material of the optical waveguide layers 20. For example, when the optical waveguide layers 20 contain an electrooptical material, the spacers 73 may contain a transparent material such as $SiO_2$, $TiO_2$, $Ta_2O_5$, SiN, AlN, or air. When the optical waveguide layers 20 contain a liquid crystal material, the spacers 73 may contain $SiO_2$ or air. By sandwiching the optical waveguide layers 20 between a pair of electrodes and applying a voltage to the electrodes, the refractive index of the optical waveguide layers 20 containing an electrooptical material or a liquid crystal material can be changed. In this manner, the emission angle of the light emitted from each first mirror 30 can be changed. The detailed driving method etc. of the optical scanning device when the optical waveguide layers 20 contain a liquid crystal material or an electrooptical material are as described above.

The structure in each of the examples in FIGS. 78 and 80 may be formed by laminating the first mirror 30 and the other components. In this case, the structure can be produced easily. When the spacers 73 are formed of a solid material, the first mirror 30 may be formed by, for example, vapor deposition or sputtering.

In the structural examples in FIGS. 76, 78, and 80, the structure of each first mirror 30 has been described on the assumption that the plurality of waveguide elements 10 share the second mirror 40. Of course, the above discussion is applicable to the second mirror 40. Specifically, when the width of at least one of the first and second mirrors 30 and 40 in the Y direction is larger than the width of the optical waveguide layers 20, leakage of evanescent light from the optical waveguide layers 20 can be prevented. A reduction in the amount of light used for optical scanning can thereby be prevented.

<Discussion about Optical Waveguide Layers and Spacers>

Next, a detailed description will be given of the influence of the structure of the optical waveguide layers 20 (referred to also as "optical waveguide regions 20") and the spacers 73 (referred to also as "non-waveguide regions 73") between the first and second mirrors 30 and 40 on waveguide modes. In the following description, the "width" means the dimension in the Y direction, and the "thickness" means the dimension in the Z direction.

The structural example in FIG. 78 is used as a computational model for a waveguide mode. Parameters used for the computations are as follows. The first mirror 30 is a multilayer reflective film prepared by stacking 12 alternate pairs of materials with refractive indexes of 2.1 and 1.45. The second mirror 40 is a multilayer reflective film prepared by stacking 17 pairs of these materials. The thickness of the optical waveguide regions 20 is h=0.65 μm, and the refractive index of the optical waveguide regions 20 is 1.6. The thickness of the non-waveguide regions 73 is h=0.65 μm, and the refractive index of the non-waveguide regions 73 is 1.45. The wavelength of the light is λ=940 nm.

The distribution of the electric field of a waveguide mode was computed for optical waveguide regions 20 with different widths. In these computations, the width of the non-waveguide regions 73 was sufficiently larger than the widths of the optical waveguide regions 20. Electric field distributions varying in the Y and Z directions and similar to those shown in the examples in FIGS. 79A and 79B were obtained. By integrating the electric field distributions varying in the Y and Z directions in the Z direction, electric field distributions in the Y direction were obtained. To compute the variance σ of each electric field distribution in the Y direction, fitting using the Gaussian function was performed. With the Gaussian function, 99.73% of the data lies within the range of $-3\sigma \leq Y \leq 3\sigma$. Therefore, analysis was performed under the assumption that 6σ corresponded to the spread of the electric field distribution. In the following description, the "spread of the electric field" means the spread of the electric field in the Y direction at 6σ.

Figure 82:
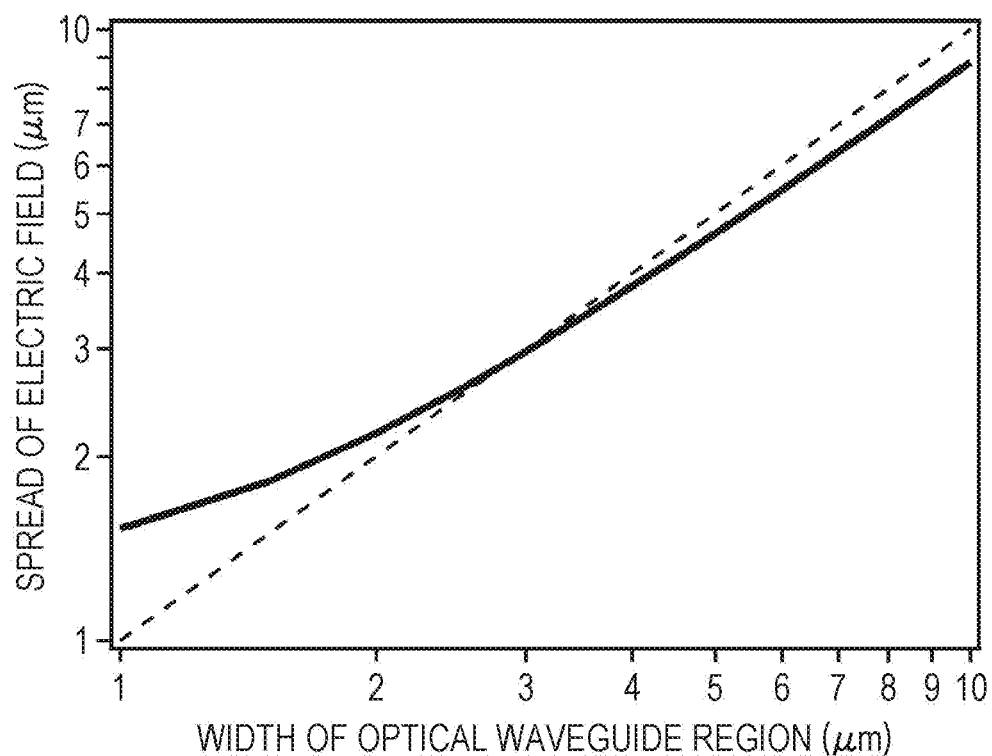

FIG. 82 is a graph showing the relation between the width of each optical waveguide region 20 and the spread of the electric field. As shown in the example in FIG. 82, when the width of the optical waveguide region 20 is w=3 μm or more, the spread of the electric field of the waveguide mode is smaller than the width of the optical waveguide region 20. When the width of the optical waveguide region 20 is w=3 μm or less, the spread of the electric field of the waveguide mode is larger than the width of the optical waveguide region 20, and the electric field penetrates into the non-waveguide regions 73.

Next, a description will be given of a structural example in which each non-waveguide region 73 includes a plurality of members.

Figure 83:
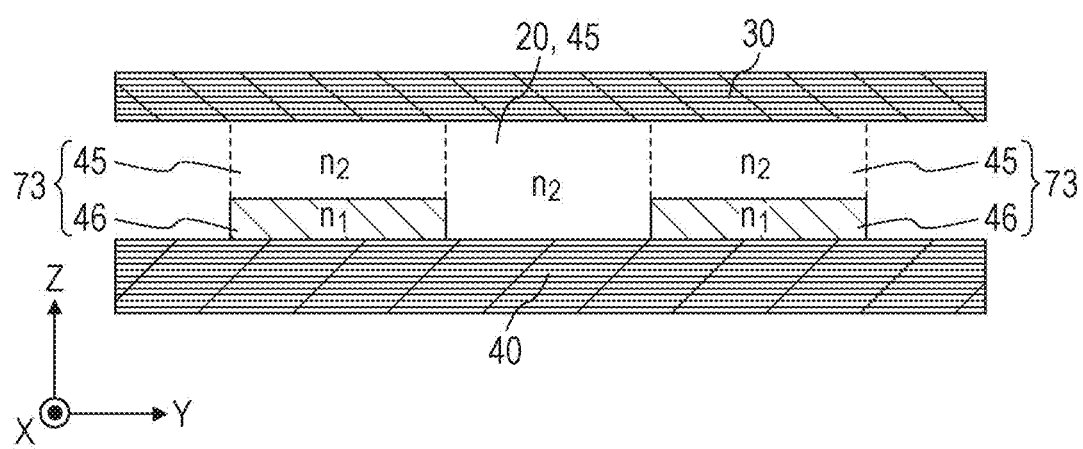

FIG. 83 is a cross-sectional view of an optical scanning device in an embodiment, schematically showing a structural example of an optical waveguide region 20 and non-waveguide regions 73.

The optical scanning device in the present embodiment includes a first mirror 30, a second mirror 40, the two non-waveguide regions 73, and the optical waveguide region 20.

The first mirror 30 has optical transparency, and the second mirror 40 is opposed to the first mirror 30.

The two non-waveguide regions 73 are disposed between the first mirror 30 and the second mirror 40 and spaced apart from each other in the Y direction. The Y direction is parallel to the reflecting surface of at least one of the first and second mirrors 30 and 40.

The optical waveguide region 20 is disposed between the first and second mirrors 30 and 40 and located between the two non-waveguide regions 73. The optical waveguide region 20 has a higher average refractive index than the non-waveguide regions 73. The optical waveguide region 20 propagates light in the X direction. The X direction is parallel to the reflecting surface of the at least one of the first and second mirrors 30 and 40 and perpendicular to the Y direction.

The optical waveguide region 20 and the two non-waveguide regions 73 include respective regions formed of a common material 45. The optical waveguide region 20 or each of the two non-waveguide regions 73 further includes at least one member 46 having a refractive index different from that of the common material 45. As illustrated, the at least one member 46 may be in contact with at least one of the first mirror 30 and the second mirror 40.

The first mirror 30 has a higher light transmittance than the second mirror 40. The first mirror 30 allows part of the light propagating through the optical waveguide region 20 to be emitted from the optical waveguide region 20 in a direction intersecting the XY plane. The XY plane is a plane formed by the X direction and the Y direction. An external adjusting element changes the refractive index and/or thickness of the optical waveguide region 20. In this manner, the direction of the light emitted from the optical waveguide region 20 is changed. More specifically, the adjusting element changes the X component of the wave vector of the emission light.

In the example shown in FIG. 83, each of the optical waveguide region 20 and the two non-waveguide regions 73 includes the common material 45, and the two non-waveguide regions 73 include their respective members 46. The members 46 are in contact with the second mirror 40. When the refractive index $n_1$ of the members 46 is lower than the refractive index $n_2$ of the common material 45, the average refractive index of the optical waveguide region 20 is higher than the average refractive index of the non-waveguide regions 73. In this case, light can propagate through the optical waveguide region 20. Each of the common material 45 and the members 46 may be, for example, one material selected from the group consisting of silicon oxide, tantalum oxide, titanium oxide, aluminum oxide, silicon nitride, aluminum nitride, and zinc oxide. When the dimension of each member 46 in the Z direction is r ($0 \leq r \leq 1$) times the distance between the first and second mirrors 30 and 40 (hereinafter referred to as an "inter-mirror distance"), the average refractive index of each of the non-waveguide regions 73 is $n_{ave}=n_1 \times r+n_2 \times (1-r)$. Hereinafter, the "dimension of a member" means the dimension of the member in the Z direction.

Waveguide modes in the example shown in FIG. 83 were analyzed in more detail. The structure of the first and second mirrors 30 and 40 is the same as the structure used for the computations in FIG. 82. The refractive indexes used in the computations are $n_1=1.45$ and $n_2=1.6$. The width of the optical waveguide region 20 is w=6 μm. The width of the optical waveguide region 20 is also the distance between the two separated non-waveguide regions 73. The thickness of the optical waveguide region 20 is h=0.65 μm or 2.15 μm. These thicknesses of 0.65 μm and 2.15 μm correspond to a second mode (m=2) and a seventh mode (m=7), respectively, in formula (9). The thickness of the non-waveguide regions 73 is equal to the thickness of the optical waveguide region 20. Computations were performed to examine how the spread of the electric field of each waveguide mode changes with the ratio r of the dimension of the members 46 to the inter-mirror distance. The results are shown below.

Figure 84A:
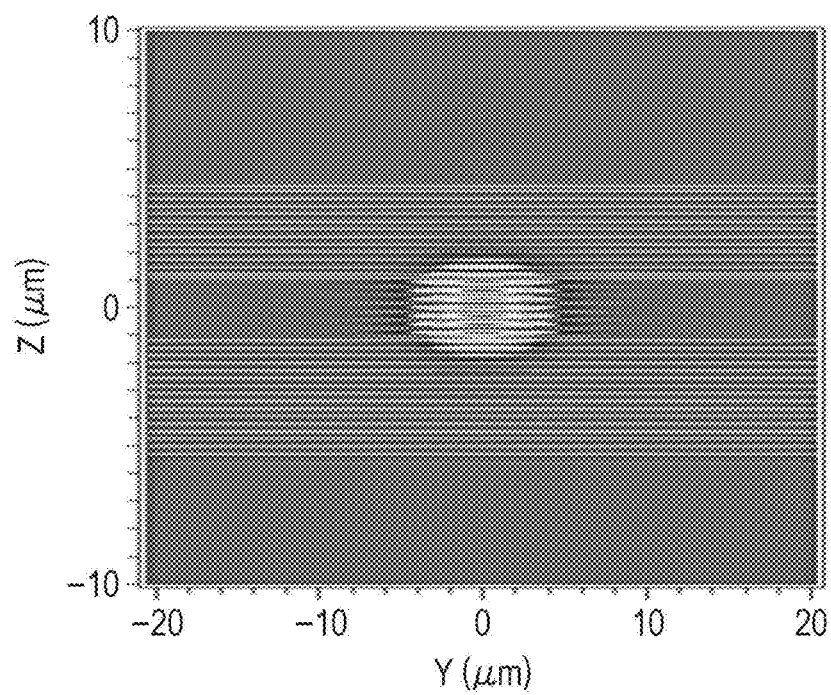
Figure 84B:
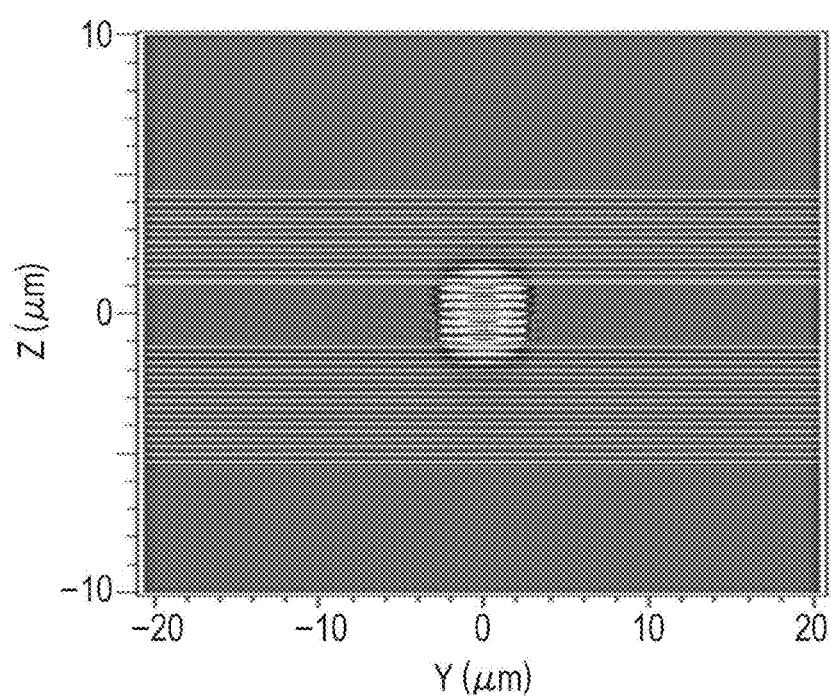

FIG. 84A is a graph showing the results of computations of the electric field distribution of a waveguide mode when r=0.1 and h=2.15 μm. FIG. 84B is a graph showing the results of computations of the electric field distribution of the waveguide mode when r=0.5 and h=2.15 μm. In each case, the waveguide mode obtained was similar to the waveguide mode shown in FIG. 79B. It was found that the electric field distribution in the Y direction when r=0.1 shown in FIG. 84A is broader than that when r=0.5 shown in FIG. 84B.

Figure 85:
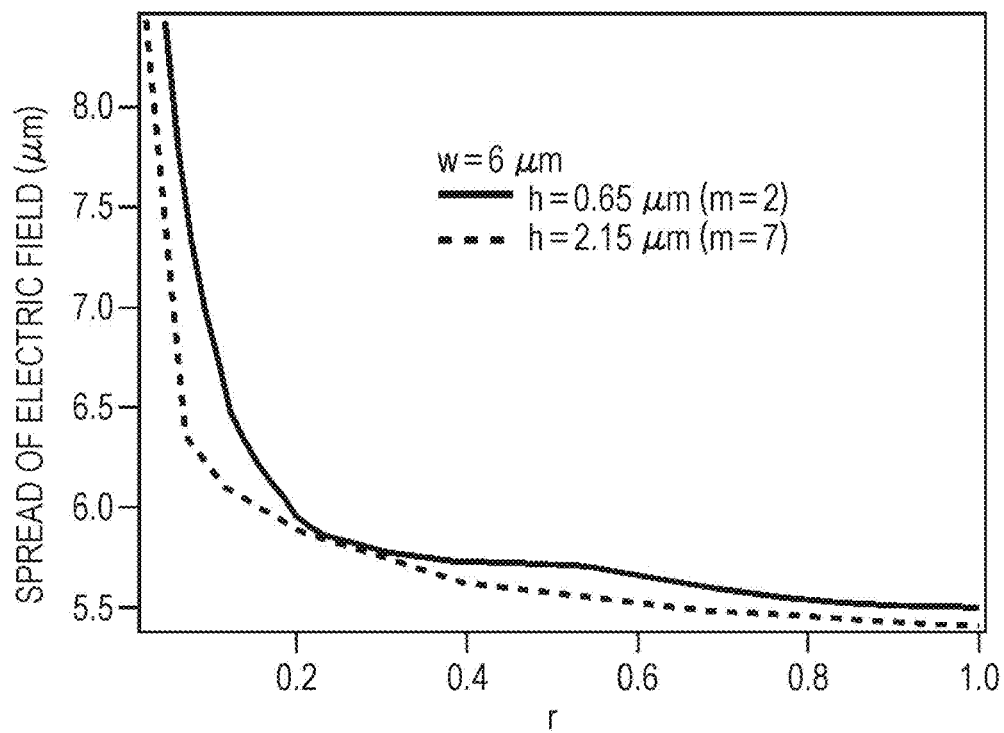

FIG. 85 is a graph showing the relation between the ratio r of the dimension of the members 46 to the inter-mirror distance and the spread of the electric field when the width of the optical waveguide region 20 is w=6.0 Jim. The thickness of the optical waveguide region 20 is h=0.65 μm (m=2, a solid line in the figure) or h=2.15 μm (m=7, a dotted line in the figure). As shown in FIG. 85, as r decreases, i.e., as the dimension of the members 46 decreases, the spread of the electric field increases. The behavior of the spread of the electric field is almost the same for both the second and seventh waveguide modes. In particular, when r≤0.2, the spread of the electric field increases steeply and exceeds the width of the optical waveguide region 20 (w=6.0 μm).

Figure 86:
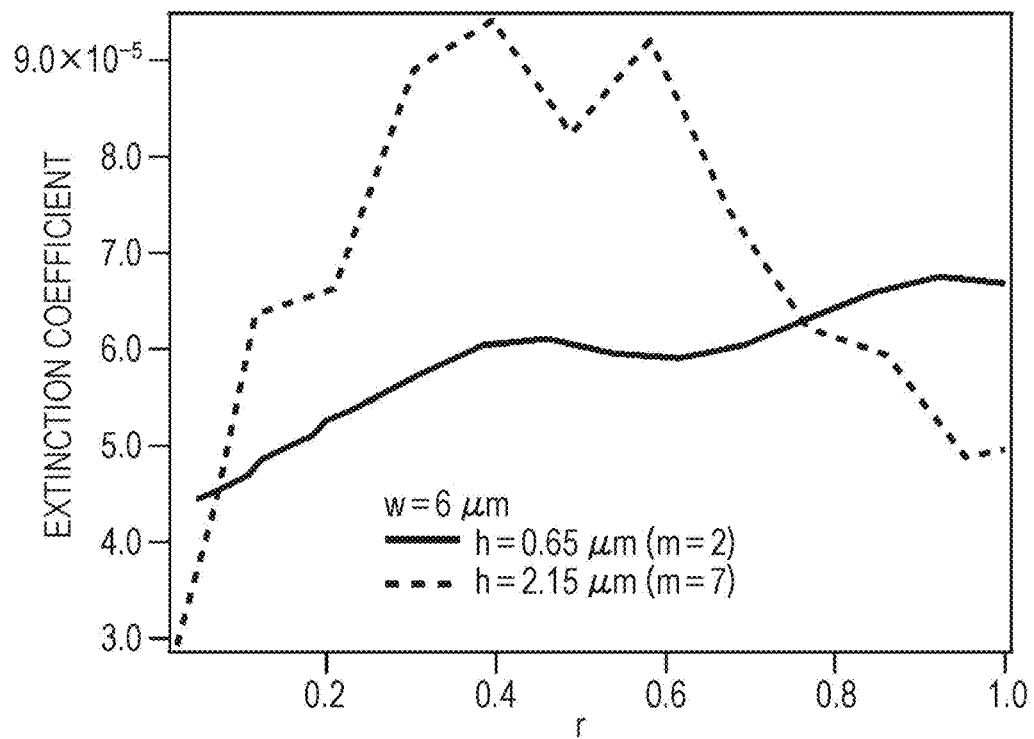

FIG. 86 is a graph showing the relation between the ratio r of the dimension of the members 46 to the inter-mirror distance in the examples in FIG. 85 and the extinction coefficient in each waveguide mode. As shown in FIG. 86, the order of magnitude of the extinction coefficient is almost unchanged ($\approx 10^{-5}$) even when r is changed. Specifically, the extinction coefficient has little dependence on r. However, when the electric field spreads to the non-waveguide regions 73, scattering or absorption may increase due to various factors. For example, when edges of the non-waveguide regions 73 are not smooth, when particles are present in the non-waveguide regions 73, or when the non-waveguide regions 73 themselves absorb light, loss of the light propagating through the optical waveguide region 20 occurs. Therefore, the condition r≥0.2 in which the electric field does not penetrate into the non-waveguide regions 73 is desirable.

Next, analysis was performed on a structural example in which the width of the optical waveguide region 20, i.e., the distance between the two separated non-waveguide regions 73, is w=3 μm. Under this condition, as shown in FIG. 82 with r=1, the spread of the electric field is about the same as the width of the optical waveguide region 20.

Figure 87:
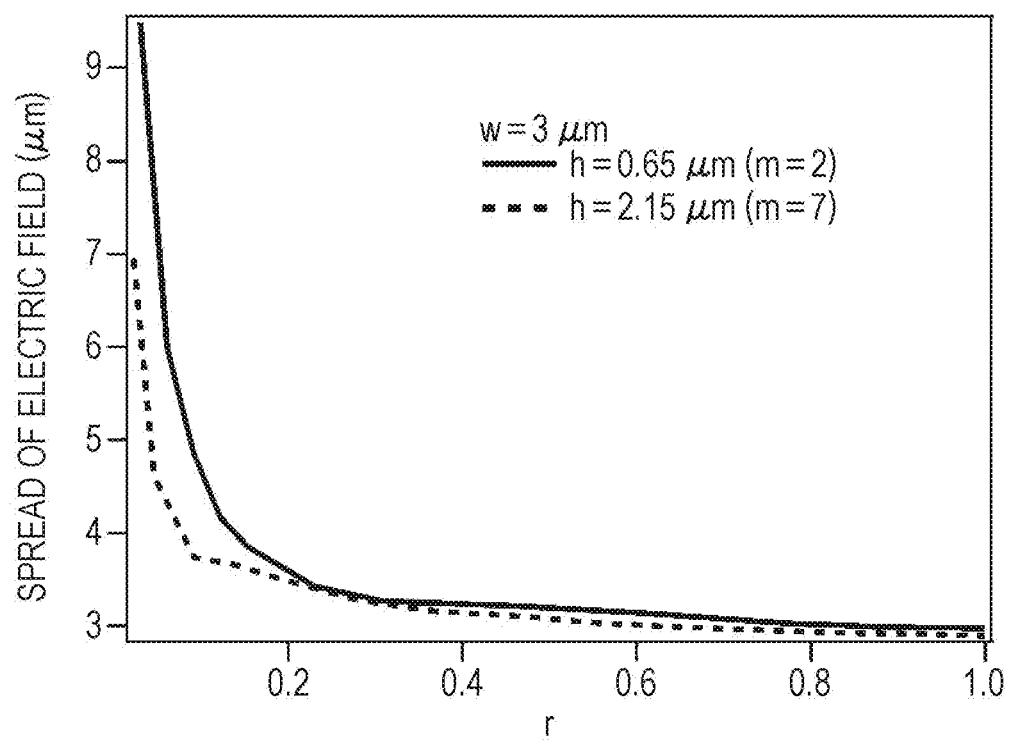

FIG. 87 is a graph showing the relation between the ratio r of the dimension of the members 46 to the inter-mirror distance and the spread of the electric field when the width of the optical waveguide region 20 is w=3.0 µm. When r≤0.2, the spread of the electric field increases steeply, as in the examples in FIG. 85. When r<0.1, the spread of the electric field exceeds 6 µm.

Even when the electric field of each waveguide mode spreads excessively, no problem arises when a single optical waveguide region 20 is used to configure an optical scanning device. However, in an optical scanning device including an array of optical waveguide regions 20, it is preferable to avoid excessive spread of the electric field of a waveguide mode. In such an optical scanning device, when the width of each non-waveguide region 73 sandwiched between two optical waveguide regions 20 is 3 µm or less, the electric field of a waveguide mode in one of the optical waveguide regions 20 and the electric field of the waveguide mode in an adjacent one of the optical waveguide regions 20 overlap each other in the non-waveguide region 73 therebetween. Therefore, part of light propagating through one of the optical waveguide regions 20 may be transmitted to an adjacent optical waveguide region 20, i.e., the crosstalk phenomenon may occur. The crosstalk phenomenon may affect the effect of interference between light beams emitted from the plurality of optical waveguide regions 20.

Because of the above reason, r is set to be, for example, equal to or larger than 0.1 in the present embodiment. When r≥0.2, almost all the electric fields can be distributed within the respective optical waveguide regions 20. Even when r<0.1, the crosstalk phenomenon can be avoided when the width of the non-waveguide regions 73 is larger than the width of the optical waveguide regions 20. Specifically, in an optical scanning device in another embodiment, r<0.1 may hold.

In the optical scanning device in the present embodiment, its production cost can be reduced by using a low-cost material as the common material 45.

<Modifications>

Figure 88:
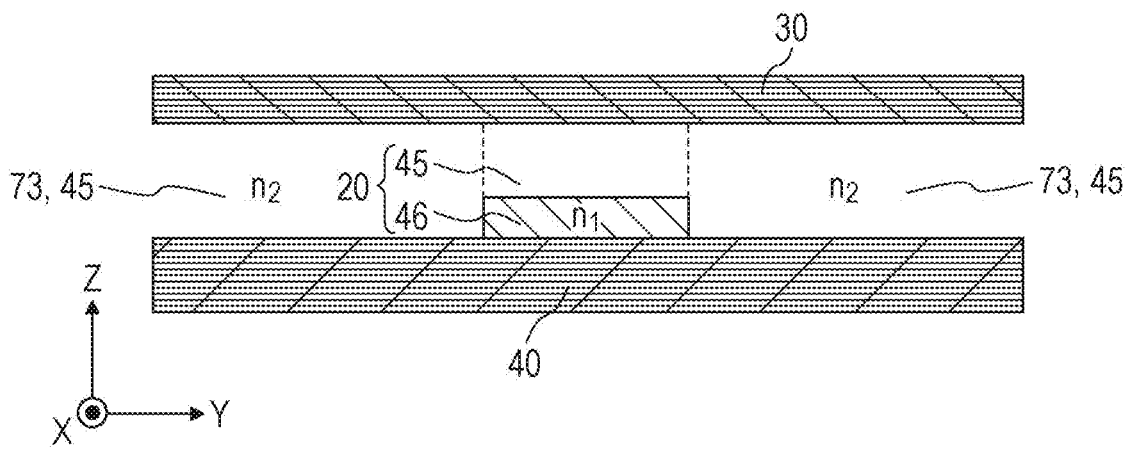

FIG. 88 is a cross-sectional view of an optical scanning device, schematically showing the structure of the optical waveguide region 20 and the non-waveguide regions 73 in a modification in the present embodiment. In the example shown in FIG. 88, each of the optical waveguide region 20 and the two non-waveguide regions 73 includes the common material 45, and the optical waveguide region 20 includes a member 46. The member 46 is in contact with the second mirror 40. When the refractive index $n_1$ of the member 46 is higher than the refractive index $n_2$ of the common material 45, the average refractive index of the optical waveguide region 20 is higher than the average refractive index of the non-waveguide regions 73. In this case, light can propagate through the optical waveguide region 20. In this structure, each of the common material 45 and the members 46 may be, for example, one material selected from the group consisting of silicon oxide, tantalum oxide, titanium oxide, aluminum oxide, silicon nitride, aluminum nitride, and zinc oxide. A gas such as air or a liquid may be used as the common material 45. In this case, its thickness can be easily changed. Specifically, the structure shown in FIG. 88 is advantageous for a method in which the thickness is modulated.

Figure 89:
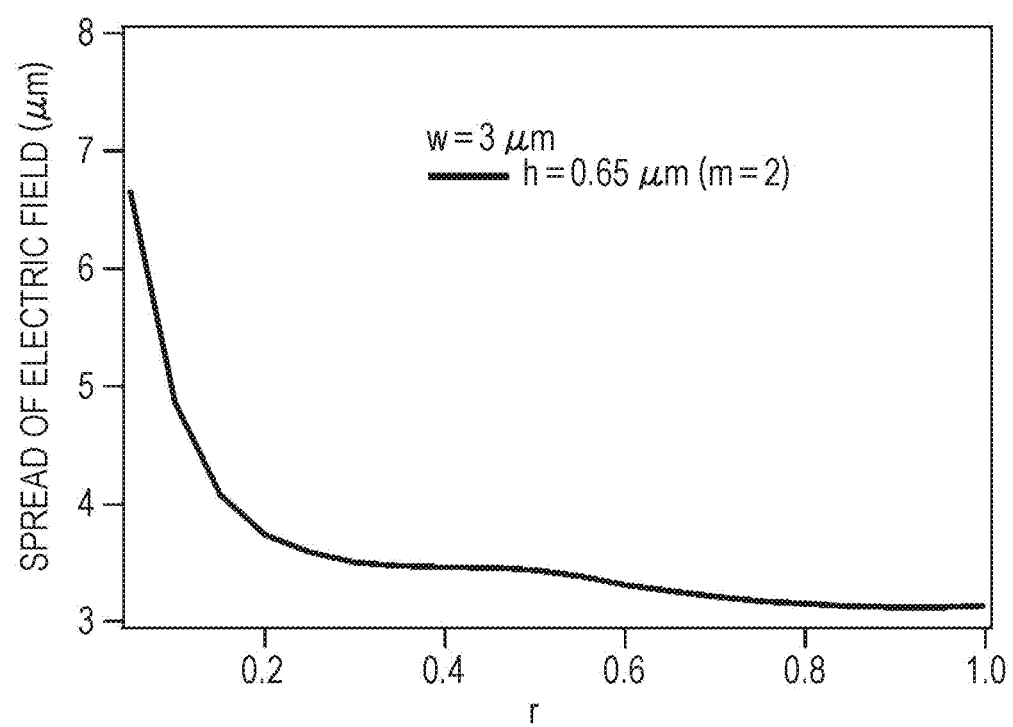

FIG. 89 is a graph showing the relation between the ratio r of the dimension of the member 46 to the inter-mirror distance and the spread of the electric field in the example in FIG. 88. The refractive indexes used for the computations are $n_1$=1.6 and $n_2$=1.45. The width of optical waveguide region 20 is w=3.0 µm, and the thickness of the optical waveguide region 20 is h=0.65 µm (m=2). As can be seen from the example in FIG. 89, in the present modification also, the spread of the electric field increases steeply when r≤0.2, as in the examples in FIGS. 85 and 87.

The optical waveguide region 20 or the non-waveguide regions 73 can be formed by providing steps on the reflecting surface of at least one of the first and second mirrors 30 and 40. The protruding portion formed by providing the steps corresponds to a member 46 having a refractive index different from that of the common material 45.

FIG. 90A is a cross-sectional view showing an example in which the protruding portion protruding from other portions is provided on part of the reflection surface of the second mirror 40. In this example, the protruding portion corresponds to the member 46 in the above example. Therefore, in the following description, the protruding portion is referred to as the "member 46." The protruding portion, i.e., the member 46, in this example is formed of the same material as the material of the second mirror 40. The member 46 is regarded as part of the second mirror 40. In the example shown in FIG. 90A, the refractive index $n_2$ of the common material is lower than the refractive index of the member 46. In this example, a region that includes the member 46 as viewed in the Z direction corresponds to the optical waveguide region 20, and regions that do not include the member 46 correspond to the non-waveguide regions 73.

FIG. 90B is a cross-sectional view schematically showing another example in which the protruding portion is provided on part of the reflection surface of the second mirror 40. In the example shown in FIG. 90B, the refractive index $n_2$ of the common material is higher than the refractive index of the protruding portion 46. In this example, regions that do not include the protruding portion, i.e., the member 46, as viewed in the Z direction, correspond to the optical waveguide regions 20, and a region that includes the member 46 corresponds to the non-waveguide region 73.

As shown in FIGS. 90A and 90B, the magnitude relation between the refractive index of the common material 45 and the refractive index of the member 46 defines each optical waveguide region 20 and each non-waveguide region 73.

FIG. 91 is a cross-sectional view schematically showing a structural example in which, between the first mirror 30 and the second mirror 40, two members 46 are disposed on the first mirror 30 so as to be spaced apart from each other. FIG. 92 is a cross-sectional view of an optical scanning device, schematically showing a structural example in which, between the first mirror 30 and the second mirror 40, two members 46 are disposed on each of the first mirror 30 and the second mirror 40 so as to be spaced apart from each other. In the example in FIG. 91, the two members 46 are in contact with the first mirror 30. In the example in FIG. 92, the two upper members 46 are in contact with the first mirror 30, and the two lower members 46 are in contact with the second mirror. The refractive index of each member 46 is denoted by $n_1$, and the refractive index of the common material 45 is denoted by $n_2$. When $n_1 < n_2$, a region that does not include the members 46 as viewed in the Z direction corresponds to an optical waveguide region 20, and a region that includes any of the members 46 corresponds to a non-waveguide region 73. When $n_1 > n_2$, a region that includes any of the members 46 as viewed in the Z direction corresponds to an optical waveguide region 20, and a region that does not include the members 46 corresponds to a non-waveguide region 73.

FIG. 93 is a cross-sectional view schematically showing a structural example in which, between the first mirror 30 and the second mirror 40, two members 46 are disposed on the first mirror 30 so as to be spaced apart from each other and an additional member 47 is disposed on the second mirror 40. In the example in FIG. 93, the two members 46 are in contact with the first mirror 30, and the additional member 47 is in contact with the second mirror 40. Each member 46 and the additional member 47 do not overlap each other as viewed in the Z direction. The refractive index of the common material 45 is denoted by $n_2$. The refractive index of the members 46 is denoted by $n_1$, and the refractive index of the additional member 47 is denoted by $n_3$. Each member 46 and the additional member 47 may differ in at least one of refractive index and dimension.

When the average refractive index of regions that include any of the members 46 as viewed in the Z direction is larger than the average refractive index of a region that includes the additional member 47, the regions including any of the members 46 correspond to optical waveguide regions 20, and the region including the additional member 47 corresponds to a non-waveguide region 73. When the average refractive index of the regions that include any of the members 46 as viewed in the Z direction is smaller than the average refractive index of the region that includes the additional member 47, the region including the additional member 47 corresponds to an optical waveguide region 20, and the regions including any of the members 46 correspond to non-waveguide regions 73.

Suppose, for example, that the refractive index n of the members 46 is lower than the refractive index $n_2$ of the common material 45 and the refractive index $n_3$ of the additional member 47 is higher than the refractive index $n_2$ of the common material 45 ($n_1<n_2<n_3$). In this structure, the region that includes the additional member 47 as viewed in the Z direction corresponds to an optical waveguide region 20, and the regions that include any of the members 46 correspond to non-waveguide regions 73. When the optical waveguide region 20 includes at least one additional member 47 having a refractive index $n_3$ higher than the refractive index $n_2$ of the common material 45, the difference between the average refractive index of the optical waveguide region 20 and the average refractive index of the non-waveguide regions 73 is large. In this case, penetration of each waveguide mode in the optical waveguide region 20 into the non-waveguide regions 73 can be reduced.

FIG. 94 is a cross-sectional view of an optical scanning device, schematically showing an example in which, between the first mirror 30 and the second mirror 40, two members 46 are disposed on the second mirror 40 so as to be spaced from each other. In the example in FIG. 94, the optical scanning device further includes two support members 74 that fix the distance between the first and second mirrors 30 and 40. The two support members 74 are located outside the two non-waveguide regions.

FIG. 95 is a cross-sectional view showing a structural example in which, between the first mirror 30 and the second mirror 40, a member 46 is disposed on each of the first and second mirrors 30 and 40. The two upper and lower members 46 overlap each other as viewed in the Z direction. When the common material 45 is air, a region that includes the members 46 as viewed in the Z direction corresponds to an optical waveguide region 20, and regions that do not include the members 46 correspond to non-waveguide regions 73.

In each optical scanning device, the adjusting element may include an actuator 78 connected to at least one of the first and second mirrors 30 and 40. The actuator 78 changes the distance between the first and second mirrors 30 and 40, and the thickness of the optical waveguide region 20 can thereby be changed.

The actuator 78 may include a piezoelectric member and may change the distance between the first and second mirrors 30 and 40 by deforming the piezoelectric member. The direction of the light emitted from the optical waveguide region 20 can thereby be changed. The material of the piezoelectric member is as described in the examples in FIGS. 42 to 48.

In the examples in FIGS. 83, 88, 90A, 90B, and 91 to 95, the common material 45 may be a liquid crystal. In this case, the adjusting element may include a pair of electrodes with the optical waveguide region 20 therebetween. The adjusting element applies a voltage to the pair of electrodes. The refractive index of the optical waveguide region 20 is thereby changed. In this manner, the direction of the light emitted from the optical waveguide region 20 is changed.

An array including the above-described optical waveguide region 20 and the above-described two non-waveguide regions 73 may be used to configure an optical scanning device. Specifically, this optical scanning device includes a plurality of optical waveguide regions including the above-described optical waveguide region 20 and a plurality of non-waveguide regions including the above-described two non-waveguide regions 73. The average refractive index of each of the plurality of optical waveguide regions is higher than the average refractive index of each of the plurality of non-waveguide regions. The plurality of optical waveguide regions and the plurality of non-waveguide regions are disposed between the first and second mirrors 30 and 40 and arranged alternately in the Y direction.

The optical scanning device may further include a plurality of phase shifters connected to the plurality of optical waveguide regions. Each of the plurality of phase shifters includes a waveguide connected to a corresponding one of the plurality of optical waveguide regions 20 directly or through another waveguide.

The waveguide of each of the phase shifters may contain a material whose refractive index is changed when a voltage is applied or temperature is changed. The above adjusting element is referred to as a first adjusting element. A second adjusting element different from the first adjusting element applies a voltage to each of the waveguides of the phase shifters or changes the temperature of each of the waveguides. The refractive index of each waveguide is thereby changed, and differences in phase between light beams to be transmitted from the plurality of phase shifters to the plurality of optical waveguide regions are changed. Therefore, the direction of the light emitted from the plurality of optical waveguide regions is changed. More specifically, the second adjusting element changes the Y component of the wave vector of the light emitted.

APPLICATION EXAMPLES

FIG. 96 is an illustration showing a structural example of an optical scanning device 100 including elements such as an optical divider 90, a waveguide array 10A, a phase shifter array 80A, and a light source 130 integrated on a circuit substrate (e.g., a chip). The light source 130 may be a light-emitting element such as a semiconductor laser. The light source 130 in this example emits single-wavelength light with a wavelength of λ in free space. The optical divider 90 divides the light from the light source 130 and introduces the resulting light beams into a plurality of waveguides of a plurality of phase shifters. In the structural example in FIG. 96, an electrode 62a and a plurality of electrodes 62b are provided on the chip. A control signal is supplied to the waveguide array 10A from the electrode 62a. Control signals are sent from the plurality of electrodes 62b to the plurality of phase shifters 80 in the phase shifter array 80A. The electrodes 62a and 62b may be connected to an unillustrated control circuit that generates the above-described control signals. The control circuit may be disposed on the chip shown in FIG. 96 or on another chip in the optical scanning device 100.

By integrating all the components on the chip as shown in FIG. 96, optical scanning over a wide area can be implemented using the small device. For example, all the components shown in FIG. 96 can be integrated on a chip of about 2 mm×about 1 mm.

FIG. 97 is a schematic diagram showing how two-dimensional scanning is performed by irradiating a distant object with a light beam such as a laser beam from the optical scanning device 100. The two-dimensional scanning is performed by moving a beam spot 310 in horizontal and vertical directions. By combining the two-dimensional scanning with a well-known TOF (time of flight) method, a two-dimensional range image can be obtained. In the TOF method, a target object is irradiated with a laser beam, and the reflected light is observed. The time of flight of the light is computed, and the distance is thereby determined.

FIG. 98 is a block diagram showing a structural example of a LiDAR system 300 that is an example of a photodetection system capable of generating a range image. The LiDAR system 300 includes the optical scanning device 100, a photodetector 400, a signal processing circuit 600, and a control circuit 500. The photodetector 400 detects light emitted from the optical scanning device 100 and reflected from the target object. For example, the photodetector 400 may be an image sensor sensitive to the wavelength λ of the light emitted from the optical scanning device 100 or a photodetector including light-receiving elements such as photodiodes. The photodetector 400 outputs an electric signal corresponding to the amount of the light received. The signal processing circuit 600 computes the distance to the target object based on the electric signal outputted from the photodetector 400 and generates distance distribution data. The distance distribution data is data indicating a two-dimensional distance distribution (i.e., a range image). The control circuit 500 is a processor that controls the optical scanning device 100, the photodetector 400, and the signal processing circuit 600. The control circuit 500 controls the timing of irradiation with the light beam from the optical scanning device 100, the timing of exposure of the photodetector 400, and the timing of signal reading and instructs the signal processing circuit 600 to generate a range image.

In the two-dimensional scanning, a frame rate for acquisition of range images can be selected from 60 fps, 50 fps, 30 fps, 25 fps, 24 fps, etc. often used for general video images. In consideration of application to vehicle-mounted systems, the higher the frame rate, the higher the frequency of range image acquisition, and the higher the accuracy of obstacle detection. For example, when the frame rate is 60 fps and a vehicle is driving at 60 km/h, an image can be acquired every time the vehicle moves about 28 cm. When the frame rate is 120 fps, an image can be acquired every time the vehicle moves about 14 cm. When the frame rate is 180 fps, an image can be acquired every time the vehicle moves about 9.3 cm.

The time required to acquire one range image depends on a beam scanning speed. For example, to acquire an image with 100×100 resolvable points at 60 fps, each point must be scanned with the beam in 1.67 μs or less. In this case, the control circuit 500 controls the emission of the light beam from the optical scanning device 100 and signal accumulation and reading by the photodetector 400 at an operating speed of 600 kHz.

Examples of Application to Photoreceiver Device

The optical scanning device in any of the above embodiments of the present disclosure can also be used as a photoreceiver device having approximately the same structure as the optical scanning device. The photoreceiver device includes the same waveguide array 10A as that in the optical scanning device and a first adjusting element 60 that adjusts a light receivable direction. Each of the first mirrors 30 of the waveguide array 10A allows light incident in the third direction on a side opposite to a first reflecting surface to pass through. Each of the optical waveguide layers 20 of the waveguide array 10A propagates the light transmitted through the corresponding first mirror 30 in the second direction. The first adjusting element 60 changes at least one of the refractive index of the optical waveguide layer 20 of each waveguide element 10, the thickness thereof, and the wavelength of the light, and the light receivable direction can thereby be changed. The photoreceiver device may further include: the same phase shifters as the plurality of phase shifters 80 or the plurality of phase shifters 80a and 80b in the optical scanning device; and a second adjusting element that changes the phase differences between light beams outputted from the plurality of waveguide elements 10 through the plurality of phase shifters 80 or the plurality of phase shifters 80a and 80b. In this case, the light receivable direction can be changed two dimensionally.

For example, by replacing the light source 130 in the optical scanning device 100 shown in FIG. 96 with a receiving circuit, a photoreceiver device can be configured. When light with a wavelength λ enters the waveguide array 10A, the light is transmitted to the optical divider 90 through the phase shifter array 80A, combined into one beam, and sent to the receiving circuit. The intensity of the one combined beam represents the sensitivity of the photoreceiver device. The sensitivity of the photoreceiver device can be adjusted by an adjusting element installed in the waveguide array and another adjusting element installed in the phase shifter array 80A. In the photoreceiver device, the direction of the wave vector shown in, for example, FIG. 31 (the thick arrow in the figure) is reversed. The incident light has a light component in the extending direction of the waveguide elements 10 (the X direction in the figure) and a light component in the arrangement direction of the waveguide elements 10 (the Y direction in the figure). The sensitivity to the light component in the X direction can be adjusted by the adjusting element installed in the waveguide array 10A. The sensitivity to the light component in the arrangement direction of the waveguide elements 10 can be adjusted by the adjusting element installed in the phase shifter array 80A. $\theta$ and $\alpha_0$ (formulas (12) and (13)) can be determined from the phase difference $\Delta\phi$ between the light beams when the sensitivity of the photoreceiver device is maximized and the refractive index $n_w$ and thickness d of the optical waveguide layers 20. This allows the incident direction of the light to be identified.

The above-described embodiments and modifications can be appropriately combined. For example, the structure of the optical device described with reference to any of FIGS. 10 to 26 may be combined with the array structure in any of the embodiments.

The optical scanning device and the photoreceiver device in the embodiments of the present disclosure can be used for applications such as LiDAR systems installed in vehicles such as automobiles, UAVs, and AGVs.

What is claimed is:

1. An optical device comprising:
a first waveguide that propagates light in a first direction; and
a second waveguide including a first mirror, a second mirror, and an optical waveguide layer, the first mirror extending in the first direction and having a first reflecting surface, the second mirror extending in the first direction and having a second reflecting surface facing the first reflecting surface, the optical waveguide layer being located between the first mirror and the second mirror and propagating the light in the first direction,
wherein a forward end portion of the first waveguide is disposed inside the optical waveguide layer, and
wherein, in a region in which the first waveguide and the second waveguide overlap each other when viewed in a direction perpendicular to the first reflecting surface, at least part of the first waveguide and/or at least part of the second waveguide includes at least one grating whose refractive index varies periodically in the first direction.

2. The optical device according to claim 1, wherein the period of the at least one grating is larger than $\lambda/n_{e1}$ and smaller than $\lambda/(n_{e1}-1)$, where $n_{e1}$ is the effective refractive index for a waveguide mode of the light propagating through the first waveguide, and $\lambda$ is the wavelength of the light in air.

3. The optical device according to claim 1, wherein, in the region in which the first waveguide and the second waveguide overlap each other, the first waveguide has a first surface facing the first reflecting surface and a second surface facing the second reflecting surface, and
wherein the at least one grating is provided on at least one of the first surface and the second surface.

4. The optical device according to claim 1, wherein the at least one grating is provided on at least one of the first reflecting surface and the second reflecting surface.

5. The optical device according to claim 1, wherein the at least one grating includes a plurality of recessed portions or protruding portions arranged in the first direction, and
wherein the number of the plurality of recessed portions or protruding portions is 4 or more.

6. The optical device according to claim 5, wherein the number of the plurality of recessed portions or protruding portions is from 4 to 64 inclusive.

7. The optical device according to claim 1, wherein the at least one grating includes a plurality of recessed portions arranged in the first direction, and
wherein the depth of each of the recessed portions is from 1/3 to 8/15 inclusive of the thickness of the first waveguide.

8. The optical device according to claim 1, wherein the at least one grating comprises a plurality of gratings, and
wherein the periods of the plurality of gratings are different.

9. The optical device according to claim 8, wherein the plurality of gratings comprise at least two gratings arranged in the first direction.

10. The optical device according to claim 8, wherein the plurality of gratings comprise at least two gratings adjacent to each other in a second direction intersecting the first direction.

11. An optical device comprising:
a first waveguide that propagates light in a first direction; and
a second waveguide including a first mirror, a second mirror, and an optical waveguide layer, the first mirror extending in the first direction and having a first reflecting surface, the second mirror extending in the first direction and having a second reflecting surface facing the first reflecting surface, the optical waveguide layer being located between the first mirror and the second mirror and propagating the light in the first direction,
wherein a forward end portion of the first waveguide is disposed inside the optical waveguide layer,
wherein, in a region in which the first waveguide and the second waveguide overlap each other when viewed in a direction perpendicular to the first reflecting surface, at least part of the first waveguide and/or at least part of the second waveguide includes a grating whose refractive index varies in the first direction, and
wherein the grating includes a plurality of periodic components.

12. The optical device according to claim 11, wherein the period of each of the plurality of periodic components is larger than $\lambda/n_{e1}$ and smaller than $\lambda/(n_{e1}-1)$, where $n_{e1}$ is the effective refractive index for a waveguide mode of the light propagating through the first waveguide, and $\lambda$ is the wavelength of the light in air.

13. The optical device according to claim 1, further comprising two non-waveguide regions sandwiched between the first mirror and the second mirror with the optical waveguide layer interposed between the two non-waveguide regions, and
wherein the average refractive index of the optical waveguide layer is higher than the average refractive index of each of the non-waveguide regions.

14. The optical device according to claim 13, wherein each of the two non-waveguide regions includes at least two members with different refractive indexes.

15. The optical device according to claim 13, wherein the optical waveguide layer and the two non-waveguide regions include respective regions formed of a common material.

16. The optical device according to claim 1, further comprising a dielectric layer that supports the first waveguide, and
wherein the second mirror supports the dielectric layer.

17. The optical device according to claim 16, wherein, inside the optical waveguide layer, the width of the dielectric layer in a second direction intersecting the first direction is the same as the width of the optical waveguide layer in the second direction.

18. The optical device according to claim 17, wherein, inside the optical waveguide layer, the width of the first waveguide in the second direction is smaller than the width of the dielectric layer in the second direction.

19. The optical device according to claim 17, wherein, inside the optical waveguide layer, the width of the first waveguide in the second direction is the same as the width of the dielectric layer in the second direction.

20. The optical device according to claim 1, wherein, outside the optical waveguide layer, the first waveguide includes a portion whose width in a second direction intersecting the first direction increases monotonically toward the second waveguide.

21. The optical device according to claim 1, wherein the first mirror has a higher light transmittance than the second mirror and allows part of the light propagating through the optical waveguide layer to be emitted in a third direction intersecting the first reflecting surface.

22. The optical device according to claim 1, wherein the first mirror has a higher light transmittance than the second mirror, and
wherein the optical waveguide layer allows light entering the optical waveguide layer through the first mirror from a third direction intersecting the first reflecting surface to propagate in the first direction.

23. The optical device according to claim 21, wherein at least part of the optical waveguide layer has a structure whose refractive index and/or thickness can be adjusted, and
wherein, by adjusting the refractive index and/or the thickness, the third direction is changed.

24. The optical device according to claim 23, wherein the at least part of the optical waveguide layer contains a liquid crystal material or an electrooptical material,
the optical device further comprising:
a pair of electrodes that sandwich therebetween the at least part of the optical waveguide layer; and
a control circuit that applies a voltage to the pair of electrodes to change the refractive index of the at least part of the optical waveguide layer.

25. The optical device according to claim 24, wherein the pair of electrodes sandwich therebetween a portion of the optical waveguide layer that differs from a portion thereof overlapping the first waveguide when viewed in the direction perpendicular to the first reflecting surface.

26. The optical device according to claim 25, wherein the pair of electrodes are a first pair of electrodes,
the optical device further comprising a second pair of electrodes that sandwich therebetween at least part of the portion of the optical waveguide layer that overlaps the first waveguide when viewed in the direction perpendicular to the first reflecting surface,
wherein the control circuit applies voltages independently to the first pair of electrodes and the second pair of electrodes to independently adjust the refractive index of the portion of the optical waveguide layer that is located between the first pair of electrodes and the refractive index of the portion of the optical waveguide layer that is sandwiched between the second pair of electrodes.

27. The optical device according to claim 23, further comprising:
at least one actuator connected to at least one of the first mirror and the second mirror; and
a control circuit that controls the at least one actuator to change the distance between the first mirror and the second mirror to thereby change the thickness of the optical waveguide layer.

28. The optical device according to claim 1, further comprising a plurality of waveguide units each including the first waveguide and the second waveguide,
wherein the plurality of waveguide units are arranged in a second direction intersecting the first direction.

29. The optical device according to claim 21, further comprising a plurality of waveguide units each including the first waveguide and the second waveguide,
wherein the plurality of waveguide units are arranged in a second direction intersecting the first direction,
wherein the optical device further comprises a plurality of phase shifters connected to the respective waveguide units, each of the plurality of phase shifters including a waveguide connected to the first waveguide of a corresponding one of the plurality of waveguide units directly or through another waveguide, and
wherein, by changing the differences in phase between light beams passing through the plurality of phase shifters, the third direction is changed.

30. A photodetection system comprising:
the optical device according to claim 1;
a photodetector that detects light emitted from the optical device and reflected from an object; and
a signal processing circuit that generates distance distribution data based on an output from the photodetector.

* * * * *